United States Patent
Kataoka et al.

(10) Patent No.: US 8,841,060 B2
(45) Date of Patent: Sep. 23, 2014

(54) ACTINIC-RAY-SENSITIVE OR RADIATION-SENSITIVE RESIN COMPOSITION, RESIST FILM AND PATTERN FORMING METHOD EACH USING THE COMPOSITION, METHOD FOR PREPARING ELECTRONIC DEVICE, AND ELECTRONIC DEVICE

(75) Inventors: Shohei Kataoka, Haibara-gun (JP);
Yusuke Iizuka, Haibara-gun (JP);
Akinori Shibuya, Haibara-gun (JP);
Tomoki Matsuda, Haibara-gun (JP);
Naohiro Tango, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 130 days.

(21) Appl. No.: 13/537,843

(22) Filed: Jun. 29, 2012

(65) Prior Publication Data
US 2013/0004740 A1    Jan. 3, 2013

(30) Foreign Application Priority Data
Jun. 30, 2011    (JP) .................. 2011-146859

(51) Int. Cl.
G03F 7/004    (2006.01)
G03F 7/20    (2006.01)
G03F 7/11    (2006.01)
G03F 7/039    (2006.01)

(52) U.S. Cl.
CPC ............... *G03F 7/2041* (2013.01); *G03F 7/11* (2013.01); *G03F 7/0397* (2013.01); *G03F 7/0045* (2013.01); *Y10S 430/106* (2013.01); *Y10S 430/114* (2013.01); *Y10S 430/128* (2013.01)
USPC ........ 430/270.1; 430/396; 430/905; 430/913; 430/927

(58) Field of Classification Search
USPC ....................... 430/270.1, 913, 927, 396, 905
IPC .................... G03F 7/00,7/004, 7/0045, 7/0397, G03F 7/2041
See application file for complete search history.

(56) References Cited

U.S. PATENT DOCUMENTS 6,004,720 A * 12/1999 Takechi et al. ............. 430/270.1
6,027,856 A *  2/2000 Nozaki et al. ............. 430/281.1

(Continued)

FOREIGN PATENT DOCUMENTS

JP        05346668 A  * 12/1993
JP        3504156 B2    3/2004

(Continued)

OTHER PUBLICATIONS

Notice of Reasons for Rejection, dated Apr. 16, 2013, issued in corresponding JP Application No. 2011-146859, 9 pages in English and Japanese.

(Continued)

*Primary Examiner* — Amanda C Walke
(74) *Attorney, Agent, or Firm* — Sughrue Mion, PLLC

(57) ABSTRACT

An actinic-ray-sensitive or radiation-sensitive resin composition which is capable of improving line edge roughness (LER) and inhibiting pattern collapse, a resist film and a pattern forming method each using the same, a method for preparing an electronic device, and an electronic device are provided.

The actinic-ray-sensitive or radiation-sensitive resin composition contains:
(A) a resin having repeating units having a structure represented by any one of the following general formulae (I-1) to (I-3), and repeating units containing at least one selected from the group consisting of a lactone structure, a sultone structure, and a cyano group; and
(B) a compound that generates an acid by irradiation with actinic rays or radiations.

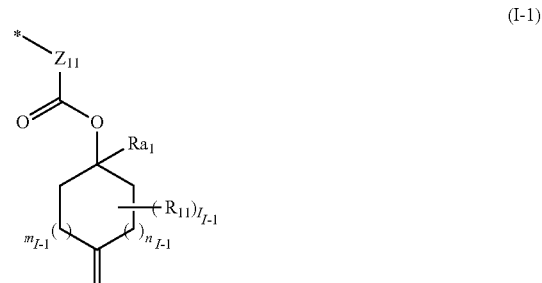

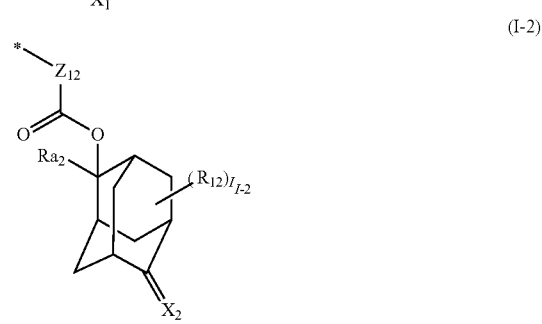

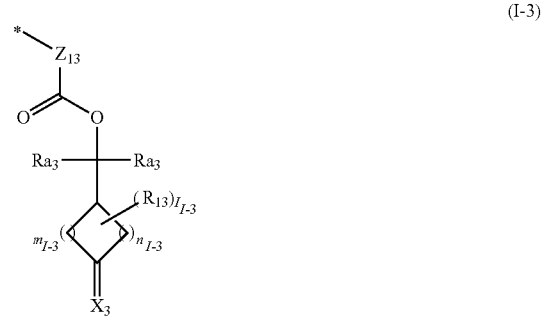

20 Claims, No Drawings

(56) References Cited

U.S. PATENT DOCUMENTS

| | | | |
|---|---|---|---|
| 6,344,304 B1* | 2/2002 | Takechi et al. | 430/270.1 |
| 6,416,925 B1* | 7/2002 | Aoai et al. | 430/270.1 |
| 6,420,082 B1* | 7/2002 | Sato et al. | 430/270.1 |
| 6,544,715 B2* | 4/2003 | Sato et al. | 430/270.1 |
| 6,699,645 B2* | 3/2004 | Takahashi et al. | 430/326 |
| 6,949,615 B2* | 9/2005 | Inoue | 526/242 |
| 7,179,580 B2* | 2/2007 | Takechi et al. | 430/270.1 |
| 7,241,553 B2* | 7/2007 | Hatakeyama et al. | 430/270.1 |
| 7,465,529 B2* | 12/2008 | Takechi et al. | 430/270.1 |
| 7,611,820 B2* | 11/2009 | Kanda et al. | 430/270.1 |
| 7,718,342 B2* | 5/2010 | Funatsu et al. | 430/270.1 |
| 7,727,704 B2* | 6/2010 | Taniguchi et al. | 430/270.1 |
| 7,851,127 B2* | 12/2010 | Ogata et al. | 430/270.1 |
| 7,867,690 B2* | 1/2011 | Nakayama et al. | 430/270.1 |
| 8,080,363 B2* | 12/2011 | Kanda | 430/270.1 |
| 2007/0121390 A1 | 5/2007 | Houston et al. | |
| 2008/0026331 A1 | 1/2008 | Hasegawa et al. | |
| 2008/0248421 A1 | 10/2008 | Fukuhara et al. | |
| 2009/0053649 A1* | 2/2009 | Nakashima et al. | 430/285.1 |
| 2009/0239176 A1* | 9/2009 | Kanda | 430/285.1 |
| 2010/0062364 A1* | 3/2010 | Dazai et al. | 430/270.1 |
| 2010/0136482 A1* | 6/2010 | Harada et al. | 430/270.1 |
| 2010/0183981 A1* | 7/2010 | Matsumiya et al. | 430/285.1 |
| 2011/0010542 A1* | 1/2011 | Choi et al. | 713/168 |
| 2011/0233048 A1* | 9/2011 | Kuramoto et al. | 204/157.82 |
| 2011/0236826 A1* | 9/2011 | Hatakeyama et al. | 430/270.1 |
| 2011/0244399 A1* | 10/2011 | Hirano et al. | 430/325 |
| 2011/0250539 A1* | 10/2011 | Sagehashi et al. | 430/270.1 |
| 2011/0262872 A1* | 10/2011 | Yokoya et al. | 430/326 |

FOREIGN PATENT DOCUMENTS

| | | |
|---|---|---|
| JP | 3982950 B2 | 9/2007 |
| JP | 2007241108 A | 9/2007 |
| JP | 2008-031298 A | 2/2008 |
| JP | 2008268932 A | 11/2008 |
| JP | 2012031381 A | 2/2012 |
| JP | 2012073564 A | 4/2012 |
| WO | WO 2006038477 A1 * | 4/2006 |

OTHER PUBLICATIONS

Notice of Reasons for Rejection, dated Dec. 3, 2013, issued in corresponding JP Application No. 2011-146859, 4 pages in English and Japanese.

* cited by examiner

ACTINIC-RAY-SENSITIVE OR RADIATION-SENSITIVE RESIN COMPOSITION, RESIST FILM AND PATTERN FORMING METHOD EACH USING THE COMPOSITION, METHOD FOR PREPARING ELECTRONIC DEVICE, AND ELECTRONIC DEVICE

BACKGROUND OF THE INVENTION

1. Field of the Invention

The present invention relates to an actinic-ray-sensitive or radiation-sensitive resin composition which is preferably used in super-micro lithography processes such as the manufacture of VLSIs and high-capacity microchips, and other photo-fabrication processes, and a pattern forming method using the same. More specifically, the present invention relates to an actinic-ray-sensitive or radiation-sensitive resin composition that is especially suitable when an ArF excimer laser or a KrF excimer laser is used as an irradiation source, a resist film and a pattern forming method each using the composition, a method for preparing an electronic device, and an electronic device.

2. Description of the Related Art

In the production process for semiconductor devices, such as ICs and LSIs, it is conventional practice to perform microfabrication by lithography using a photoresist composition. In recent years, the formation of an ultrafine pattern in the submicron region or quarter-micron region has increasingly been demanded in accordance with the realization of high integration for integrated circuits. Accordingly, the trend of exposure wavelength toward a short wavelength, for example, from g rays to i rays, and further to KrF excimer laser light has been seen.

As a resist composition for KrF, those including a resin having a polyhydroxystyrene as a basic skeleton, have been developed. As such a resin, use of, for example, a copolymer including hydroxystyrene and a monomer containing an adamantyl group is known (see, for example, US2007/0121390A).

Meanwhile, as a resist composition for which an ArF light source is mainly used, the compositions including a resin containing no aromatic ring have been developed, and for example, the resist compositions including a resin having a specified lactone structure are known (see, for example, JP2008-031298A). Moreover, in order to improve adhesion to a substrate, resist compositions including a resin having a ketone structure are known (see, for example, JP3982950B and JP3504156B).

However, for the resist compositions, there are demands for improvement of line edge roughness (LER) and further improvement of inhibition of pattern collapse.

SUMMARY OF THE INVENTION

It is an object of the present invention to solve a problem concerning technology for improving performance in microfabrication a semiconductor element using actinic rays or radiations, in particular, ArF excimer laser light, and provide an actinic-ray-sensitive or radiation-sensitive resin composition which is capable of improving line edge roughness (LER) and inhibiting pattern collapse, a resist film and a pattern forming method each using the same, a method for preparing an electronic device, and an electronic device.

The present inventors have developed an actinic-ray-sensitive or radiation-sensitive resin composition, in which both of acid-decomposable groups and non-acid-decomposable groups are hydrophilized to hydrophilize a resin, and the line edge roughness and the pattern collapse are improved.

Specifically, the present invention is configured as follows.

[1] An actinic-ray-sensitive or radiation-sensitive resin composition containing:
  (A) a resin having repeating units having a structure represented by any one of the following general formulae (I-1) to (I-3), and repeating units containing at least one selected from the group consisting of a lactone structure, a sultone structure, and a cyano group, and
  (B) a compound that generates an acid by irradiation with actinic rays or radiations.

[Chem. 1]

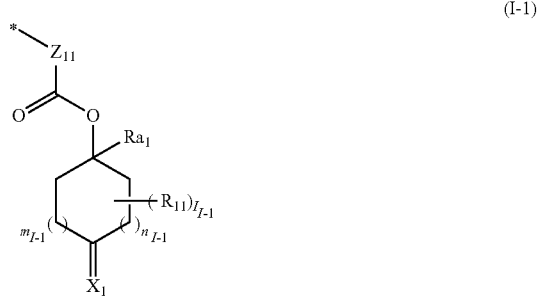

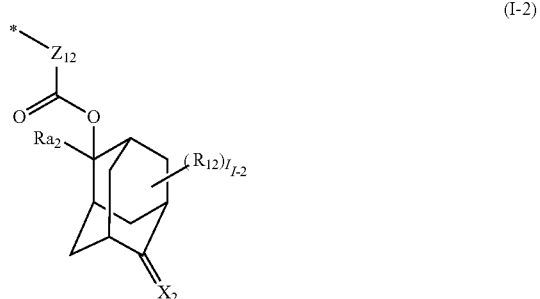

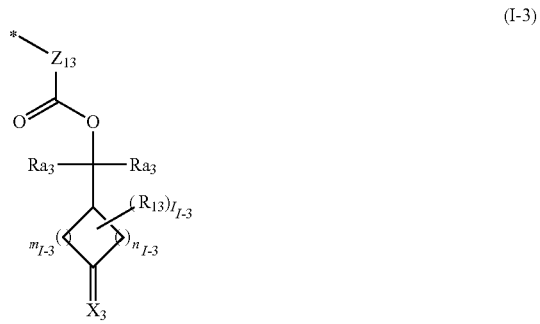

In the general formulae above,
  $R_{11}$, $R_{12}$, and $R_{13}$ each independently represent a monovalent organic group,
  when a plurality of $R_{11}$'s, $R_{12}$'s, or $R_{13}$'s are each present, the plurality of $R_{11}$'s, $R_{12}$'s, or $R_{13}$'s may be the same as or different from each other and may be linked to each other to form a ring,
  $Ra_1$, $Ra_2$, and $Ra_3$ each independently represent an alkyl group or a cycloalkyl group,
  $X_1$, $X_2$, and $X_3$ each independently represent an oxygen atom or a sulfur atom,
  $Z_{11}$, $Z_{12}$, and $Z_{13}$ each independently represent a single bond or a divalent linking group,
  * represents a moiety linked to a resin, $l_{I-1}$ represents an integer number of 0 to 12, $l_{I-2}$ represents an integer number of 0 to 10, and $l_{I-3}$ represents an integer number of 0 to 12, $m_{I-1}$ represents an integer number of 1 to 3 and $n_{I-1}$ represents an integer number of 1 to 3, provided that is equal $m_{I-1}+n_{I-1}$ to 2 to 4, and $m_{I-3}$ represents an integer number of 1 to 5 and $n_{I-3}$ represents an integer number of 1 to 5, provided that $m_{I-3}+n_{I-3}$ is equal to 3 to 6.

[2] The actinic-ray-sensitive or radiation-sensitive resin composition according to [1], wherein the repeating unit containing at least one selected from the group consisting of a lactone structure, a sultone structure, and a cyano group is represented by any one of the following general formulae (II-1) to (II-4).

[Chem. 2]

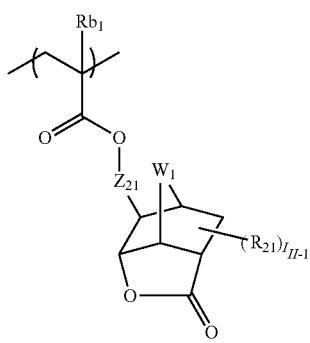

(II-1)

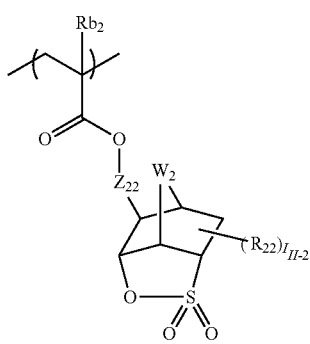

(II-2)

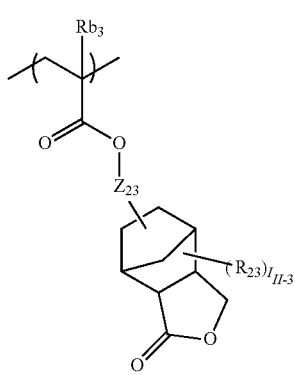

(II-3)

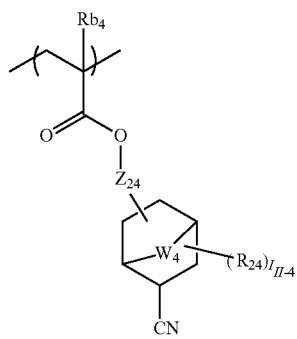

(II-4)

In the general formulae above, $R_{21}$, $R_{22}$, $R_{23}$, and $R_{24}$ each independently represent a monovalent organic group, $Rb_1$, $Rb_2$, $Rb_3$, and $Rb_4$ each independently represent a hydrogen atom or an alkyl group, $W_1$, $W_2$, and $W_4$ each independently represent an alkylene group or an oxygen atom, $Z_{21}$, $Z_{22}$, $Z_{23}$, and $Z_{24}$ each independently represent a single bond or a divalent linking group, $l_{II-1}$ represents an integer number of 0 to 8, $l_{II-2}$ represents an integer number of 0 to 8, $l_{II-3}$ represents an integer number of 0 to 9, and $l_{II-4}$ represents an integer number of 0 to 6.

[3] The actinic-ray-sensitive or radiation-sensitive resin composition according to [1] or [2], wherein the repeating unit having a structure represented by any one of the general formulae (I-1) to (I-3) is a (meth)acrylate-based repeating unit.

[4] The actinic-ray-sensitive or radiation-sensitive resin composition according to any one of [1] to [3], wherein the resin (A) contains at least repeating units having a structure represented by the general formula (I-1).

[5] The actinic-ray-sensitive or radiation-sensitive resin composition according to any one of [1] to [4], wherein the resin (A) further contains a group that decomposes by the action of an acid to generate an alkali-soluble group, in addition to a structure represented by any one of the general formulae (I-1) to (I-3).

[6] The actinic-ray-sensitive or radiation-sensitive resin composition according to any one of [1] to [5], further contains a hydrophobic resin (HR).

[7] The actinic-ray-sensitive or radiation-sensitive resin composition according to [6], wherein the hydrophobic resin (HR) is a hydrophobic resin having at least any one of a fluorine atom and a silicon atom.

[8] The actinic-ray-sensitive or radiation-sensitive resin composition according to [1], which contains an acid-decomposable resin, in addition to the resin (A).

[9] The actinic-ray-sensitive or radiation-sensitive resin composition according to [1], which contains two or more kinds of the compound (B).

[10] The actinic-ray-sensitive or radiation-sensitive resin composition according to [6], which contains the hydrophobic resin (HR) in a proportion of 0.1 to 10 mass % (based on the solid content).

[11] The actinic-ray-sensitive or radiation-sensitive resin composition according to [1], further contains a low-molecular-weight compound (D) having a nitrogen atom and a group that leaves by the action of an acid.

[12] The actinic-ray-sensitive or radiation-sensitive resin composition according to [1], further contains a basic compound that lowers basicity by irradiation with actinic rays or radiations or an ammonium salt compound.

[13] The actinic-ray-sensitive or radiation-sensitive resin composition according to [6], wherein the hydrophobic resin (HR) contains repeating units having an alkali-soluble group (x).

[14] The actinic-ray-sensitive or radiation-sensitive resin composition according to [6], wherein the hydrophobic resin (HR) contains repeating units having a group that decomposes by the action of an alkali developer to increase the solubility in the alkali developer (y).

[15] The actinic-ray-sensitive or radiation-sensitive resin composition according to [6], wherein the hydrophobic resin (HR) contains repeating units having a group that decomposes by the action of an acid to increase the solubility in an alkali developer (z).

[16] A resist film formed using the actinic-ray-sensitive or radiation-sensitive resin composition according to any one of [1] to [15].

[17] A pattern forming method including a step of exposing the resist film according to [16], and a step of developing the exposed resist film.

[18] The pattern forming method according to [17], wherein the exposure is a liquid immersion exposure.

[19] A method for preparing an electronic device, including the pattern forming method according to [17] or [18].

[20] An electronic device prepared by the method for preparing an electronic device according to [19].

The present invention is further configured as follows.

[21] The actinic-ray-sensitive or radiation-sensitive resin composition according to any one of [1] to [15], wherein the repeating unit having a structure represented by any one of the general formulae (I-1) to (I-3) is represented by any one of the following general formulae (I-1') to (I-3').

[Chem. 3]

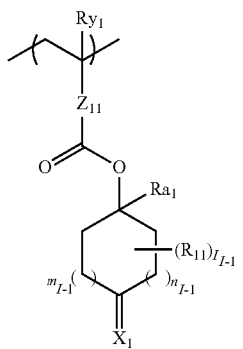

(I-1')

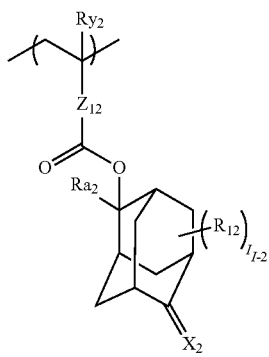

(I-2')

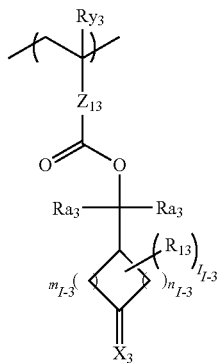

(I-3')

In the general formulae above, $Ry_1$, $Ry_2$, and $Ry_3$ each independently represent a hydrogen atom, a halogen atom or an alkyl group having 1 to 4 carbon atoms, $R_{11}$, $R_{12}$, $R_{13}$, $Ra_1$, $Ra_2$, $Ra_3$, $X_1$, $X_2$, $X_3$, $Z_{11}$, $Z_{12}$, $Z_{13}$, $l_{I-1}$, $l_{I-2}$, $l_{I-3}$, $m_{I-1}$, $n_{I-1}$, $m_{I-3}$, and $n_{I-3}$ have the same definitions as $R_{11}$, $R_{12}$, $R_{13}$, $Ra_1$, $Ra_2$, $Ra_3$, $X_1$, $X_2$, $X_3$, $Z_{11}$, $Z_{12}$, $Z_{13}$, $l_{I-1}$, $l_{I-2}$, $l_{I-3}$, $m_{I-1}$, $n_{I-1}$, $m_{I-3}$, and $n_{I-3}$ in the general formulae (I-1) to (I-3), and when a plurality of $R_{11}$'s, $R_{12}$'s, or $R_{13}$'s are each present, the plurality of $R_{11}$'s, $R_{12}$'s, or $R_{13}$'s may be the same as or different from each other and may be linked to each other to form a ring.

[22] The actinic-ray-sensitive or radiation-sensitive resin composition according to any one of [1] to [15] and [21], wherein the content of the repeating units having a structure represented by any one of the general formulae (I-1) to (I-3), when a plurality of kinds thereof are included, is from 5 to 70 mol % in total, based on all the repeating units in the resin (A).

[23] The actinic-ray-sensitive or radiation-sensitive resin composition according to any one of [1] to [15], [21], and [22], wherein the content of the repeating units containing at least one selected from the group consisting of a lactone structure, a sultone structure, and a cyano group, when a plurality of kinds thereof are included, is from 15 to 70 mol % in total, based on all the repeating units in the resin (A).

[24] The actinic-ray-sensitive or radiation-sensitive resin composition according to [5], wherein the total content of the repeating units having an acid-decomposable group other than a structure represented by any one of the general formulae (I-1) to (I-3) is from 5 to 60 mol % based on all the repeating units in the resin.

[25] The pattern forming method according to [17] or [18], wherein the exposure is exposure by an ArF excimer laser.

According to the present invention, it is possible to provide an actinic-ray-sensitive or radiation-sensitive resin composition which is capable of improving line edge roughness and inhibiting pattern collapse, a resist film and a pattern forming method each using the composition, a method for preparing an electronic device, and an electronic device.

DESCRIPTION OF THE PREFERRED EMBODIMENTS

In the description of a group (atomic group) in the present specification, when the group (atomic group) is described without specifying whether substituted or unsubstituted, the group includes both a group (atomic group) having no substituent and a group (atomic group) having a substituent. For example, the term "alkyl group" includes not only an alkyl group having no substituent (unsubstituted alkyl group) but also an alkyl group having a substituent (substituted alkyl group).

In the present invention, the term "actinic ray" or "radiation" refers to, for example, a bright line spectrum of a mercury lamp, a far ultraviolet ray typified by an excimer laser, an extreme-ultraviolet ray (EUV light), an X-ray, an electron beam (EB), or the like. Further, the light in the present invention means actinic rays or radiations.

Furthermore, unless otherwise specifically indicated, the term "exposure" in the present specification includes not only exposure to a mercury lamp, far ultraviolet rays typified by an excimer laser, X-rays, EUV light or the like but also drawing with a particle beam such as an electron beam and an ion beam.

The actinic-ray-sensitive or radiation-sensitive resin composition of the present invention contains:

(A) a resin having repeating units having a structure represented by any one of the following general formulae (I-1) to (I-3), and repeating units containing at least one selected from the group consisting of a lactone structure, a sultone structure, and a cyano group, and (B) a compound that generates an acid by irradiation with actinic rays or radiations.

[Chem. 4]

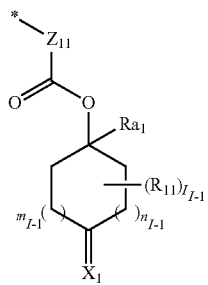

(I-1)

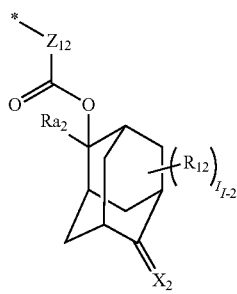

(I-2)

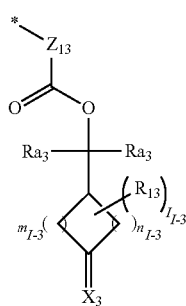

(I-3)

In the general formulae above,
$R_{11}$, $R_{12}$, and $R_{13}$ each independently represent a monovalent organic group, when a plurality of $R_{11}$'s, $R_{12}$'s, or $R_{13}$'s are each present, the plurality of $R_{11}$'s, $R_{12}$'s, or $R_{13}$'s may be the same as or different from each other and may be linked to each other to form a ring, $Ra_1$, $Ra_2$, and $Ra_3$ each independently represent an alkyl group or a cycloalkyl group, $X_1$, $X_2$, and $X_3$ each independently represent an oxygen atom or a sulfur atom, $Z_{11}$, $Z_{12}$, and $Z_{13}$ each independently represent a single bond or a divalent linking group,

* represents a moiety linked to a resin, $l_{I-1}$ represents an integer number of 0 to 12, $l_{I-2}$ represents an integer number of 0 to 10, and $l_{I-3}$ represents an integer number of 0 to 12, $m_{I-1}$ represents an integer number of 1 to 3 and $n_{I-1}$ represents an integer number of 1 to 3, provided that $m_{I-1}+n_{I-1}$ is equal to 2 to 4, and $m_{I-3}$ represents an integer number of 1 to 5 and $n_{I-3}$ represents an integer number of 1 to 5, provided that $m_{I-3}+n_{I-3}$ is equal to 3 to 6.

Although the reason why the actinic-ray-sensitive or radiation-sensitive resin composition of the present invention which contains (A) a resin having repeating units having a structure represented by any one of the following general formulae (I-1) to (I-3), and repeating units containing at least one selected from the group consisting of a lactone structure, a sultone structure, and a cyano group is capable of improving line edge roughness and inhibiting pattern collapse is not clear, but is presumed to be as follows.

It is presumed that when the group that leaves by the action of an acid is allowed to have a specific structure represented by any one of the general formulae (I-1) to (I-3) having a hydrophilic carbonyl group or a thiocarbonyl group, the resin (A) become more hydrophilic, and thus can reduce the leaving rate required for a group capable of inhibiting by the action of an acid, and improve the effect on the line width by unevenness in a leaving reaction, thereby improving LER. It is also thought that when a specific structure represented by any one of the general formulae (I-1) to (I-3) is given, the carbonyl group or thiocarbonyl group having an electron-withdrawing property can be suitably left from the leaving reaction, and the reduction in the sensitivity due to the electron-withdrawing property can be inhibited. In addition, it is presumed that when the resin (A) contains repeating unites containing a specific hydrophobic group of a lactone structure, a sultone structure, or a cyano group in combination with a structure of any of the general formulae (I-1) to (I-3), the pattern collapse is inhibited.

[1] The (A) Resin Having Repeating Units Having a Structure Represented by any One of the Following General Formulae (I-1) to (I-3), and Repeating Units Containing at Least One Selected from the Group Consisting of a Lactone Structure, a Sultone Structure and a Cyano Structure (which Will be Also be Hereinafter Simply Referred to as a "Resin (A)")

In the present invention, the repeating unit having a structure represented by any one of the general formulae (I-1) to (I-3) is a repeating unit that decomposes by the action of an acid to generate an alkali-soluble group (which will also be hereinafter referred to as an "acid-decomposable group"), and the structure represented by any one of the general formulae (I-1) to (I-3) is an acid-decomposable group that generates a carboxyl group as an alkali-soluble group.

Accordingly, the resin (A) functions as a resin that increases the solubility in an alkaline developer by the action of an acid (which will also be hereinafter referred to as an "acid-decomposable resin").

The resin (A) is preferably insoluble or sparingly soluble in an alkaline developer.

The resin (A) preferably has a structure represented by any one of the general formulae (I-1) to (I-3) in a main chain or a side chain, or both of the main chain and the side chain, of a resin.

The actinic-ray-sensitive or radiation-sensitive resin composition of the present invention contains a resin having repeating units represented by the following general formulae (I-1) to (I-3) (which will also be hereinafter referred to as an "acid-decomposable resin").

The repeating units having a structure represented by any one of the general formulae (I-1) to (I-3) will be described below.

The monovalent organic group as $R_{11}$, $R_{12}$, and $R_{13}$ is preferably a linear or branched alkyl group having 1 to 10 carbon atoms, a cycloalkyl group having 3 to 10 carbon atoms, or an alkoxy group having 1 to 10 carbon atoms.

Examples of the linear or branched alkyl group having 1 to 10 carbon atoms for $R_{11}$, $R_{12}$, and $R_{13}$ include a methyl group, an ethyl group, an n-propyl group, an isopropyl group, an n-butyl group, an isobutyl group, and a t-butyl group.

Examples of the cycloalkyl group having 3 to 10 carbon atoms for $R_{11}$, $R_{12}$, and $R_{13}$ include a cyclopentyl group and a cyclohexyl group.

The alkoxy group having 1 to 10 carbon atoms as $R_{11}$, $R_{12}$, and $R_{13}$ may be any of a linear one and a branched one, and examples thereof include a methoxy group, an ethoxy group, a linear or branched propoxy group, a linear or branched butoxy group, and a linear or branched pentoxy group.

The alkyl group as $Ra_1$, $Ra_2$, and $Ra_3$ may have a substituent, and is preferably a linear or branched alkyl group having 1 to 10 carbon atoms, and more preferably one having 1 to 6 carbon atoms. Examples thereof include a methyl group, an ethyl group, a propyl group, a butyl group, and an isopropyl group.

The cycloalkyl group as $Ra_1$, $Ra_2$, and $Ra_3$ is preferably a cycloalkyl group having 3 to 10 carbon atoms, and more preferably a cyclopentyl group, a cyclohexyl group, or the like.

$X_1$, $X_2$, and $X_3$ are preferably an oxygen atom.

The linking group as $Z_{11}$, $Z_{12}$, and $Z_{13}$ is preferably an alkylene group, a cycloalkylene group, an oxygen atom, a carbonyl group, or a combination thereof, and more preferably an alkylene group, or a combination of an alkylene group, an oxygen atom, and a carbonyl group.

$l_{I-1}$, $l_{I-2}$, and $l_{I-3}$ are preferably an integer number of 0 to 3, more preferably an integer number of 0 to 2, and still more preferably 0 or 1.

From the viewpoint of inhibiting the reduction in the sensitivity by placing a carbon atom between a carbon atom to which $Ra_1$ and an oxygen atom are bonded and $C=X_1$ capable of functioning as an electron-withdrawing group in the general formula (I-1), $m_{I-1}$ is preferably 1 or 2, and $n_{I-1}$ is preferably 1 or 2.

From the viewpoint of inhibiting the reduction in the sensitivity by placing a carbon atom between a carbon atom to which two $Ra_3$'s and an oxygen atom are bonded and $C=X_3$ capable of functioning as an electron-withdrawing group in the general formula (I-2), $m_{I-3}$ is preferably an integer number of 1 to 4, and more preferably an integer number of 1 to 3.

Similarly, $n_{I-3}$ is preferably an integer number of 1 to 4, and more preferably an integer number of 1 to 3.

The repeating units having a structure represented by any one of the general formulae (I-1) to (I-3) preferably constitute (meth)acrylate-based repeating units by linking to a resin through *. As an embodiment of the (meth)acrylate-based repeating units, for example, a repeating unit represented by any one of the following general formulae (I-1') to (I-3') is preferred.

[Chem. 5]

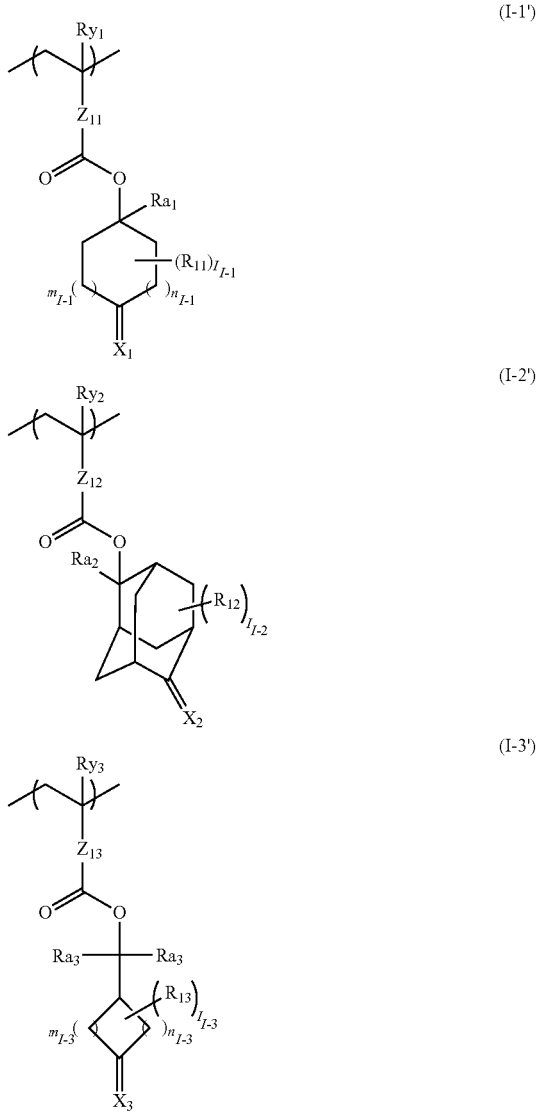

In the general formulae above, $Ry_1$, $Ry_2$, and $Ry_3$ each independently represent a hydrogen atom, a halogen atom, or an alkyl group having 1 to 4 carbon atoms. Preferred examples of the substituent that the alkyl group of $Ry_1$, $Ry_2$, and $Ry_3$ may have include a hydroxyl group and a halogen atom. Examples of the halogen atom of $Ry_1$, $Ry_2$, and $Ry_3$ include a fluorine atom, a chlorine atom, a bromine atom, and an iodine atom. $Ry_1$, $Ry_2$, and $Ry_3$ are each preferably a hydrogen atom, a methyl group, a hydroxymethyl group or a trifluoromethyl group, and particularly preferably a hydrogen atom or a methyl group, $R_{11}$, $R_{12}$, $R_{13}$, $Ra_1$, $Ra_2$, $Ra_3$, $X_1$, $X_2$, $X_3$, $Z_{11}$, $Z_{12}$, $Z_{13}$, $l_{I-1}$, $l_{I-2}$, $l_{I-3}$, $m_{I-1}$, $n_{I-1}$, $m_{I-3}$, and $n_{I-3}$ have the same definitions as $R_{11}$, $R_{12}$, $R_{13}$, $Ra_1$, $Ra_2$, $Ra_3$, $X_1$, $X_2$, $X_3$, $Z_{11}$, $Z_{12}$, $Z_{13}$, $l_{I-1}$, $l_{I-2}$, $l_{I-3}$, $m_{I-1}$, $n_{I-1}$, $m_{I-3}$, and $n_{I-3}$ in the general formulae (I-1) to (I-3), and when a plurality of $R_{11}$'s, $R_{12}$'s, or $R_{13}$'s are each present, the plurality of $R_{11}$'s, $R_{12}$'s, or $R_{13}$'s may be the same as or different from each other and may be linked to each other to form a ring.

The content of the repeating units having a structure represented by any one of the general formulae (I-1) to (I-3), when a plurality of kinds thereof are included, is preferably from 5 to 70 mol % in total, based on all the repeating units in the resin (A), more preferably from 8 to 60 mol %, and still more preferably from 10 to 50 mol %.

Specific examples of the repeating units having the structures represented by the general formulae (I-1) to (I-3) are shown below, but the present invention is not limited thereto.

[Chem. 6]

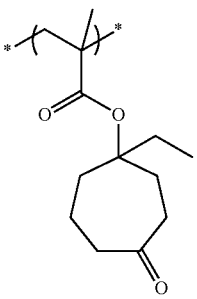
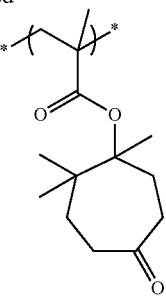

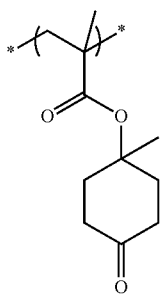
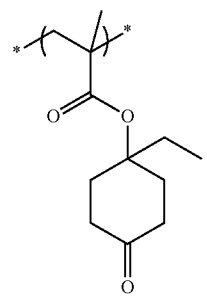

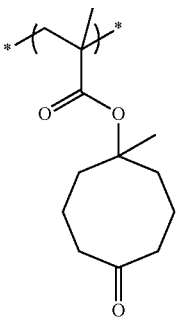
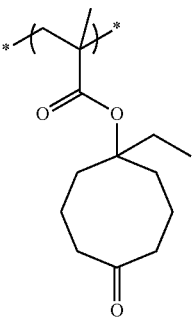

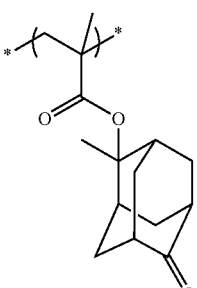
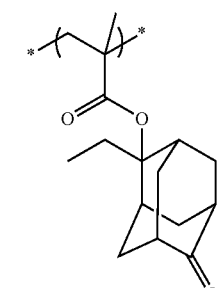

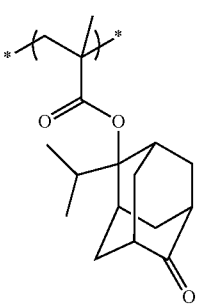
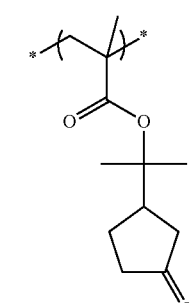

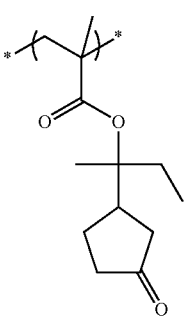
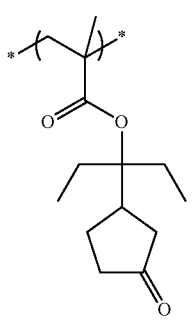

-continued
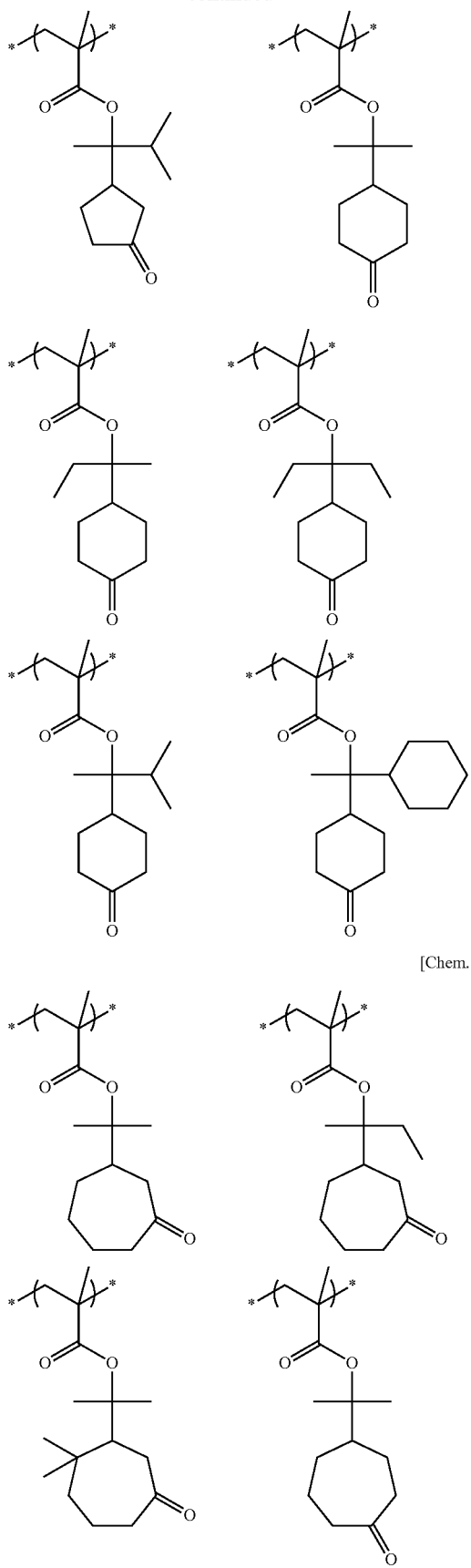
[Chem. 7]
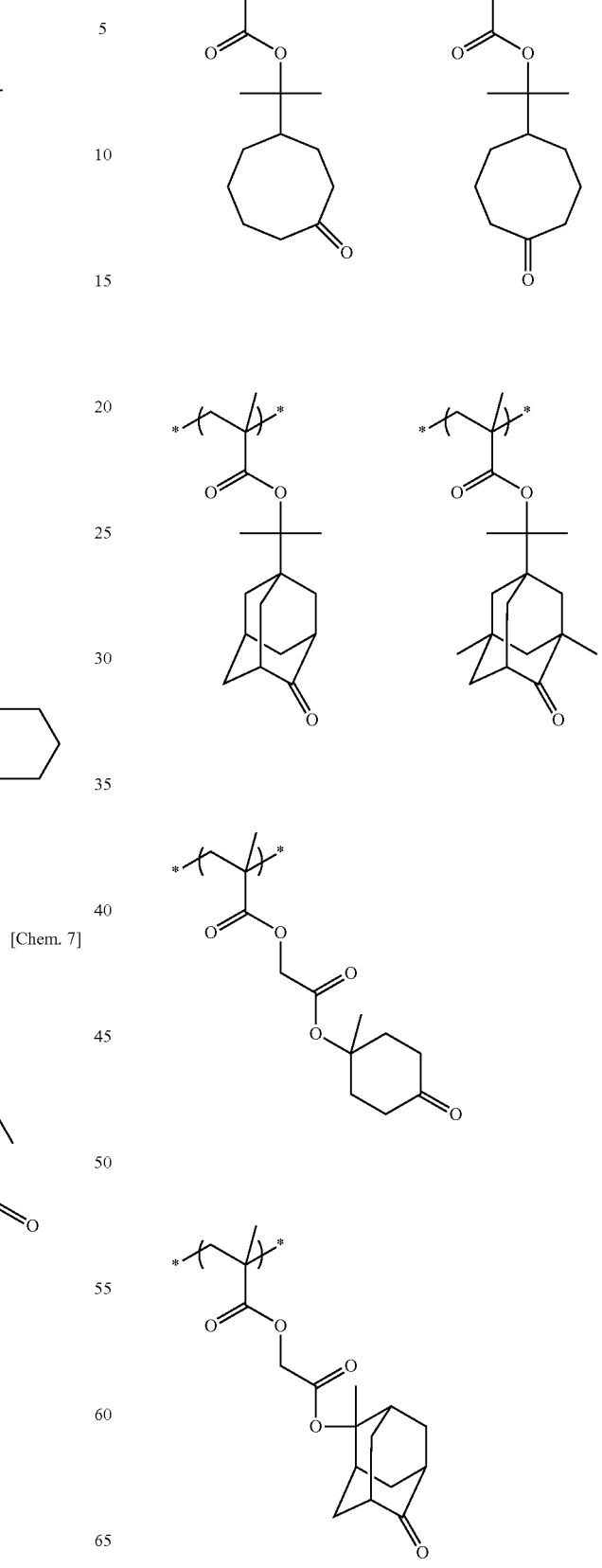

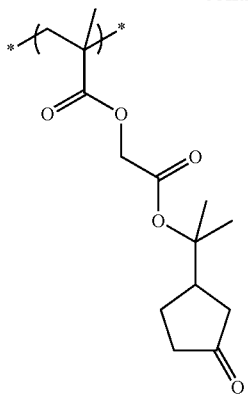
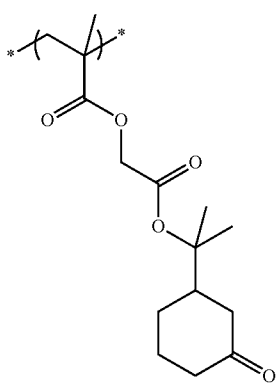
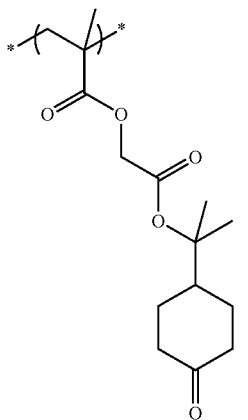
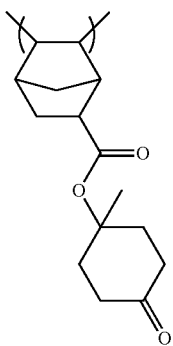
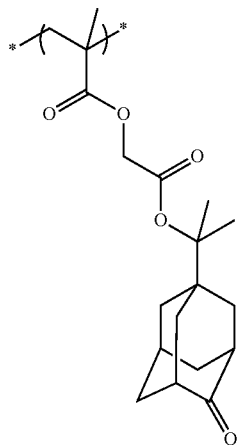
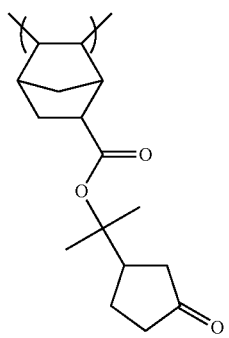
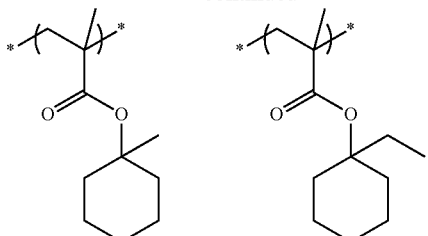
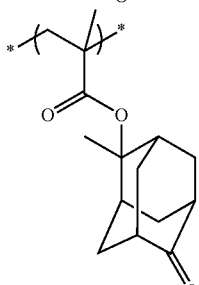
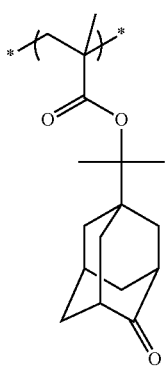

The resin (A) may contain repeating units having at least one selected from the group consisting of a lactone structure, a sultone structure (cyclic sulfonic acid ester structure), and a cyano group.

First, the repeating units having a lactone structure and the repeating units having a sultone structure will be described.

As the lactone structure or sultone structure, a 5- to 7-membered ring lactone structure or sultone structure is preferred, and a structure where another ring structure is condensed to a 5- to 7-membered ring lactone structure or sultone structure in the form of forming a bicyclo or spiro structure is more preferred. The possession of the repeating units having a lactone structure or sultone structure represented by any one of the following formulae (LC1-1) to (LC1-17), (SL1-1), and (SL1-2) is more preferred. The lactone structure may be bonded directly to the main chain. The lactone structure or sultone structure is preferably (LC1-1), (LC1-4), (LC1-5), and (LC1-8), and more preferably (LC1-4). By using these specified lactone structures or sultone structures, inhibition of pattern collapse, LER, or the like is improved.

[Chem. 8]
LC1-1 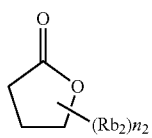
LC1-2 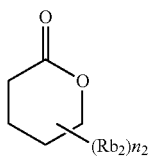
LC1-3 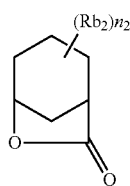
LC1-4 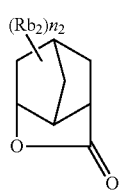
LC1-5 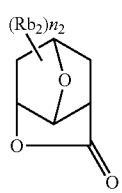
LC1-6 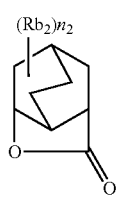
LC1-7 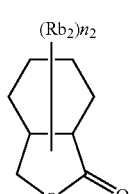
LC1-8 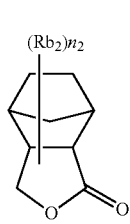
LC1-9 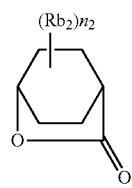
LC1-10 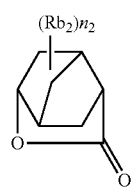
LC1-11 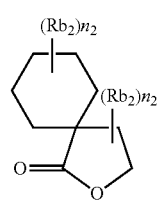
LC1-12 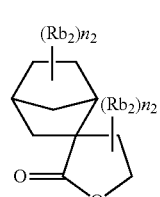
LC1-13 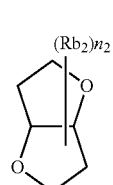
LC1-14 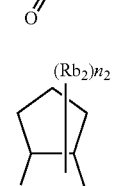
LC1-15 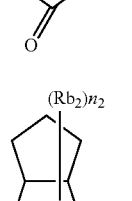
LC1-16 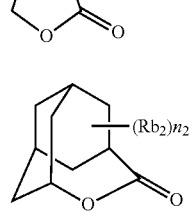

-continued

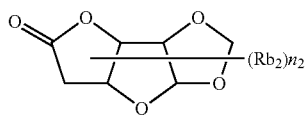
LC1-17

[Chem. 9]

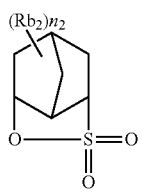
SL1-1

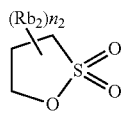
SL1-2

The presence of a substituent ($Rb_2$) on the portion of the lactone structure or sultone structure is optional. Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group, and an acid-decomposable group are more preferred. $n_2$ represents an integer of 0 to 4. When $n_2$ is 2 or more, the plurality of present substituents ($Rb_2$) may be the same as or different from each other, and further, the plurality of present substituents ($Rb_2$) may be bonded to each other to form a ring.

In one embodiment, the resin (A) preferably contains repeating units represented by the following general formula (AII') as the repeating units having a lactone structure or sultone structure.

[Chem. 10]

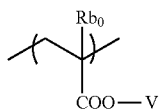
(AII')

In the general formula (AII'), $Rb_0$ represents a hydrogen atom, a halogen atom, or an alkyl group having 1 to 4 carbon atoms. Preferred examples of the substituent that the alkyl group of $Rb_0$ may have include a hydroxyl group and a halogen atom. Examples of the halogen atom of $Rb_0$ include a fluorine atom, a chlorine atom, a bromine atom and an iodine atom. $Rb_0$ is preferably a hydrogen atom, a methyl group, a hydroxymethyl group, or a trifluoromethyl group, and particularly preferably a hydrogen atom or a methyl group, and V represents a monovalent organic group having a lactone structure or sultone structure, and preferably a group having a structure represented by any one of the general formulae (LC1-1) to (LC1-17), (SL1-1), and (SL1-2) as shown above.

Specific examples of the repeating unit having a sultone structure represented by the general formula (AII') are shown below, but the present invention is not limited thereto.

[Chem. 11]

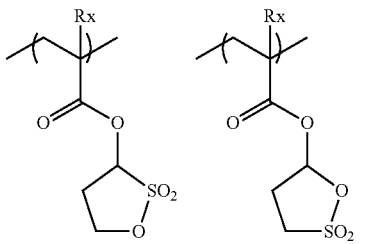

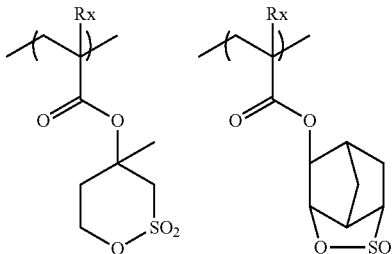

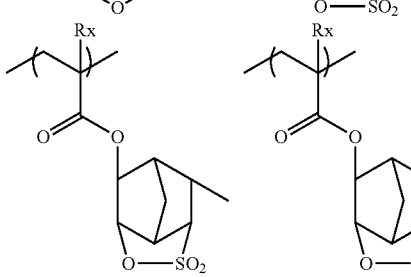

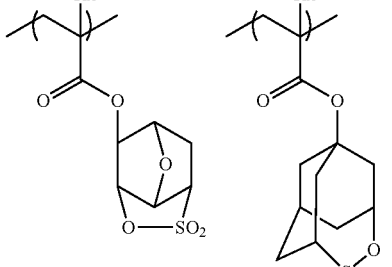

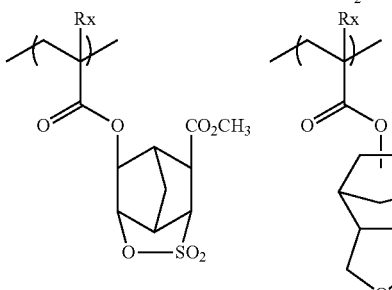

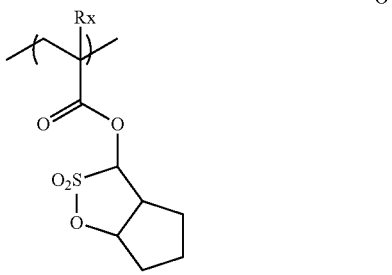

(wherein Rx represents H, $CH_3$, $CH_2OH$, or $CF_3$).

Specific examples of the repeating unit having a lactone group represented by the general formula (AII') are shown below, but the present invention is not limited thereto.
In the following formula, Me represents a methyl group.
[Chem. 12]
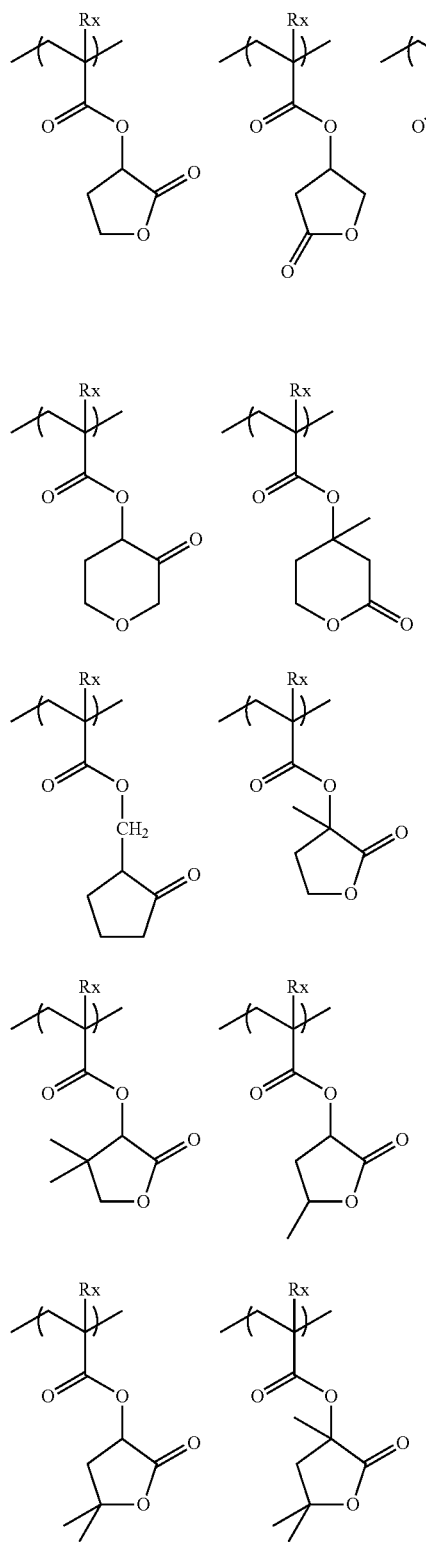
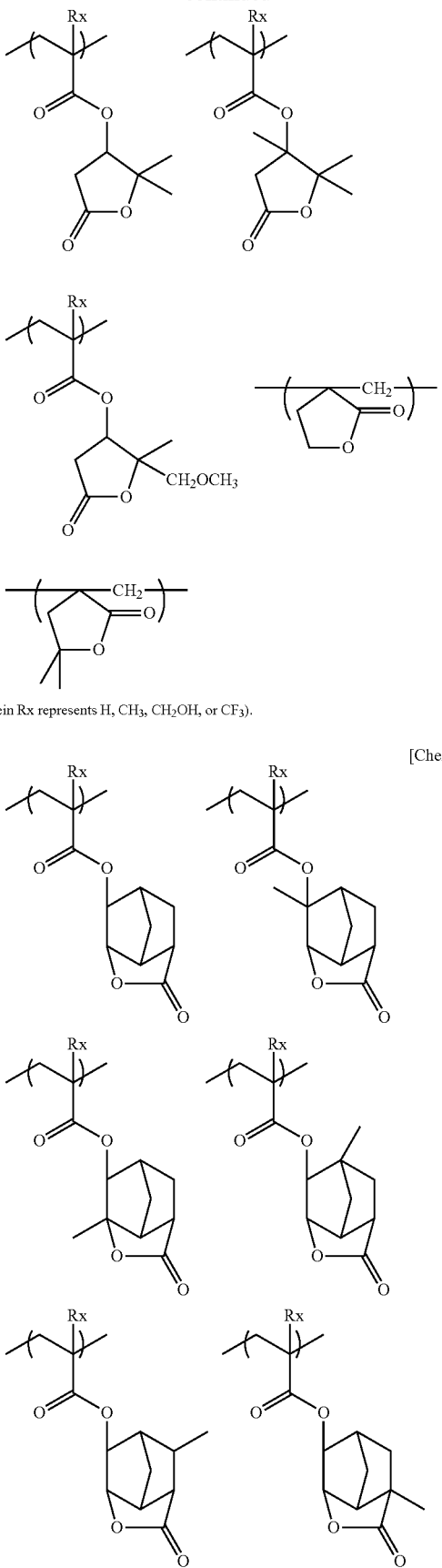
(wherein Rx represents H, CH$_3$, CH$_2$OH, or CF$_3$).
[Chem. 13]

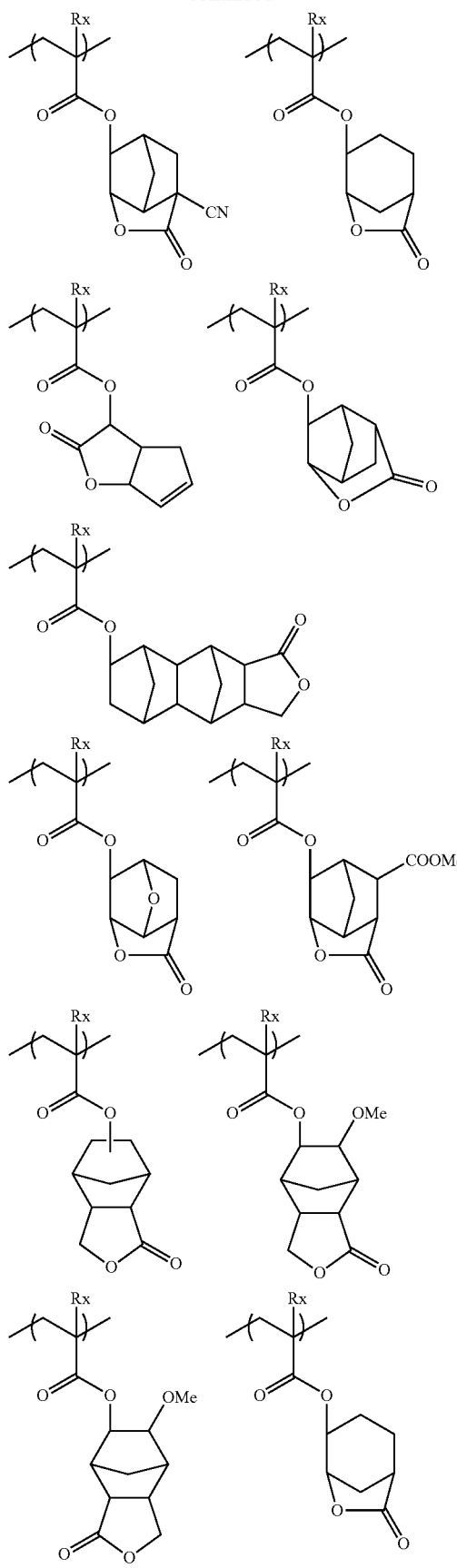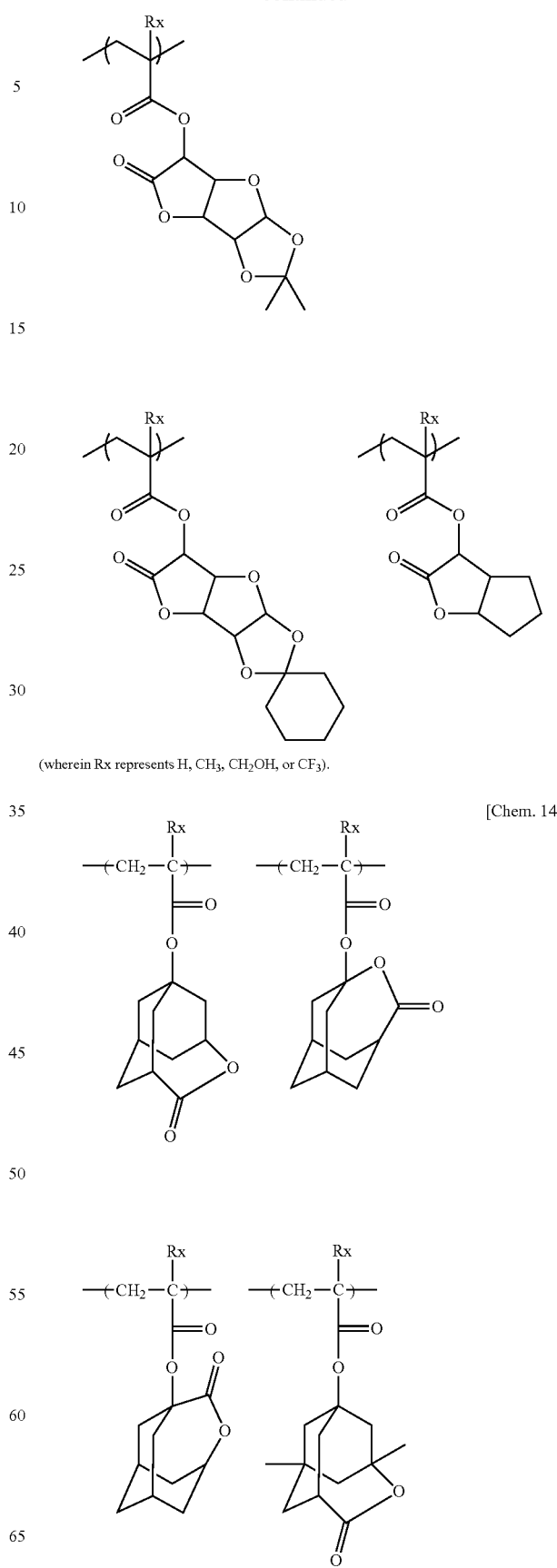
(wherein Rx represents H, CH₃, CH₂OH, or CF₃).
[Chem. 14]

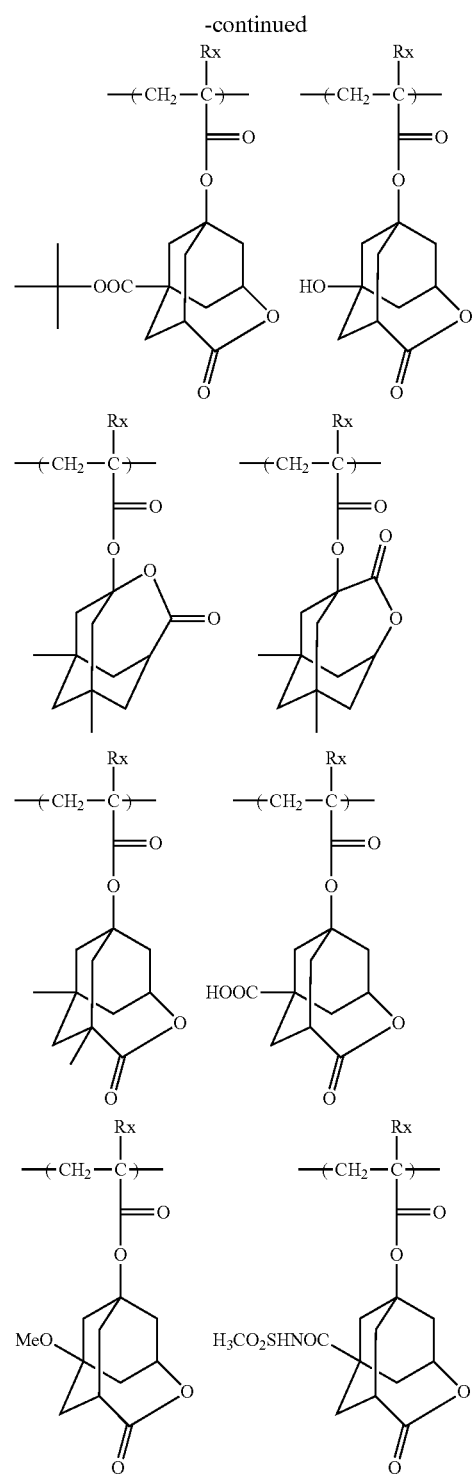

(wherein Rx represents H, CH₃, CH₂OH, or CF₃).

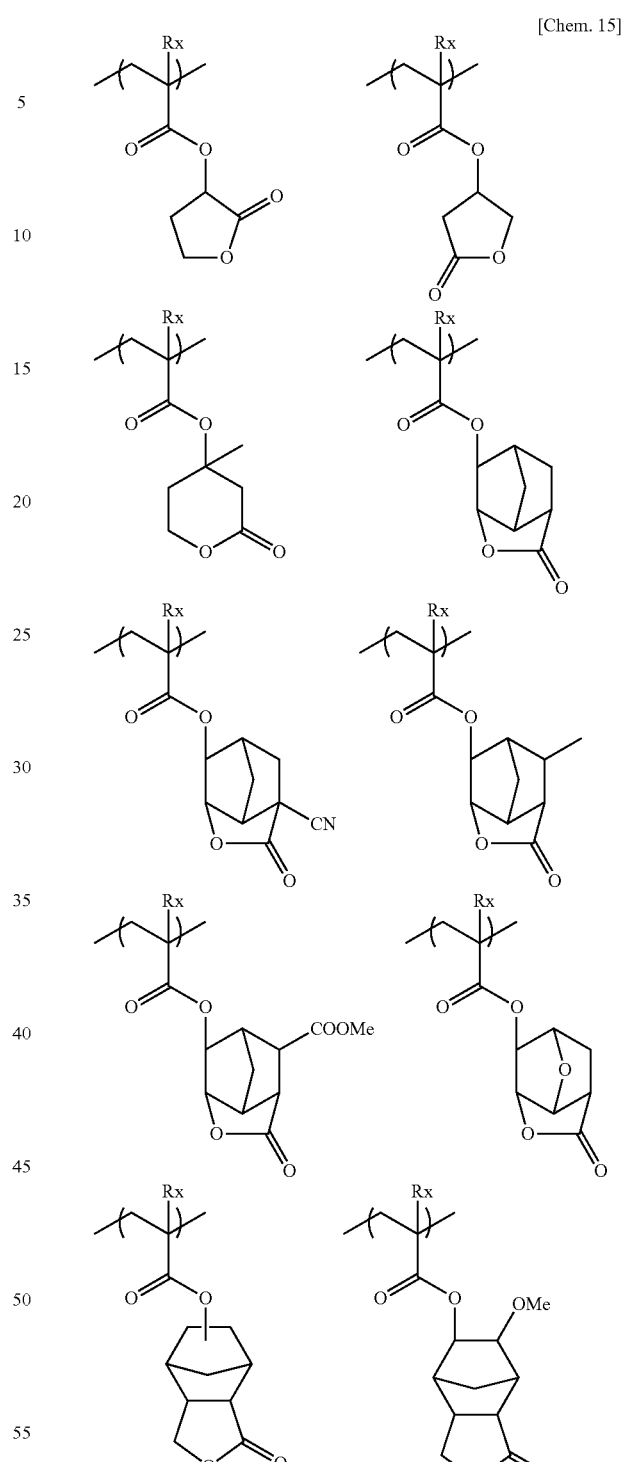

(wherein Rx represents H, CH₃, CH₂OH, or CF₃).

Particularly preferred examples of the repeating unit having a lactone group represented by the general formula (AII') include the following repeating units. By selecting an optimal lactone group, the pattern profile such as inhibition of pattern collapse, LER, and iso/dense bias are improved.

In another embodiment, the resin (A) preferably contains repeating units represented by the following general formula (III) as the repeating units having a lactone structure or sultone structure.

[Chem. 16]

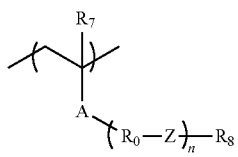
(III)

In the formula (III),

A represents an ester bond (a group represented by —COO—) or an amide bond (a group represented by —CONH—).

In the case where a plurality of $R_0$'s are present, they each independently represent an alkylene group, a cycloalkylene group, or a combination thereof.

In the case where a plurality of Z's are present, they each independently represent an ether bond, an ester bond, an amide bond, a urethane bond

[Chem. 17]

(a group represented by 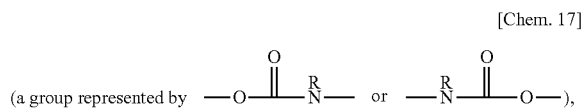), or a urea bond

[Chem. 17]

(a group represented by 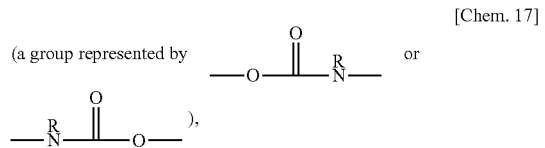),

Here, R represents a hydrogen atom, an alkyl group, a cycloalkyl group, or an aryl group.

$R_8$ represents a monovalent organic group having a lactone structure or a sultone structure.

n is the number of repetitions of the structure represented by —$R_0$—Z— and represents an integer of 1 to 5, and preferably 1.

$R_7$ represents a hydrogen atom, a halogen atom, or an alkyl group.

The alkylene group or the cycloalkylene group of $R_0$ may have a substituent.

Z is preferably an ether bond or an ester bond, and particularly preferably an ester bond.

The alkyl group of $R_7$ is preferably an alkyl group having 1 to 4 carbon atoms, more preferably a methyl group or an ethyl group, and particularly preferably a methyl group. The alkylene group and the cycloalkylene group of $R_0$, and the alkyl group in $R_7$ may be substituted, and examples of the substituent include halogen atoms such as a fluorine atom, a chlorine atom, and a bromine atom; a mercapto group; a hydroxyl group; an alkoxy group such as a methoxy group, an ethoxy group, an isopropoxy group, a t-butoxy group, and a benzyloxy group; an acyl group such as an acetyl group and a propionyl group; and an acetoxy group. $R_7$ is preferably a hydrogen atom, a methyl group, a trifluoromethyl group, or a hydroxymethyl group.

A straight-chain alkylene group in $R_0$ is preferably a chain alkylene group having 1 to 10 carbon atoms, and more preferably having 1 to 5 carbon atoms, and examples thereof include a methylene group, an ethylene group, and a propylene group. The cycloalkylene is preferably cycloalkylene having 3 to 20 carbon atoms, and examples thereof include cyclohexylene, cyclopentylene, norbornylene, and adamantylene. The chain alkylene groups are preferred from the viewpoint of the exertion of the effect of the present invention, and a methylene group is particularly preferred.

The substituent having a lactone structure or sultone structure represented by $R_8$ is not limited as long as it has a lactone structure. Specific examples thereof include the lactone structures of the general formulae (LC1-1) to (LC1-17), (SL1-1), and (SL1-2) as described above, and among these, the structures represented by the general formula (LC1-4) are most preferred. Further, in (LC1-1) to (LC1-17), (SL1-1), and (SL1-2), $n_2$ is more preferably 2 or less.

Further, $R_8$ is preferably a monovalent organic group having an unsubstituted lactone structure or sultone structure or a monovalent organic group having a lactone structure or sultone structure containing a methyl group, a cyano group or an alkoxycarbonyl group as the substituent, and more preferably a monovalent organic group having a lactone structure containing a cyano group as the substituent (cyanolactone) or a sultone structure containing a cyano group as the substituent (cyanosultone).

Specific examples of the repeating units containing a group having a lactone structure or sultone structure represented by the general formula (III) are shown below, but the present invention is not limited thereto.

In the specific examples, R represents a hydrogen atom, an alkyl group which may have a substituent, or a halogen atom, and preferably a hydrogen atom, a methyl group, a hydroxymethyl group, or an acetyloxymethyl group.

[Chem. 19]

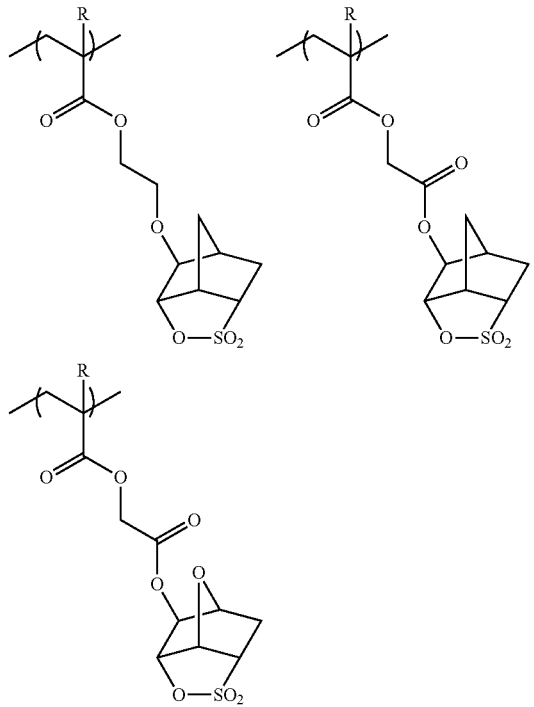

-continued
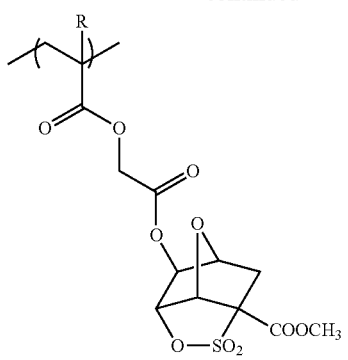
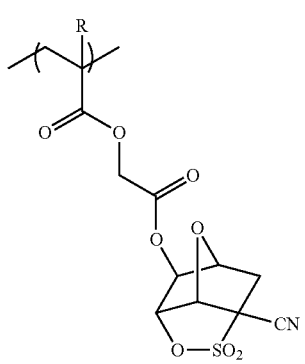
[Chem. 20]
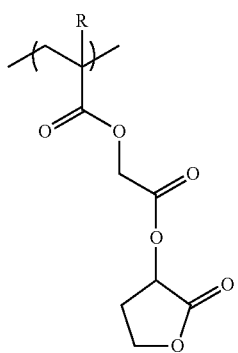 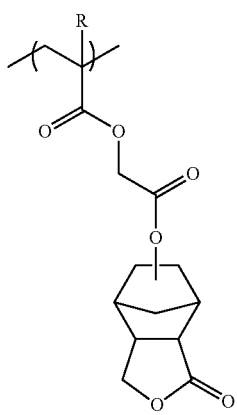
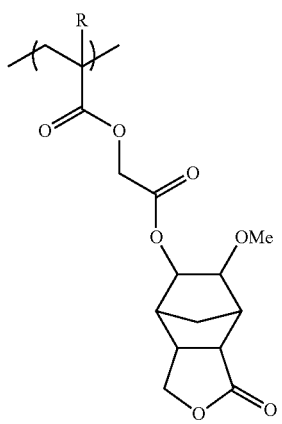
-continued
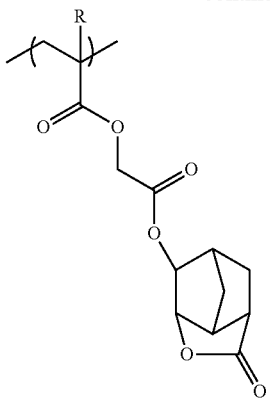
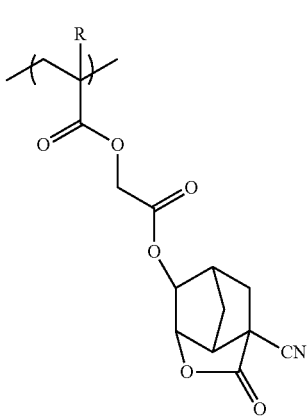
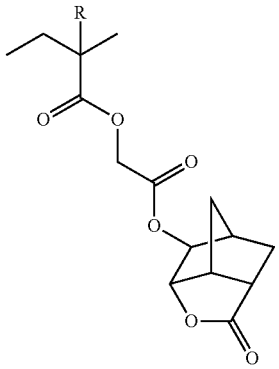
[Chem. 21]
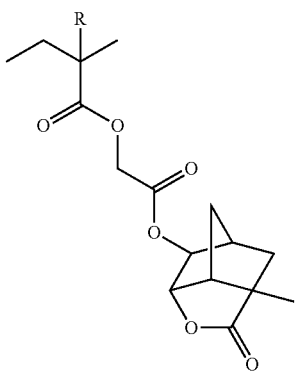

-continued
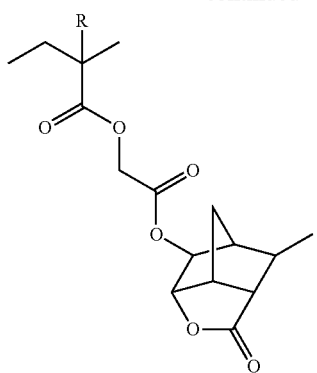
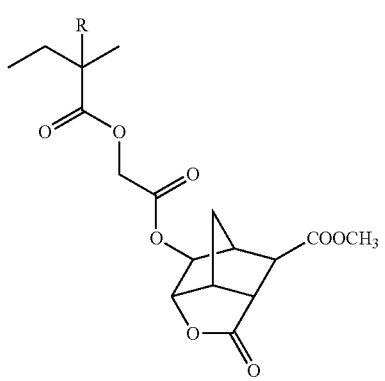
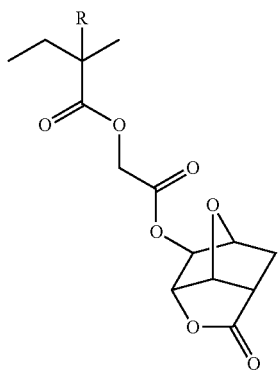
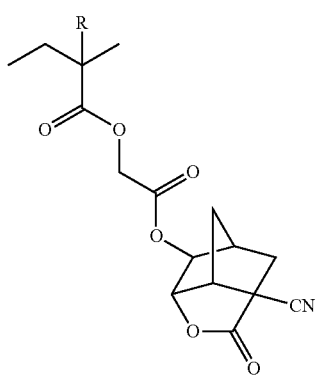
-continued
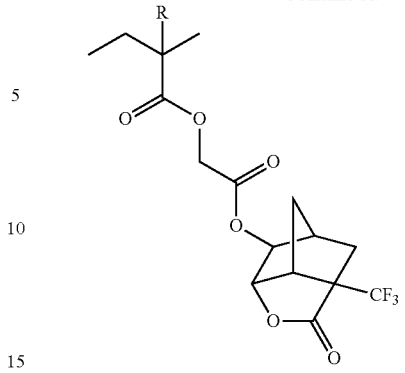
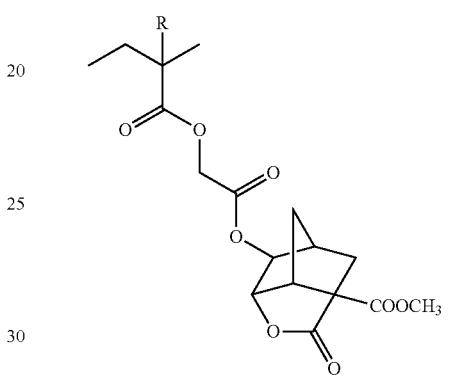
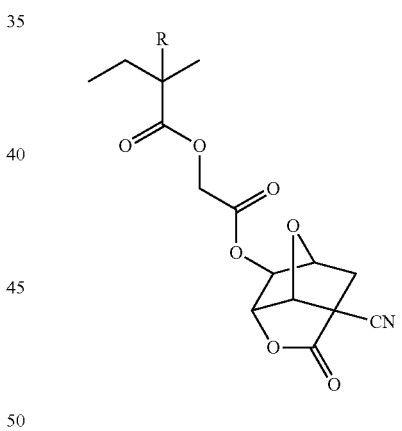
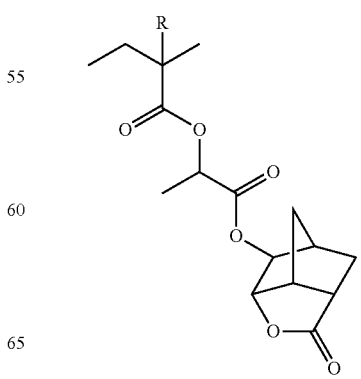

33
-continued
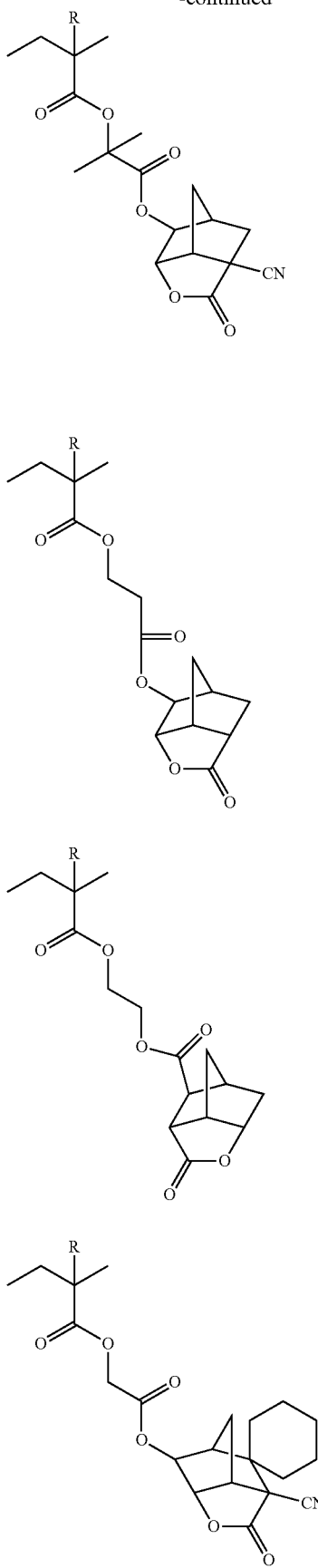
34
-continued
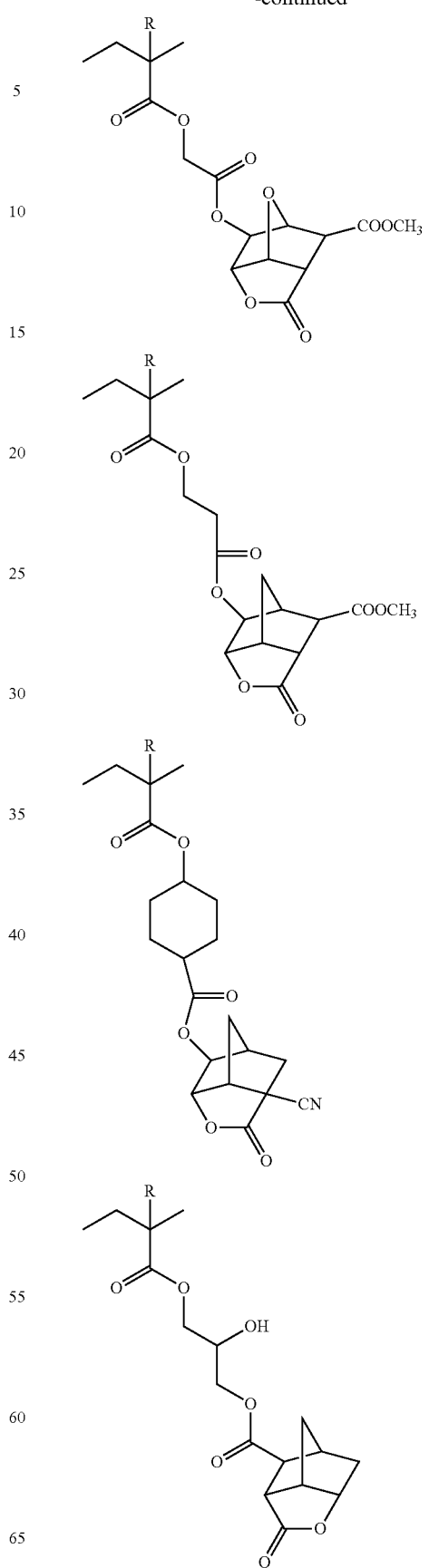

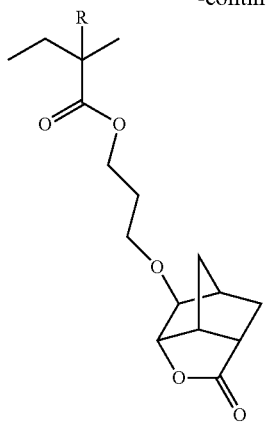

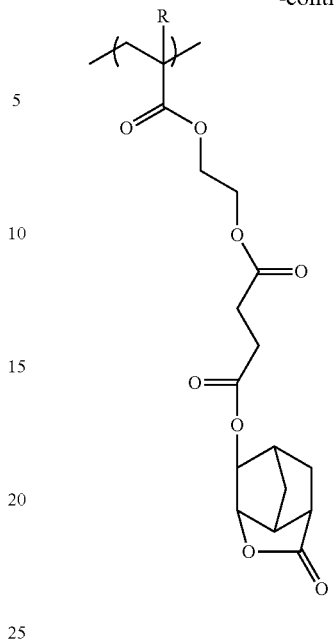

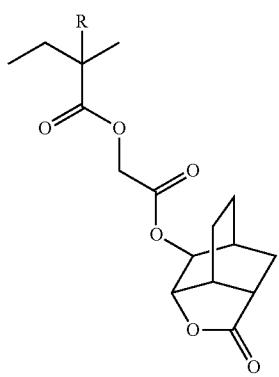

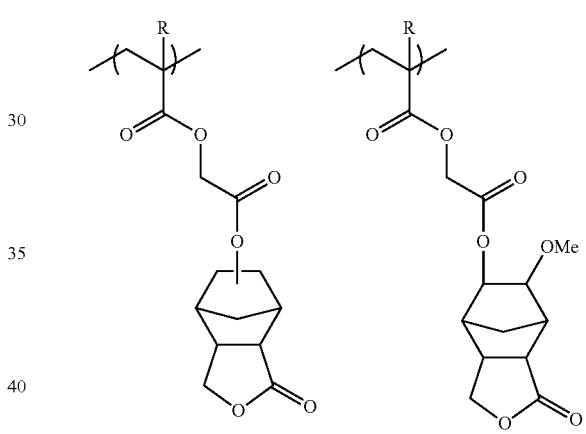

[Chem. 22]

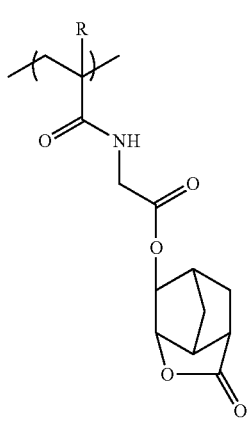

The repeating units having a lactone group or sultone group usually have an optical isomer, but any optical isomer may be used. One optical isomer may be used alone or a mixture of a plurality of optical isomers may be used. In the case of mainly using one optical isomer, the optical purity (ee) thereof is preferably 90% or more, and more preferably 95% or more.

Two or more kinds of the repeating units having a lactone group or sultone group may also be used in combination for increasing the effects of the present invention. In the case of a combination use, it is preferable that two or more kinds of the repeating units having a lactone group or sultone group selected from the general formula (III) be used in combination, and it is particularly preferable that lactone or sultone repeating units where n is 1 be selected and used in combination in the general formula (III).

Next, the repeating units containing a cyano group will be described.

The repeating units containing a cyano group are the same as the repeating units having a lactone structure or sultone structure, and contribute to improvement of LER and inhibition of pattern collapse.

The repeating units containing a cyano group are preferably repeating units having an alicyclic hydrocarbon structure substituted with a cyano group. As for the alicyclic hydrocarbon structure, an adamantyl group, a diamantyl group, and a norborane group are preferred. In the formulae, Ra represents a hydrogen atom or an alkyl group (preferably an alkyl group having 1 to 4 carbon atoms). The alkyl group may have a substituent and examples of the substituent include a hydroxyl group and a halogen atom. Examples of the halogen atom of Ra include a fluorine atom, a chlorine atom, a bromine atom, and an iodine atom. Ra is preferably a hydrogen atom, a methyl group, a hydroxymethyl group, or a trifluoromethyl group, and particularly preferably a hydrogen atom or a methyl group.

[Chem. 23]

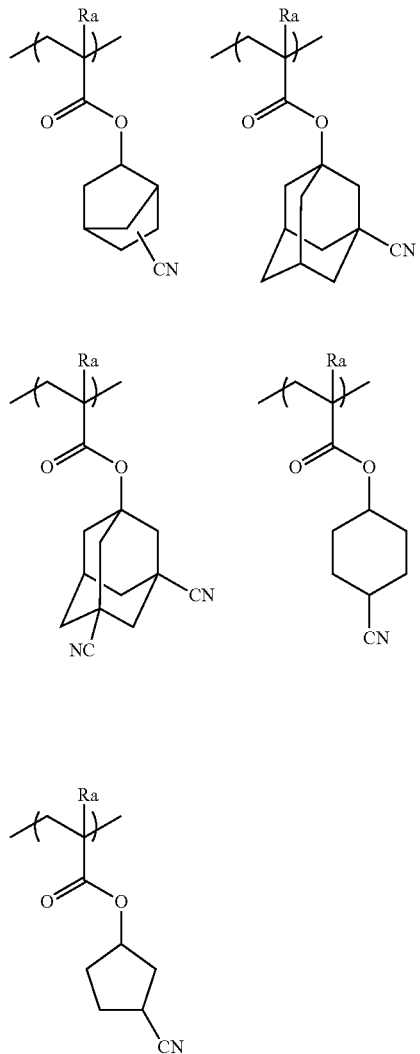

In the present invention, the repeating units having at least any one of a lactone structure, a sultone structure, and a cyano group as described above are preferably represented by any one of the following general formulae (II-1) to (II-4).

[Chem. 24]

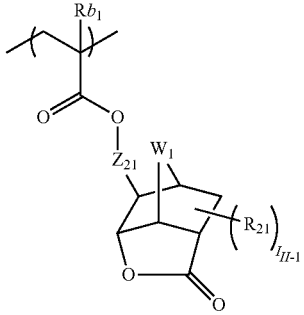

(II-1)

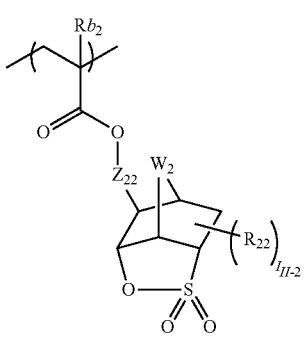

(II-2)

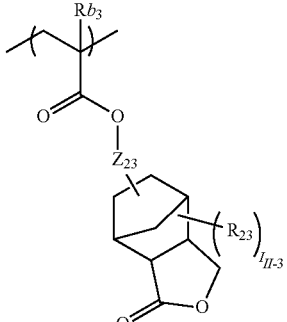

(II-3)

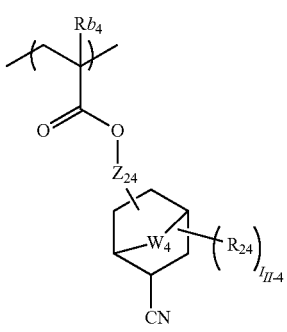

(II-4)

In the general formulae (II-1) to (II-4), $R_{21}$, $R_{22}$, $R_{23}$, and $R_{24}$ each independently represent a monovalent organic group, $Rb_1$, $Rb_2$, $Rb_3$, and $Rb_4$ each independently represent a hydrogen atom or an alkyl group, $W_1$, $W_2$, and $W_4$ each independently represent an alkylene group or an oxygen atom, $Z_{21}$, $Z_{22}$, $Z_{23}$, and $Z_{24}$ each independently represent a single bond or a divalent linking group, $l_{II\text{-}1}$ represents an integer number of 0 to 8, $l_{II\text{-}2}$ represents an integer number of 0 to 8, $l_{II-3}$ represents an integer number of 0 to 9, and
$l_{114}$ represents an integer number of 0 to 6.

The monovalent organic group for $R_{21}$, $R_{22}$, $R_{23}$, and $R_{24}$ represents an alkyl group, a cycloalkyl group, an alkoxycarbonyl group, a cyano group, a hydroxyl group, or alkoxy group, and when a plurality thereof are present, two of $R_{21}$, $R_{22}$, $R_{23}$, or $R_{24}$ may be bonded to each other to form a ring.

The alkyl group for $R_{21}$, $R_{22}$, $R_{23}$, and $R_{24}$ is preferably an alkyl group having 1 to 4 carbon atoms, more preferably a methyl group or an ethyl group, and most preferably a methyl group. Examples of the cycloalkyl group include a cyclopropyl group, a cyclobutyl group, a cyclopentyl group, and a cyclohexyl group. Examples of the alkoxycarbonyl group include a methoxycarbonyl group, an ethoxycarbonyl group, an n-butoxycarbonyl group, and a t-butoxycarbonyl group. Examples of the alkoxy group include a methoxy group, an ethoxy group, a propoxy group, an isopropoxy group, and a butoxy group. These groups may have a substituent, and examples of the substituent include a hydroxy group, an alkoxy group such as a methoxy group, and an ethoxy group, a cyano group, and a halogen atom such as a fluorine atom.

The $R_{21}$, $R_{22}$, $R_{23}$, and $R_{24}$ are more preferably a methyl group, a cyano group, or an alkoxycarbonyl group, and still more preferably a cyano group.

$Rb_1$, $Rb_2$, $Rb_3$, and $Rb_4$ are preferably a hydrogen atom, a methyl group, or a trifluoromethyl group, and more preferably a hydrogen atom or a methyl group.

$W_1$, $W_2$, and $W_4$ are preferably an alkylene group having 1 to 3 carbon atoms (for example, a methylene group and an ethylene group), or an oxygen atom, and more preferably a methylene group or an oxygen atom.

The divalent linking group for $Z_{21}$, $Z_{22}$, $Z_{23}$, and $Z_{24}$ is preferably an alkylene group, a divalent linking group having a monocyclic or polycyclic cycloalkyl structure, or a divalent linking group formed by an ether bond, an ester bond, a carbonyl group, or a combination thereof.

$Z_{21}$, $Z_{22}$, $Z_{23}$, and $Z_{24}$ are more preferably a single bond or a divalent linking group represented by $-Z_x-CO_2-$.

$Z_x$ is a linear or branched alkylene group or a monocyclic or polycyclic cycloalkylene group, and preferably a methylene group, an ethylene group, a cyclohexylene group, an adamantylene group, or a norbornylene group.

$l_{II-2}$, and $l_{II-3}$ are preferably an integer number of 0 to 4, and more preferably 0 or 1.

$l_{II-4}$ is preferably an integer number of 0 to 2, and more preferably 0.

The content of the repeating units having a lactone structure, a sultone structure, and a cyano group, when a plurality of kinds thereof are included, is preferably from 15 to 70 mol %, more preferably from 20 to 65 mol %, and still more preferably from 25 to 60 mol % in total, based on all the repeating units in the resin.

In the present invention, it is preferable that the resin (A) have an acid-decomposable group other than a structure represented by any one of the general formulae (I-1) to (I-3); it is more preferable that the resin (A) have an acid-decomposable group other than a structure represented by any one of the general formulae (I-1) to (I-3) in a main chain or a side chain, or both of the main chain and the side chain, of a resin; and it is still more preferable that the resin (A) have repeating units having an acid-decomposable group other than repeating units having a structure represented by any one of the general formulae (I-1) to (I-3).

The acid-decomposable group other than repeating units having a structure represented by any one of the general formulae (I-1) to (I-3) preferably has a structure where an alkali-soluble group is protected by a group that decomposes and leaves by the action of an acid.

Examples of the alkali-soluble group include a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred examples of the alkali-soluble group include a carboxyl group, a fluorinated alcohol group (preferably a hexafluoroisopropanol group), and a sulfonic acid group.

The acid-decomposable group is preferably a group formed by substituting a group that leaves for a hydrogen atom of the alkali-soluble group above.

Examples of the group that leaves include $-C(R_{36})(R_{37})(R_{38})$, $-C(R_{36})(R_{37})(OR_{39})$, and $-C(R_{01})(R_{02})(OR_{39})$.

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

The acid-decomposable group is preferably a cumyl ester group, an enol ester group, an acetal ester group, a tertiary alkyl ester group, or the like, and more preferably a tertiary alkyl ester group.

The repeating unit containing an acid-decomposable group that the resin (A) may contain is preferably a repeating unit represented by the following general formula (AI).

[Chem. 25]

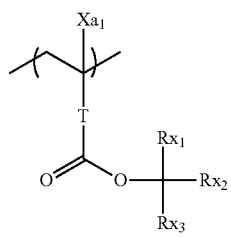

(AI)

In the general formula (AI), $Xa_1$ represents a hydrogen atom, a methyl group which may have a substituent, or a group represented by $-CH_2-R_9$. $R_9$ represents a hydroxyl group or a monovalent organic group. Examples of the monovalent organic group include an alkyl group having 5 or less carbon atoms and an acyl group having 5 or less carbon atoms. Among these, an alkyl group having 3 or less carbon atoms is preferred, and a methyl group is more preferred. $Xa_1$ is preferably a hydrogen atom, a methyl group, a trifluoromethyl group, or a hydroxymethyl group.

T represents a single bond or a divalent linking group.

$Rx_1$ to $Rx_3$ each independently represent an (linear or branched) alkyl group or a (monocyclic or polycyclic) cycloalkyl group.

Two members of $Rx_1$ to $Rx_3$ may be bonded to each other to form a (monocyclic or polycyclic) cycloalkyl group.

Examples of the divalent linking group of T include an alkylene group, a $-COO-Rt-$ group, and a $-O-Rt-$ group. In the formulae, Rt represents an alkylene group or a cycloalkylene group.

T is preferably a single bond or a —COO-Rt- group. Rt is preferably an alkylene group having 1 to 5 carbon atoms, and more preferably a —CH$_2$— group, a —(CH$_2$)$_2$— group, or a —(CH$_2$)$_3$— group.

The alkyl group of Rx$_1$ to Rx$_3$ is preferably an alkyl group having 1 to 4 carbon atoms, such as a methyl group, an ethyl group, an n-propyl group, an isopropyl group, an n-butyl group, an isobutyl group, and a t-butyl group.

The cycloalkyl group of Rx$_1$ to Rx$_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group.

The cycloalkyl group formed by the combination of at least two members of Rx$_1$ to Rx$_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group, and particularly preferably a monocyclic cycloalkyl group having 5 to 6 carbon atoms.

An embodiment where Rx$_1$ is a methyl group or an ethyl group and Rx$_2$ and Rx$_3$ are combined to form the above-described cycloalkyl group is preferred.

Each of the groups above may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), and the number of carbon atoms is preferably 8 or less.

When the resin (A) has an acid-decomposable group other than the structure represented by any one of the general formulae (I-1) to (I-3), the total content of the repeating units having an acid-decomposable group other than the structure represented by any one of the general formulae (I-1) to (I-3) is preferably from 5 to 60 mol %, more preferably from 10 to 55 mol %, and still more preferably from 15 to 50 mol %, based on all the repeating units in the resin.

Specific preferred examples of the repeating units having an acid-decomposable group are shown below, but the present invention is not limited thereto.

In the specific examples, Rx and Xa$_1$ each represent a hydrogen atom, CH$_3$, CF$_3$, or CH$_2$OH, and Rxa and Rxb each represent an alkyl group having 1 to 4 carbon atoms. Z represents a substituent containing a polar group, and when a plurality of Z's are present, they may be the same as or different from each other. p represents 0 or a positive integer. Specific examples and preferred examples of Z are the same as specific examples and preferred examples of R$_{10}$ in the general formula (II-1) described later.

[Chem. 26]

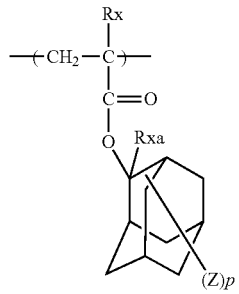

1

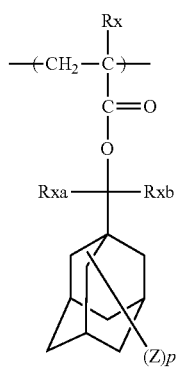

2

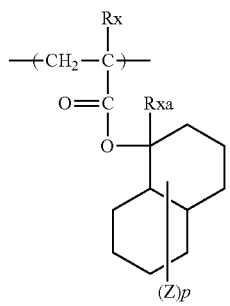

3

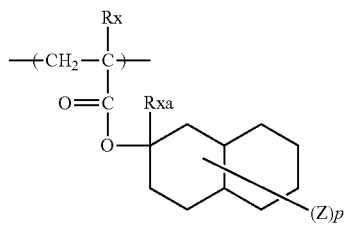

4

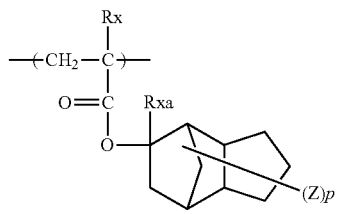

5

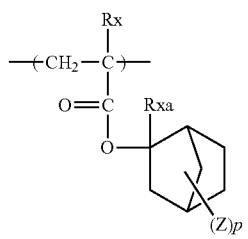

6

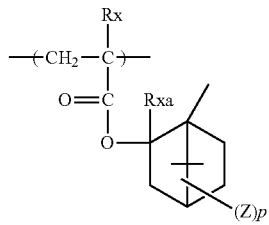

7

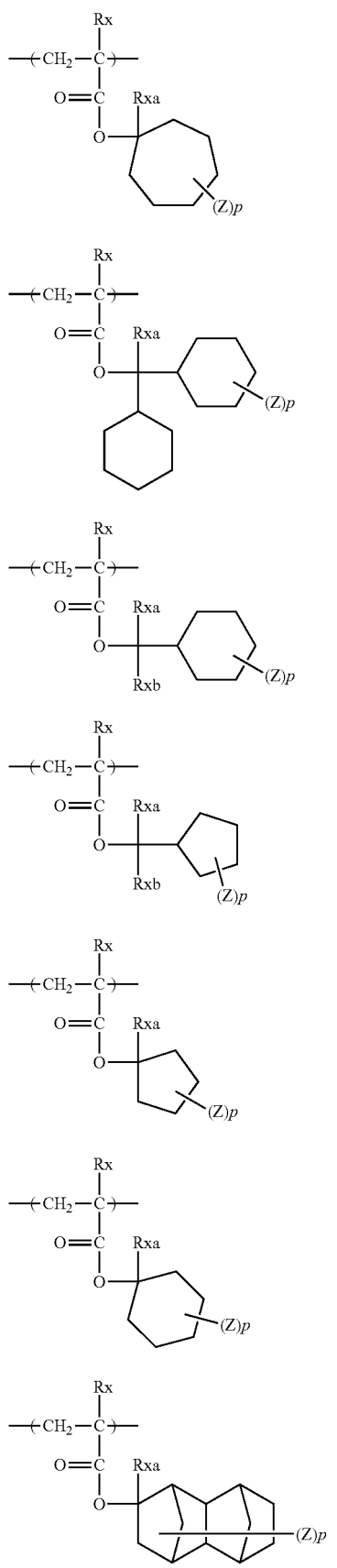
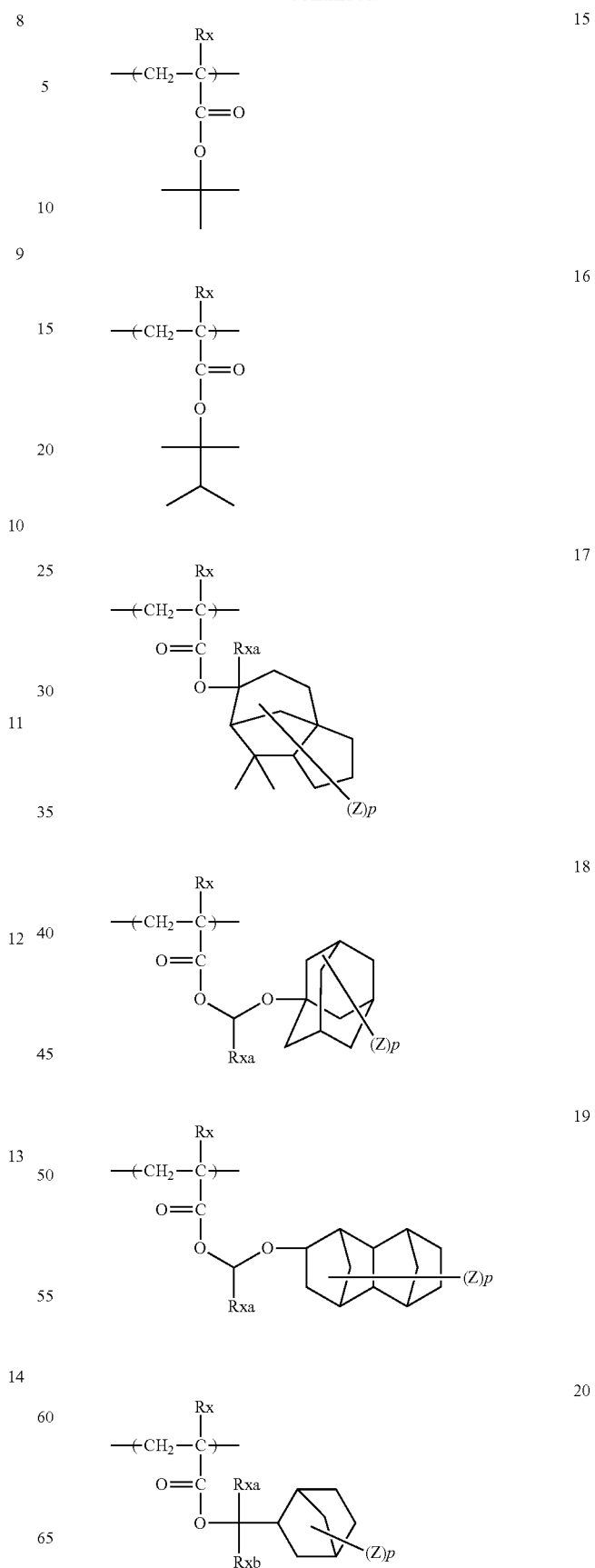

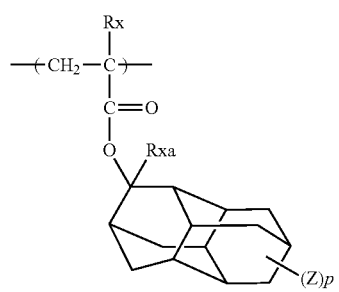
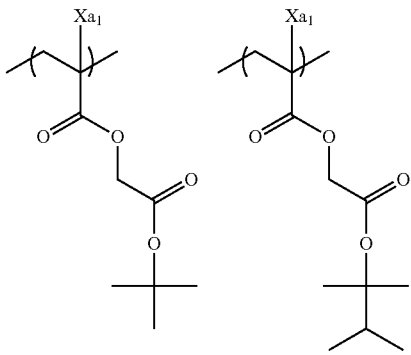
[Chem. 27]
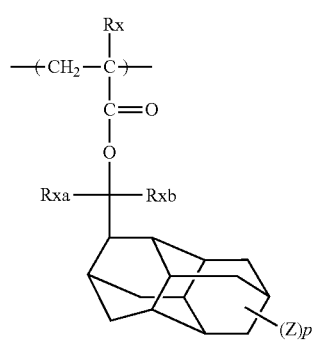
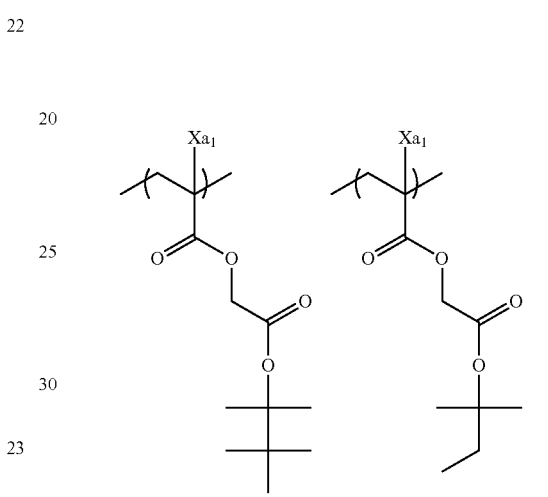
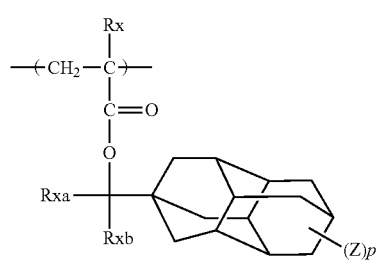
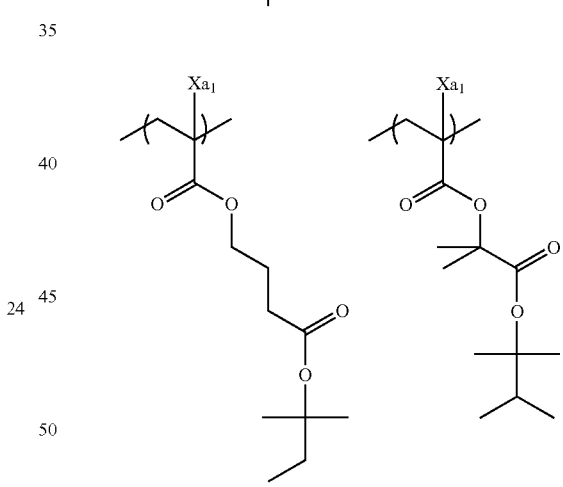
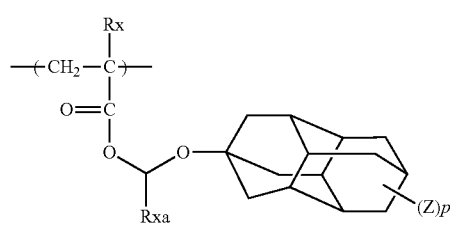
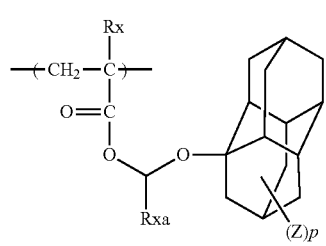
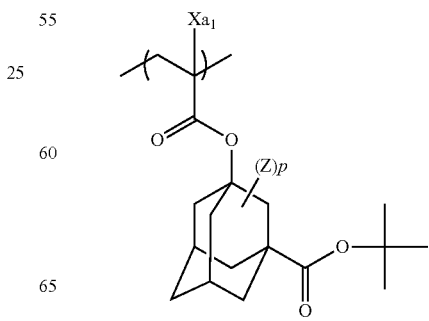

-continued
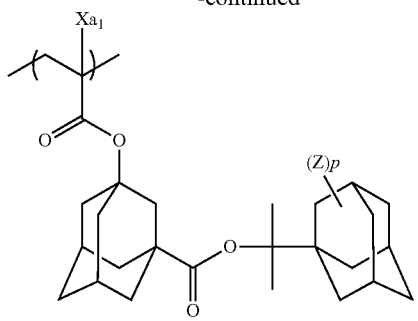
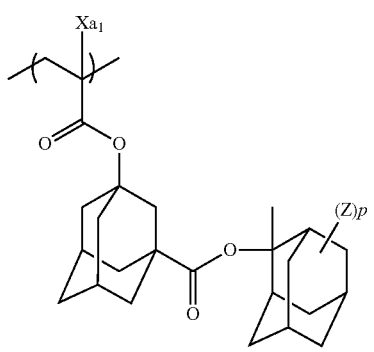
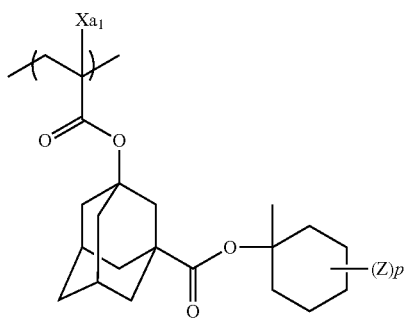
-continued
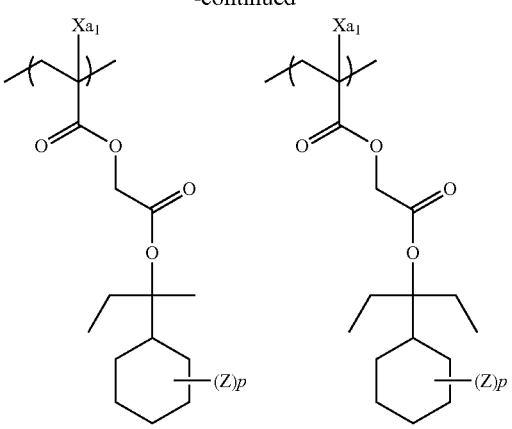
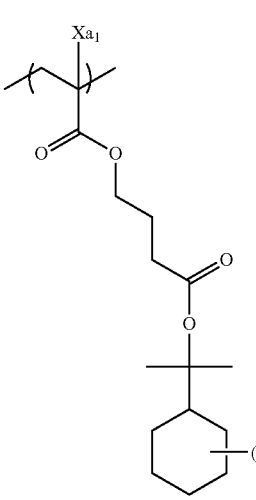
[Chem. 28]
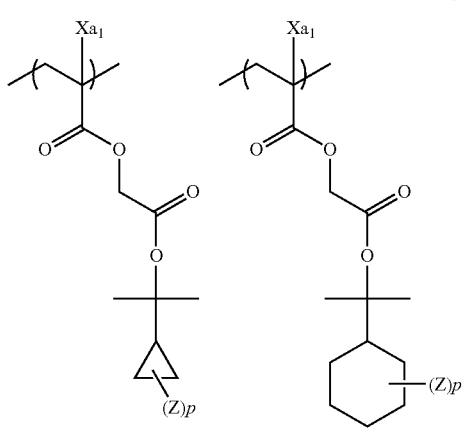
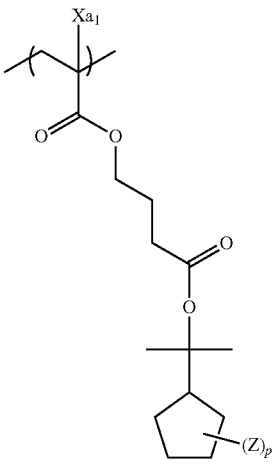

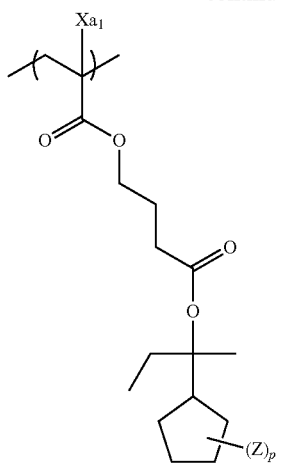
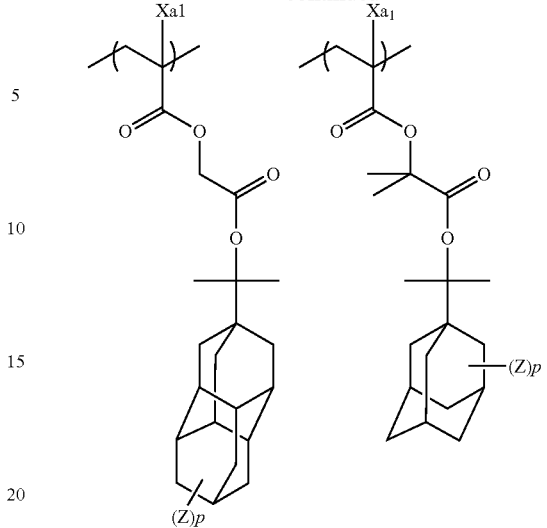
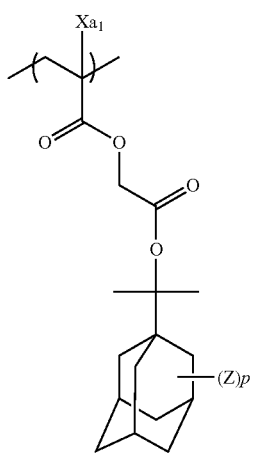
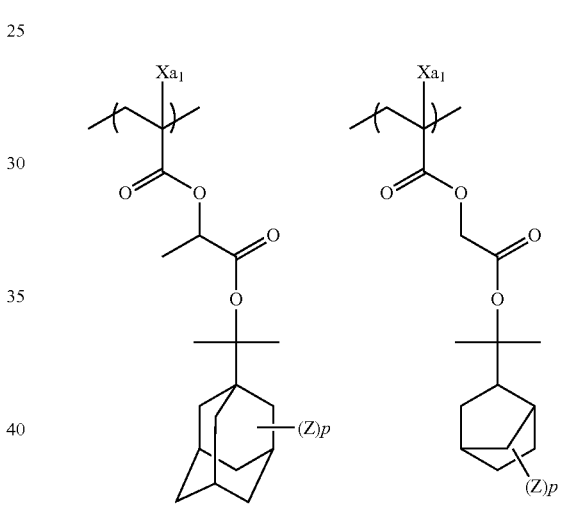
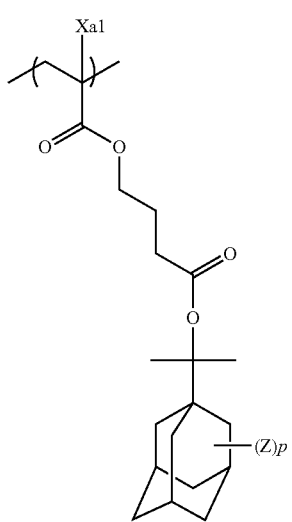
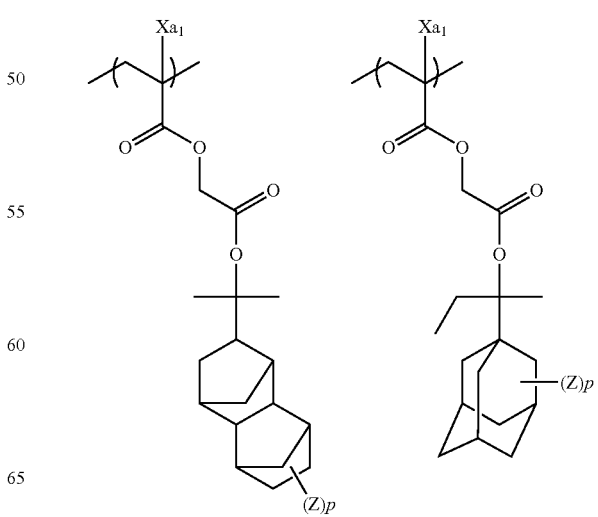

[Chem. 29]
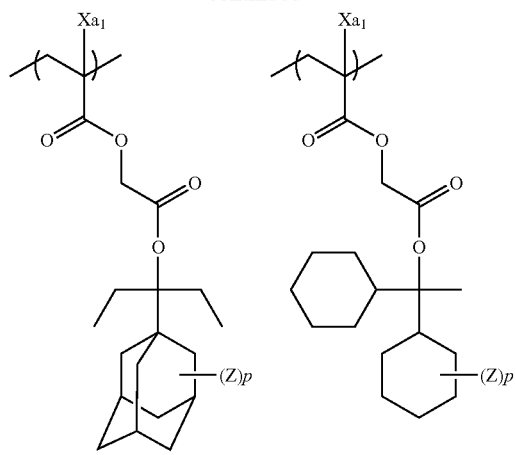
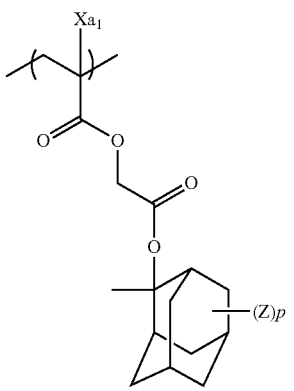
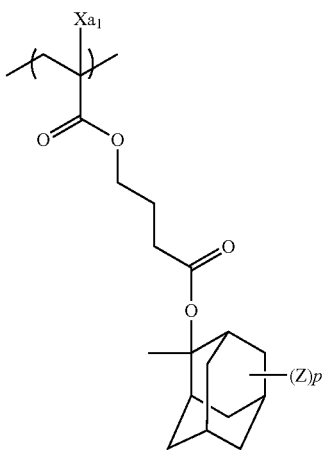

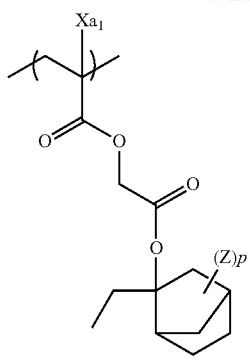
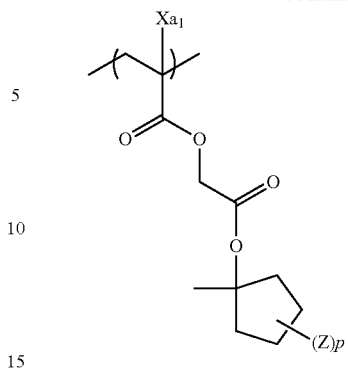
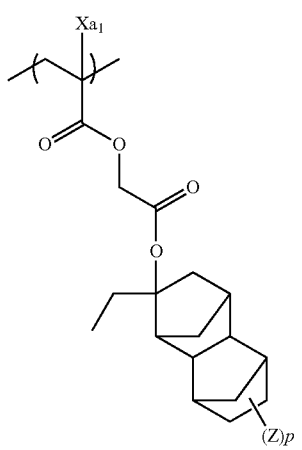
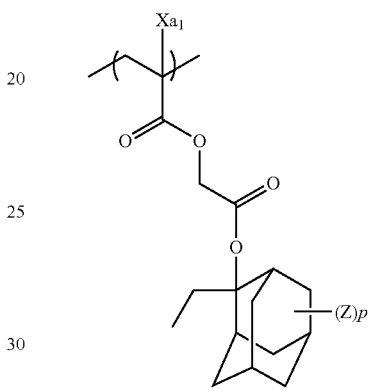
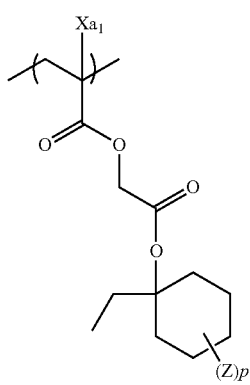
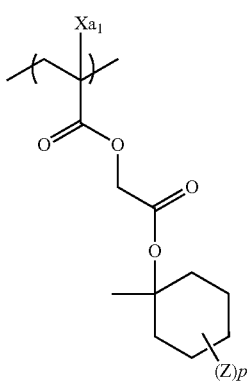
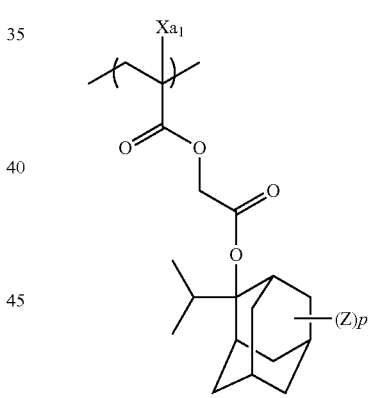
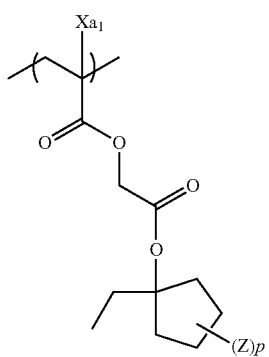
The resin (A) is more preferably a resin containing, as the repeating units represented by the general formula (AI), at least either repeating units represented by the general formula (I) or repeating units represented by the general formula (II).
[Chem. 30]
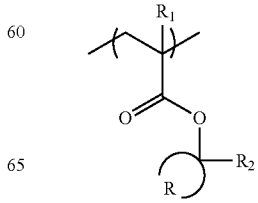
(I)

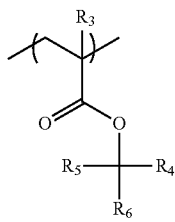

(II)

In the general formulae (I) and (II), $R_1$ and $R_3$ each independently represent a hydrogen atom, a methyl group which may have a substituent, or a group represented by —$CH_2$—$R_9$, wherein $R_9$ represents a hydroxyl group or a monovalent organic group, $R_2$, $R_4$, $R_5$, and $R_6$ each independently represent an alkyl group or a cycloalkyl group, and R represents an atomic group that is necessary to form an alicyclic structure together with the carbon atom.

Examples of the substituent that a methyl group as $R_1$ or $R_3$ may have include a fluorine atom and the like.

$R_1$ and $R_3$ each preferably represent a hydrogen atom, a methyl group, a trifluoromethyl group, or a hydroxymethyl group. Specific examples and preferred examples of the monovalent organic group in $R_9$ are the same as those described for $R_9$ in the general formula (AI).

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having 1 to 10 carbon atoms, still more preferably an alkyl group having 1 to 5 carbon atoms, and examples thereof include a methyl group and an ethyl group.

R represents an atomic group necessary for forming an alicyclic structure together with the carbon atom. The alicyclic structure formed by R together with the carbon atom is preferably a monocyclic alicyclic structure, and the number of carbon atoms thereof is preferably from 3 to 7, and more preferably 5 or 6.

$R_3$ is preferably a hydrogen atom or a methyl group, and more preferably a methyl group.

The alkyl group in $R_4$, $R_5$, and $R_6$ may be linear or branched and may have a substituent. The alkyl group is preferably an alkyl group having 1 to 4 carbon atoms, such as a methyl group, an ethyl group, an n-propyl group, an isopropyl group, an n-butyl group, an isobutyl group, and a t-butyl group.

The cycloalkyl group in $R_4$, $R_5$, and $R_6$ may be monocyclic or polycyclic and may have a substituent. As the cycloalkyl group, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferred.

Examples of the substituent that the alkyl group or the cycloalkyl group as $R_3$, $R_4$, $R_5$, and $R_6$ may have include the same groups as described later as the substituent containing a polar group as $R_{10}$.

Examples of the repeating unit represented by the general formula (I) include repeating unit represented by the following general formula (1-a).

[Chem. 31]

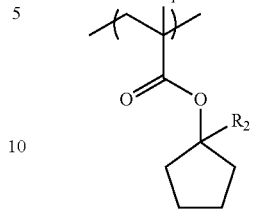

(1-a)

In the formula, $R_1$ and $R_2$ have the same meanings as those in the general formula (I).

The repeating unit represented by the general formula (II) is preferably a repeating unit represented by the following general formula (II-1).

[Chem. 32]

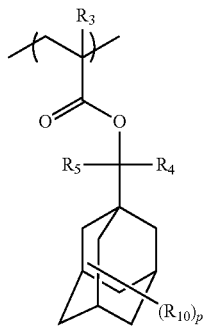

(II-1)

In the formula (II-1), $R_3$ to $R_5$ have the same meanings as those in the general formula (II).

$R_{10}$ represents a polar group-containing substituent. In the case where a plurality of $R_{10}$'s are present, these may be the same as or different from each other. Examples of the polar group-containing substituent include a hydroxyl group, a cyano group, an amino group, an alkylamide group, a sulfonamide group itself, and a linear or branched alkyl group or a cycloalkyl group having at least one of the groups above. An alkyl group having a hydroxyl group is preferred, and a branched alkyl group having a hydroxyl group is more preferred. The branched alkyl group is particularly preferably an isopropyl group.

p represents an integer of 0 to 15. p is preferably an integer of 0 to 2, and more preferably 0 or 1.

The acid decomposable resin is more preferably a resin containing, as the repeating unit represented by the general formula (AI), at least either a repeating unit represented by the general formula (I) or a repeating unit represented by the general formula (II). In another embodiment, the acid decomposable resin is preferably a resin containing, as the repeating unit represented by the general formula (AI), at least two kinds of repeating units represented by the general formula (I).

As for the repeating units in which the resin (A) has an acid decomposable group, the repeating units may be used alone or in combination of two or more kinds thereof. In the case of using the repeating units in combination, preferred examples of the combination are shown below. In the formulae below, R's independently represent a hydrogen atom or a methyl group.

[Chem. 33]
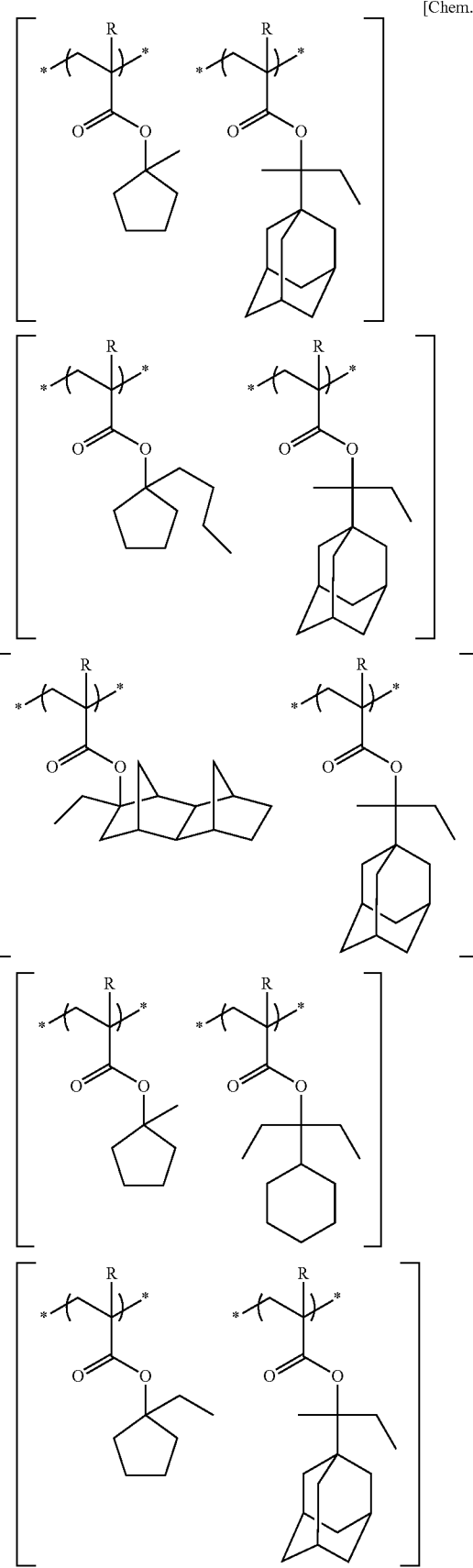
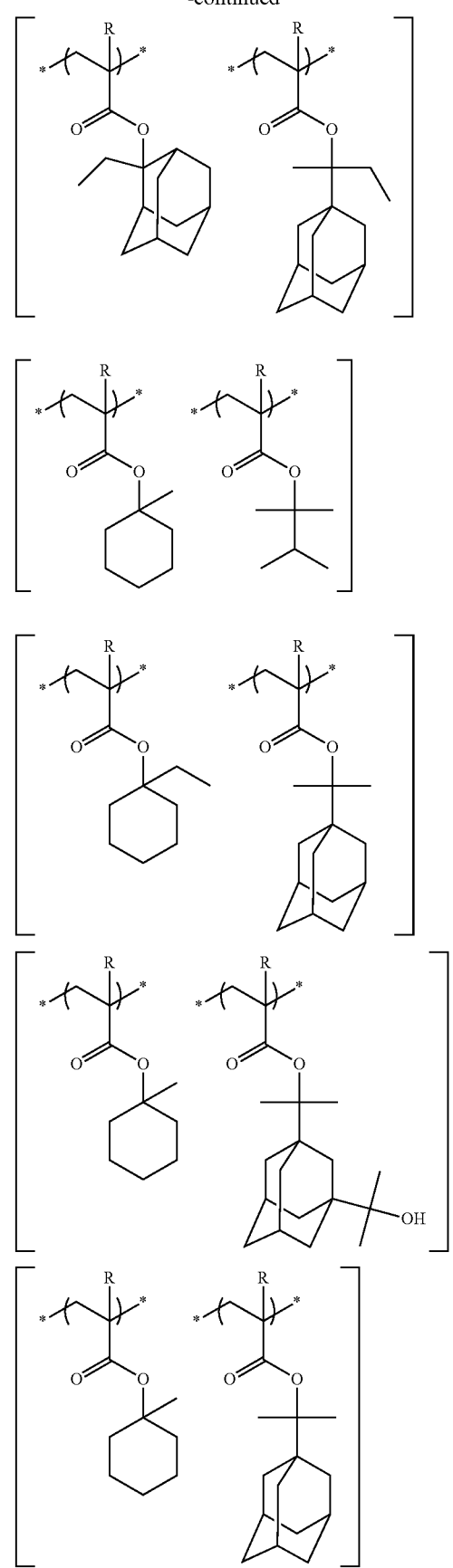

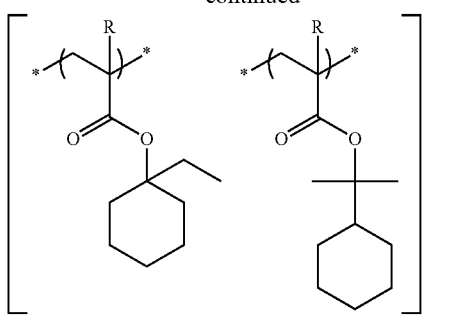
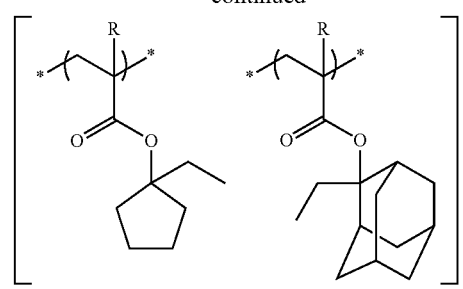
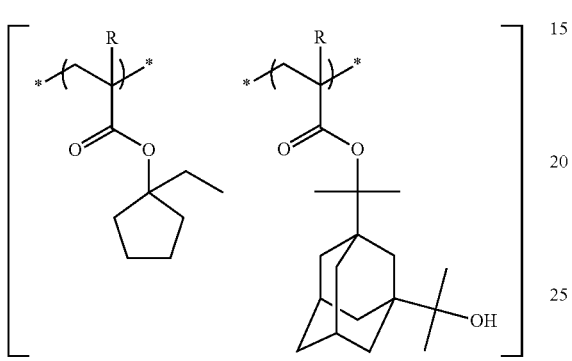
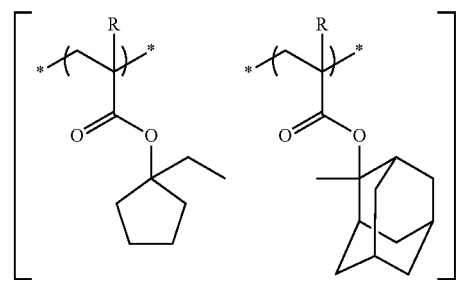
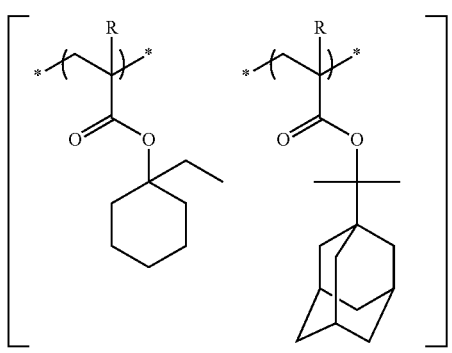
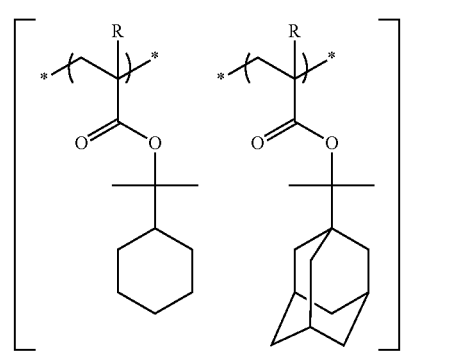
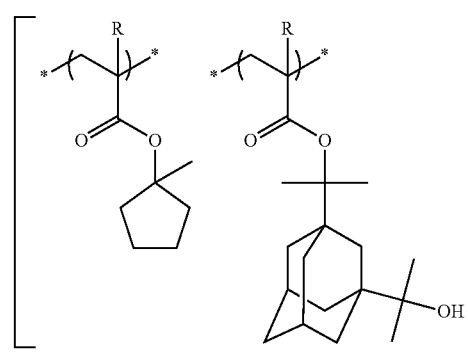
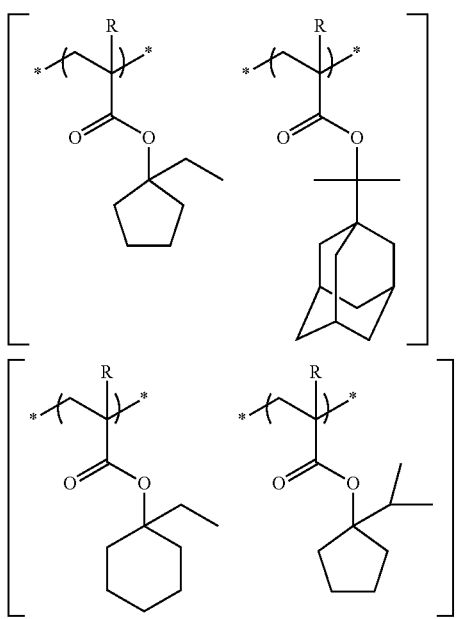

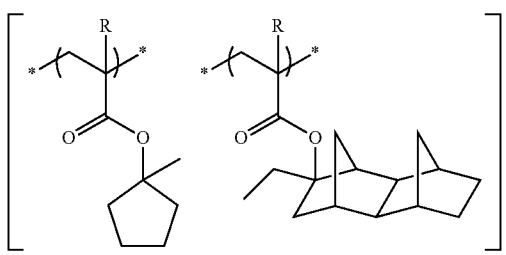
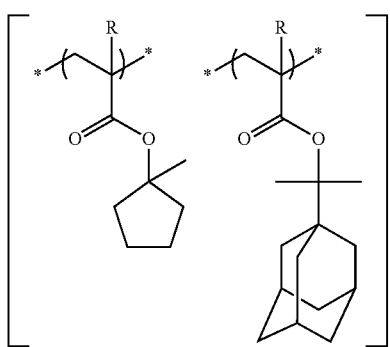

The resin (A) may further contain repeating units having a hydroxyl group so as to improve adhesion to a substrate and affinity for a developer. The repeating units having a hydroxyl group are preferably repeating units having an alicyclic hydrocarbon structure substituted with a hydroxyl group and preferably have no acid-decomposable group. The alicyclic hydrocarbon structure in the alicyclic hydrocarbon structure substituted with a hydroxyl group is preferably an adamantyl group, a diamantyl group, or a norbornane group. The alicyclic hydrocarbon structure substituted with a hydroxyl group is preferably a partial structure represented by the following formulae (VIIa) to (VIId).

[Chem. 34]

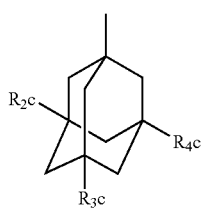

(VIIa)

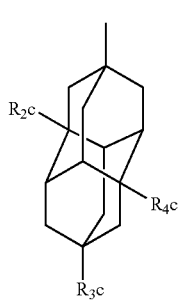

(VIIb)

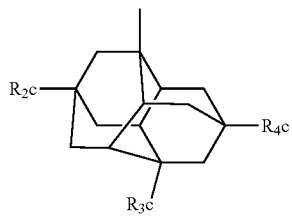

(VIIc)

In the general formulae (VIIa) to (VIIc), $R_2c$ to $R_1c$ each independently represent a hydrogen atom or a hydroxyl group, provided that at least one of $R_2c$ to $R_4c$ represents a hydroxyl group. A structure where one or two members of $R_2c$ to $R_4c$ are a hydroxyl group with the remaining ones being a hydrogen atom is preferred. In the general formula (VIIa), it is more preferable that two members of $R_2c$ to $R_4c$ be hydroxyl groups and the remaining ones be hydrogen atoms.

Examples of the repeating units having a partial structure represented by the general formulae (VIIa) to (VIId) include repeating units represented by the following general formulae (AIIa) to (AIId).

[Chem. 35]

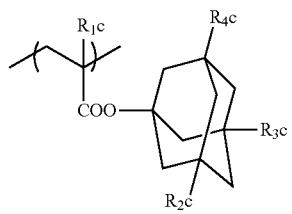

(AIIa)

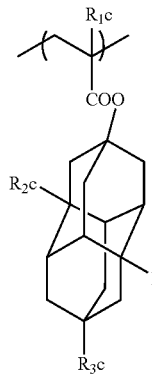

(AIIb)

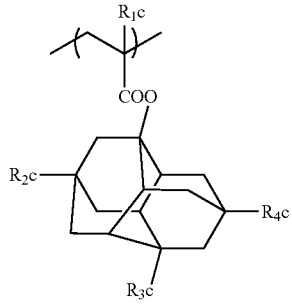

(AIIc)

In the general formulae (AIIa) to (AIId),

R$_1$c represents a hydrogen atom, a methyl group, a trifluoromethyl group, or a hydroxymethyl group.

R$_2$c to R$_4$c have the same meanings as R$_2$c to R$_4$c in the general formulae (VIIa) to (VIIc).

The resin (A) may or may not contain repeating units having a hydroxyl group, but in the case of such a repeating unit being contained, the content thereof is preferably from 5 to 30 mol %, more preferably from 5 to 20 mol %, and still more preferably from 10 to 15 mol %, based on all the repeating units in the resin (A).

Specific examples of the repeating units having a hydroxyl group are shown below, but the present invention is not limited thereto.

[Chem. 36]

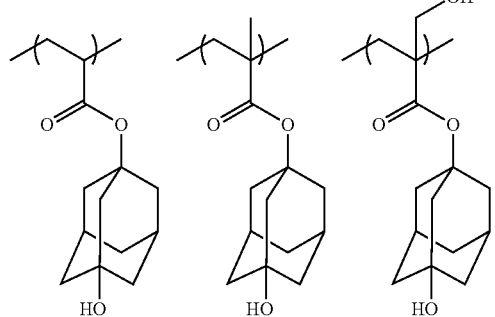

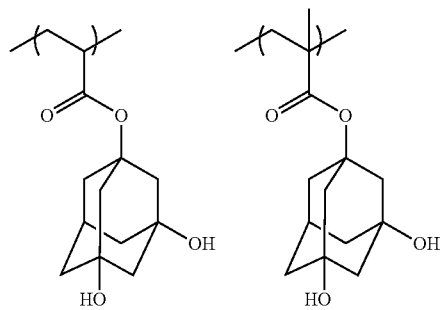

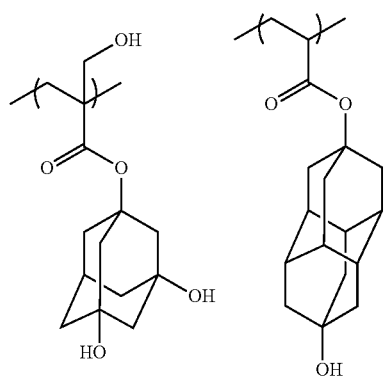

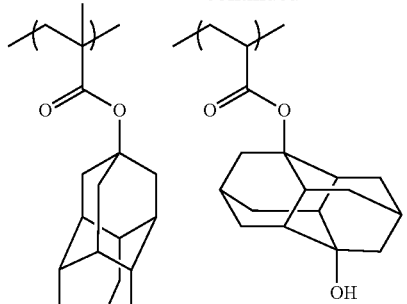

-continued

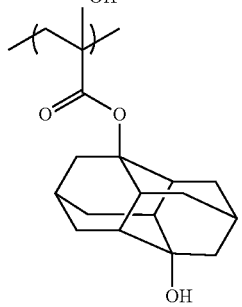

The resin used in the actinic-ray-sensitive or radiation-sensitive resin composition of the present invention may contain repeating units having an alkali-soluble group. Examples of the alkali-soluble group include a carboxyl group, a sulfonamide group, a sulfonylimide group, a bissulfonylimide group, and an aliphatic alcohol substituted with an electron-withdrawing group at the α-position (for example, hexafluoroisopropanol group), with repeating units having a carboxyl group being more preferred. By virtue of containing repeating units having an alkali-soluble group, the resolution increases in the usage of forming contact holes. As for the repeating units having an alkali-soluble group, all of a repeating unit where an alkali-soluble group is directly bonded to the main chain of the resin, such as a repeating unit of an acrylic acid or methacrylic acid, a repeating unit where an alkali-soluble group is bonded to the main chain of the resin through a linking group, and a repeating unit where an alkali-soluble group is introduced into the polymer chain terminal by using a polymerization initiator or chain transfer agent containing an alkali-soluble group at during the polymerization, are preferred. The linking group may have a monocyclic or polycyclic cyclic hydrocarbon structure. In particular, a repeating unit of an acrylic acid or a methacrylic acid is preferred.

The resin (A) in the present invention may or may not contain repeating units having an alkali-soluble group, but in the case of repeating units having an alkali-soluble group being contained, the content thereof is preferably from 1 to 15 mol %, more preferably from 3 to 10 mol %, and still more preferably from 4 to 8 mol %, based on all the repeating units in the resin (A).

Specific examples of the repeating units having an alkali-soluble group are shown below, but the present invention is not limited thereto.

In the specific examples, Rx represents H, CH$_3$, CH$_2$OH, or CF$_3$.

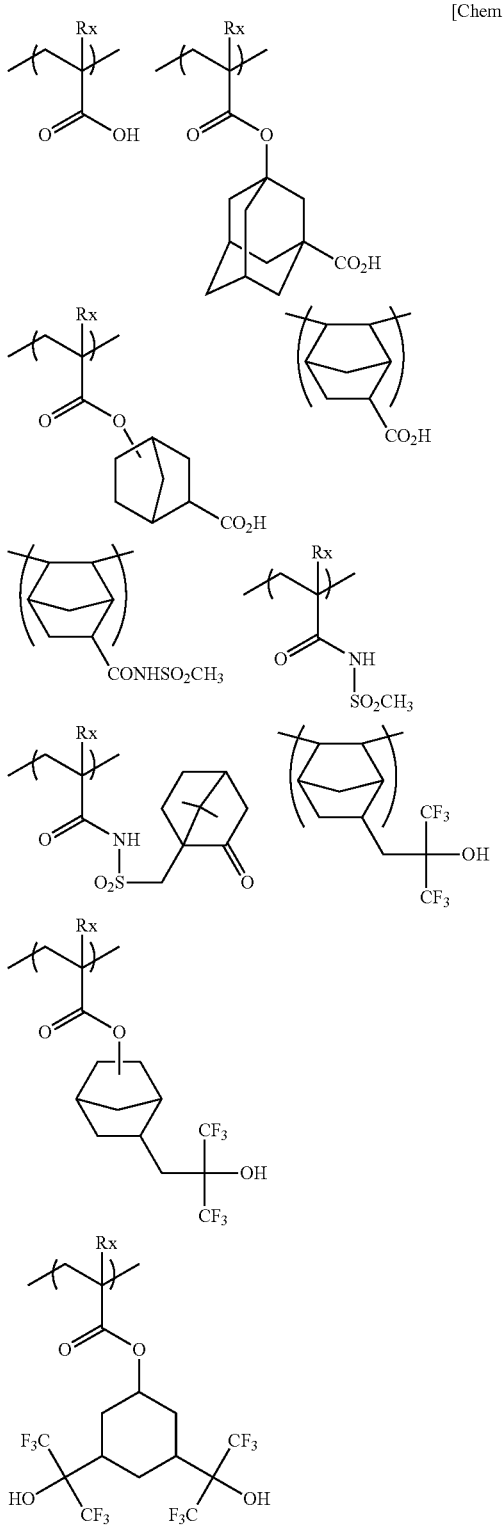

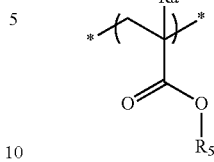

[Chem. 38]

$$\text{IV}$$

In the general formula (IV), $R_5$ represents a hydrocarbon group having at least one cyclic structure and having no polar group.

Ra represents a hydrogen atom, an alkyl group or a —$CH_2$—O—$Ra_2$ group, wherein $Ra_2$ represents a hydrogen atom, an alkyl group, or an acyl group. Ra is preferably a hydrogen atom, a methyl group, a hydroxymethyl group, or a trifluoromethyl group, and more preferably a hydrogen atom or a methyl group.

The cyclic structure included in $R_5$ includes a monocyclic hydrocarbon group and a polycyclic hydrocarbon group. Examples of the monocyclic hydrocarbon group include a cycloalkyl group having 3 to 12 carbon atoms, such as a cyclopentyl group, a cyclohexyl group, a cycloheptyl group, and a cyclooctyl group, and a cycloalkenyl group having 3 to 12 carbon atoms, such as a cyclohexenyl group. The monocyclic hydrocarbon group is preferably a monocyclic hydrocarbon group having 3 to 7 carbon atoms, and more preferably a cyclopentyl group or a cyclohexyl group.

The polycyclic hydrocarbon group includes a ring system hydrocarbon group and a crosslinked cyclic hydrocarbon group. Examples of the ring system hydrocarbon group include a bicyclohexyl group and a perhydronaphthalenyl group. Examples of the crosslinked cyclic hydrocarbon group include a bicyclic hydrocarbon group such as a pinane ring, a bornane ring, a norpinane ring, a norbornane ring, and a bicyclooctane ring (for example, a bicyclo[2.2.2]octane ring and a bicyclo[3.2.1]octane ring), a tricyclic hydrocarbon group such as a homobredane ring, an adamantane ring, a tricyclo[5.2.1.0$^{2,6}$]decane ring, and a tricyclo[4.3.1.1$^{2,5}$]undecane ring, and a tetracyclic hydrocarbon ring such as a tetracyclo[4.4.0.1$^{2,5}$.1$^{7,10}$]dodecane ring and a perhydro-1,4-methano-5,8-methanonaphthalene ring. The crosslinked cyclic hydrocarbon ring also includes a condensed cyclic hydrocarbon ring, for example, a condensed ring formed by condensing a plurality of 5- to 8-membered cycloalkane rings, such as a perhydronaphthalene (decalin) ring, a perhydroanthracene ring, a perhydrophenanthrene ring, a perhydroacenaphthene ring, a perhydrofluorene ring, a perhydroindene ring, and a perhydrophenalene ring.

Preferred examples of the crosslinked cyclic hydrocarbon ring include a norbornyl group, an adamantyl group, a bicyclooctanyl group, and a tricyclo[5.2.1.0$^{2,6}$]decanyl group. More preferred examples of the crosslinked cyclic hydrocarbon ring include a norbornyl group and an adamantyl group.

The alicyclic hydrocarbon group may have a substituent, and preferred examples of the substituent include a halogen atom, an alkyl group, a hydroxyl group substituted with a hydrogen atom, and an amino group substituted with a hydrogen atom. Preferred examples of the halogen atom include a bromine atom, a chlorine atom, and a fluorine atom, and preferred examples of the alkyl group include a methyl group, an ethyl group, a butyl group, and a t-butyl group. This alkyl group may further have a substituent, and examples of the substituent that the alkyl group may further have include a The resin (A) of the present invention may further contain a repeating unit having an alicyclic hydrocarbon structure free from a polar group (for example, an alkali-soluble group, a hydroxyl group, and a cyano group) and not exhibiting acid decomposability. Examples of such a repeating unit include repeating units represented by the general formula (IV).

halogen atom, an alkyl group, a hydroxyl group substituted with a hydrogen atom, and an amino group substituted with a hydrogen atom.

Examples of the group substituted with a hydrogen atom include an alkyl group, a cycloalkyl group, an aralkyl group, a substituted methyl group, a substituted ethyl group, an alkoxycarbonyl group, and an aralkyloxycarbonyl group. Preferred examples of the alkyl group include an alkyl group having 1 to 4 carbon atoms; preferred examples of the substituted methyl group include a methoxymethyl group, a methoxythiomethyl group, a benzyloxymethyl group, a t-butoxymethyl group, and a 2-methoxyethoxymethyl group; preferred examples of the substituted ethyl group include a 1-ethoxyethyl group and a 1-methyl-1-methoxyethyl group; preferred examples of the acyl group include an aliphatic acyl group having 1 to 6 carbon atoms, such as a formyl group, an acetyl group, a propionyl group, a butyryl group, an isobutyryl group, a valeryl group, and a pivaloyl group; and examples of the alkoxycarbonyl group include an alkoxycarbonyl group having 1 to 4 carbon atoms.

The resin (A) may or may not contain repeating units having an alicyclic hydrocarbon structure free from a polar group and not exhibiting acid decomposability, but in the case where it contains the repeating units, the content of the repeating units is preferably from 1 to 20 mol %, and more preferably from 2 to 15 mol %, based on all the repeating units in the resin (A).

Specific examples of the repeating units having an alicyclic hydrocarbon structure free from a polar group and not exhibiting acid decomposability are shown below, but the present invention is not limited thereto. In the formulae, Ra represents H, $CH_3$, $CH_2OH$, or $CF_3$.

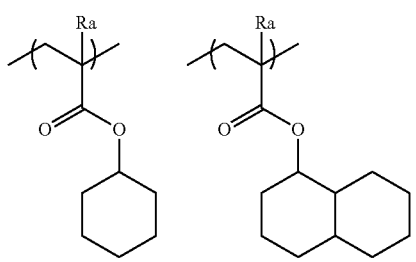

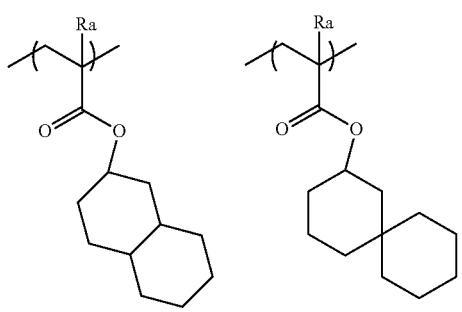

-continued

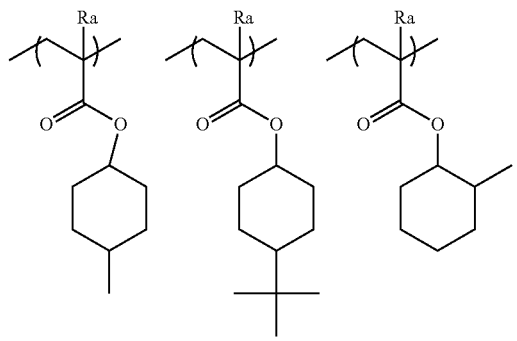

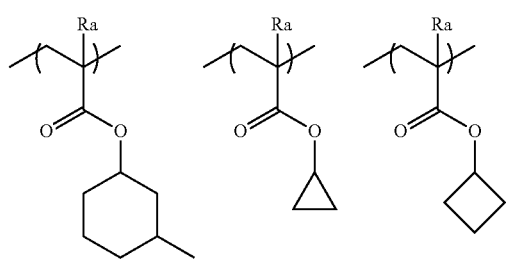

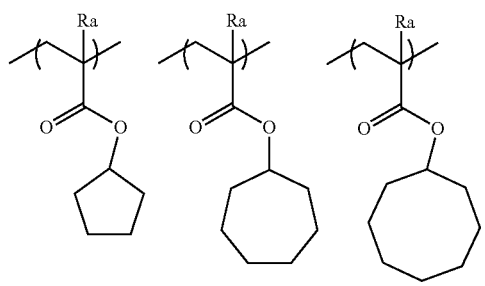

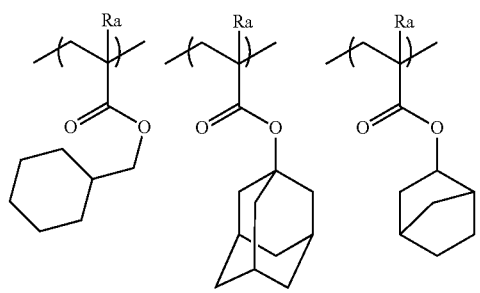

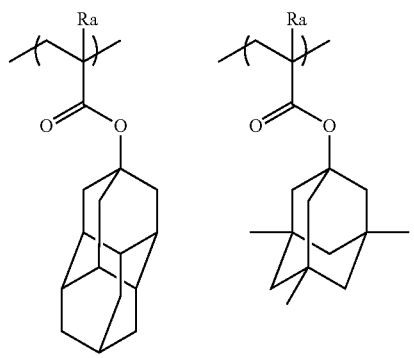

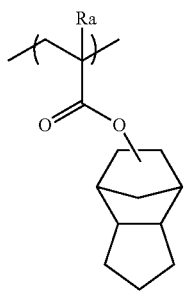

The resin (A) used in the composition of the present invention may contain, in addition to the above-described repeating structural units, various repeating structural units for the purpose of controlling the dry etching resistance, suitability for standard developer, adhesion to a substrate, a resist profile, and characteristics that are generally required for a resist, such as resolution, heat resistance, and sensitivity.

Examples of such a repeating structural unit include, but are not limited to, repeating structural units corresponding to the monomers described below.

The use of such repeating structural units enables the fine control of the performance that is required for the resin used in the composition of the present invention, particularly (1) solubility in a coating solvent, (2) a film forming property (glass transition point), (3) alkaline developability, (4) film loss (selection of hydrophilic, hydrophobic, or alkali-soluble groups), (5) adhesion of unexposed area to a substrate, (6) dry etching resistance, and the like.

Examples of the monomer include a compound having one addition-polymerizable unsaturated bond selected from acrylic acid esters, methacrylic acid esters, acrylamides, methacrylamides, allyl compounds, vinyl ethers, and vinyl esters.

In addition, an addition-polymerizable unsaturated compound that is copolymerizable with the monomers corresponding to the above-described various repeating structural units may be copolymerized.

In the resin (A) used in the composition of the present invention, the molar ratio of respective repeating structural units included in the resin (A) is appropriately set to control the dry etching resistance of resist, suitability for standard developer, adhesion to a substrate, resist profile, and performance that is generally required for a resist, such as resolution, heat resistance, and sensitivity.

When the composition of the present invention is one for ArF exposure, it is preferable for the resin (A) used in the composition of the present invention to have substantially no aromatic group from the viewpoint of transparency to ArF light. More specifically, in all repeating units of the resin (A), the content of the aromatic group-containing repeating units is preferably 5 mol % or less, more preferably 3 mol % or less, and ideally 0 mol %, based on all the repeating units, that is, still more preferably free from the aromatic group-containing repeating units.

The resin (A) preferably has a monocyclic or polycyclic alicyclic hydrocarbon structure.

Furthermore, the resin (A) preferably has neither a fluorine atom nor a silicon atom from the viewpoints of compatibility with a hydrophobic resin (HR) as described later.

The resin (A) used in the composition of the present invention is preferably a resin wherein all the repeating units consist of (meth)acrylate-based repeating units. In this case, use can be made of any of a resin wherein all the repeating units consist of methacrylate-based repeating units, a resin wherein all the repeating units consist of acrylate-based repeating units and a resin wherein all the repeating units consist of methacrylate-based repeating units and acrylate-based repeating units. However, it is preferable for the acrylate-based repeating units to account for 50 mol % or less of all the repeating units.

The resin (A) in the present invention can be synthesized by conventional techniques (for example, radical polymerization). Examples of the general synthetic method include a batch polymerization method in which a monomer species and an initiator are dissolved in a solvent and heated so as to accomplish polymerization and a dropping polymerization method in which a solution of monomer species and initiator is added by dropwise addition to a heated solvent over a period of 1 to 10 hours. The dropping polymerization method is preferred. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate; amide solvents such as dimethylformamide and dimethylacetamide; and solvents capable of dissolving the composition of the present invention, such as propylene glycol monomethyl ether acetate, propylene glycol monomethyl ether, and cyclohexanone, as described later. It is preferable to perform the polymerization with the use of the same solvent as employed in the actinic-ray-sensitive or radiation-sensitive resin composition of the present invention. This could inhibit generation of particles during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxyl group is especially preferred. Preferred examples of the initiator include azobisisobutyronitrile, azobisdimethylvaleronitrile, and dimethyl 2,2'-azobis(2-methylpropionate). According to necessity, a supplementation of initiator or divided addition thereof may be effected. After the completion of the reaction, the reaction mixture is poured into a solvent. The desired polymer is recovered by a method for powder or solid recovery, or the like. The concentration during the reaction is in the range of 5 to 50 mass %, preferably 10 to 30 mass %. The reaction temperature is generally in the range of 10° C. to 150° C., preferably 30° C. to 120° C., and more preferably 60° C. to 100° C.

The weight average molecular weight of the resin (A) of the present invention in terms of polystyrene as measured by GPC is preferably in the range of 1,000 to 200,000, more preferably 2,000 to 20,000, still more preferably 3,000 to 18,000, and further preferably 3,000 to 16,000. The regulation of the weight average molecular weight to 1,000 to 200,000 would prevent deterioration of heat resistance and dry etching resistance and also prevent deterioration of developability and increase of viscosity, thereby preventing deterioration of a film forming property.

The dispersity (molecular weight distribution, Mw/Mn) is usually from 1.0 to 3.0, preferably from 1.0 to 2.6, more preferably from 1.0 to 2.0, and still more preferably from 1.4 to 2.0. As the molecular weight distribution is smaller, the resolution and resist shape are superior, the side wall of the resist pattern is smoother, and the roughness is more improved. In the present specification, the weight average molecular weight (Mw) and the number average molecular weight (Mn) of the resin (A) may be calculated by using, for example, an HLC-8120 (manufactured by Tosoh Corporation) using a TSK gel Multipore HXL-M column (manufactured by Tosoh Corporation, 7.8 mm ID×30.0 cm) and THF (tetrahydrofuran) as an eluent.

In the present invention, the blending amount of the resin (A) in the entire composition is preferably from 30 to 99 mass %, and more preferably from 60 to 95 mass %, based on the total solid content.

As for the resin of the present invention, one kind of a resin may be used or a plurality of kinds of resins may be used in combination.

Further, within a range which does not interfere with the effect of the present invention, other resins other than the resin (A) in the present invention may be used in combination. Examples of the resin other than the resin (A) in the present invention include acid-decomposable resins which may contain repeating units optionally included in the resin (A) as described above, and other known acid-decomposable resins.

[2] Compound that Generates Acid Upon Irradiation of Actinic Rays or Radiations (B)

The composition in the present invention further contains a compound that generates an acid by irradiation with actinic rays or radiations (B) (which will also be hereinafter referred to as an "acid generator").

As such an acid generator, photoinitiators of photo-cation polymerization, photoinitiators of photo radical polymerization, photodecoloring agents of dyes, photo-discoloring agents, known compounds that generate an acid by irradiation with actinic rays or radiations, which are used in microresists or the like, and mixtures thereof may be properly selected and used.

Examples of the acid generator include diazonium salts, phosphonium salts, sulfonium salts, iodonium salts, imide sulfonates, oxime sulfonates, diazodisulfone, disulfone, and o-nitrobenzyl sulfonate.

As a preferable compound in the acid generator, the compounds represented by the following general formulae (ZI), (ZII), and (ZIII) may be mentioned as preferred compounds.

[Chem. 40]

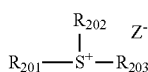 (ZI)

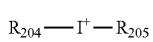 (ZII)

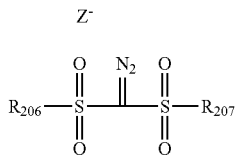 (ZIII)

In the general formula (ZI), $R_{201}$, $R_{202}$, and $R_{203}$ each independently represent an organic group.

The number of carbon atoms of the organic group as $R_{201}$, $R_{202}$, and $R_{203}$ is generally from 1 to 30, and preferably from 1 to 20.

Further, two members of $R_{201}$ to $R_{203}$ may be bonded to each other to form a ring structure, and the ring may contain an oxygen atom, a sulfur atom, an ester bond, an amide bond or a carbonyl group. Examples of the group formed by the combination of two members of $R_{201}$ to $R_{203}$ include an alkylene group (for example, a butylene group and a pentylene group).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion, and a tris(alkylsulfonyl)methyl anion.

The non-nucleophilic anion is an anion having an exceedingly low ability of causing a nucleophilic reaction, and is also an anion capable of suppressing the decomposition over time by the nucleophilic reaction in the molecule, which thus leads to improvement of the stability over time of the resist composition.

Examples of the sulfonate anion include an aliphatic sulfonate anion, an aromatic sulfonate anion, and a camphor sulfonate anion.

Examples of the carboxylate anion include an aliphatic carboxylate anion, an aromatic carboxylate anion, and an aralkylcarboxylate anion.

The aliphatic moiety in the aliphatic sulfonate anion and the aliphatic carboxylate anion may be an alkyl group or a cycloalkyl group. It is preferably an alkyl group having 1 to 30 carbon atoms and a cycloalkyl group having 3 to 30 carbon atoms, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbonyl group, and a bornyl group.

The aromatic group in the aromatic sulfonate anion and the aromatic carboxylate anion is preferably an aryl group having 6 to 14 carbon atoms, and examples thereof include a phenyl group, a tolyl group, and a naphthyl group.

The alkyl group, the cycloalkyl group, and the aryl group in the aliphatic sulfonate anion and the aromatic sulfonate anion may have a substituent. Examples of the substituent of the alkyl group, the cycloalkyl group, and the aryl group of the aliphatic sulfonate anion and the aromatic sulfonate anion include a nitro group, a halogen atom (fluorine atom, chlorine atom, bromine atom or iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). The aryl group or ring structure of these groups may further have an alkyl group (preferably having 1 to 15 carbon atoms) and a cycloalkyl group (preferably having 3 to 15 carbon atoms) as its substituent.

The aralkyl group in the aralkylcarboxylate anion is preferably an aralkyl group having 7 to 12 carbon atoms, and examples thereof include a benzyl group, a phenethyl group, a naphthylmethyl group, a naphthylethyl group, and a naphthylbutyl group.

The alkyl group, the cycloalkyl group, the aryl group, and the aralkyl group in the aliphatic carboxylate anion, the aromatic carboxylate anion, and the aralkylcarboxylate anion may have a substituent. Examples of the substituent include halogen atoms, alkyl groups, cycloalkyl groups, alkoxy groups, and alkylthio groups as described for the aromatic sulfonate anion.

Examples of the sulfonylimide anion include a saccharin anion.

The alkyl group in the bis(alkylsulfonyl)imide anion and the tris(alkylsulfonyl)methide anion is preferably an alkyl group having 1 to 5 carbon atoms, and examples thereof include a methyl group, an ethyl group, a propyl group, an isopropyl group, an n-butyl group, an isobutyl group, a sec-butyl group, a pentyl group, and a neopentyl group. Examples of the substituent for the alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group, and an alkyl group substituted with a fluorine atom is preferred.

Examples of other non-nucleophilic anions include fluorophosphates, fluoroborates, and fluoroantimonates.

The non-nucleophilic anion for $Z^-$ is preferably an aliphatic sulfonate anion substituted at the α-position of sulfonic acid with a fluorine atom, an aromatic sulfonate anion substituted with a fluorine atom, or a group having a fluorine atom, a bis(alkylsulfonyl)imido anion in which an alkyl group is substituted with a fluorine atom, or a tris(alkylsulfonyl)methide anion in which an alkyl group is substituted with a fluorine atom. The nonnucleophilic anion is more preferably a perfluorinated aliphatic sulfonate anion, and more preferably having 4 to 8 carbon atoms, or a benzene sulfonate anion having a fluorine atom, and still more preferably a nonafluorobutane sulfonate anion, a perfluorooctane sulfonate anion, a pentafluorobenzene sulfonate anion, or a 3,5-bis(trifluoromethyl)benzene sulfonate anion.

The acid generator is preferably a compound that produces a sulfonic acid represented by the following general formula (I). Since the sulfonic acid represented by the general formula (I) has a cyclic organic group, the resolution and roughness performance can be improved for the reasons as described above.

Accordingly, when the acid generator is, for example, a compound represented by the general formula (ZI) or (ZII), the aromatic sulfonate anion is preferably an anion that produces an acid represented by the following formula (I).

[Chem. 41]

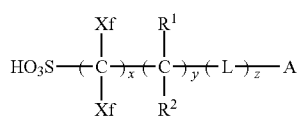

(I)

In the formula, Xf's each independently represent a fluorine atom, or an alkyl group substituted with at least one fluorine atom, $R^1$ and $R^2$ each independently represent a hydrogen atom, a fluorine atom, or an alkyl group, and when a plurality of $R^1$'s or $R^2$'s are present, they may be the same as or different from each other, L represents a divalent linking group, and when a plurality of L's are present, they may be the same as or different from each other, A represents a cyclic organic group, and X represents an integer of 1 to 20, Y represents an integer of 0 to 10, and Z represents an integer of 0 to 10.

The general formula (I) will be described in more detail.

The alkyl group in the alkyl group substituted with a fluorine atom for Xf preferably contains 1 to 10 carbon atoms, and more preferably 1 to 4 carbon atoms. Further, the alkyl group substituted with a fluorine atom for Xf is preferably a perfluoroalkyl group.

Xf is preferably a fluorine atom or a perfluoroalkyl group having 1 to 4 carbon atoms. Specific examples of Xf include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, a fluorine atom and $CF_3$ are preferred. In particular, both Xf's are preferably fluorine atoms.

The alkyl group for $R^1$ or $R^2$ may have a substituent (preferably a fluorine atom) and preferably contains 1 to 4 carbon atoms. More preferred is a perfluoroalkyl group having 1 to 4 carbon atoms. Specific examples of the alkyl group having a substituent for $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferred. $R^1$ or $R^2$ is preferably a fluorine atom or $CF_3$.

y is preferably 0 to 4, and more preferably 0. X is preferably 1 to 8, more preferably 1 to 4, and particularly preferably 1. Z is preferably 0 to 8, and more preferably 0 to 4.

The divalent linking group for L is not particularly limited, and examples thereof include —COO—, —COO—, —CONR—, —NRCO— (wherein R is a hydrogen atom, an alkyl group (preferably having 1 to 6 carbon atoms), a cycloalkyl group (preferably having 3 to 10 carbon atoms)), —CO—, —O—, —S—, —SO—, —SO$_2$—, an alkylene group (preferably having 1 to 6 carbon atoms), a cycloalkylene group (preferably having 3 to 10 carbon atoms), an alkenylene group (preferably having 2 to 6 carbon atoms), and a linking group formed by a combination of a plurality of these groups, with the linking group having 12 or less carbon atoms in total being preferred. Among these, —COO—, —COO—, —CONR—, —NRCO—, —CO—, —O—, —SO$_2$—, —COO-alkylene group-, —OCO-alkylene group-, —CONR-alkylene group-, and —NRCO-alkylene group- are more preferred, and —COO—, —COO—, and —SO$_2$— are still more preferred.

The cyclic organic group of A is not particularly limited as long as it has a cyclic structure. Examples of the cyclic organic group include an alicyclic group, an aryl group, and a heterocyclic group (including one having or having not aromaticity, for example, a tetrahydropyran ring, and a lactone ring structure).

The alicyclic group may be monocyclic or polycyclic, and is preferably a monocyclic cycloalkyl group such as a cyclopentyl group, a cyclohexyl group, and a cyclooctyl group, or a polycyclic cycloalkyl group such as a norbornyl group, a tricyclodecanyl group, a tetracyclodecanyl group, a tetracyclododecanyl group, and an adamantyl group. Among these, an alicyclic group having a bulky structure containing 7 or more carbon atoms, such as a norbornyl group, a tricyclodecanyl group, a tetracyclodecanyl group, a tetracyclododecanyl group, and an adamantyl group, is preferred since diffusion into a film during a post-exposure baking (PEB) step is inhibited and a MEEF (mask error enhancement factor) is improved.

Examples of the aryl group, which may be monocyclic or polycyclic, include a benzene ring, a naphthalene ring, a phenanthrene ring, and an anthracene ring. Among these, naphthalene with low light absorbance is preferred from the viewpoint of absorbance at 193 nm.

The heterocyclic group may be monocyclic or polycyclic, and examples thereof include those derived from a furan ring, a thiophene ring, a benzofuran ring, a benzothiophene ring, a dibenzofuran ring, a dibenzothiophene ring, a pyridine ring, and a decahydroisoquinoline ring. Among these, those derived from a furan ring, a thiophene ring, a pyridine ring, and a decahydroisoquinoline ring are preferred.

Furthermore, other examples of the cyclic organic group include a lactone structure.

The cyclic organic group may have a substituent, and examples of the substituent include an alkyl group (may be linear, branched, or cyclic, preferably having 1 to 12 carbon atoms), a cycloalkyl group (may be monocyclic, polycyclic or spirocyclic, preferably having 3 to 20 carbon atoms), an aryl group (preferably having 6 to 14 carbon atoms), a hydroxyl group, an alkoxy group, an ester group, an amide group, a urethane group, a ureido group, a thioether group, a sulfonamide group, and a sulfonic acid ester group. Incidentally, the carbon constituting the cyclic organic group (the carbon contributing to ring formation) may be carbonyl carbon.

Examples of the organic group represented by $R_{201}$, $R_{202}$, and $R_{203}$ include the corresponding groups in the compounds (ZI-1), (ZI-2), (ZI-3), and (ZI-4) as described later.

Moreover, the compound may be a compound having a plurality of structures represented by the general formula (ZI). For example, the compound may be a compound having a structure where at least one of $R_{201}$ to $R_{203}$ in the compound represented by the general formula (ZI) is bonded to at least one of $R_{201}$ to $R_{203}$ in another compound represented by the general formula (ZI) through a single bond or a linking group.

More preferred examples of the component (ZI) include the compounds (ZI-1), (ZI-2), (ZI-3), and (ZI-4) as described below.

The compound (ZI-1) is an arylsulfonium compound where at least one of $R_{201}$ to $R_{203}$ in the general formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group, with the remaining ones being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, and more preferably a phenyl group. The aryl group may be an aryl group having a heterocyclic structure containing an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In the case where the arylsulfonium compound has two or more aryl groups, these two or more aryl groups may be the same as or different from each other.

The alkyl or cycloalkyl group which is present, if desired, in the arylsulfonium compound is preferably a linear or branched alkyl group having 1 to 15 carbon atoms or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of $R_{201}$ to $R_{203}$ may have, as the substituent, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group or a phenylthio group. The substituent is preferably a linear or branched alkyl group having 1 to 12 carbon atoms, a cycloalkyl group having 3 to 12 carbon atoms, or a linear, branched, or cyclic alkoxy group having 1 to 12 carbon atoms, more preferably an alkyl group having 1 to 4 carbon atoms, or an alkoxy group having 1 to 4 carbon atoms. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

Next, the compound (ZI-2) will be described.

The compound (ZI-2) is a compound in which $R_{201}$ to $R_{203}$ in the formula (ZI) each independently represent an organic group having no aromatic ring. Here, the aromatic ring also includes an aromatic ring containing a heteroatom.

The organic group containing no aromatic ring as $R_{201}$ to $R_{203}$ generally contains 1 to 30 carbon atoms, and preferably 1 to 20 carbon atoms.

$R_{201}$ to $R_{203}$ each independently preferably represent an alkyl group, a cycloalkyl group, an allyl group, or a vinyl group, still more preferably a linear or branched 2-oxoalkyl group, a 2-oxocycloalkyl group, or an alkoxycarbonylmethyl group, and particularly preferably a linear or branched 2-oxoalkyl group.

Preferable examples of the alkyl group and the cycloalkyl group of $R_{201}$ to $R_{203}$ include a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbornyl group). More preferable examples of the alkyl group include a 2-oxoalkyl group and an alkoxycarbonylmethyl group, and more preferable examples of the cycloalkyl group include a 2-oxocycloalkyl group.

The 2-oxoalkyl group may be either linear or branched, and examples thereof include a group containing >C=O at the 2-position of the alkyl group.

The 2-oxocycloalkyl group is preferably the group containing >C=O at the 2-position of the cycloalkyl group as described above.

Examples of the alkoxy group in the alkoxycarbonylmethyl group preferably include an alkoxy group having 1 to 5 carbon atoms (a methoxy group, an ethoxy group, a propoxy group, a butoxy group, and a pentoxy group).

$R_{201}$ to $R_{203}$ may be further substituted with a halogen atom, an alkoxyl group (for example, having 1 to 5 carbon atoms), a hydroxyl group, a cyano group, or a nitro group.

Next, the compound (ZI-3) will be described.

The compound (ZI-3) is a compound represented by the following general formula (ZI-3), which is a compound having a phenacylsulfonium salt structure.

[Chem. 42]

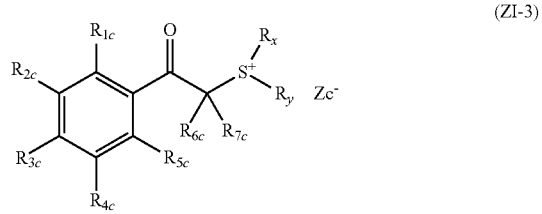

(ZI-3)

In the general formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, $R_{6c}$ and $R_{7c}$ each independently represent a hydrogen atom, an alkyl group, a cycloalkyl group, a halogen atom, a cyano group, or an aryl group, and $R_x$ and $R_y$ each independently represent an alkyl group, a cycloalkyl group, a 2-oxoalkyl group, a 2-oxocycloalkyl group, an alkoxycarbonylalkyl group, an allyl group, or vinyl group.

Any two or more members of $R_{1c}$ to $R_{5c}$, $R_{5c}$ and $R_{6c}$, $R_{6c}$ and $R_{7c}$, $R_{7c}$ and $R_x$, and $R_x$ and $R_y$ may be bonded to each other to form a ring structure, and this ring structure may contain an oxygen atom, a sulfur atom, a ketone group, an ester bond, or an amide bond.

The ring structure includes an aromatic or non-aromatic hydrocarbon ring, an aromatic or non-aromatic heterocyclic ring, and a polycyclic condensed ring formed by combination of two or more of these rings. The ring structure includes a 3- to 10-membered ring, and is preferably a 4- to 8-membered ring, and more preferably a 5- or 6-membered ring.

Examples of the group formed by bonding of any two or more members of $R_{1c}$ to $R_{5c}$, $R_{6c}$ and $R_{7c}$, and $R_x$ and $R_y$ include a butylene group and a pentylene group.

The group formed by bonding of $R_{5c}$ and $R_{6c}$, and $R_{5c}$ and $R_x$ is preferably a single bond or an alkylene group, and examples of the alkylene group include a methylene group and an ethylene group.

$Zc^-$ represents a non-nucleophilic anion, and examples thereof include the same non-nucleophilic anions as mentioned above as examples of $Z^-$ in the general formula (ZI).

The alkyl group as $R_{1c}$ to $R_{7c}$ may be either linear or branched, and examples thereof include an alkyl group having 1 to 20 carbon atoms, and preferably a linear or branched alkyl group having 1 to 12 carbon atoms (for example, a methyl group, an ethyl group, a linear or branched propyl group, a linear or branched butyl group, and a linear or branched pentyl group), and examples of the cycloalkyl group include a cycloalkyl group having 3 to 10 carbon atoms (for example, a cyclopentyl group and a cyclohexyl group).

The aryl group as $R_{1c}$ to $R_{5c}$ preferably has 5 to 15 carbon atoms, and examples thereof include a phenyl group and a naphthyl group.

The alkoxy group as $R_{1c}$ to $R_{5c}$ may be any of linear, branched, and cyclic, and examples thereof include an alkoxy group having 1 to 10 carbon atoms, preferably a linear and branched alkoxy group having 1 to 5 carbon atoms (for example, a methoxy group, an ethoxy group, a linear or branched propoxy group, a linear or branched butoxy group, and a linear or branched pentoxy group), and a cyclic alkoxy group having 3 to 10 carbon atoms (for example, a cyclopentyloxy group and a cyclohexyloxy group).

Specific examples of the alkoxy group in the alkoxycarbonyl group as $R_{1c}$ to $R_{5c}$ include the same as those of the alkoxy group as $R_{1c}$ to $R_{5c}$.

Specific examples of the alkyl group in the alkylcarbonyloxy group and the alkylthio group as $R_{1c}$ to $R_{5c}$ include the same as those of the alkyl group as $R_{1c}$ to $R_{5c}$.

Specific examples of the cycloalkyl group in the cycloalkylcarbonyloxy group and the arylthio group as $R_{1c}$ to $R_{5c}$ include the same as those of the cycloalkyl group as $R_{1c}$ to $R_{5c}$.

Specific examples of the aryl group in the aryloxy group and the arylthio group as $R_{1c}$ to $R_{5c}$ include the same as those of the aryl group as $R_{1c}$ to $R_{5c}$.

Preferably, any one of $R_{1c}$ to $R_{5c}$ is a linear or branched alkyl group, a cycloalkyl group, or a linear, branched, or cyclic alkoxy group, and $R_{1c}$ to $R_{5c}$ more preferably has 2 to 15 carbon atoms in total, due to which the solvent solubility is more enhanced and production of particles during storage is be inhibited.

The ring structure formed by bonding of any two or more of $R_{1c}$ to $R_{5c}$ preferably includes a 5- or 6-membered ring, and particularly preferably a 6-membered ring (such as a phenyl ring).

The ring structure formed by the mutual bonding of $R_{5c}$ and $R_{6c}$ preferably includes a 4 or more-membered ring (preferably a 5- or 6-membered ring) formed with the carbonyl carbon atom and carbon atom in the general formula (I) by the mutual bonding of $R_{5c}$ and $R_{6c}$ to constitute a single bond or an alkylene group (a methylene group, an ethylene group, and the like).

The aryl group as any of $R_{6c}$ and $R_{7c}$ is an aryl group having 5 to 15 carbon atoms, and examples thereof include a phenyl group and a naphthyl group.

In one embodiment of $R_{6c}$ and $R_{7c}$, a case where both of $R_{6c}$ and $R_{7c}$ are alkyl groups is preferred. Particularly, a case where $R_{6c}$ and $R_{7c}$ are each a linear or branched alkyl group having 1 to 4 carbon atoms is preferred, and a case where both of them are methyl groups is particularly preferred.

Furthermore, in the case where $R_{6c}$ and $R_{7c}$ are combined to form a ring, the group formed by bonding of $R_{6c}$ and $R_{7c}$ is preferably an alkylene group having 2 to 10 carbon atoms, and examples thereof include an ethylene group, a propylene group, a butylene group, a pentylene group, and a hexylene group. Further, the ring formed by bonding of $R_{6c}$ and $R_{7c}$ may contain a heteroatom such as an oxygen atom in the ring.

Examples of the alkyl group and the cycloalkyl group as $R_x$ and $R_y$ include the same as those of the alkyl group and the cycloalkyl group as in $R_{1c}$ to $R_{7c}$.

Examples of the 2-oxoalkyl group and the 2-oxocycloalkyl group as $R_x$ and $R_y$ include a group containing >C=O at the 2-position of the alkyl group and the cycloalkyl group as $R_{1c}$ to $R_{7c}$.

Examples of the alkoxy group in the alkoxycarbonylalkyl group as $R_x$ and $R_y$ are the same as those of the alkoxy group in $R_{1c}$ to $R_{5c}$. Examples of the alkyl group include an alkyl group having 1 to 12 carbon atoms, and preferably a linear alkyl group having 1 to 5 carbon atoms (for example, a methyl group and an ethyl group).

The allyl group as $R_x$ and $R_y$ is not particularly limited but is preferably an unsubstituted allyl group or an allyl group substituted with a monocyclic or polycyclic cycloalkyl group (preferably a cycloalkyl group having 3 to 10 carbon atoms).

The vinyl group as $R_x$ and $R_y$ is not particularly limited but is preferably an unsubstituted vinyl group or a vinyl group substituted with a monocyclic or polycyclic cycloalkyl group (preferably a cycloalkyl group having 3 to 10 carbon atoms).

The ring structure which may be formed by the mutual bonding of $R_{5c}$ and $R_x$ includes a 5-membered or higher ring (particularly preferably a 5-membered ring), fowled together with a sulfur atom and a carbonyl carbon atom in the general formula (I) by the mutual boding of $R_{5c}$ and $R_x$ to constitute a single bond or an alkylene group (a methylene group, an ethylene group, or the like).

The ring structure which may be formed by the mutual bonding of $R_x$ and $R_y$ includes a 5- or 6-membered ring, and particularly preferably a 5-membered ring (that is, tetrahydrothiophene ring), formed together with a sulfur atom in the general formula (ZI-3) and divalent $R_x$ and $R_y$ (for example, a methylene group, and ethylene group, and a propylene group).

$R_x$ and $R_y$ are each preferably an alkyl group, or a cycloalkyl group having 4 or more carbon atoms, more preferably an alkyl group, or a cycloalkyl group having 6 or more carbon atoms, and still more preferably an alkyl group, or a cycloalkyl group having 8 or more carbon atoms.

$R_{1c}$ to $R_{7c}$, $R_x$ and $R_y$ may further contain a substituent, and examples of such a substituent include a halogen atom (for example, a fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, and an aryloxycarbonyloxy group.

In the general formula (ZI-3), more preferably, $R_{1c}$, $R_{2c}$, $R_{4c}$, and $R_{5c}$ each independently represent a hydrogen atom, and $R_{3c}$ represents a group other than a hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, Specific examples of the cation in the compound represented by the general formula (ZI-2) or (ZI-3) in the present invention will be shown below.

[Chem. 43]

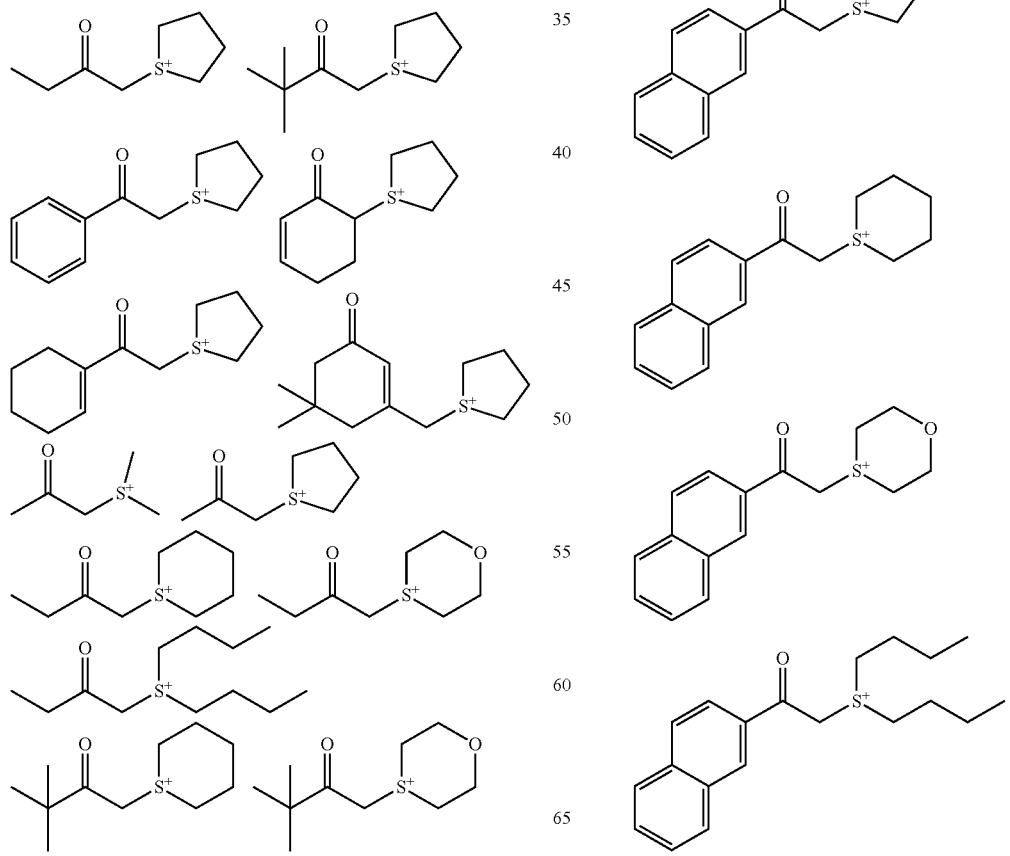

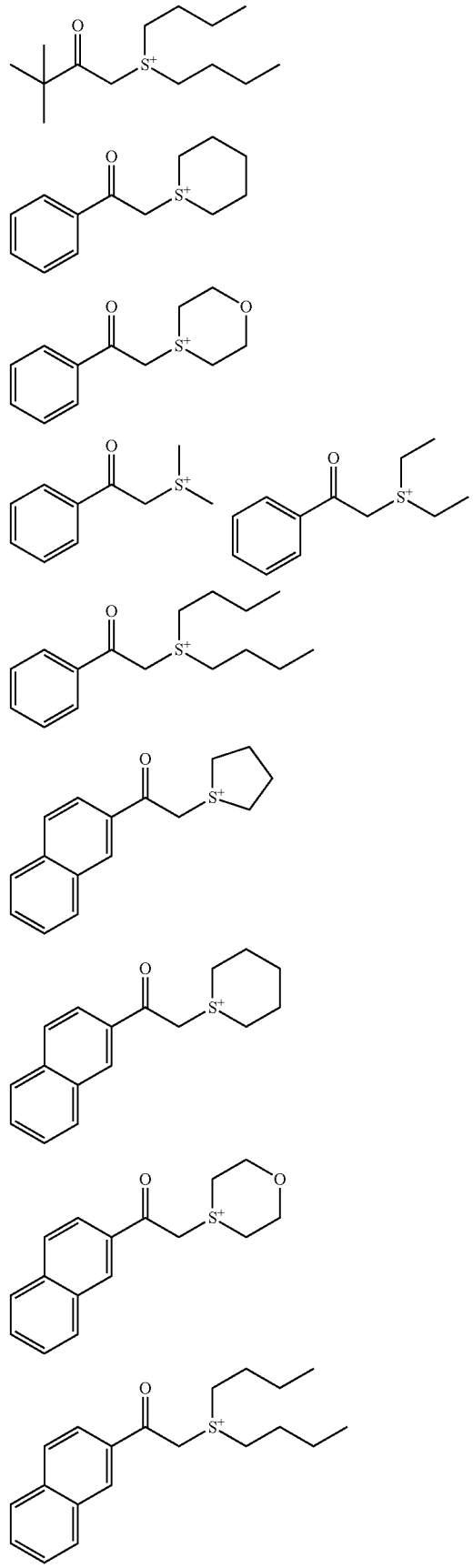

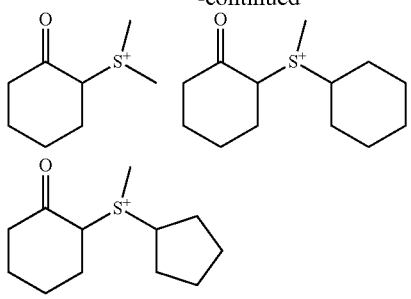
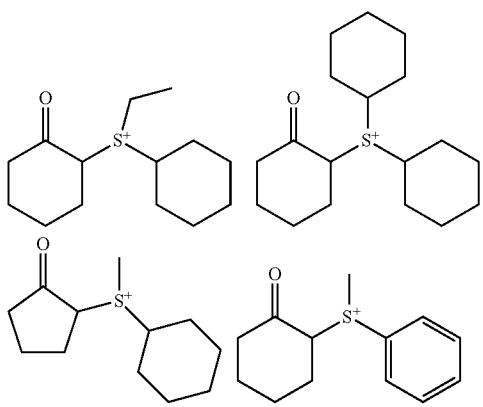
[Chem. 44]
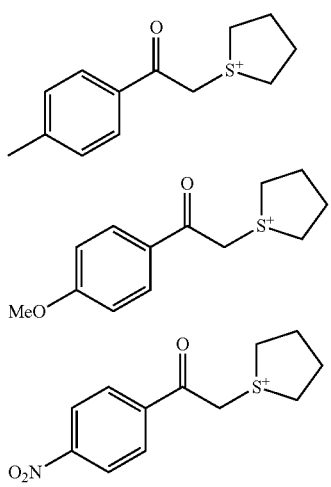
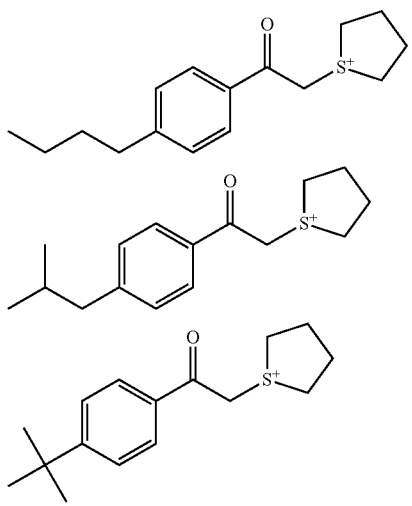
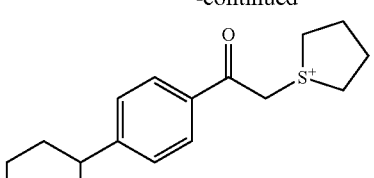
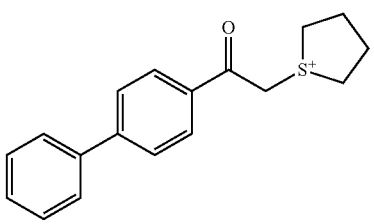
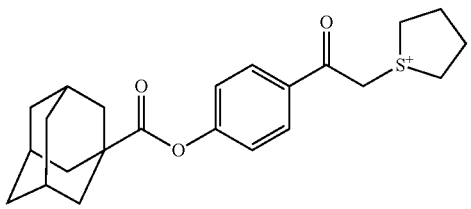
[Chem. 45]
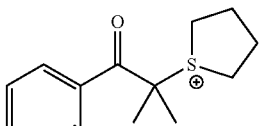
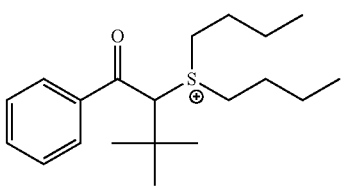
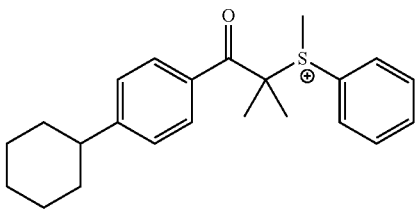
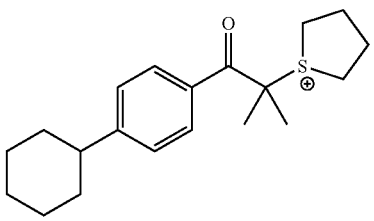
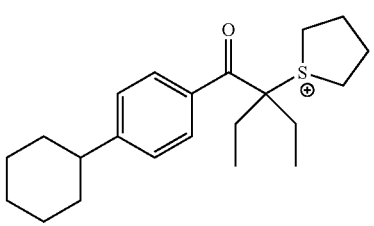

-continued
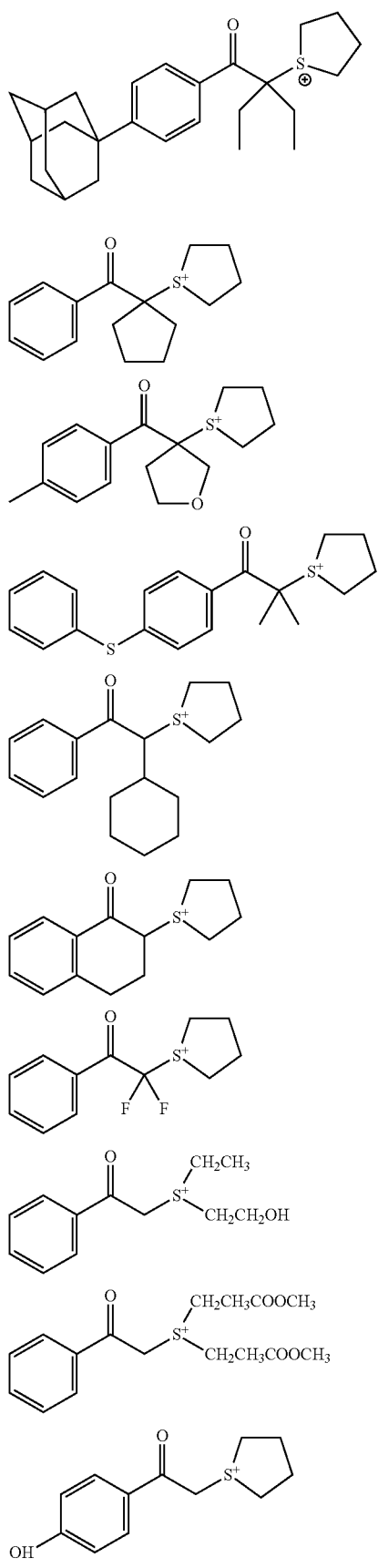
-continued
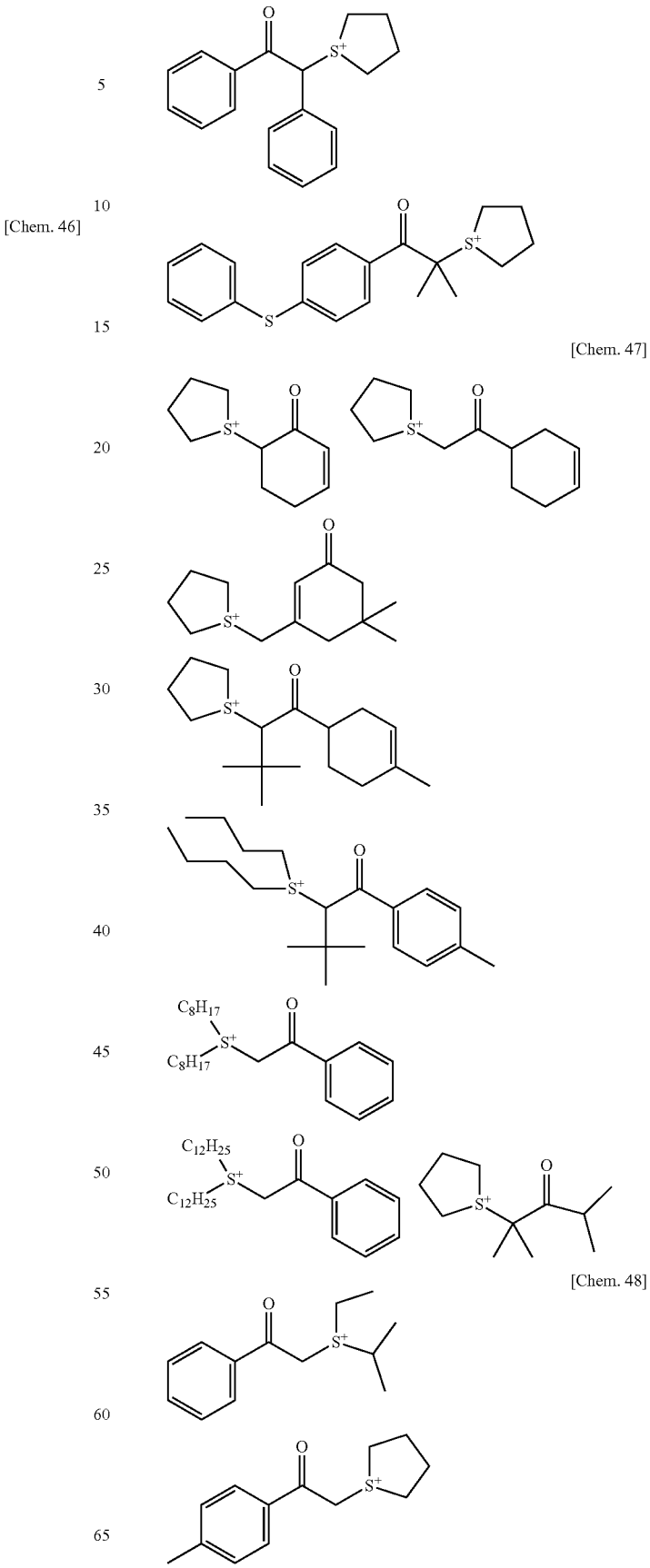
[Chem. 46]
[Chem. 47]
[Chem. 48]

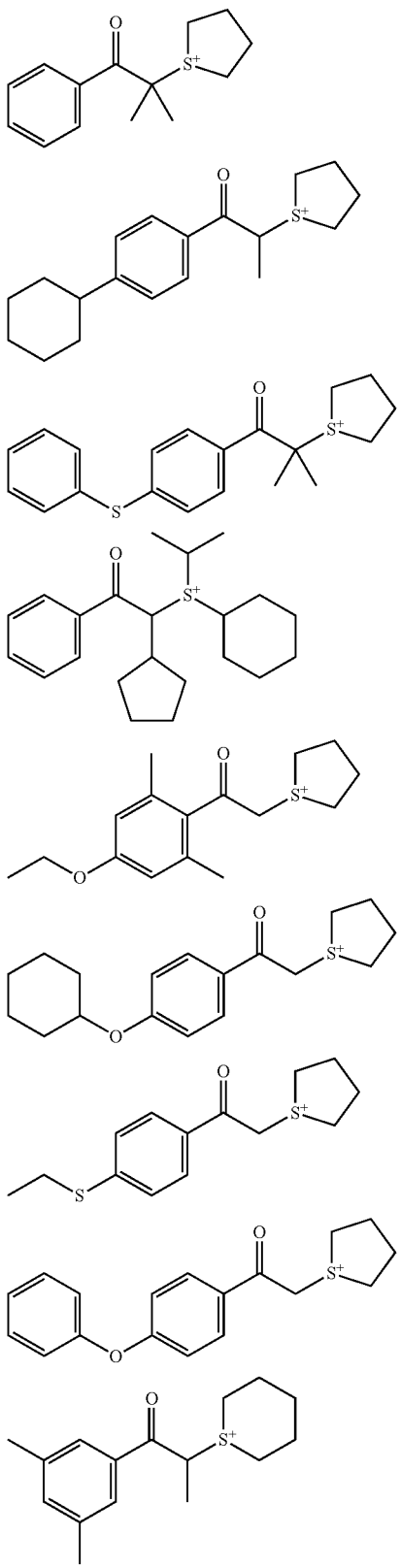

Next, the compound (ZI-4) will be described.

The compound (ZI-4) is represented by the following general formula (ZI-4).

[Chem. 49]

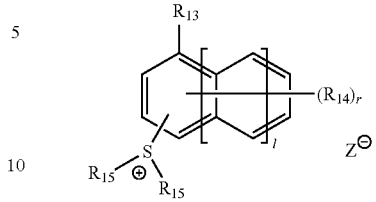

(ZI-4)

In the general formula (ZI-4), $R_{13}$ represents a group containing a hydrogen atom, a fluorine atom, a hydroxyl group, an alkyl group, a cycloalkyl group, an alkoxy group, an alkoxycarbonyl group, or a cycloalkyl group, wherein these groups may have a substituent.

When a plurality of $R_{14}$'s are present, they each independently represent a group containing a hydroxyl group, an alkyl group, a cycloalkyl group, an alkoxy group, an alkoxycarbonyl group, an alkylcarbonyl group, an alkylsulfonyl group, a cycloalkylsulfonyl group, or a cycloalkyl group. These groups may have a substituent.

$R_{15}$'s each independently represent an alkyl group, a cycloalkyl group, or a naphthyl group. Two $R_{15}$'s may be bonded to each other to form a ring. These groups may have a substituent.

l represents an integer of 0 to 2.

r represents an integer of 0 to 8.

$Z^-$ represents a non-nucleophilic anion, and examples thereof include the same non-nucleophilic anions as mentioned above as examples of $Z^-$ in the general formula (ZI).

In the general formula (ZI-4), the alkyl group of $R_{13}$, $R_{14}$, and $R_{15}$ is linear or branched, preferably has 1 to 10 carbon atoms, and preferred examples thereof include a methyl group, an ethyl group, an n-butyl group, and a t-butyl group.

Examples of the cycloalkyl group of $R_{13}$, $R_{14}$, and $R_{15}$ include a monocyclic or polycyclic cycloalkyl group (preferably a cycloalkyl group having 3 to 20 carbon atoms), and particularly preferred examples thereof include cyclopropyl, cyclopentyl, cyclohexyl, cycloheptyl, and cyclooctyl.

The alkoxy group of $R_{13}$ and $R_{14}$ is linear or branched, preferably has 1 to 10 carbon atoms, and preferred examples thereof include a methoxy group, an ethoxy group, an n-propoxy group, and an n-butoxy group.

The alkoxycarbonyl group of $R_{13}$ and $R_{14}$ is linear or branched, preferably has 2 to 11 carbon atoms, and preferred examples thereof include a methoxycarbonyl group, an ethoxycarbonyl group, and an n-butoxycarbonyl group.

Examples of the group having a cycloalkyl group of $R_{13}$ and $R_{14}$ include a monocyclic or polycyclic cycloalkyloxy group (preferably a cycloalkyl group having of 3 to 20 carbon atoms), and examples thereof include a monocyclic or polycyclic cycloalkyloxy group and an alkoxy group having a monocyclic or polycyclic cycloalkyl group. These groups may further have a substituent.

The monocyclic or polycyclic cycloalkyloxy group of $R_{13}$ and $R_{14}$ preferably has a total number of carbon atoms of 7 or more, more preferably a total number of carbon atoms of 7 to 15, and preferably has a monocyclic cycloalkyl group. The monocyclic cycloalkyloxy group having a total number of carbon atoms of 7 or more indicates a monocyclic cycloalkyloxy group where a cycloalkyloxy group such as a cyclopropyloxy group, a cyclobutyloxy group, a cyclopentyloxy group, a cyclohexyloxy group, a cycloheptyloxy group, a cyclooctyloxy group, and a cyclododecanyloxy group arbitrarily has a substituent such as an alkyl group such as a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group, and an iso-amyl group; a hydroxyl group; a halogen atom (fluorine, chlorine, bromine, and iodine); a nitro group; a cyano group; an amido group; a sulfonamido group; an alkoxy group such as a methoxy group, an ethoxy group, a hydroxyethoxy group, a propoxy group, a hydroxypropoxy group, and a butoxy group; an alkoxycarbonyl group such as a methoxycarbonyl group, and an ethoxycarbonyl group; an acyl group such as a formyl group, an acetyl group, and a benzoyl group; and an acyloxy group such as an acetoxy group and a butyryloxy group; and a carboxy group, and where the total number of carbon atoms of carbon atoms of an arbitrary substituent on the cycloalkyl group is 7 or more.

Furthermore, examples of the polycyclic cycloalkyloxy group having a total number of carbon atoms of 7 or more include a norbornyloxy group, a tricyclodecanyloxy group, a tetracyclodecanyloxy group, and an adamantyloxy group.

The alkoxy group having a monocyclic or polycyclic cycloalkyl group of $R_{13}$ and $R_{14}$ preferably has a total number of carbon atoms of 7 or more, and more preferably a total number of carbon atoms of 7 to 15, and is preferably an alkoxy group having a monocyclic cycloalkyl group. The alkoxy group having a total number of carbon atoms of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy, and iso-amyloxy, in which where the total number of carbon atoms of the substituent is 7 or more. Examples thereof include a cyclohexylmethoxy group, a cyclopentylethoxy group, and a cyclohexylethoxy group, with a cyclohexylmethoxy group being preferred.

Furthermore, examples of the alkoxy group having a total number of carbon atoms of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$.

The alkylsulfonyl group or the cycloalkylsulfonyl group of $R_{14}$ is linear, branched, or cyclic, preferably has 1 to 10 carbon atoms, and preferred examples thereof include a methanesulfonyl group, an ethanesulfonyl group, an n-propanesulfonyl group, an n-butanesulfonyl group, a cyclopentanesulfonyl group, and a cyclohexanesulfonyl group.

Examples of the substituent which each of the groups above may have include a halogen atom (for example, a fluorine atom), a hydroxyl group, a carboxyl group, a cyano group, a nitro group, an alkoxy group, an alkoxyalkyl group, an alkoxycarbonyl group, and an alkoxycarbonyloxy group.

Examples of the alkoxy group include a linear, branched, or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group.

Examples of the alkoxyalkyl group include a linear, branched, or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group.

Examples of the alkoxycarbonyl group include a linear, branched, or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl.

Examples of the alkoxycarbonyloxy group include a linear, branched, or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group, and a cyclohexyloxycarbonyloxy group.

Examples of the ring structure which may be formed by the mutual bonding of two $R_{15}$'s include a 5- or 6-membered ring, preferably a 5-membered ring (that is, a tetrahydrothiophene ring), formed together with the sulfur atom in the general formula (ZI-4) by two $R_{15}$'s and may be condensed with an aryl group or a cycloalkyl group. The ring structure may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group, and an alkoxycarbonyloxy group. As for the substituent on the ring structure, a plurality of substituents may be present, and they may be bonded to each other to form a ring (an aromatic or non-aromatic hydrocarbon ring, an aromatic or non-aromatic heterocyclic ring, a polycyclic condensed ring formed by combination of two or more of these rings, or the like).

In the general formula (ZI-4), $R_{15}$ is preferably, for example, a methyl group, an ethyl group, a naphthyl group, or a divalent group for forming a tetrahydrothiophene ring structure together with the sulfur atom when two $R_{15}$'s are bonded to each other, or the like.

The substituent which $R_{13}$ and $R_{14}$ may have is preferably a hydroxyl group, an alkoxy group, an alkoxycarbonyl group, or a halogen atom (particularly a fluorine atom).

l is preferably 0 or 1, and more preferably 1.

r is preferably from 0 to 2.

Specific examples of the cation in the compound represented by the general formula (ZI-4) in the present invention will be shown below.

[Chem. 50]

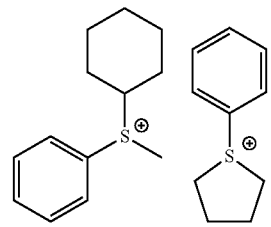

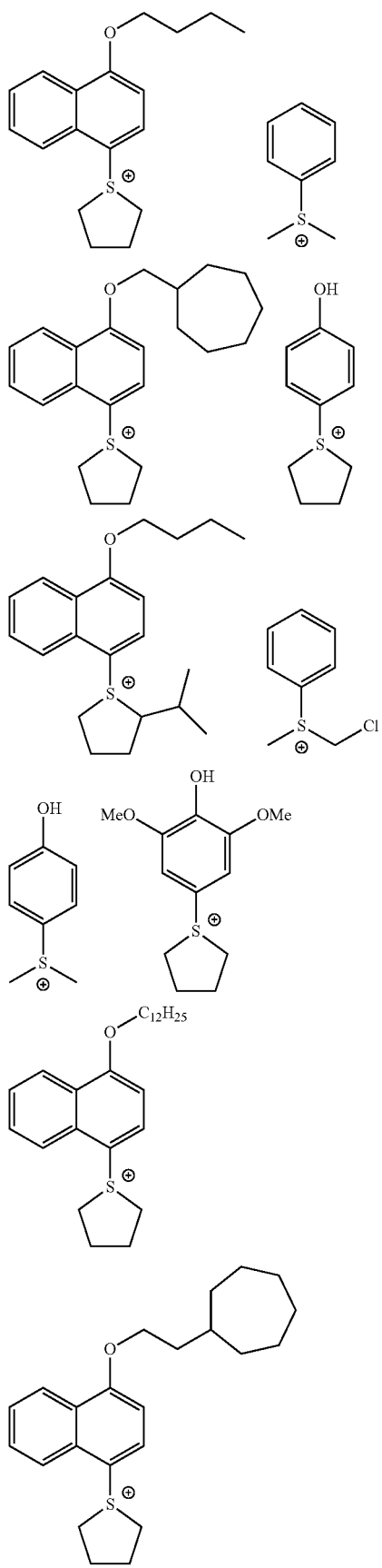
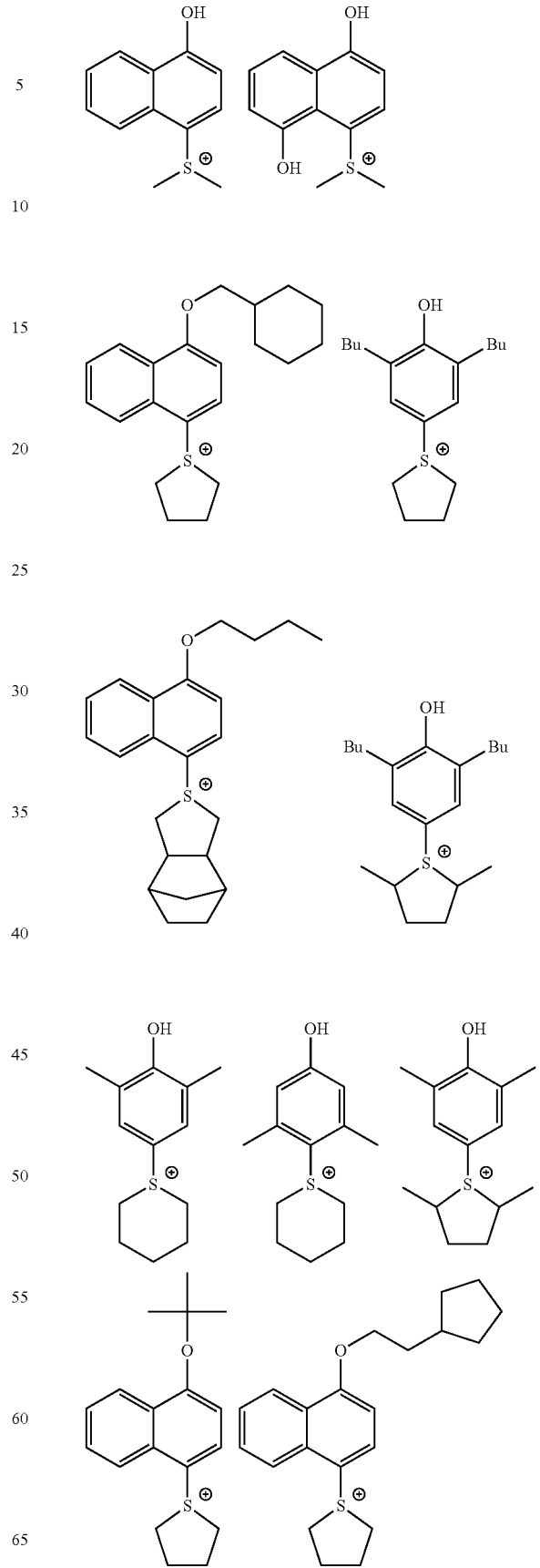

91
-continued
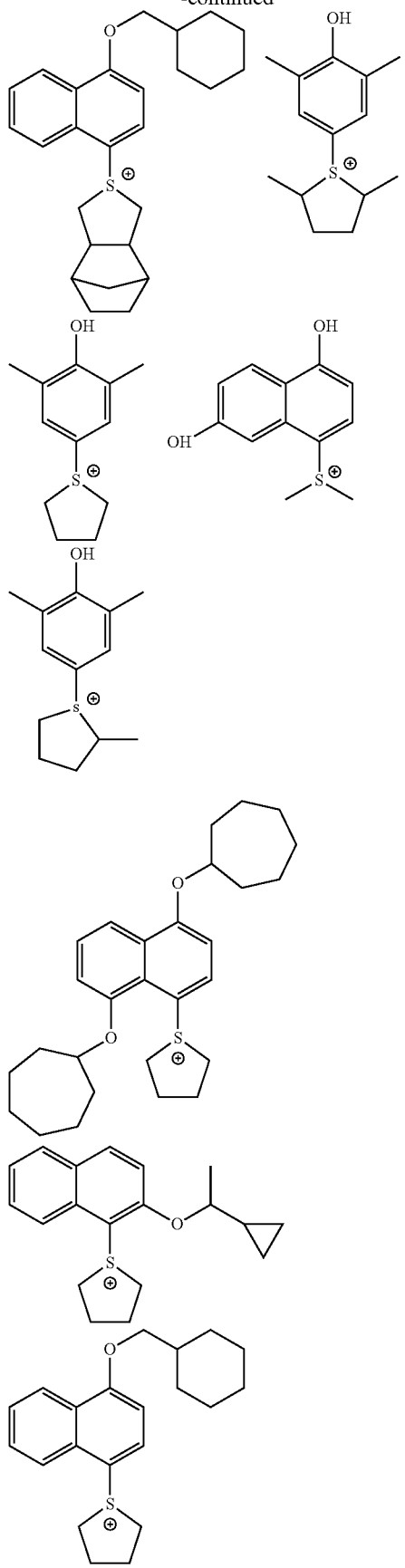
92
-continued
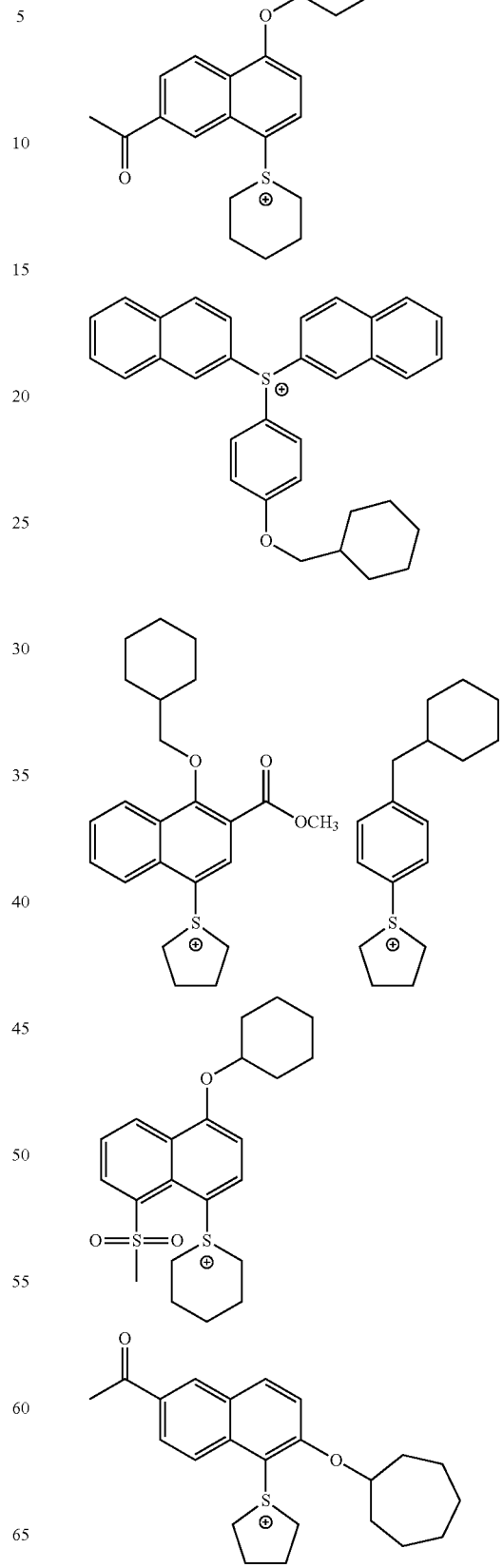
[Chem. 51]

-continued

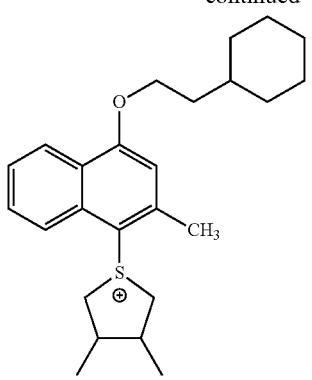

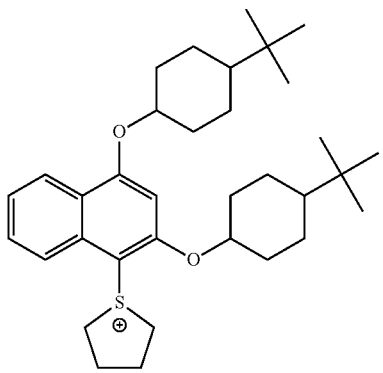

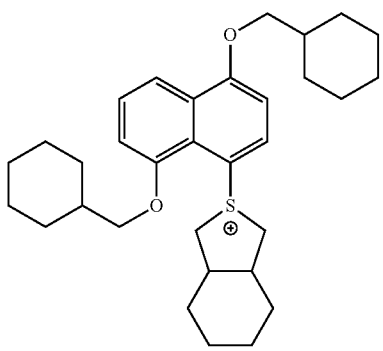

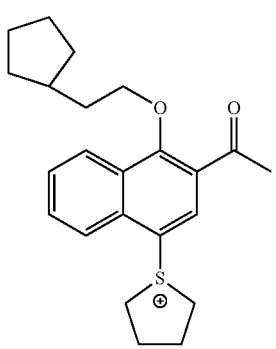

-continued

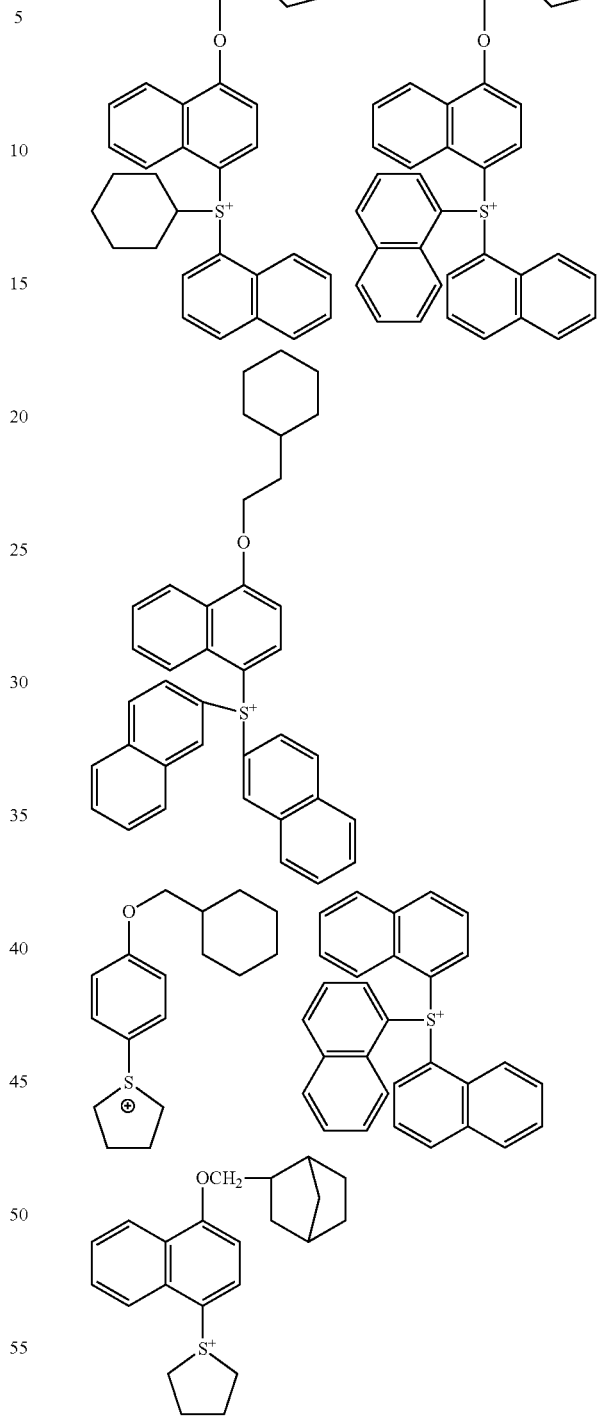

Next, the general formulae (ZII) and (ZIII) will be described.

In the general formulae (ZII) and (ZIII), $R_{204}$ to $R_{207}$ each independently represent an aryl group, an alkyl group, or a cycloalkyl group.

the aryl group of $R_{204}$ to $R_{207}$ is preferably a phenyl group or a naphthyl group, and more preferably a phenyl group. The aryl group of $R_{204}$ to $R_{207}$ may be an aryl group having a heterocyclic structure containing an oxygen atom, a nitrogen atom, a sulfur atom or the like. Examples of the skeleton of the aryl group having a heterocyclic structure include pyrrole, furan, thiophene, indole, benzofuran, and benzothiophene.

Preferred examples of the alkyl group and cycloalkyl group in $R_{204}$ to $R_{207}$ include a linear or branched alkyl group having 1 to 10 carbon atoms (for example, a methyl group, an ethyl group, a propyl group, a butyl group, a pentyl group), and a cycloalkyl group having 3 to 10 carbon atoms (a cyclopentyl group, a cyclohexyl group, or a norbonyl group).

The aryl group, the alkyl group, and the cycloalkyl group of $R_{204}$ to $R_{207}$ may have a substituent. Examples of the substituent that the aryl group, the alkyl group, and the cycloalkyl group of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents a non-nucleophilic anion, and examples thereof include the same non-nucleophilic anions as mentioned above as examples of $Z^-$ in the general formula (ZI).

Further examples of the acid generator include compounds represented by the following general formulae (ZIV), (ZV), and (ZVI).

[Chem. 52]

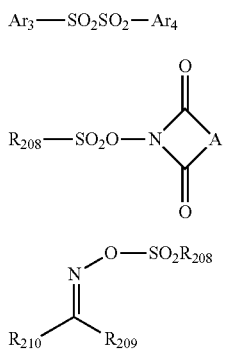

In the general formulae (ZIV) to (ZVI),
$Ar_3$ and $Ar_4$ each independently represent an aryl group,
$R_{208}$, $R_{209}$, and $R_{210}$ each independently represent an alkyl group, a cycloalkyl group, or an aryl group, and
A represents an alkylene group, an alkenylene group, or an arylene group.

Specific examples of the aryl group of $Ar_3$, $Ar_4$, $R_{208}$, $R_{209}$, and $R_{210}$ are the same as specific examples of the aryl group of $R_{201}$, $R_{202}$, and $R_{203}$ in the general formula (ZI-1).

Specific examples of the alkyl group and cycloalkyl group of $R_{208}$, $R_{209}$, and $R_{210}$ are the same as specific examples of the alkyl group and cycloalkyl group of $R_{201}$, $R_{202}$, and $R_{203}$ in the general formula (ZI-2), respectively.

Examples of the alkylene group of A include an alkylene group having 1 to 12 carbon atoms (for example, a methylene group, an ethylene group, a propylene group, an isopropylene group, a butylene group, and an isobutylene group); examples of the alkenylene group of A include an alkenylene group having 2 to 12 carbon atoms (for example, an ethenylene group, a propenylene group, and a butenylene group); and examples of the arylene group of A include an arylene group having 6 to 10 carbon atoms (for example, a phenylene group, a tolylene group, and a naphthylene group).

Among the acid generators, compounds represented by the general formulae (ZI) to (ZIII) are more preferred.

Furthermore, the acid generator is preferably a compound that generates an acid having one sulfonic acid group or imide group, more preferably a compound that generates a monovalent perfluoroalkanesulfonic acid, a compound that generates an aromatic sulfonic acid substituted with a monovalent fluorine atom or a fluorine atom-containing group, or a compound that generates an imide acid substituted with a monovalent fluorine atom or a fluorine atom-containing group, and still more preferably a sulfonium salt of a fluoro-substituted alkanesulfonic acid, fluorine-substituted benzenesulfonic acid, fluorine-substituted imide acid or fluorine-substituted methide acid. The acid generator which can be used is particularly preferably a compound that generates a fluoro-substituted alkanesulfonic acid, a fluoro-substituted benzenesulfonic acid, or a fluoro-substituted imide acid, wherein pKa of the acid generated is −1 or less, and in this case, the sensitivity can be enhanced.

In one preferred embodiment of the present invention, the acid generator is represented by the following general formula (I'). When it is represented by the following general formula (I'), the light transmission of a film is improved, which in turn contributes to improvement of LWR (Line Width Roughness) and DOF (Depth of Focus).

[Chem. 53]

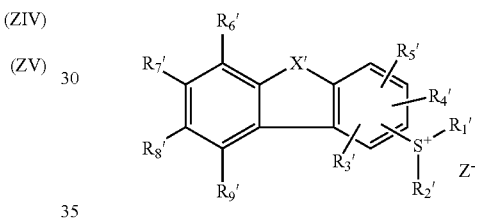

In the general formula (I'),

X' represents an oxygen atom, a sulfur atom, or —N($R_x'$)—. $R_1'$ and $R_2'$ may be linked to each other to form a ring. Further, any two or more members of $R_6'$ to $R_9'$, $R_3'$ and $R_9'$, $R_4'$ and $R_5'$, $R_5'$ and $R_x'$, or $R_6'$ and $R_x'$ may be linked to each other to form a ring.

$R_1'$ and $R_2'$ each independently represent an alkyl group, a cycloalkyl group, or an aryl group.

$R_3'$ to $R_9'$ each independently represent a hydrogen atom, an alkyl group, a cycloalkyl group, an alkoxy group, an alkoxycarbonyl group, an acyl group, an alkylcarbonyloxy group, an aryl group, an aryloxy group, an aryloxycarbonyl group, or an arylcarbonyloxy group.

$R_x'$ represents a hydrogen atom, an alkyl group, a cycloalkyl group, an acyl group, an alkenyl group, an alkoxycarbonyl group, an aryl group, an arylcarbonyl group, or an aryloxycarbonyl group.

$Z^-$ represents a non-nucleophilic anion, and examples thereof include the same non-nucleophilic anions as mentioned above as examples of $Z^-$ in the general formula (ZI).

Among the acid generators, particularly preferred examples are shown below.

[Chem. 54]

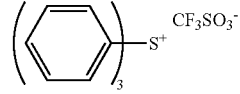

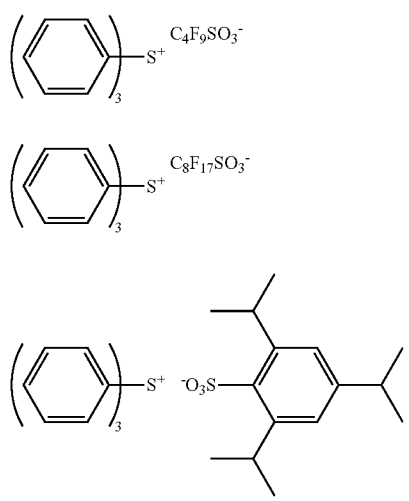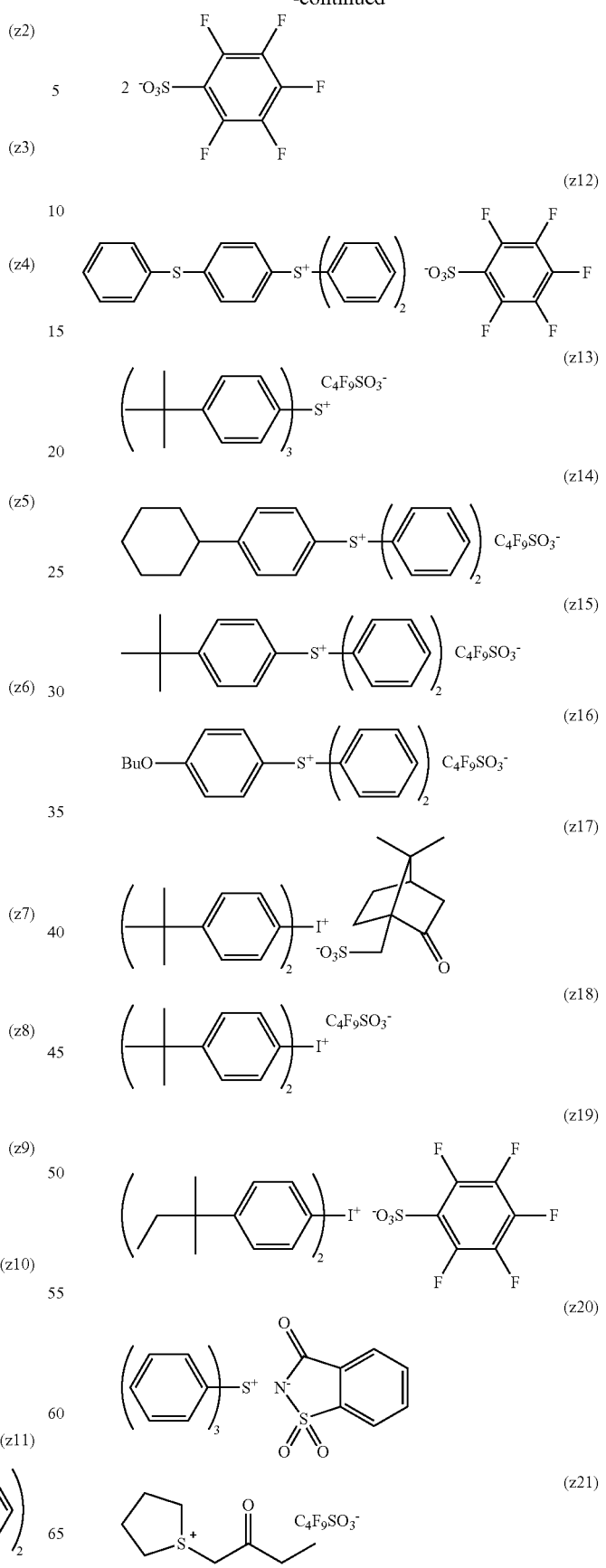

-continued
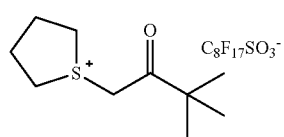 (z22)
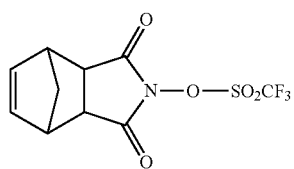 (z23)
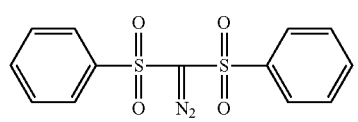 (z24)
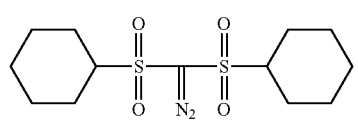 (z25)
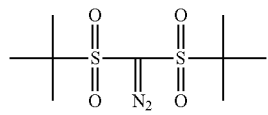 (z26)
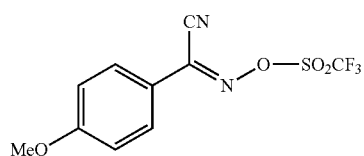 (z27)
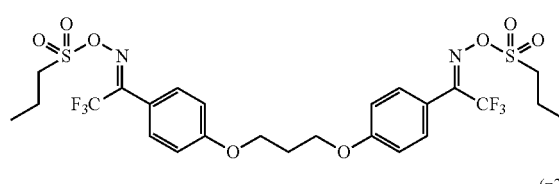 (z28)
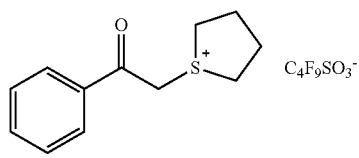 (z29)
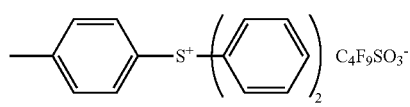 (z30)
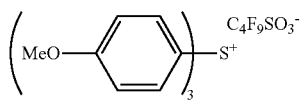 (z31)

-continued

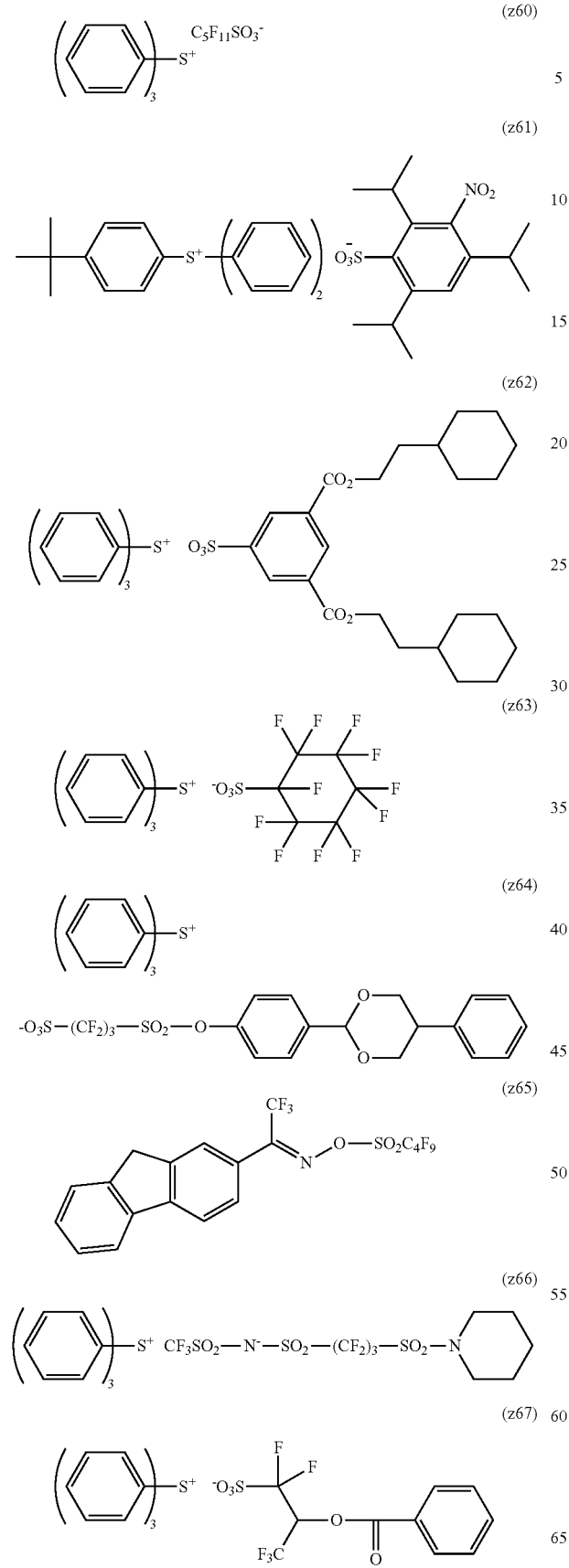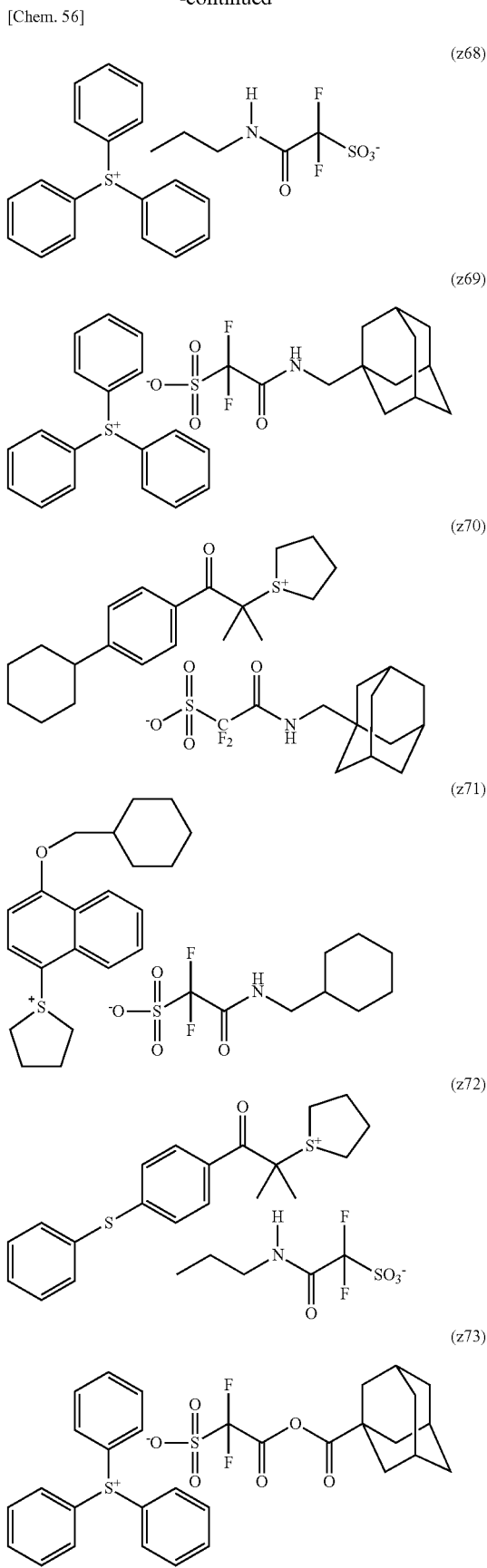

(z74) 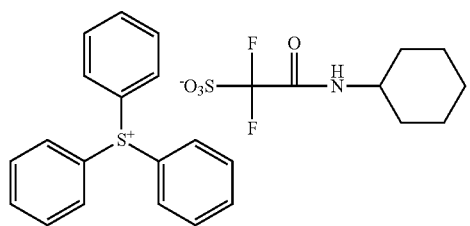
(z75) 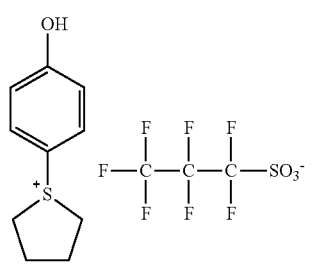
(z76) 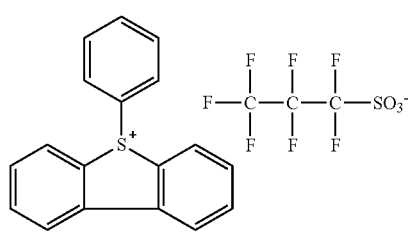
(z77) 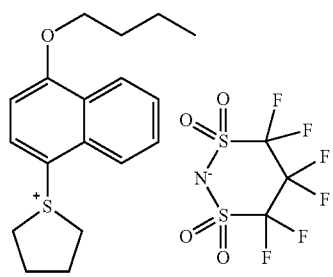
(z78) 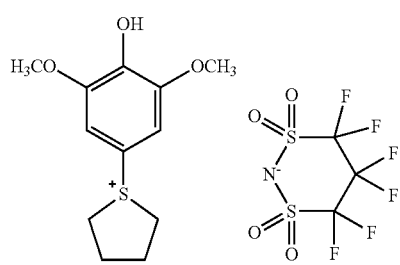
(z79) 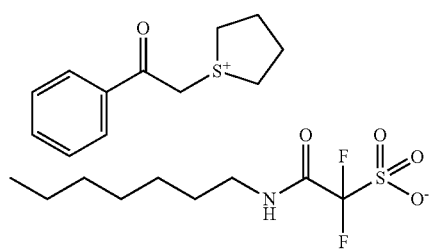
(z80) 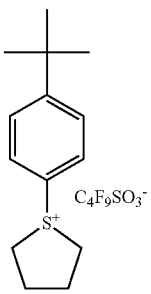
(z81) 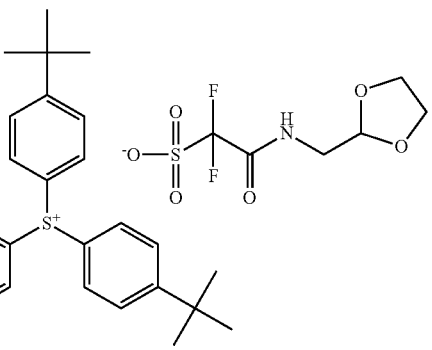
(z82) 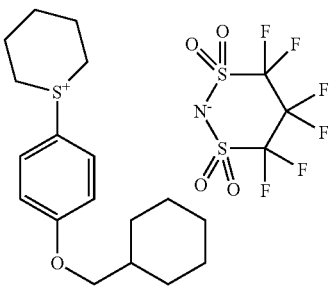
(z83) 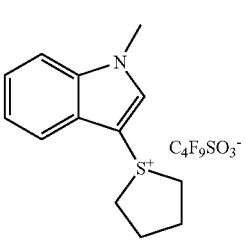
(z84) 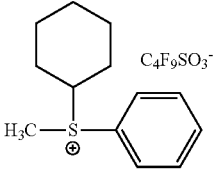

(z85)
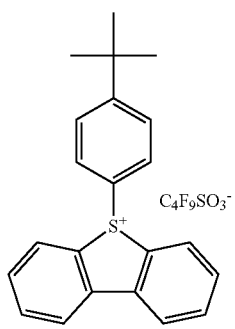
(z86)
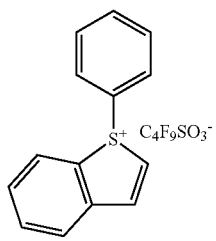
(z87)
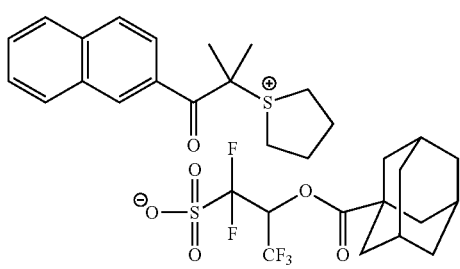
(z88)
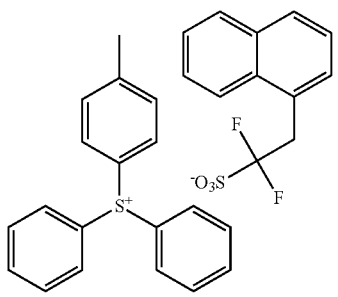
[Chem. 57]
(z89)
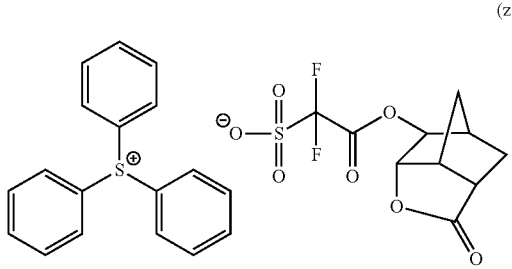
(z90)
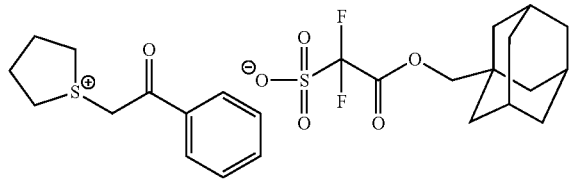
(z91)
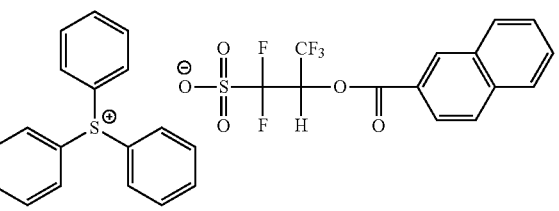
(z92)
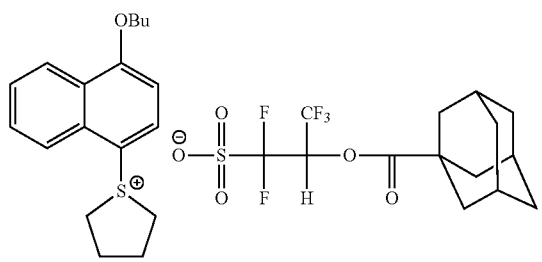
[Chem. 58]
(z93)
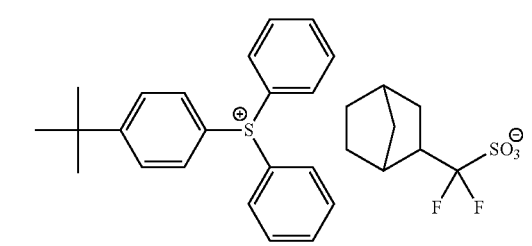
(z94)
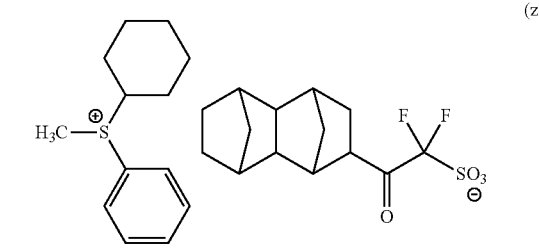
(z95)
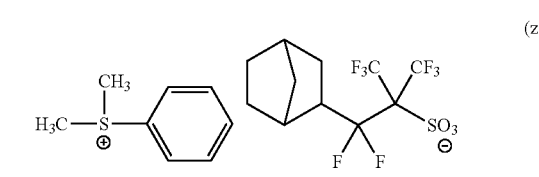
(z96)
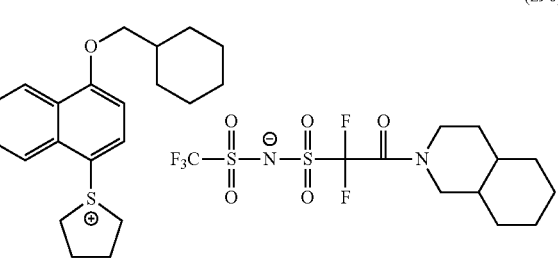

(z97)
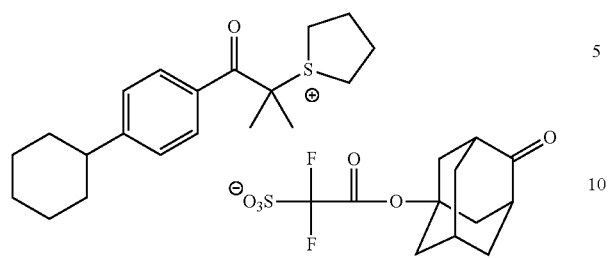
(z98)
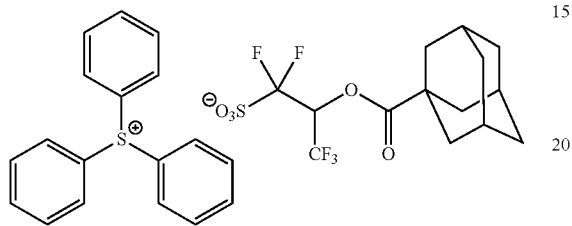
(z99)
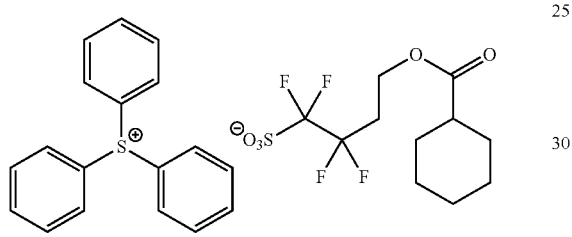
(z100)
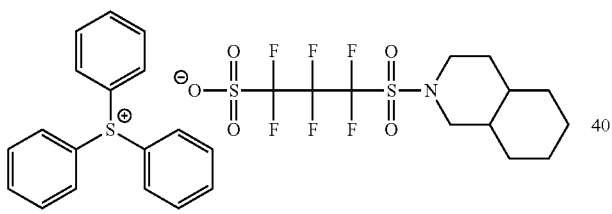
(z101)
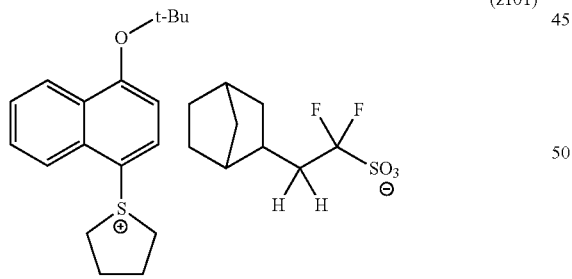
(z102)
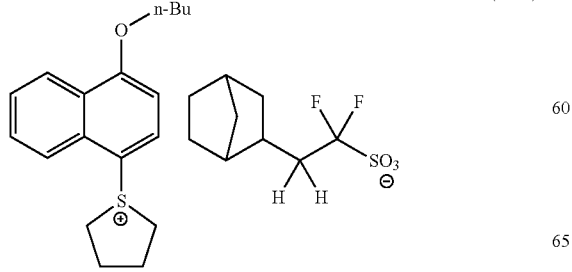
[Chem. 59]
(z103)
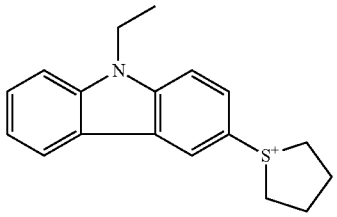
(z104)
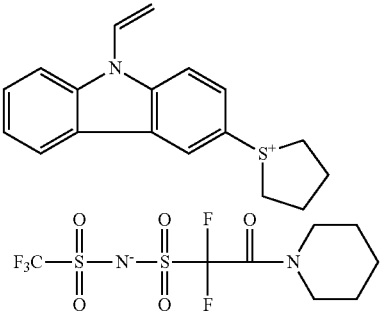
(z105)
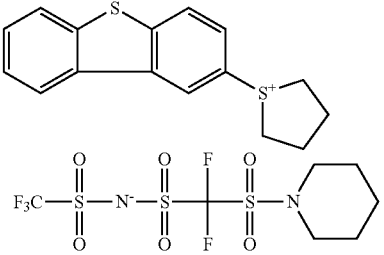
(z106)
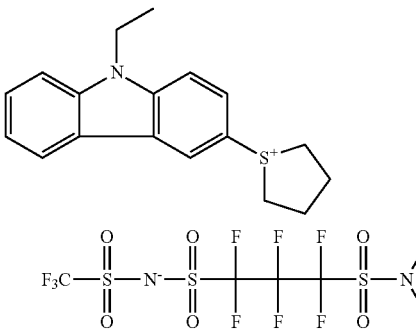
(z107)
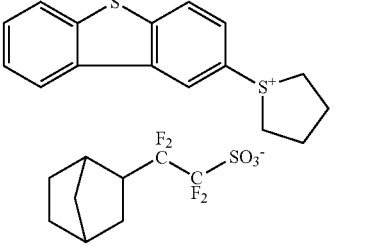

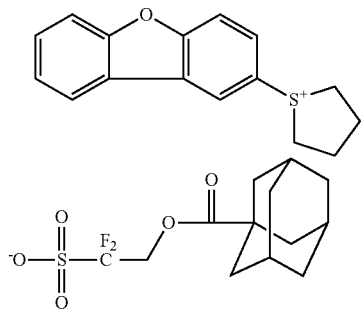
(z108)

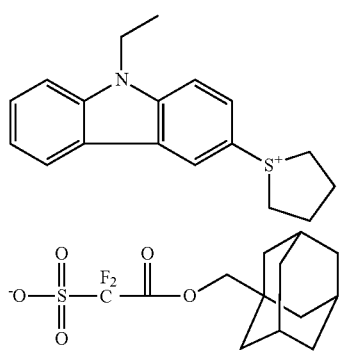
(z109)

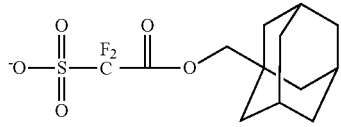
(z110)

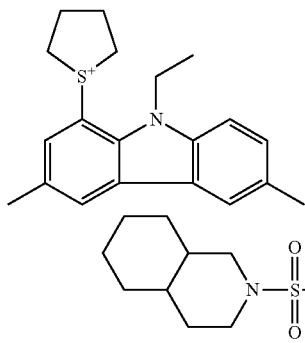

The acid generator can be synthesized by a known method, for example, can be synthesized in accordance with the method described in JP2007-161707A.

As for the acid generator, one kind may be used, or two or more kinds may be used in combination.

The content of the acid generator in the composition is preferably from 0.1 to 30 mass %, more preferably from 3 to 25 mass %, still more preferably from 7 to 20 mass %, based on the entire solid content of the composition.

[4] Hydrophobic Resin (HR)

The actinic-ray-sensitive or radiation-sensitive resin composition of the present invention may contain a hydrophobic resin having at least either fluorine atoms or silicon atoms (hereinafter, also referred to as a "hydrophobic resin (HR)") particularly when the resist composition is applied to liquid immersion exposure. The hydrophobic resin (HR) is unevenly distributed at the film surface layer and when the liquid immersion medium is water, the static/dynamic contact angle on the resist film surface for water as well as the followability of a liquid for liquid immersion can be enhanced.

The hydrophobic resin (HR) is, as described above, unevenly distributed at the interface but unlike a surfactant, need not necessarily have a hydrophilic group in the molecule and may not contribute to uniform mixing of polar/nonpolar substances.

The hydrophobic resin typically contains fluorine atoms and/or silicon atoms. The fluorine atoms and/or silicon atoms in the hydrophobic resin (HR) may be included in the main chain of the resin or may be included in the side chain.

In the case where the hydrophobic resin contains fluorine atoms, the resin preferably contains, as a fluorine atom-containing partial structure, a fluorine atom-containing alkyl group, a fluorine atom-containing cycloalkyl group or a fluorine atom-containing aryl group.

The fluorine atom-containing alkyl group, preferably having 1 to 10 carbon atoms, and more preferably 1 to 4 carbon atoms, is a linear or branched alkyl group with at least one hydrogen atom substituted with a fluorine atom and may further have a substituent other than the fluorine atom.

The fluorine atom-containing cycloalkyl group is a monocyclic or polycyclic cycloalkyl group with at least one hydrogen atom substituted with a fluorine atom and may further have a substituent other than the fluorine atom.

The fluorine atom-containing aryl group is an aryl group, such as a phenyl group and a naphthyl group, that has at least one hydrogen atom substituted with a fluorine atom and may further have a substituent other than the fluorine atom.

Preferred examples of the fluorine atom-containing alkyl group, fluorine atom-containing cycloalkyl group and fluorine atom-containing aryl group include the groups represented by the following general formulae (F2) to (F4), but the present invention is not limited thereto.

[Chem. 60]

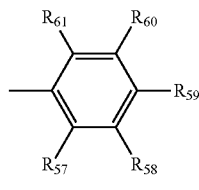
(F2)

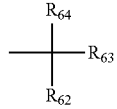
(F3)

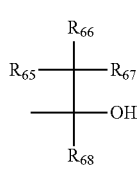
(F4)

In the general formulae (F2) to (F4), $R_{57}$ to $R_{68}$ each independently represent a hydrogen atom, a fluorine atom or an (linear or branched) alkyl group, provided that at least one of $R_{57}$ to $R_{61}$, at least one of $R_{62}$ to $R_{64}$, and at least one of $R_{65}$ to $R_{68}$ each independently represent a fluorine atom or an alkyl group (preferably having 1 to 4 carbon atoms) with at least one hydrogen atom substituted with a fluorine atom.

It is preferable that all of $R_{57}$ to $R_{61}$ and $R_{65}$ to $R_{67}$ be fluorine atoms. $R_{62}$, $R_{63}$ and $R_{68}$ are each preferably a fluoroalkyl group (preferably having 1 to 4 carbon atoms), and more preferably a perfluoroalkyl group having 1 to 4 carbon atoms. When $R_{62}$ and $R_{63}$ are perfluoroalkyl groups, $R_{64}$ is preferably a hydrogen atom. $R_{62}$ and $R_{63}$ may be linked to each other to form a ring.

Specific examples of the group represented by the general formula (F2) include a p-fluorophenyl group, a pentafluorophenyl group, and a 3,5-di(trifluoromethyl)phenyl group.

Specific examples of the group represented by the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Among these, a hexafluoroisopropyl group, a heptafluoroisopropyl group, a hexafluoro(2-methyl)isopropyl group, an octafluoroisobutyl group, a nonafluoro-t-butyl group, and a perfluoroisopentyl group are preferred, and a hexafluoroisopropyl group and a heptafluoroisopropyl group are more preferred.

Specific examples of the group represented by the general formula (F4) include —C(CF$_3$)$_2$OH, —C(C$_2$F$_5$)$_2$OH, —C(CF$_3$)(CH$_3$)OH, and —CH(CF$_3$)OH, with —C(CF$_3$)$_2$OH being preferred.

The fluorine atom-containing partial structure may be bonded directly to the main chain or may be bonded to the main chain through a group selected from the group consisting of an alkylene group, a phenylene group, an ether bond, a thioether bond, a carbonyl group, an ester bond, an amide bond, a urethane bond and a ureylene bond, or a group formed by the combination of two or more thereof.

Preferred examples of the repeating units having a fluorine atom are shown below.

[Chem. 61]

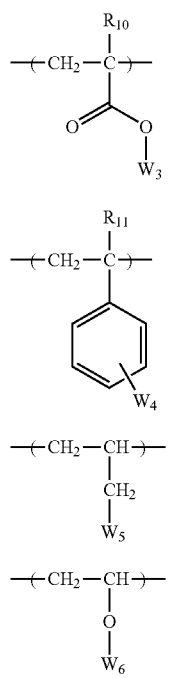

In the formulae, $R_{10}$ and $R_{11}$ each independently represent a hydrogen atom, a fluorine atom or an alkyl group. The alkyl group is preferably a linear or branched alkyl group having 1 to 4 carbon atoms and may have a substituent, and the alkyl group having a substituent includes, in particular, a fluorinated alkyl group.

$W_3$ to $W_6$ each independently represent an organic group having at least one or more fluorine atoms and specifically includes the atomic groups of (F2) to (F4) above.

Other than these, the hydrophobic resin may contain a unit shown below as the repeating units having a fluorine atom.

[Chem. 62]

In the formulae, $R_4$ to $R_7$ each independently represent a hydrogen atom, a fluorine atom or an alkyl group. The alkyl group is preferably a linear or branched alkyl group having 1 to 4 carbon atoms and may have a substituent, and the alkyl group having a substituent includes, in particular, a fluorinated alkyl group.

However, at least one of $R_4$ to $R_7$ represents a fluorine atom. $R_4$ and $R_5$, or $R_6$ and $R_7$ may form a ring.

$W_2$ represents an organic group having at least one fluorine atom and specifically includes the atomic groups of (F2) to (F4) above.

$L_2$ represents a single bond or a divalent linking group. The divalent linking group is a substituted or unsubstituted arylene group, a substituted or unsubstituted alkylene group, a substituted or unsubstituted cycloalkylene group, —O—, —SO$_2$—, —CO—, —N(R)— (wherein R represents a hydrogen atom or an alkyl group), —NHSO$_2$—, or a divalent linking group formed by the combination of a plurality of these groups.

Q represents an alicyclic structure. The alicyclic structure may have a substituent and may be monocyclic or polycyclic, and in the case of a polycyclic structure, the structure may be a crosslinked structure. The monocyclic structure is preferably a cycloalkyl group having 3 to 8 carbon atoms, and examples thereof include a cyclopentyl group, a cyclohexyl group, a cyclobutyl group and a cyclooctyl group. Examples of the polycyclic structure include a group containing a bicyclo, tricyclo or tetracyclo structure having 5 or more carbon atoms. A cycloalkyl group having 6 to 20 carbon atoms is preferred, and examples thereof include an adamantyl group, a norbornyl group, a dicyclopentyl group, a tricyclodecanyl group and a tetracyclododecyl group. At least one of carbon atoms in the cycloalkyl group may be substituted with a heteroatom such as an oxygen atom. In particular, Q is preferably a norbornyl group, a tricyclodecanyl group, a tetracyclododecyl group or the like.

The hydrophobic resin may contain a silicon atom.

The resin preferably has an alkylsilyl structure (preferably a trialkylsilyl group) or a cyclic siloxane structure as a silicon atom-containing partial structure.

Specific examples of the alkylsilyl structure and cyclic siloxane structure include the groups represented by the following formulae (CS-1) to (CS-3).

[Chem. 63]

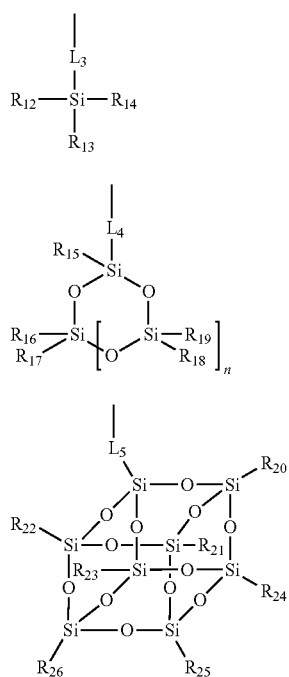

(CS-1)

(CS-2)

(CS-3)

In the general formulae (CS-1) to (CS-3), $R_{12}$ to $R_{26}$ each independently represent a linear or branched alkyl group (preferably having 1 to 20 carbon atoms) or a cycloalkyl group (preferably having 3 to 20 carbon atoms), $L_3$ to $L_5$ each represent a single bond or a divalent linking group. The divalent linking group is a single group or a combination of two or more groups selected from the group consisting of an alkylene group, a phenylene group, an ether bond, a thioether bond, a carbonyl group, an ester bond, an amide bond, a urethane bond and a ureylene bond, and n represents an integer of 1 to 5. n is preferably an integer of 2 to 4.

The repeating units having at least either fluorine atoms or silicon atoms are preferably (meth)acrylate-based repeating units.

Specific examples of the repeating units having at least either a fluorine atom or a silicon atom are shown below, but the present invention is not limited thereto. In the specific examples, $X_1$ represents a hydrogen atom, —$CH_3$, —F or —$CF_3$, and $X_2$ represents —F or —$CF_3$.

[Chem. 64]

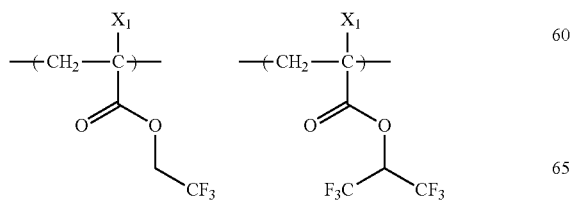

-continued

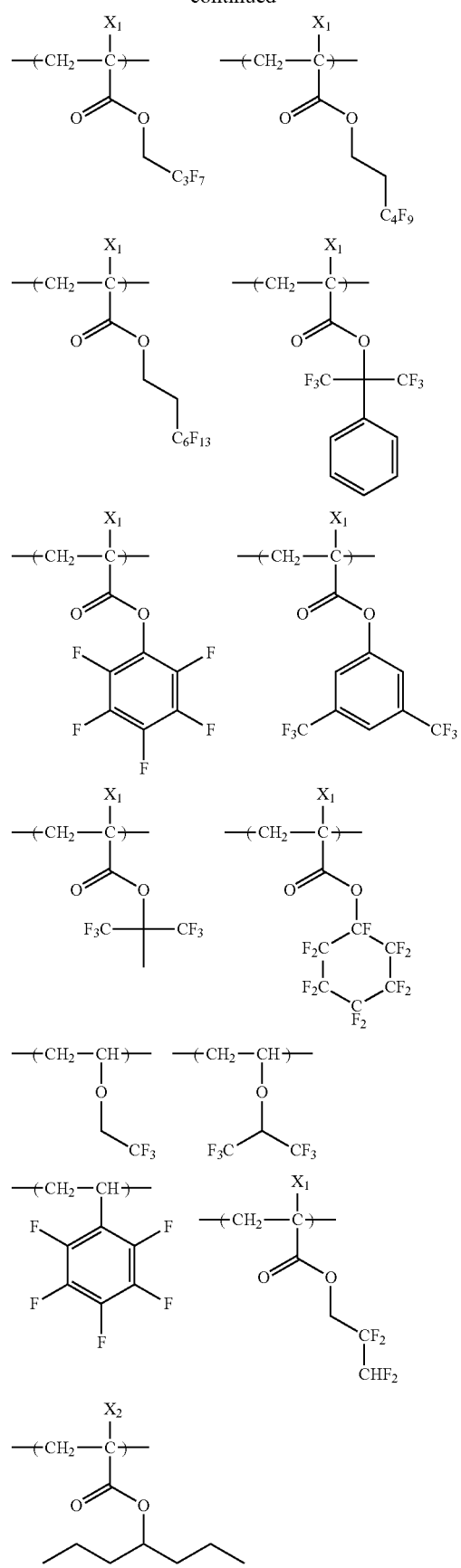

117
-continued
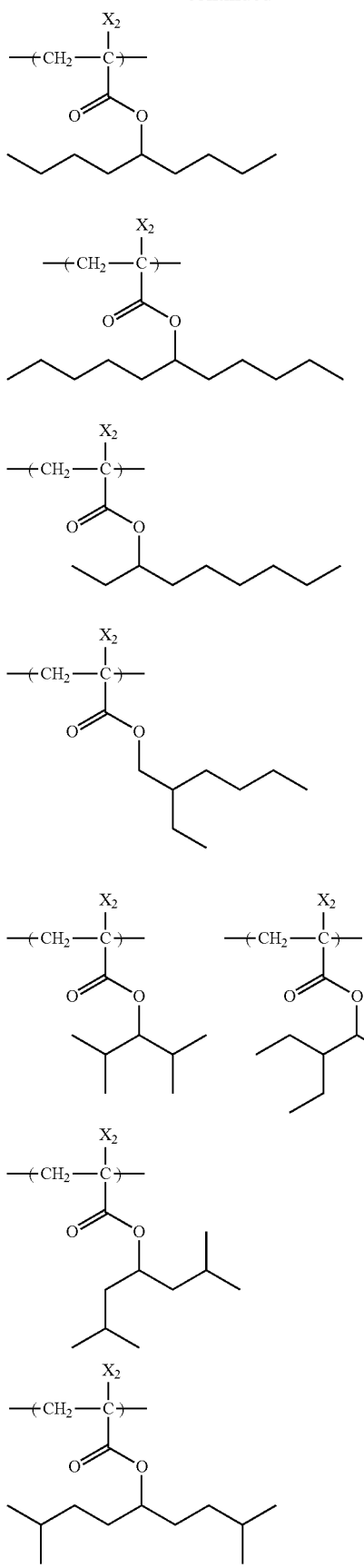
118
-continued
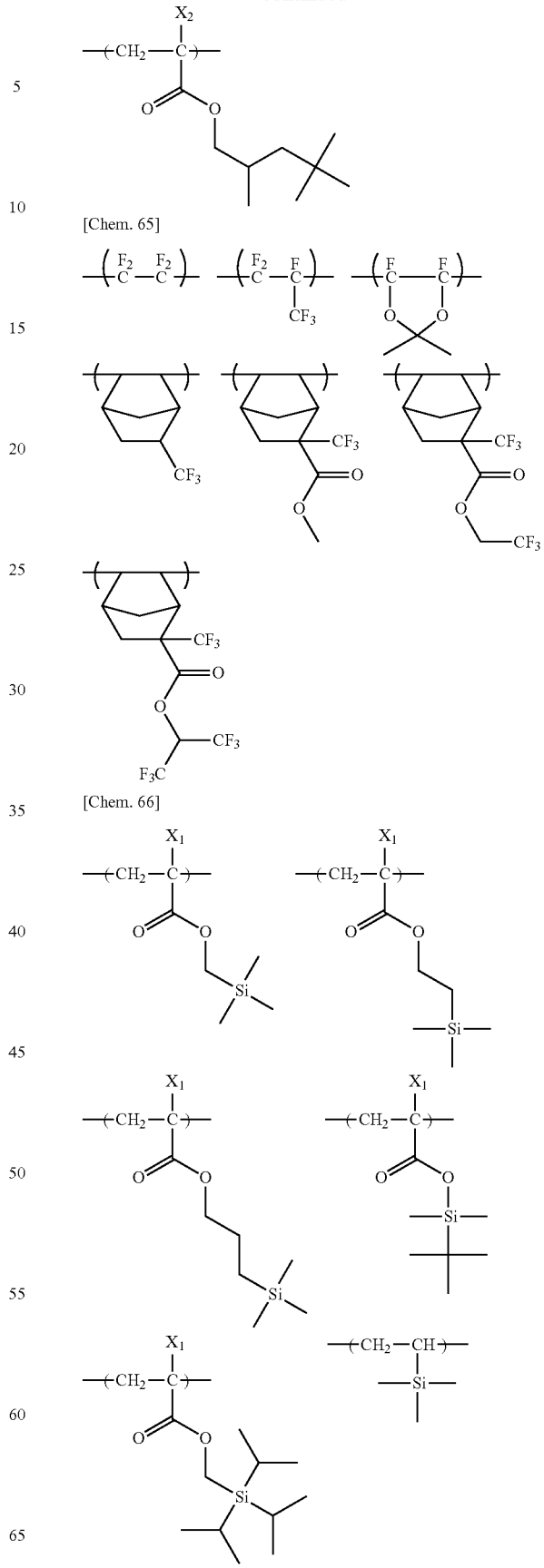
[Chem. 65]
[Chem. 66]

-continued

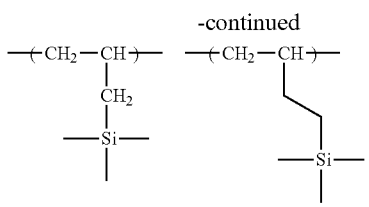

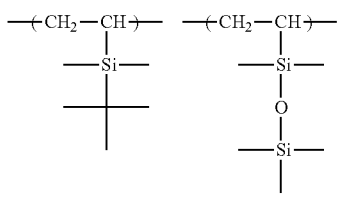

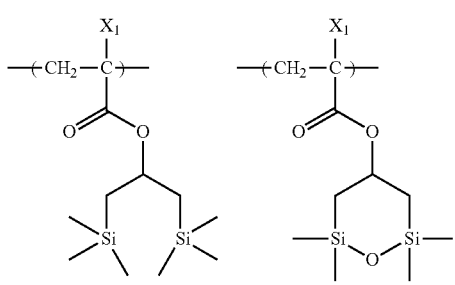

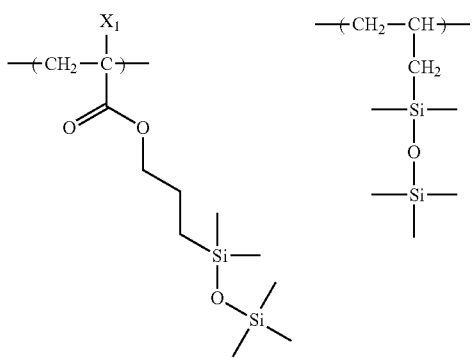

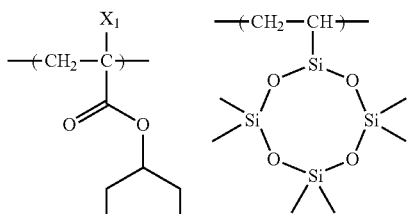

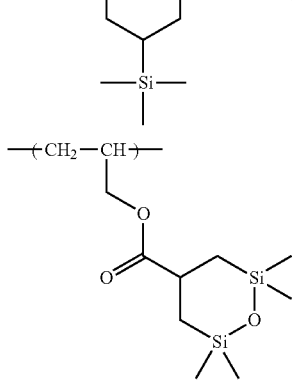

-continued

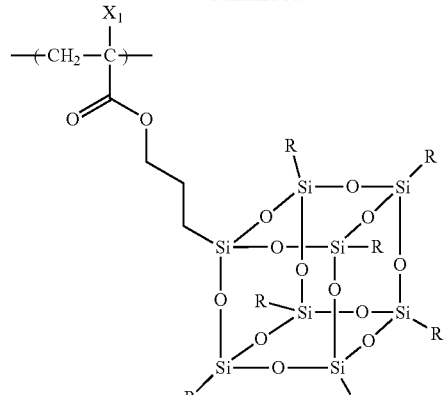

R = CH₃, C₂H₅, C₃H₇, C₄H₉

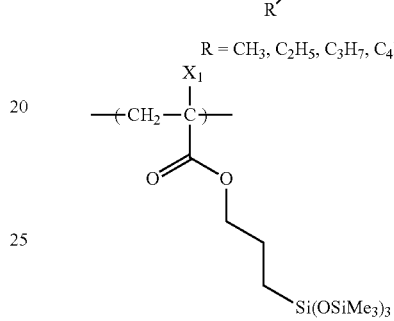

The hydrophobic resin preferably contains a repeating unit (b) having at least one group selected from the group consisting of the following (x) to (z):

(x) an alkali-soluble group,
(y) a group that decomposes by the action of an alkaline developer to increase the solubility in an alkaline developer (hereinafter, also referred to as a "polarity converting group"), and
(z) a group that decomposes by the action of an acid to increase the solubility in an alkaline developer.

The repeating unit (b) includes the following types.

(b') repeating units having at least either fluorine atoms or silicon atoms and at least one group selected from the group consisting of (x) to (z) on one side chain, (b*) repeating units having at least one group selected from the group consisting of (x) to (z) and having neither a fluorine atom nor a silicon atom, and (b") repeating units having at least one group selected from the group consisting of (x) to (z) on one side chain and having at least either a fluorine atom or a silicon atom on a side chain different from the side chain above in the same repeating unit.

The hydrophobic resin more preferably contains the repeating unit (b') as the repeating unit (b). That is, the repeating unit (b) having at least one group selected from the group consisting of (x) to (z) more preferably contains at least either a fluorine atom or a silicon atom.

In the case where the hydrophobic resin contains the repeating unit (b*), the resin is preferably a copolymer with repeating units having at least either a fluorine atom or a silicon atom (a repeating unit different from the repeating units (b') and (b")). Also, in the repeating unit (b"), the side chain having at least one group selected from the group consisting of (x) to (z) and the side chain having at least either a fluorine atom or a silicon atom are preferably bonded to the same carbon atom in the main chain, that is, have a positional relationship as in the following formula (K1).

In the formula, B1 represents a partial structure having at least one group selected from the group consisting of (x) to (z), and B2 represents a partial structure having at least either a fluorine atom or a silicon atom.

[Chem. 67]

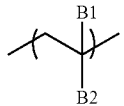
(K1)

The group selected from the group consisting of (x) to (z) is preferably (x) an alkali-soluble group or (y) a polarity converting group, and more preferably (y) a polarity converting group.

Examples of the alkali-soluble group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred alkali-soluble groups include a fluorinated alcohol group (preferably, a hexafluoroisopropanol group), a sulfonimide group, and a bis(carbonyl)methylene group.

Examples of the repeating unit (bx) having an alkali-soluble group (x) include a repeating unit where an alkali-soluble group is directly bonded to the main chain of the resin, such as repeating unit by an acrylic acid or a methacrylic acid, and a repeating unit where an alkali-soluble group is bonded to the main chain of the resin through a linking group. Furthermore, an alkali-soluble group may be introduced into the polymer chain terminal by using an alkali-soluble group-containing polymerization initiator or chain transfer agent at the polymerization. All of these cases are preferred.

In the case where the repeating unit (bx) is repeating units having at least either a fluorine atom or a silicon atom (that is, a repeating unit corresponding to the repeating unit (b') or (b")), examples of the fluorine atom-containing partial structure in the repeating unit (bx) are the same as those described for the repeating units having at least either a fluorine atom or a silicon atom and preferably include the groups represented by the general formulae (F2) to (F4). Also in this case, examples of the silicon atom-containing partial structure in the repeating unit (bx) are the same as those described for the repeating units having at least either a fluorine atom or a silicon atom and preferably include the groups represented by the general formulae (CS-1) to (CS-3).

The content of the repeating unit (bx) having an alkali-soluble group (x) is preferably from 1 to 50 mol %, more preferably from 3 to 35 mol %, and still more preferably from 5 to 20 mol %, based on all repeating units in the hydrophobic resin.

Specific examples of the repeating unit (bx) having an alkali-soluble group (x) are shown below, but the present invention is not limited thereto. Further, in the specific examples, $X_1$ represents a hydrogen atom, $CH_3$, —F, or —$CF_3$.

[Chem. 68]

In the formulae, Rx represents H, $CH_3$, $CF_3$, or $CH_2OH$.

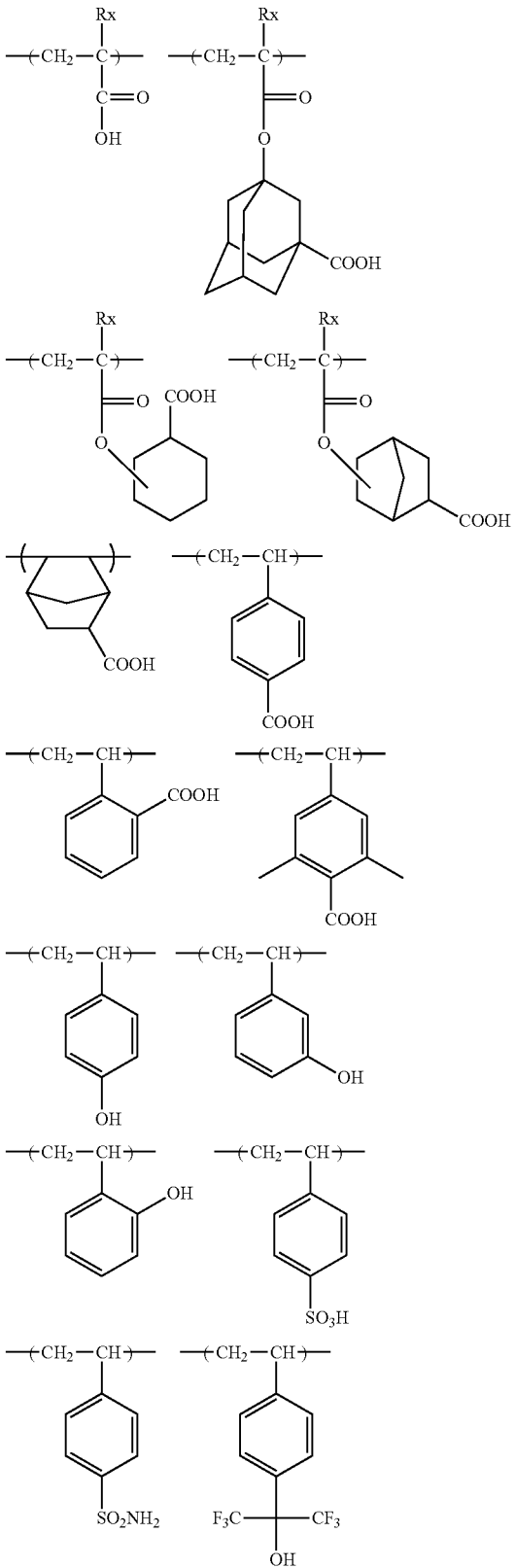

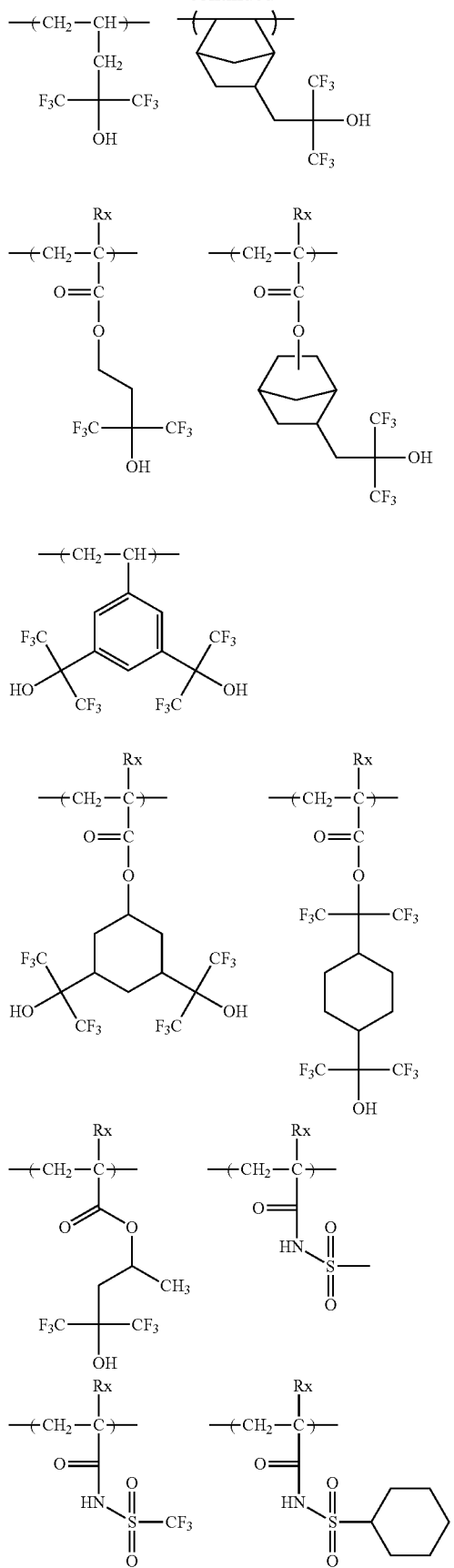
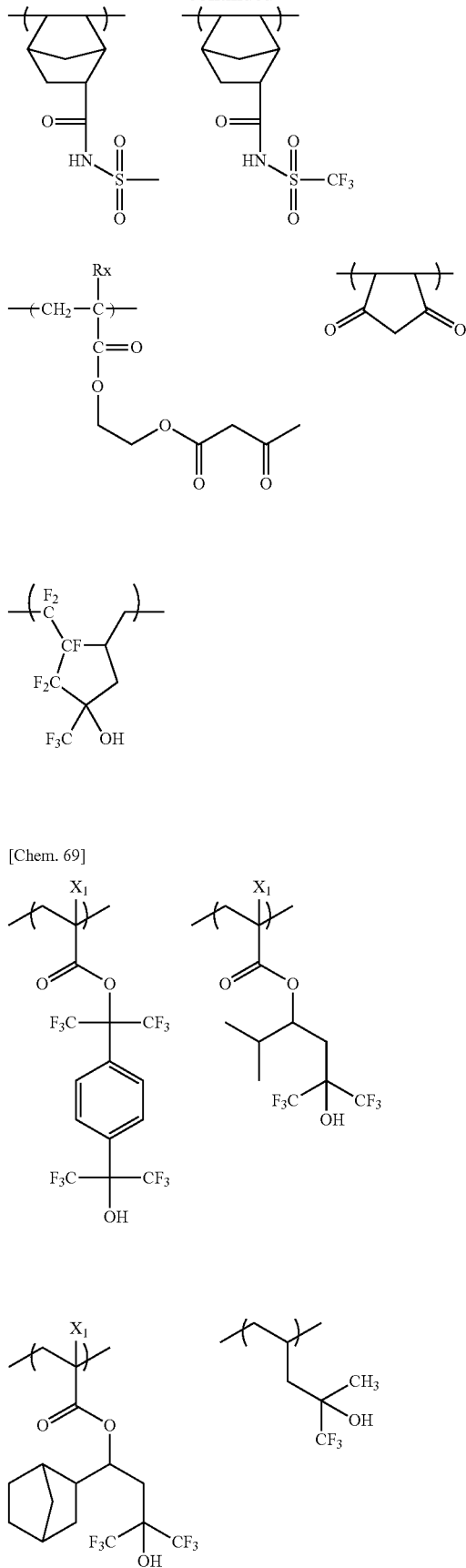

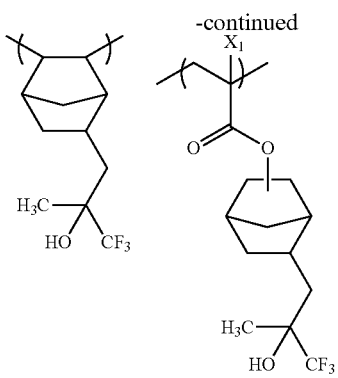

Examples of the polarity converting group (y) include a lactone group, a carboxylic acid ester group (—COO—), an acid anhydride group (—C(O)OC(O)—), an acid imide group (—NHCONH—), a carboxylic acid thioester group (—COS—), a carbonic acid ester group (—OC(O)O—), a sulfuric acid ester group (—OSO$_2$O—), and a sulfonic acid ester group (—SO$_2$O—), with a lactone group being preferred.

As for the polarity converting group (y), both a configuration where the polarity converting group is included in a repeating unit composed of an acrylic acid ester or a methacrylic acid ester and thereby is introduced into the side chain of the resin, and a configuration where the polarity converting group is introduced into the polymer chain terminal by using a polymerization initiator or chain transfer agent containing the polarity converging group during the polymerization are preferred.

Specific examples of the repeating unit (by) having a polarity converting group (y) include repeating units having a lactone structure represented by the formulae (KA-1-1) to (KA-1-17) to be described later.

Further, the repeating unit (by) having a polarity converting group (y) is preferably a repeating unit having at least either a fluorine atom and a silicon atom (that is, a repeating unit corresponding to the repeating unit (b') or (b")). The repeating unit (by)-containing resin has hydrophobicity, and addition thereof is preferred particularly from the viewpoint of reducing the development defect.

The repeating unit (by) includes, for example, a repeating unit represented by the formula (K0):

[Chem. 70]

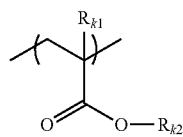

(K0)

In the formula, $R_{k1}$ represents a hydrogen atom, a halogen atom, a hydroxyl group, an alkyl group, a cycloalkyl group, an aryl group, or a polarity converting group-containing group.

$R_{k2}$ represents an alkyl group, a cycloalkyl group, an aryl group, or a polarity converting group-containing group.

However, at least either one of $R_{k1}$ and $R_{k2}$ represents a polarity converting group-containing group.

The polarity converting group is, as described above, a group that decomposes by the action of an alkaline developer to increase the solubility in an alkaline developer. The polarity converting group is preferably a group X in a partial structure represented by the general formula (KA-1) or (KB-1).

[Chem. 71]

In the general formulae (KA-1) and (KB-1), X represents a carboxylic acid ester group: —COO—, an acid anhydride group: —C(O)OC(O)—, an acid imide group: —NHCONH—, a carboxylic acid thioester group: —COS—, a carbonic acid ester group: —OC(O)O—, a sulfuric acid ester group: —OSO$_2$O—, or a sulfonic acid ester group: —SO$_2$O—.

Each $Y^1$ and $Y^2$, which may be the same as or different from each other, represents an electron-withdrawing group.

Incidentally, the repeating unit (by) has a preferred group that increases the solubility in an alkaline developer by containing a group having a partial structure represented by the general formula (KA-1) or (KB-1), but as in the case of the partial structure represented by the general formula (KA-1) or the partial structure represented by (KB-1) wherein $Y^1$ and $Y^2$ are monovalent, when the partial structure does not have a bond, the group having the partial structure is a group having a monovalent or higher valent group formed by removing at least one arbitrary hydrogen atom in the partial structure.

The partial structure represented by the general formula (KA-1) or (KB-1) is connected to the main chain of the hydrophobic resin at an arbitrary position through a substituent.

The partial structure represented by the general formula (KA-1) is a structure forming a ring structure together with the group as X.

In the general formula (KA-1), X is preferably a carboxylic acid ester group (that is, a case of forming a lactone ring structure as KA-1), an acid anhydride group or a carbonic acid ester group, more preferably a carboxylic acid ester group.

The ring structure represented by the general formula (KA-1) may have a substituent and, for example, may have nka substituents $Z_{ka1}$.

When a plurality of $Z_{ka1}$'s are present, they each independently represent a halogen atom, an alkyl group, a cycloalkyl group, an ether group, a hydroxyl group, an amido group, an aryl group, a lactone ring group, or an electron-withdrawing group.

$Z_{ka1}$'s may combine with each other to form a ring. Examples of the ring formed by the combination of $Z_{ka1}$'s with each other include a cycloalkyl ring and a heterocyclic ring (for example, a cyclic ether ring, or a lactone ring).

nka represents an integer of 0 to 10 and is preferably an integer of 0 to 8, more preferably an integer of 0 to 5, still more preferably an integer of 1 to 4, and most preferably an integer of 1 to 3.

The electron-withdrawing group as $Z_{ka1}$ has the same meaning as the electron-withdrawing group of $Y^1$ and $Y^2$ to be described hereinafter. Incidentally, the electron-withdrawing group above may be substituted with another electron-withdrawing group.

$Z_{ka1}$ is preferably an alkyl group, a cycloalkyl group, an ether group, a hydroxyl group or an electron-withdrawing group, more preferably an alkyl group, a cycloalkyl group or an electron-withdrawing group. The ether group is preferably an ether group substituted, for example, with an alkyl group or a cycloalkyl group, that is, an alkyl ether group. The electron-withdrawing group has the same meaning as above.

Examples of the halogen atom as $Z_{ka1}$ include a fluorine atom, a chlorine atom, a bromine atom and an iodine atom, with a fluorine atom being preferred.

The alkyl group as $Z_{ka1}$ may have a substituent and may be either linear or branched. The linear alkyl group is preferably an alkyl group having 1 to 30 carbon atoms, more preferably 1 to 20 carbon atoms, and examples thereof include a methyl group, an ethyl group, an n-propyl group, an n-butyl group, a sec-butyl group, a t-butyl group, an n-pentyl group, an n-hexyl group, an n-heptyl group, an n-octyl group, an n-nonyl group and an n-decanyl group. The branched alkyl group is preferably an alkyl group having 3 to 30 carbon atoms, more preferably 3 to 20, and examples thereof include an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group and a t-decanoyl group. An alkyl group having 1 to 4 carbon atoms is preferred, such as a methyl group, an ethyl group, an n-propyl group, an i-propyl group, am n-butyl group, an i-butyl group and a t-butyl group.

The cycloalkyl group as $Z_{ka1}$ may have a substituent and may be monocyclic or polycyclic. The polycyclic cycloalkyl group may be crosslinked. That is, in this case, the cycloalkyl group may have a bridged structure. The monocyclic type is preferably a cycloalkyl group having 3 to 8 carbon atoms, and examples thereof include a cyclopropyl group, a cyclopentyl group, a cyclohexyl group, a cyclobutyl group and a cyclooctyl group. The polycyclic type includes a group having a bicyclo, tricyclo or tetracyclo structure or the like and having 5 or more carbon atoms. A cycloalkyl group having 6 to 20 carbon atoms is preferred, and examples thereof include an adamantyl group, a norbornyl group, an isobornyl group, a camphanyl group, a dicyclopentyl group, an α-pinel group, a tricyclodecanyl group, a tetracyclododecyl group and an androstanyl group. The following structures are also preferred as the cycloalkyl group. Incidentally, at least one carbon atom in the cycloalkyl group may be substituted with a hetero atom such as an oxygen atom.

[Chem. 72]

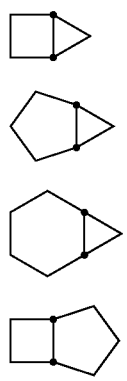

(1)

(2)

(3)

(4)

-continued

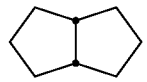

(5)

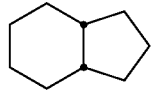

(6)

(7)

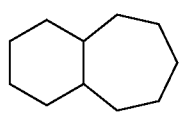

(8)

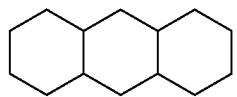

(9)

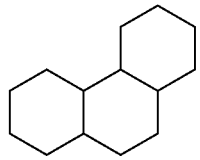

(10)

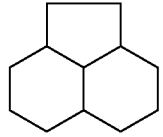

(11)

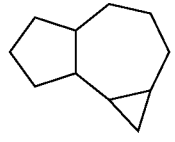

(12)

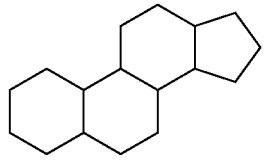

(13)

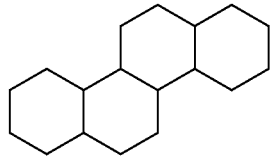

(14)

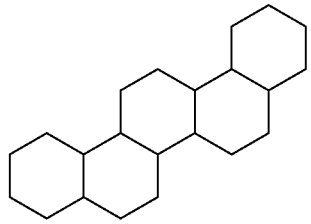

(15)

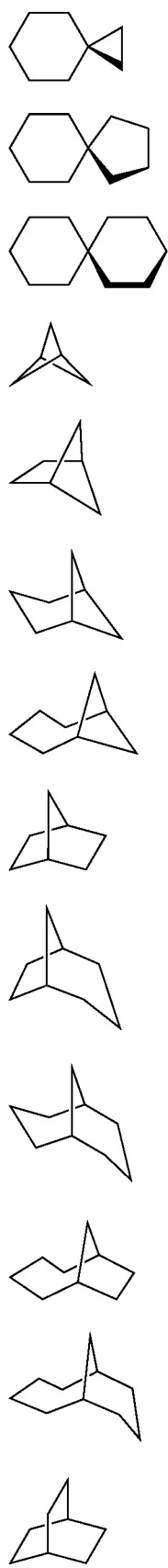
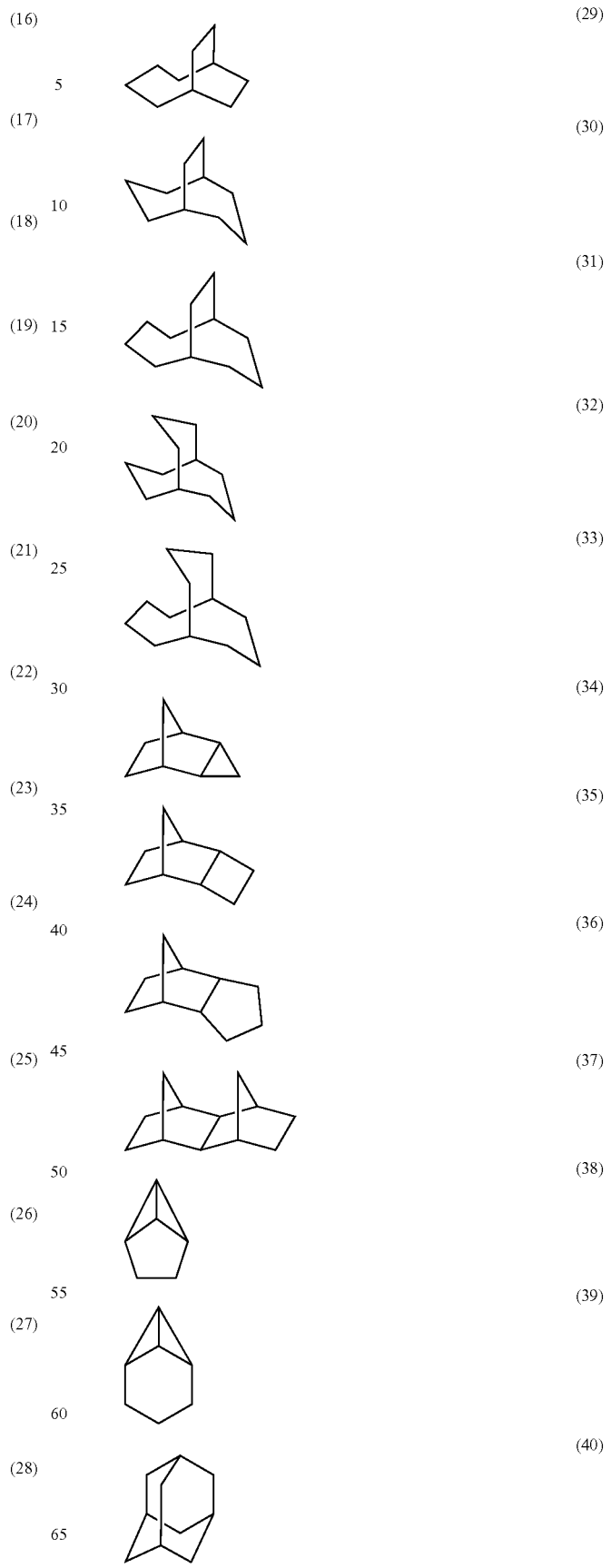

(41) 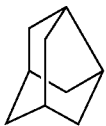

(42) 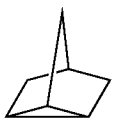

(43) 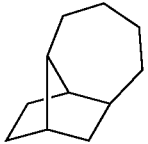

(44) 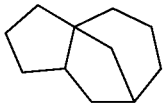

(45) 

(46) 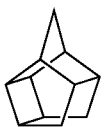

(47) 

(48) 

(49) 

(50) 

The alicyclic moiety is preferably an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group or a cyclododecanyl group, more preferably an adamantyl group, a decalin group, a norbornyl group, a cedrol group, a cyclohexyl group, a cycloheptyl group, a cyclooctyl group, a cyclodecanyl group, a cyclododecanyl group, or a tricyclodecanyl group.

Examples of the substituent in such an alicyclic moiety include an alkyl group, a halogen atom, a hydroxyl group, an alkoxy group, a carboxyl group, and an alkoxycarbonyl group. The alkyl group is preferably a lower alkyl group such as a methyl group, an ethyl group, a propyl group, an isopropyl group, and a butyl group, and more preferably a methyl group, an ethyl group, a propyl group, or an isopropyl group.

Preferred examples of the alkoxy group include an alkoxy group having 1 to 4 carbon atoms, such as a methoxy group, an ethoxy group, a propoxy group, and a butoxy group. Examples of the substituent that the alkyl group and the alkoxy group may have include a hydroxyl group, a halogen atom and an alkoxy group (preferably having 1 to 4 carbon atoms).

Each of these groups may further have a substituent, and examples of the further substituent include a hydroxyl group, a halogen atom (fluorine, chlorine, bromine, or iodine), a nitro group, a cyano group, the foregoing alkyl group, an alkoxy group such as a methoxy group, an ethoxy group, a hydroxyethoxy group, a propoxy group, a hydroxypropoxy group, an n-butoxy group, an isobutoxy group, a sec-butoxy group, and a t-butoxy group, an alkoxycarbonyl group such as a methoxycarbonyl group and an ethoxycarbonyl group, an aralkyl group such as a benzyl group, a phenethyl group, and a cumyl group, an aralkyloxy group, an acyl group such as a formyl group, an acetyl group, a butyryl group, a benzoyl group, a cinnamoyl group, and a valeryl group, an acyloxy group such as a butyryloxy group, an alkenyl group such as a vinyl group, a propenyl group, and an allyl group, an alkenyloxy group such as a vinyloxy group, a propenyloxy group, an allyloxy group, and a butenyloxy group, an aryl group such as a phenyl group and a naphthyl group, an aryloxy group such as a phenoxy group, and an aryloxycarbonyl group such as a benzoyloxy group.

It is preferable that X in the general formula (KA-1) be a carboxylic acid ester group and the partial structure represented by the general formula (KA-1) be a lactone ring, and the lactone ring be preferably a 5- to 7-membered lactone ring.

In this connection, as in (KA-1-1) to (KA-1-17) described below, another ring structure is preferably condensed to a 5- to 7-membered lactone ring that is the partial structure represented by the general formula (KA-1), in the form of forming a bicyclo or spiro structure.

Examples of the peripheral ring structure with which the ring structure represented by the general formula (KA-1) may combine include those in (KA-1-1) to (KA-1-17) and structures based on these structures.

The structure containing the lactone ring structure represented by the general formula (KA-1) is more preferably a structure represented by any one of the following (KA-1-1) to (KA-1-17). The lactone structure may be bonded directly to the main chain. Preferred structures are (KA-1-1), (KA-1-4), (KA-1-5), (KA-1-6), (KA-1-13), (KA-1-14), and (KA-1-17).

[Chem. 73]

KA-1-1

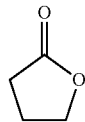

KA-1-2

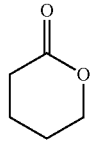

KA-1-3 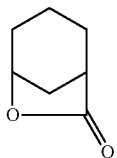

KA-1-4 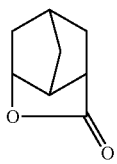

KA-1-5 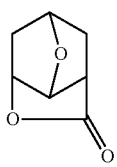

KA-1-6 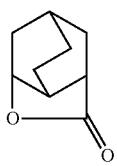

KA-1-7 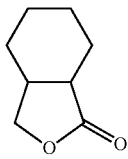

KA-18 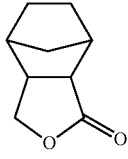

KA-1-9 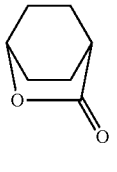

KA-1-10 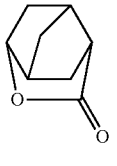

KA-1-11 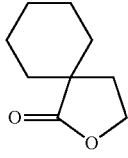

KA-1-12 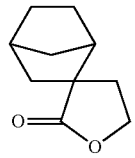

KA-1-13 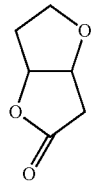

KA-1-14 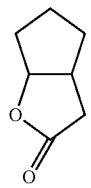

KA-1-15 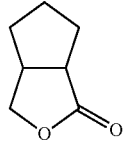

KA-1-16 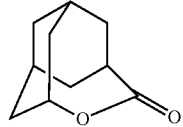

KA-1-17 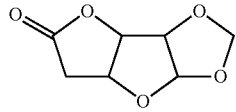

The structure containing the lactone ring structure may or may not have a substituent. Preferred examples of the substituent are the same as those of the substituent $Z_{ka1}$ which the ring structure represented by the general formula (KA-1) may have.

In the general formula (KB-1), X is preferably a carboxylic acid ester group (—COO—).

In the general formula (KB-1), $Y^1$ and $Y^2$ each independently represent an electron-withdrawing group.

The electron-withdrawing group is a partial structure represented by the general formula (EW) described below. In the general formula (EW), * indicates a direct bond to (KA-1) or a direct bond to X in (KB-1).

[Chem. 74]

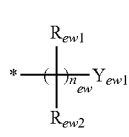

(EW)

In the formula (EW), $R_{ew1}$ and $R_{ew2}$ each independently represent an arbitrary substituent, for example, a hydrogen atom, an alkyl group, a cycloalkyl group, or an aryl group.

$n_{ew}$ is a repetition number of the linking group represented by —$C(R_{ew1})(R_{ew2})$— and represents an integer of 0 or 1. In the case where $n_{ew}$ is 0, this indicates that the bond is a single bond and $Y_{ew1}$ is directly bonded.

Examples of $Y_{ew1}$ include a halogen atom, a cyano group, a nitrile group, a nitro group, a halo(cyclo)alkyl group represented by —$C(R_{f1})(R_{f2})$—$R_{f3}$, a haloaryl group, an oxy group, a carbonyl group, a sulfonyl group, a sulfinyl group, and a combination thereof. The electron-withdrawing group may be, for example, a structure shown below. The "halo(cyclo)alkyl group" indicates an alkyl or cycloalkyl group that is at least partially halogenated, and the "haloaryl group" indicates an aryl group that is at least partially halogenated. In the following structural formulae, $R_{ew3}$ and $R_{ew4}$ each independently represent an arbitrary structure. The partial structure represented by the general formula (EW) has an electron-withdrawing group regardless of what structure $R_{ew3}$ or $R_{ew4}$ may take, and each of $R_{ew3}$ and $R_{ew4}$ may be connected, for example, to the main chain of the resin but is preferably an alkyl group, a cycloalkyl group or a fluoroalkyl group.

[Chem. 75]

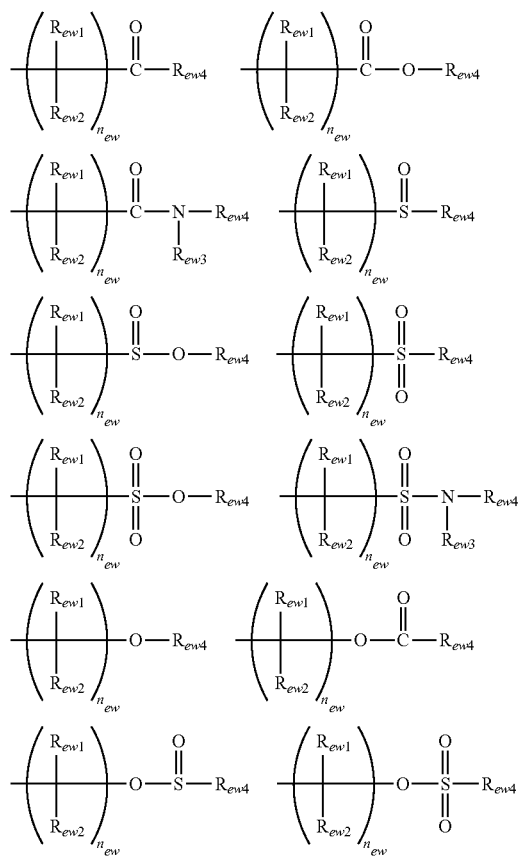

When $Y_{ew1}$ is a divalent or higher valent group, the remaining bond bonds to an arbitrary atom or a substituent. At least any one group of $Y_{ew1}$, $R_{ew1}$, and $R_{ew2}$ may be connected to the main chain of the hydrophobic resin through a further substituent.

$Y_{ew1}$ is preferably a halogen atom, a halo(cyclo)alkyl group represented by —$C(R_{f1})(R_{f2})$—$R_{f3}$ or a haloaryl group.

At least two members of $R_{ew1}$, $R_{ew2}$ and $Y_{ew1}$ may combine with each other to form a ring.

$R_{f1}$ represents a halogen atom, a perhaloalkyl group, a perhalocycloalkyl group or a perhaloaryl group and is preferably a fluorine atom, a perfluoroalkyl group or a perfluorocycloalkyl group, more preferably a fluorine atom or a trifluoromethyl group.

$R_{f2}$ and $R_{f3}$ each independently represent a hydrogen atom, a halogen atom or an organic group, or alternatively $R_{f2}$ and $R_{f3}$ may be bonded to each other to form a ring. Examples of the organic group include an alkyl group, a cycloalkyl group and an alkoxy group. $R_{f2}$ is more preferably the same group as $R_{f1}$ or combines with $R_{f3}$ to form a ring.

$R_{f1\ to}\ R_{f3}$ may be bonded to each other to form a ring, and examples of the ring formed include a (halo)cycloalkyl ring and a (halo)aryl ring.

Examples of the (halo)alkyl group in $R_{f1}$ to $R_{f3}$ include the alkyl group in $Z_{ka1}$ and halogenated structures thereof.

Examples of the (per)halocycloalkyl group and (per)haloaryl group in $R_{f1}$ to $R_{f3}$ or in the ring formed by the combination of $R_{f2}$ and $R_{f3}$ include structures resulting from halogenation of cycloalkyl groups in $Z_{ka1}$, preferably a fluorocycloalkyl group represented by —$C_{(n)}F_{(2n-2)}H$, and a perfluoroaryl group represented by —$C_{(n)}F_{(n-1)}$, wherein the number of carbon atoms n is not particularly limited but is preferably from 5 to 13, and more preferably 6.

The ring which may be formed by the combination of at least two members of $R_{ew1}$, $R_{ew2}$ and $Y_{ew1}$ with each other is preferably a cycloalkyl group or a heterocyclic group, and the heterocyclic group is preferably a lactone ring group. Examples of the lactone ring include structures represented by the formulae (KA-1-1) to (KA-1-17).

Incidentally, the repeating unit (by) may have a plurality of partial structures represented by the general formula (KA-1), a plurality of partial structures represented by the general formula (KB-1), or both a partial structure of the general formula (KA-1) and a partial structure of the general formula (KB-1).

Here, the partial structure of the general formula (KA-1) may partially or entirely serve also as the electron-withdrawing group of $Y^1$ or $Y^2$ in the general formula (KB-1). For example, in the case where X in the general formula (KA-1) is a carboxylic acid ester group, the carboxylic acid ester group may function as an electron-withdrawing group of $Y^1$ or $Y^2$ in the general formula (KB-1).

In the case where the repeating unit (by) corresponds to the repeating unit (b*) or (b″) and has a partial structure represented by the general formula (KA-1), the partial structure represented by the general formula (KA-1) is more preferred when the polarity converting group is a partial structure represented by —COO— in the structure of the general formula (KA-1).

The repeating unit (by) may be repeating units having a partial structure represented by the general formula (KY-0).

[Chem. 76]

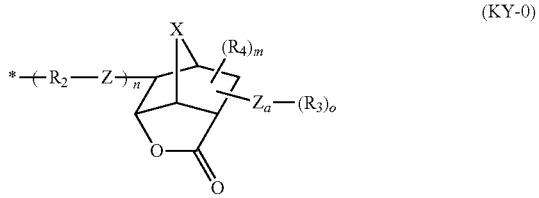

(KY-0)

In the general formula (KY-0), $R_2$ represents a chain or cyclic alkylene group and when a plurality of $R_2$'s are present, they may be the same as or different from each other.

$R_3$ represents a linear, branched, or cyclic hydrocarbon group where a part or all of hydrogen atoms on the constituent carbons are substituted by a fluorine atom.

$R_4$ represents a halogen atom, a cyano group, a hydroxy group, an amide group, an alkyl group, a cycloalkyl group, an alkoxy group, a phenyl group, an acyl group, an alkoxycarbonyl group or a group represented by R—C(=O)— or R—C(=O)O— (wherein R represents an alkyl group or a cycloalkyl group). When a plurality of $R_4$'s are present, they may be the same as or different from each other, and two or more $R_4$'s may be bonded to each other to form a ring.

X represents an alkylene group, an oxygen atom or a sulfur atom.

Z and Za each represent a single bond, an ether bond, an ester bond, an amide bond, a urethane bond or a urea bond and when a plurality of Z's or Za's are present, they may be the same as or different from each other. * represents a bond to the main or side chain of the resin.

o is the number of substituents and represents an integer of 1 to 7.

m is the number of substituents and represents an integer of 0 to 7.

n is a repetition number and represents an integer of 0 to 5.

The structure of —$R_2$—Z— is preferably a structure represented by —$(CH_2)_l COO$— (wherein l represents an integer of 1 to 5).

The preferred number of carbon atoms and specific examples of the chain or cyclic alkylene group as $R_2$ are the same as those described for the chain alkylene group and cyclic alkylene group in $Z_2$ of the general formula (bb).

The number of carbon atoms of the linear, branched, or cyclic hydrocarbon group as $R_3$ is, in the case of a linear hydrocarbon group, preferably from 1 to 30, more preferably from 1 to 20; in the case of a branched hydrocarbon group, preferably from 3 to 30, more preferably from 3 to 20; and in the case of a cyclic hydrocarbon group, from 6 to 20. Specific examples of $R_3$ include specific examples of the alkyl group and cycloalkyl group as $Z_{ka1}$ above.

The preferred number of carbon atoms and specific examples of the alkyl group and cycloalkyl group as $R_4$ and R are the same as those described above for the alkyl group and cycloalkyl group as $Z_{ka1}$.

The acyl group as $R_4$ is preferably an acyl group having 1 to 6 carbon atoms, and examples thereof include a formyl group, an acetyl group, a propionyl group, a butyryl group, an isobutyryl group, a valeryl group, and a pivaloyl group.

The alkyl moiety in the alkoxy group and alkoxycarbonyl group as $R_4$ includes a linear, branched, or cyclic alkyl moiety, and the preferred number of carbon atoms and specific examples of the alkyl moiety are the same as those described above for the alkyl group and cycloalkyl group as $Z_{ka1}$.

The alkylene group as X includes a chain or cyclic alkylene group, and the preferred number of carbon atoms and specific examples thereof are the same as those described for the chain alkylene group and cyclic alkylene group as $R_2$.

Examples of the specific structure of the repeating unit (by) also include repeating units having a partial structure shown below.

[Chem. 77]

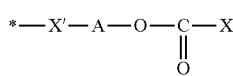

(rf-1)

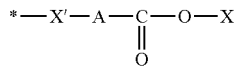

(rf-2)

In the general formulae (rf-1) and (rf-2),

X' represents an electron-withdrawing substituent and is preferably a carbonyloxy group, an oxycarbonyl group, a fluorine atom-substituted alkylene group or a fluorine atom-substituted cycloalkylene group.

A represents a single bond or a divalent linking group represented by —C(Rx)(Ry)- wherein Rx and Ry each independently represent a hydrogen atom, a fluorine atom, an alkyl group (preferably having 1 to 6 carbon atoms, which may be substituted with a fluorine atom or the like), or a cycloalkyl group (preferably having 5 to 12 carbon atoms, which may be substituted with a fluorine atom or the like). Each of Rx and Ry is preferably a hydrogen atom, an alkyl group or a fluorine atom-substituted alkyl group.

X represents an electron-withdrawing group and specific examples thereof include those electron-withdrawing groups as $Y^1$ and $Y^2$ above. Among these, a fluoroalkyl group, a cycloalkyl fluoride group, an aryl group substituted with fluorine or a fluoroalkyl group, an aralkyl group substituted with fluorine or a fluoroalkyl group, a cyano group, and a nitro group are preferred.

* represents a bond to the main or side chain of the resin, that is, a bond to the main chain of the resin through a single bond or a linking group.

Incidentally, when X' is a carbonyloxy group or an oxycarbonyl group, A is not a single bond.

The polarity converting group is decomposed by the action of an alkaline developer to effect polarity conversion, whereby the receding contact angle with water of the resist film after alkali development can be decreased. Decreasing the receding contact angle with water of the film after alkali development is preferred from the viewpoint of suppressing the development defect.

The receding contact angle with water of the resist film after alkali development is preferably 50° or less, more preferably 40° or less, still more preferably 35° or less, and most preferably 30° or less, at a temperature of 23±3° C. and a humidity of 45±5%.

The receding contact angle is a contact angle measured when a contact line recedes on the liquid droplet-substrate interface, and this is generally known to be useful in simulating the mobility of a liquid droplet in the dynamic state. In a simple manner, the receding contact angle is defined as a contact angle at the time of the liquid droplet interface receding when a liquid droplet ejected from a needle tip is landed on a substrate and then the liquid droplet is again suctioned into the needle. In general, the receding contact angle may be measured by a contact angle measuring method called an expansion/contraction method.

The hydrolysis rate of the hydrophobic resin for an alkaline developer is preferably 0.001 nm/sec or more, more preferably 0.01 nm/sec or more, still more preferably 0.1 nm/sec or more, and most preferably 1 nm/sec or more.

Here, the hydrolysis rate of the hydrophobic resin for an alkaline developer is a rate at which the thickness of a resin film formed of only the hydrophobic resin decreases when treated with TMAH (an aqueous tetramethylammonium hydroxide solution) (2.38 mass %) at 23° C.

The repeating unit (by) is more preferably a repeating unit having at least two or more polarity converting groups.

In the case where the repeating unit (by) has at least two polarity converting groups, the repeating unit preferably has a group containing a partial structure having two polarity converting groups represented by the following general formula (KY-1). Incidentally, when the structure represented by the general formula (KY-1) does not have a bond, this is a group containing a monovalent or higher valent group formed by removing at least one arbitrary hydrogen atom from the structure.

[Chem. 78]

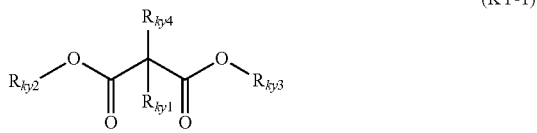

(KY-1)

In the general formula (KY-1), $R_{ky1}$ and $R_{ky4}$ each independently represent a hydrogen atom, a halogen atom, an alkyl group, a cycloalkyl group, a carbonyl group, a carbonyloxy group, an oxycarbonyl group, an ether group, a hydroxyl group, a cyano group, an amide group or an aryl group. Alternatively, $R_{ky1}$ and $R_{ky4}$ may be bonded to the same atom to form a double bond. For example, $R_{ky1}$ and $R_{ky4}$ may be bonded to the same oxygen atom to form a part (=O) of a carbonyl group.

$R_{ky2}$ and $R_{ky3}$ each independently represent an electron-withdrawing group, or when $R_{ky1}$ and $R_{ky2}$ combine to form a lactone ring, $R_{ky3}$ is an electron-withdrawing group. The lactone ring formed is preferably a structure of (KA-1-1) to (KA-1-17). Examples of the electron-withdrawing group are the same as those for $Y_1$ and $Y_2$ in the general formula (KB-1), and a halogen atom, or a halo(cyclo)alkyl group or haloaryl group represented by —C($R_{f1}$)($R_{f2}$)—$R_{f3}$ is preferred. Preferably, $R_{ky3}$ is a halogen atom, or a halo(cyclo)alkyl group or haloaryl group represented by —C($R_{f1}$)($R_{f2}$)—$R_{f3}$, and $R_{ky2}$ combines with $R_{ky1}$ to form a lactone ring or is an electron-withdrawing group containing no halogen atom. $R_{ky1}$, $R_{ky2}$, and $R_{ky4}$ may be linked with each other to form a monocyclic or polycyclic structure.

Specific examples of $R_{ky1}$ and $R_{ky4}$ include the same groups as those for $Z_{ka1}$ in the formula (KA-1).

The lactone ring formed by the combination of $R_{ky1}$ and $R_{ky2}$ is preferably a structure of (KA-1-1) to (KA-1-17). Examples of the electron-withdrawing group are the same as those for $Y_1$ and $Y_2$ in the general formula (KB-1).

The structure represented by the general formula (KY-1) is preferably a structure represented by the following general formula (KY-2). Here, the structure represented by the general formula (KY-2) is a group having a monovalent or higher valent group formed by removing at least one arbitrary hydrogen atom from the structure.

[Chem. 79]

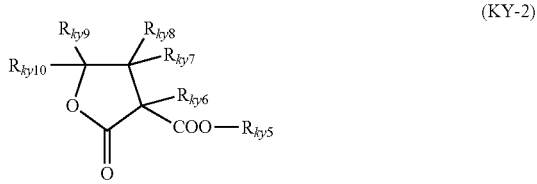

(KY-2)

In the general formula (KY-2), $R_{ky6}$ to $R_{ky10}$ each independently represent a hydrogen atom, a halogen atom, an alkyl group, a cycloalkyl group, a carbonyl group, a carbonyloxy group, an oxycarbonyl group, an ether group, a hydroxyl group, a cyano group, an amide group, or an aryl group.

Two or more members of $R_{ky6}$ to $R_{ky10}$ may be linked with each other to form a monocyclic or polycyclic structure.

$R_{ky5}$ represents an electron-withdrawing group. Examples of the electron-withdrawing group are the same as those for $Y_1$ and $Y_2$ above, and among these, a halogen atom, or a halo(cyclo)alkyl group or haloaryl group represented by —C($R_{f1}$)($R_{f2}$)—$R_{f3}$ is preferred.

Specific examples of $R_{ky5}$ to $R_{ky10}$ include the same groups as those for $Z_{ka1}$ in the formula (KA-1).

The structure represented by the general formula (KY-2) is preferably a partial structure represented by the following general formula (KY-3):

[Chem. 80]

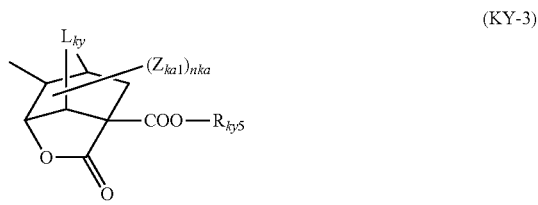

(KY-3)

In the formula (KY-3), $Z_{ka1}$ and nka have the same meanings as in the general formula (KA-1). $R_{ky5}$ has the same meaning as in the formula (KY-2).

$L_{ky}$ represents an alkylene group, an oxygen atom or a sulfur atom. Examples of the alkylene group of $L_{ky}$ include a methylene group and an ethylene group. $L_{ky}$ is preferably an oxygen atom or a methylene group, and more preferably a methylene group.

The repeating unit (b) is not limited as long as it is a repeating unit obtained by polymerization such as addition polymerization, condensation polymerization or addition condensation, but this repeating unit is preferably a repeating unit obtained by addition polymerization of a carbon-carbon double bond. Examples thereof include an acrylate-based repeating unit (including a system having a substituent at the α- or β-position), a styrene-based repeating unit (including a system having a substituent at the α- or β-position), a vinyl ether-based repeating unit, a norbornene-based repeating unit, and a maleic acid derivative (such as a maleic anhydride or its derivative, and maleimide) repeating unit. An acrylate-based repeating unit, a styrene-based repeating unit, a vinyl ether-based repeating unit and a norbornene-based repeating unit are preferred, an acrylate-based repeating unit, a vinyl ether-based repeating unit and a norbornene-based repeating unit are more preferred, and an acrylate-based repeating unit is most preferred.

In the case where the repeating unit (by) is a repeating unit having at least either a fluorine atom or a silicon atom (that is, a repeating unit corresponding to the repeating unit (b') or (b")), examples of the fluorine atom-containing partial structure in the repeating unit (by) are the same as those in the repeating units having at least either a fluorine atom or a silicon atom, and the groups represented by the general formulae (F2) to (F4) are preferred. Also, examples of the silicon atom-containing partial structure in the repeating unit (by) are the same as those in the repeating units having at least either a fluorine atom or a silicon atom, and the groups represented by the general formulae (CS-1) to (CS-3) are preferred.

In the hydrophobic resin, the content of the repeating unit (by) is preferably from 10 to 100 mol %, more preferably from 20 to 99 mol %, still more preferably from 30 to 97 mol %, and most preferably from 40 to 95 mol %, based on all repeating units in the hydrophobic resin.

Specific examples of the repeating unit (by) having a group that increases the solubility in an alkaline developer are shown below, but the present invention is not limited thereto. Specific examples of the repeating unit (a3) of the resin (A) are also included in specific examples of the repeating unit (by).

In specific examples shown below, Ra represents a hydrogen atom, a fluorine atom, a methyl group, or a trifluoromethyl group.

[Chem. 81]

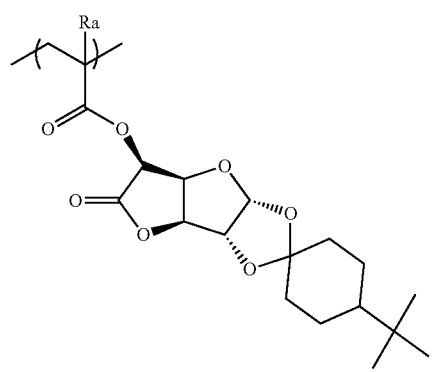
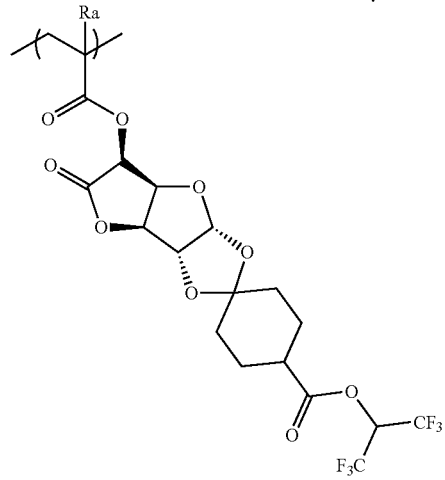
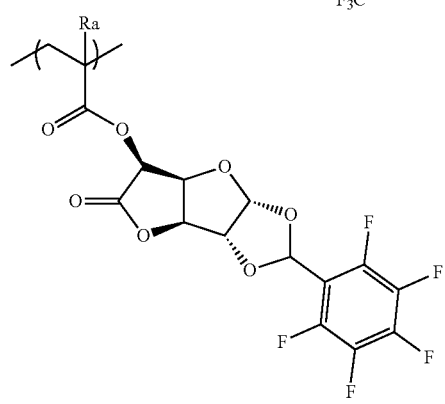

-continued

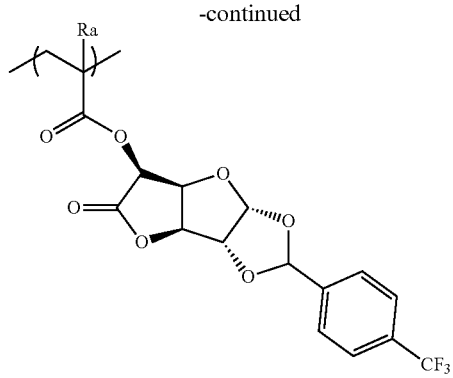
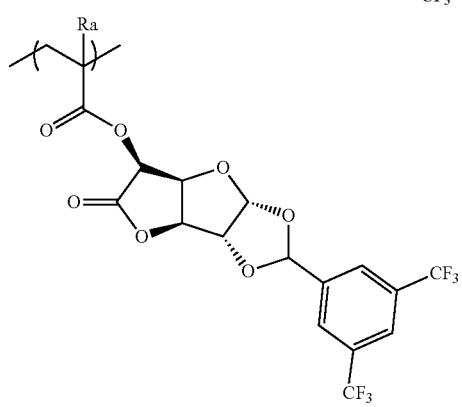
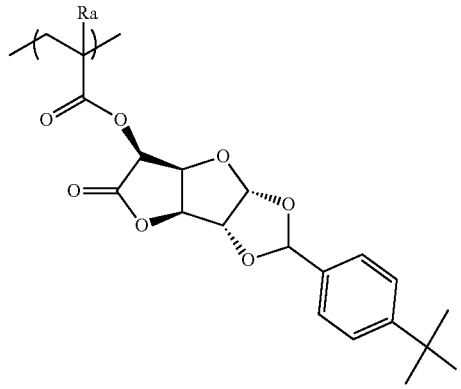
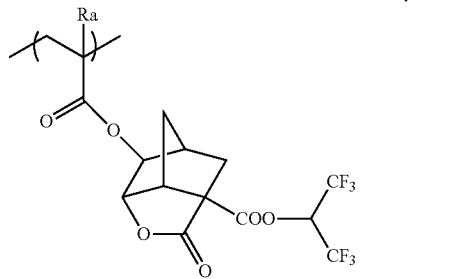
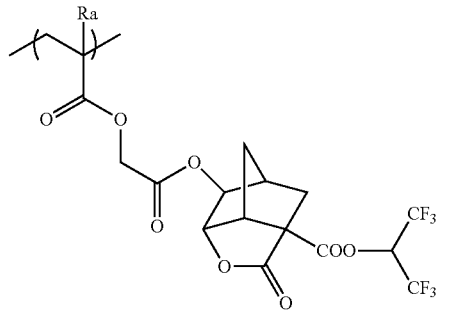

143
-continued
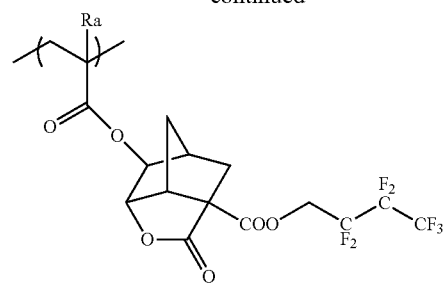
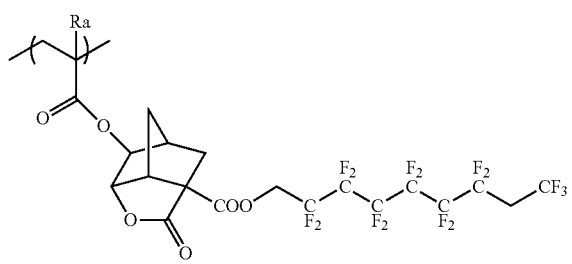
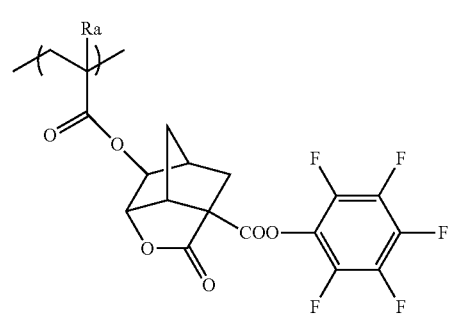
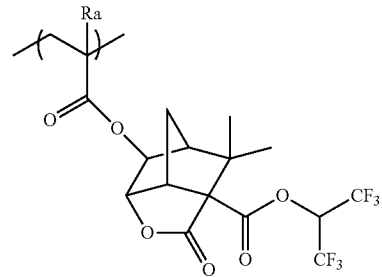
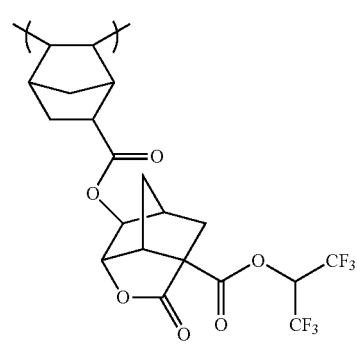
144
-continued
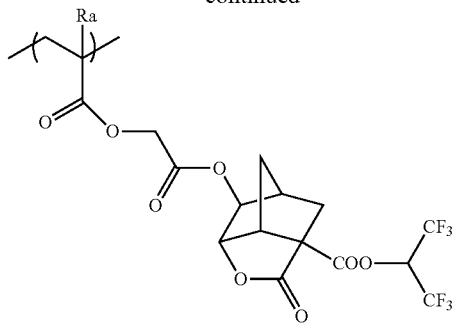
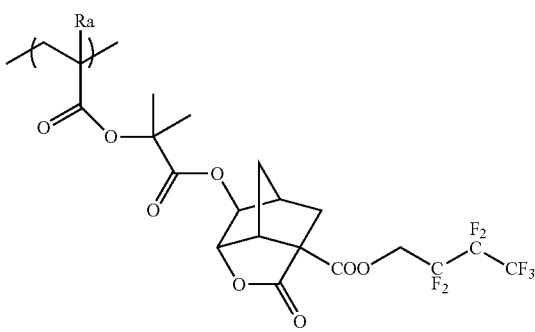
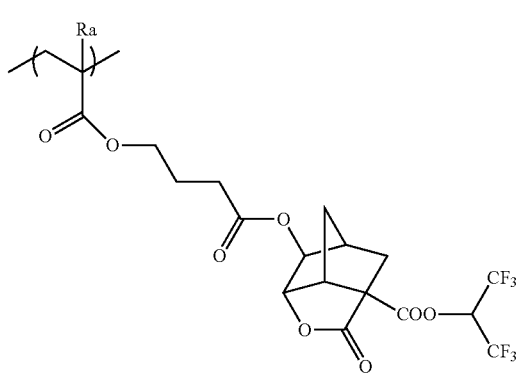
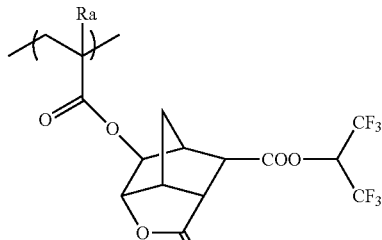
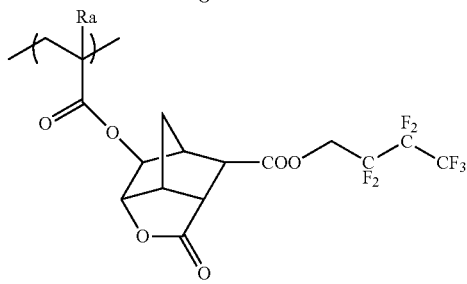

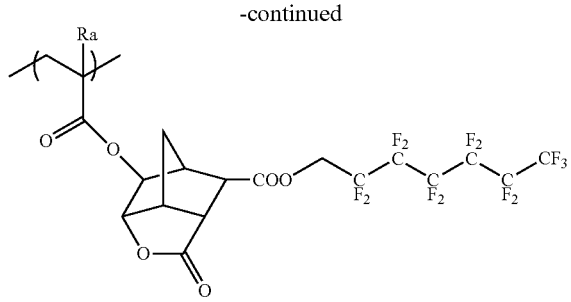

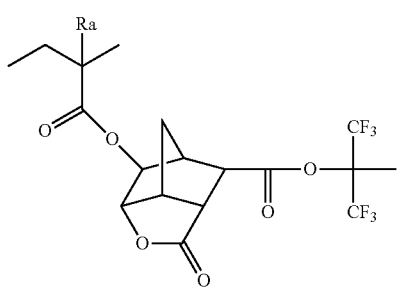

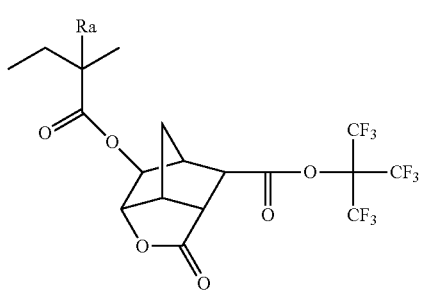

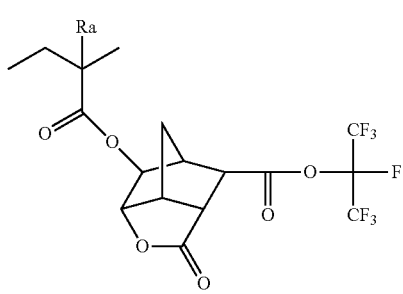

[Chem. 82]

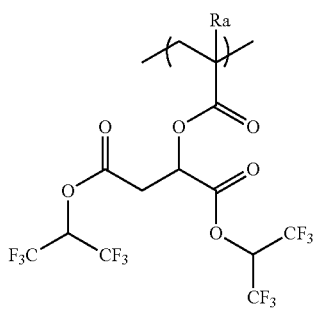

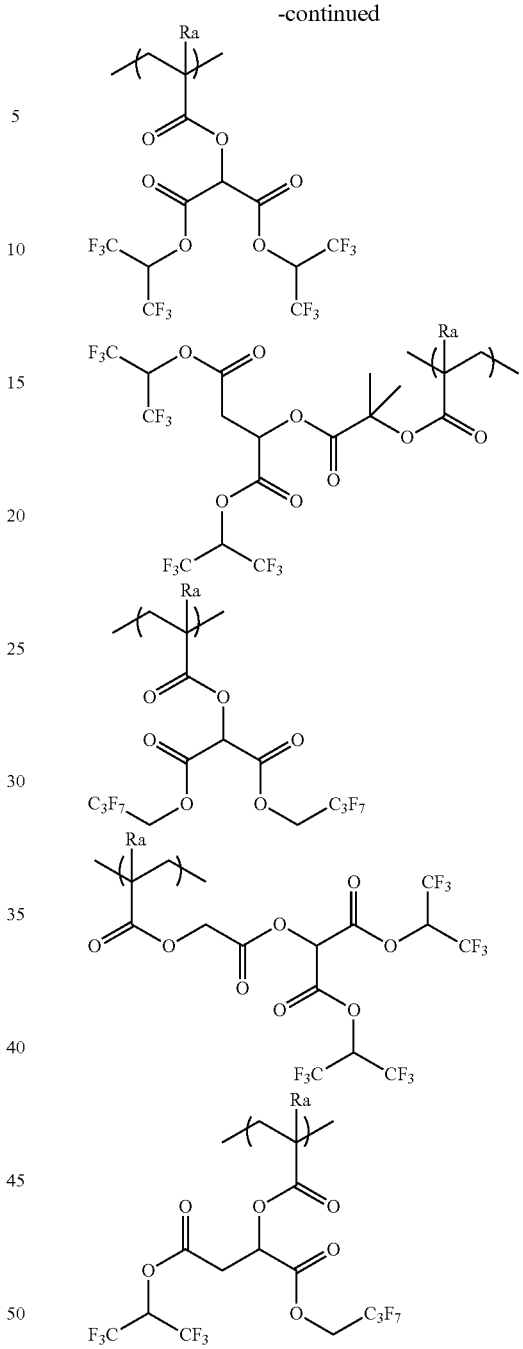

Synthesis of monomers corresponding to the repeating unit (by) having the polarity converting group (y) as described above may be carried out, for example, with reference to the method disclosed in WO2010/067905A or WO2010/067905A.

In the hydrophobic resin, examples of the repeating unit (bz) having a group (z) that decomposes by the action of an acid are the same as those described for the repeating units having an acid-decomposable group in the resin (A).

In the case where the repeating unit (bz) is a repeating unit having at least either a fluorine atom or a silicon atom (that is, a repeating unit corresponding to the repeating unit (b') or (b")), examples of the fluorine atom-containing partial structure in the repeating unit (bz) are the same as those described for the repeating units having at least either a fluorine atom or a silicon atom and preferably include the groups represented by the general formulae (F2) to (F4). Also in this case, examples of the silicon atom-containing partial structure in the repeating unit (by) are the same as those described for the repeating units having at least either a fluorine atom or a silicon atom and preferably include the groups represented by the general formulae (CS-1) to (CS-3).

In the hydrophobic resin, the content of the repeating unit (bz) having a group (z) that decomposes by the action of an acid is preferably from 1 to 80 mol %, more preferably from 10 to 80 mol %, and still more preferably from 20 to 60 mol %, based on all repeating units in the hydrophobic resin.

The repeating unit (b) having at least one group selected from the group consisting of (x) to (z) was described as above, but the content of the repeating unit (b) in the hydrophobic resin is preferably from 1 to 98 mol %, more preferably from 3 to 98 mol %, still more preferably from 5 to 97 mol %, and most preferably from 10 to 95 mol %, based on all repeating units in the hydrophobic resin.

The content of the repeating unit (b') is preferably from 1 to 100 mol %, more preferably from 3 to 99 mol %, still more preferably from 5 to 97 mol %, and most preferably from 10 to 95 mol %, based on all repeating units in the hydrophobic resin.

The content of the repeating unit (b*) is preferably from 1 to 90 mol %, more preferably from 3 to 80 mol %, still more preferably 5 to 70 mol %, and most preferably 10 to 60 mol %, based on all repeating units in the hydrophobic resin. The content of the repeating units having at least either a fluorine atom or a silicon atom, which is used together with the repeating unit (b*) is preferably from 10 to 99 mol %, more preferably from 20 to 97 mol %, still more preferably from 30 to 95 mol %, and most preferably from 40 to 90 mol %, based on all repeating units in the hydrophobic resin.

The content of the repeating unit (b") is preferably from 1 to 100 mol %, more preferably from 3 to 99 mol %, more preferably from 5 to 97 mol %, and most preferably from 10 to 95 mol %, based on all repeating units in the hydrophobic resin.

The hydrophobic resin may further contain a repeating unit represented by the following general formula (CIII).

[Chem. 83]

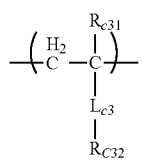

(CIII)

In the general formula (CIII), $R_{c31}$ represents a hydrogen atom, an alkyl group (which may be substituted with a fluorine atom or the like), a cyano group or a —$CH_2$—O—$R_{ac2}$ group wherein $R_{ac2}$ represents a hydrogen atom, an alkyl group or an acyl group. $R_{c31}$ is preferably a hydrogen atom, a methyl group, a hydroxymethyl group or a trifluoromethyl group, and more preferably a hydrogen atom or a methyl group.

$R_{c32}$ represents a group having an alkyl group, a cycloalkyl group, an alkenyl group, a cycloalkenyl group or an aryl group. Each of these groups may be substituted with a fluorine atom or silicon atom-containing group or the like.

$L_{c3}$ represents a single bond or a divalent linking group.

In the general formula (CIII), the alkyl group of $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably a phenyl group having 6 to 20 carbon atoms or a naphthyl group, each of which may have a substituent.

$R_{c32}$ is preferably an unsubstituted alkyl group or a fluorine atom-substituted alkyl group.

The divalent linking group of $L_{c3}$ is preferably an alkylene group (preferably having 1 to 5 carbon atoms), an oxy group, a phenylene group or an ester bond (a group represented by —COO—).

It is also preferable that the hydrophobic resin further contain a repeating unit represented by the following general formula (BII-AB).

[Chem. 84]

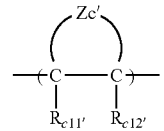

(BII-AB)

In the formula (BII-AB), $R_{c11}'$ and $R_{c12}'$ each independently represent a hydrogen atom, a cyano group, a halogen atom, or an alkyl group, and $Z_c'$ represents an atomic group for forming an alicyclic structure containing two carbon atoms (C—C) to which $Z_c'$ is bonded.

In the case where each group in the repeating units represented by the general formulae (III) and (BII-AB) is substituted with a fluorine atom- or silicon atom-containing group, the repeating unit corresponds also to the repeating units having at least either a fluorine atom or a silicon atom.

Specific examples of the repeating units represented by the general formulae (III) and (BII-AB) are shown below, but the present invention is not limited thereto. In the formulae, Ra represents H, $CH_3$, $CH_2OH$, $CF_3$, or CN. Incidentally, the repeating unit where Ra is $CF_3$ corresponds also to the repeating units having at least either a fluorine atom or a silicon atom.

[Chem. 85]

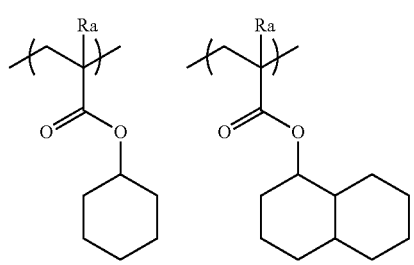

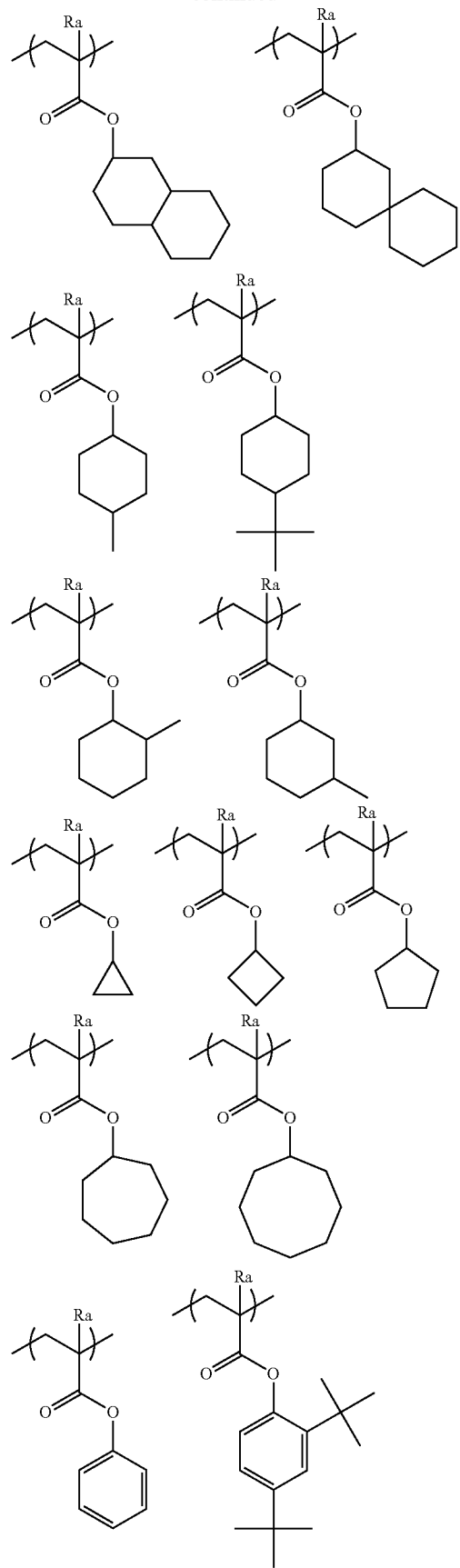
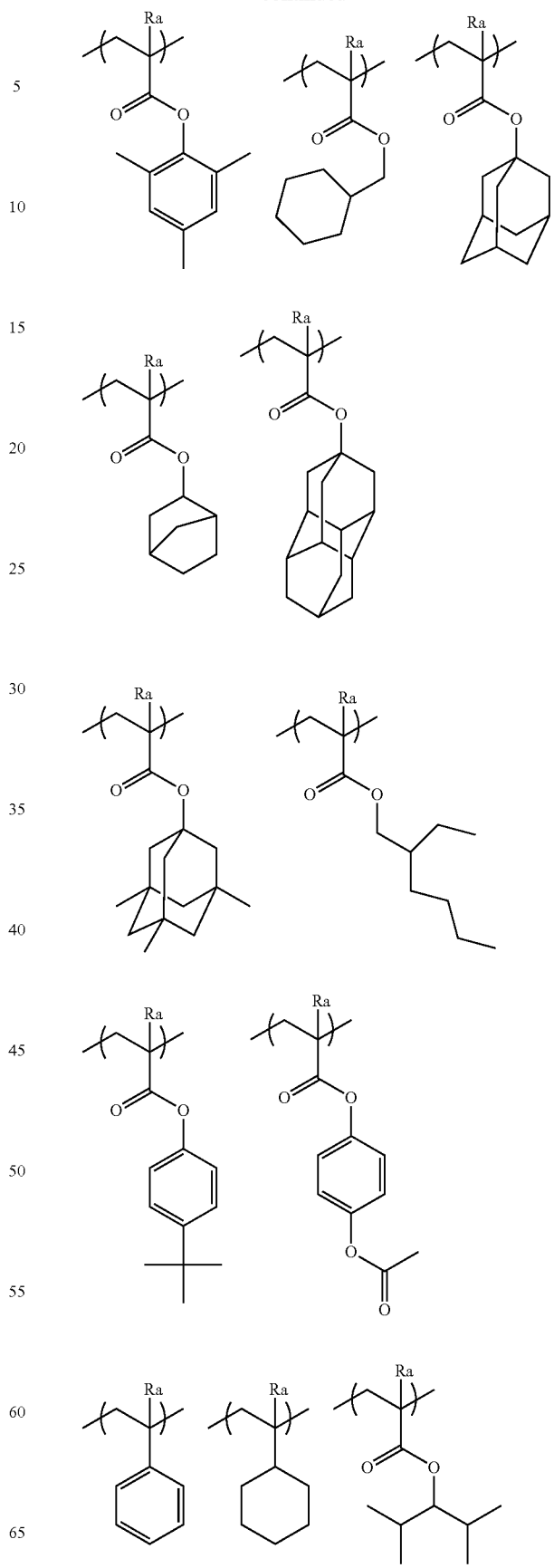

-continued

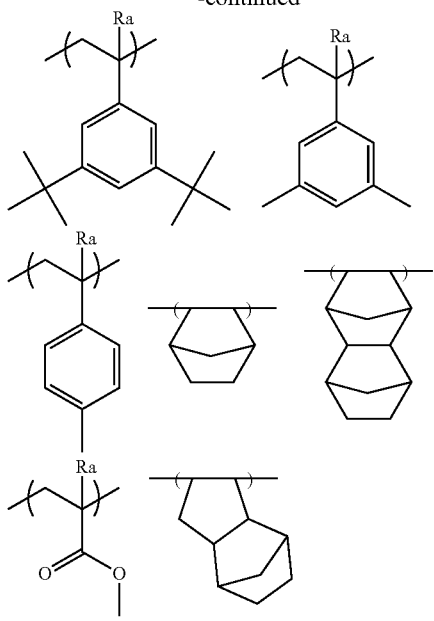

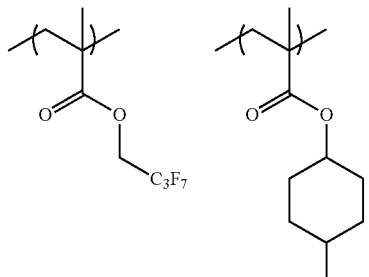
(B-1)

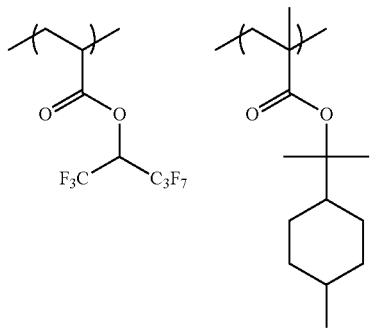
(B-2)

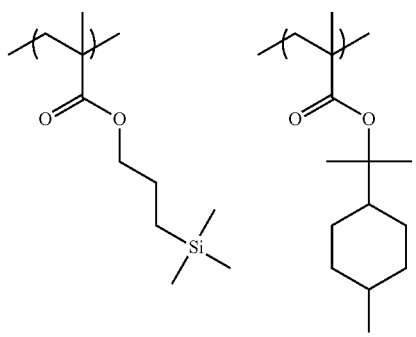
(B-3)

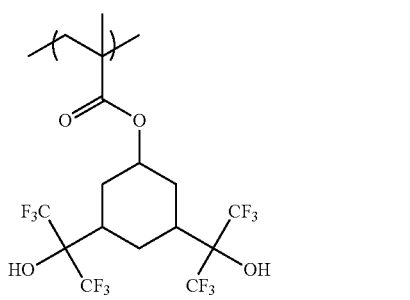
(B-4)

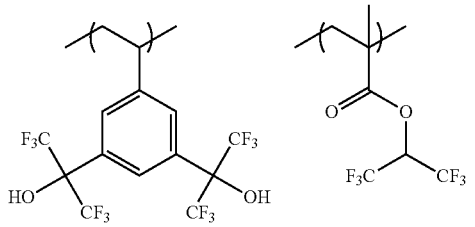
(B-5)

In the hydrophobic resin, similarly to the resin (A), it is of course preferable that the content of impurities such as metals be low, but also, the content of residual monomers or oligomer components is preferably from 0 to 10 mass %, more preferably from 0 to 5 mass %, and still more preferably from 0 to 1 mass %. When these conditions are satisfied, a resist composition free from foreign substances in liquid or change with aging of sensitivity or the like can be obtained. Furthermore, in view of resolution, resist profile, side wall of resist pattern, roughness, and the like, the molecular weight distribution (Mw/Mn, also referred to as "dispersity") is preferably in a range of 1 to 3, more preferably 1 to 2, still more preferably 1 to 1.8, and most preferably 1 to 1.5.

As for the hydrophobic resin, various commercially available products may be also used, or the resin may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred.

The reaction solvent, the polymerization initiator, the reaction conditions (for example, temperature, concentration) and the purification method after reaction are the same as those described for the resin (A).

Specific examples of the hydrophobic resin (HR) are shown below. Also, the molar ratio of repeating units (corresponding to repeating units starting from the left), weight average molecular weight and dispersity of each resin are shown in Table 1 below.

(B-6)
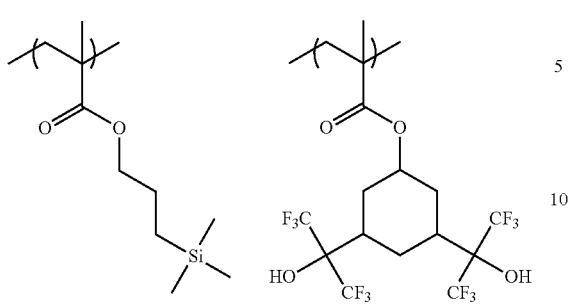
(B-7)
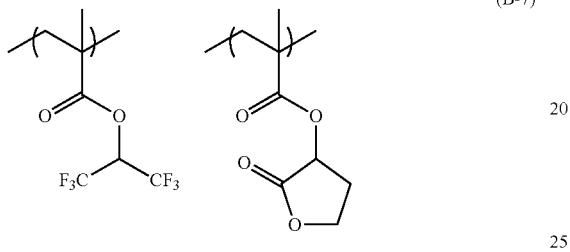
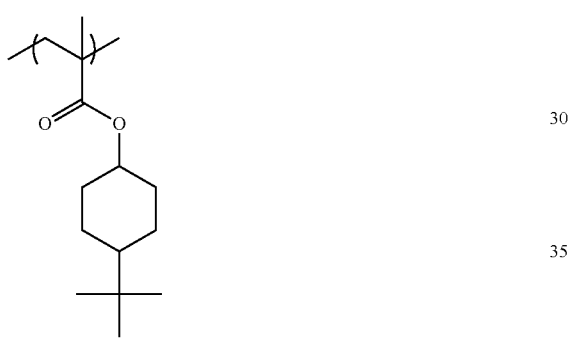
(B-8)
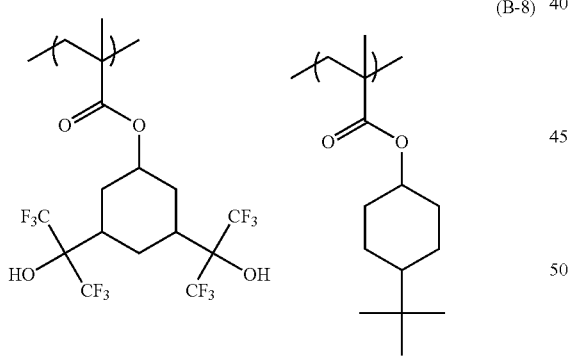
(B-9)
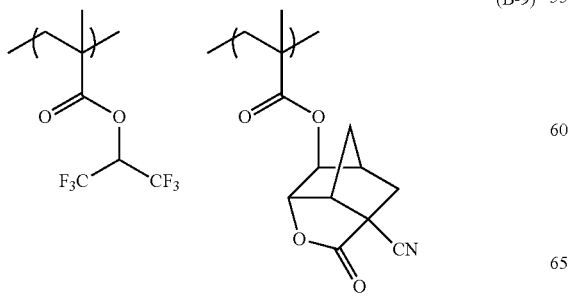
(B-10)
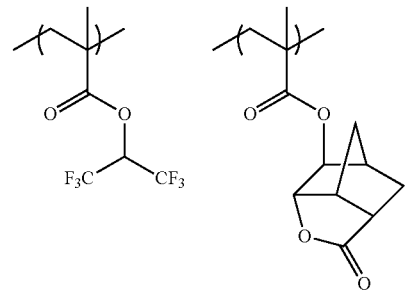
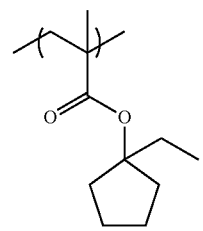
(B-11)
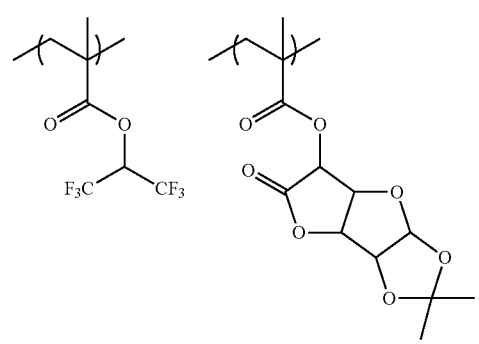
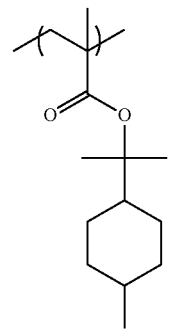
(B-12)
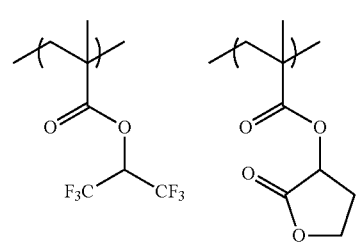

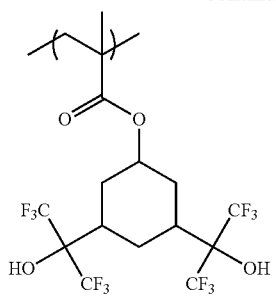
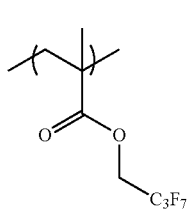
(B-13)
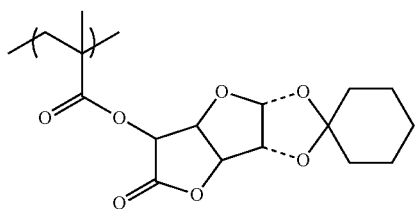
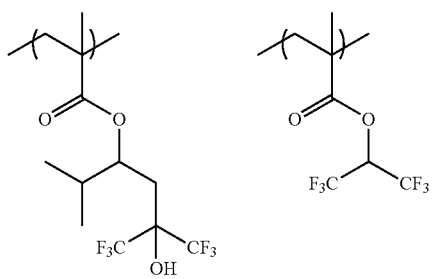
(B-14)
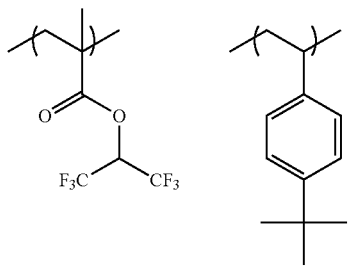
(B-15)
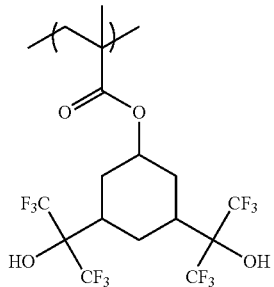
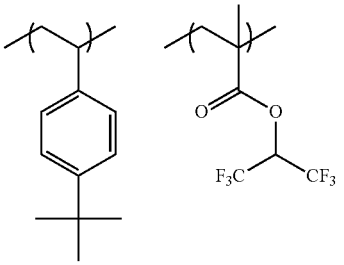
(B-16)
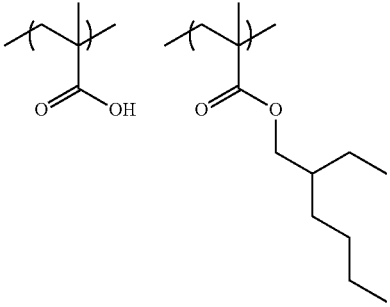
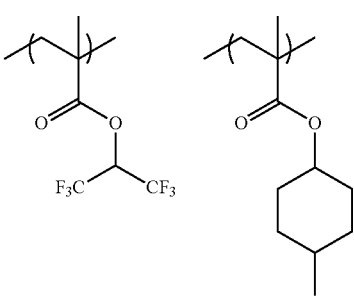
(B-17)
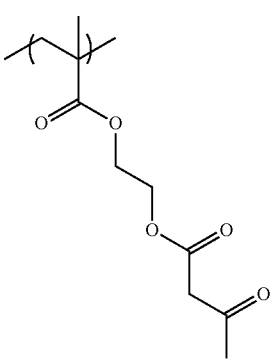
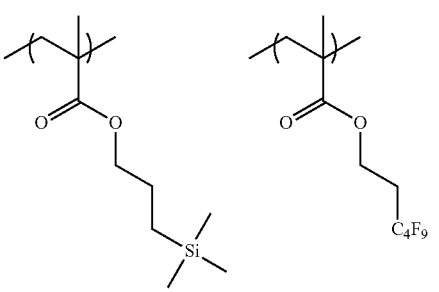
(B-18)

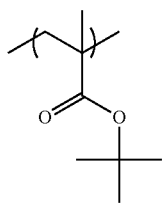
(B-19)
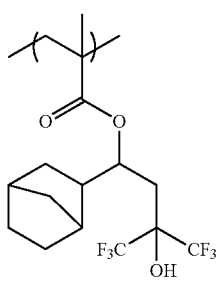
(B-20)
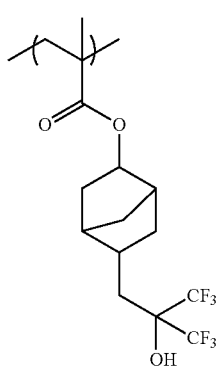
(B-21)
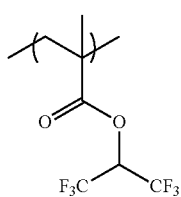 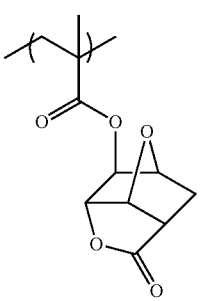
(B-22)
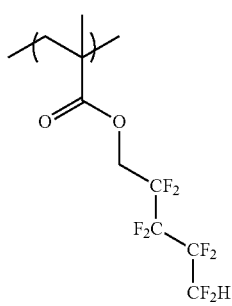 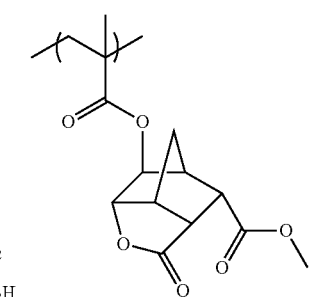
[Chem. 87]
(B-23)
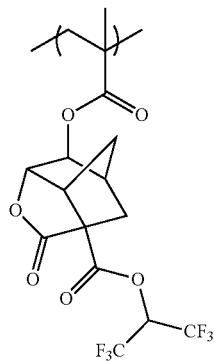
(B-24)
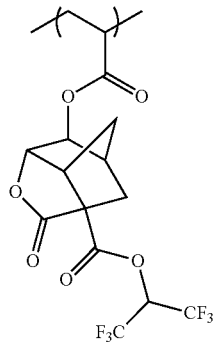
(B-25)
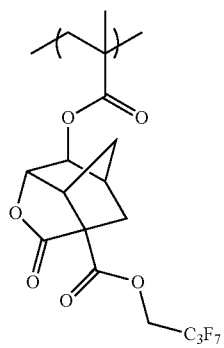
(B-26)
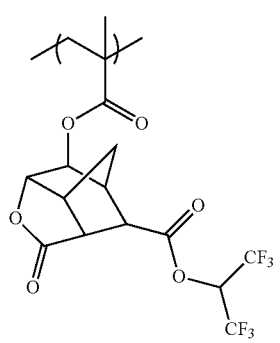

-continued
(B-27)
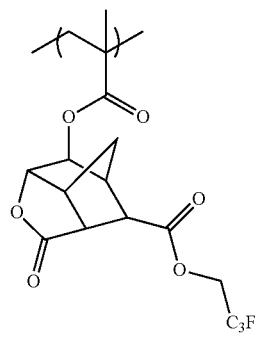
(B-28)
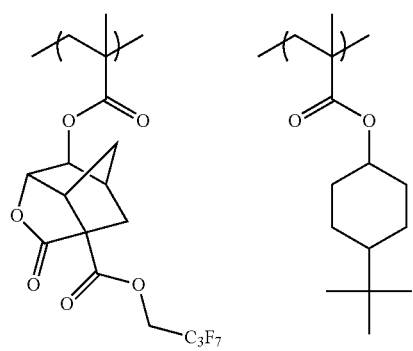
(B-29)
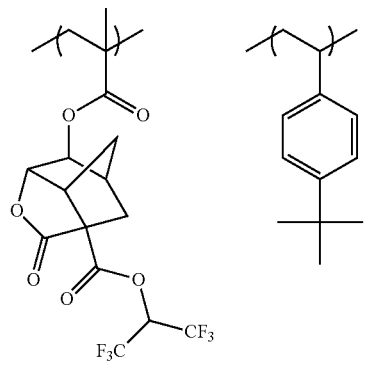
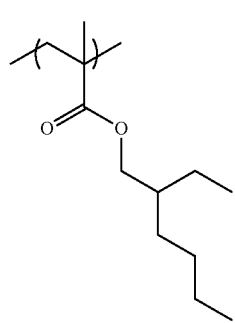
-continued
(B-30)
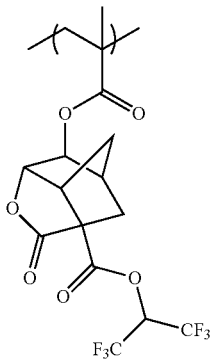
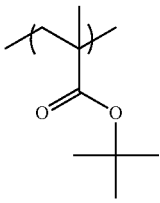
(B-31)
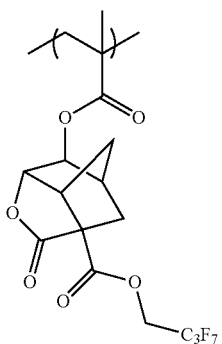
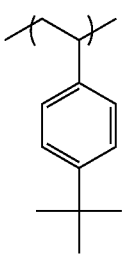
(B-32)
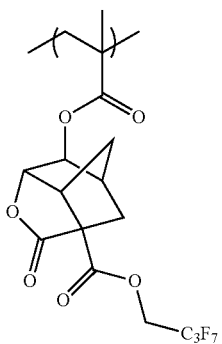
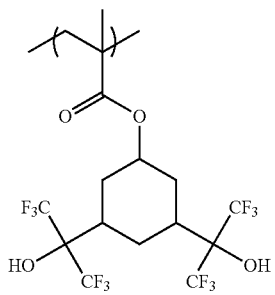
(B-33)
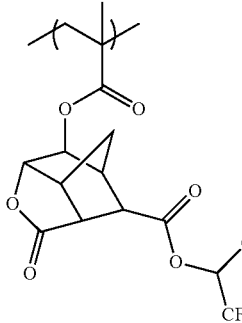
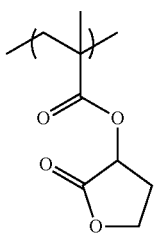

(B-34)
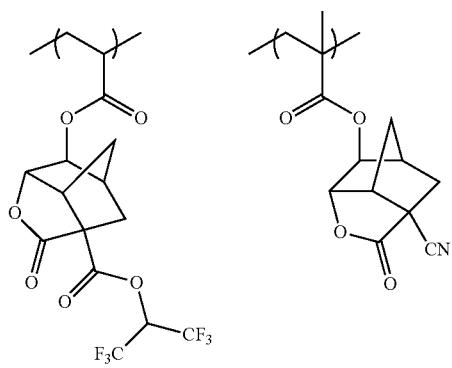
(B-35)
(B-36)
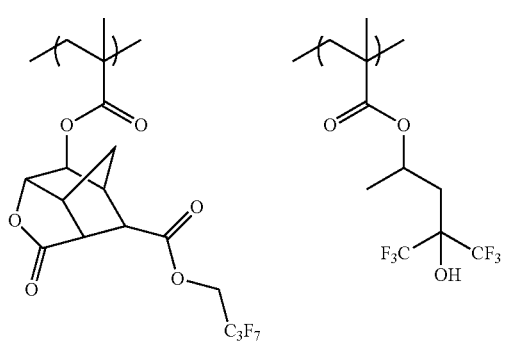
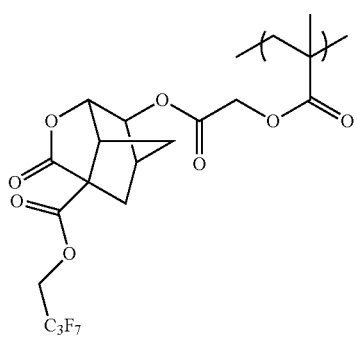
(B-37)
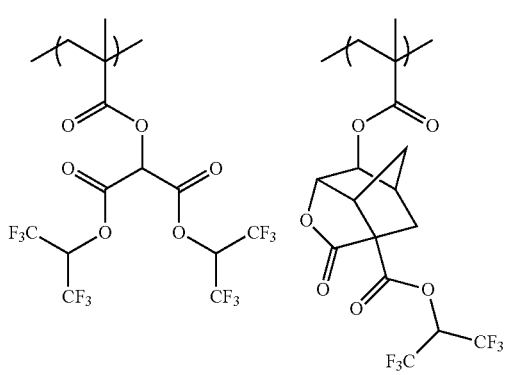
(B-38)
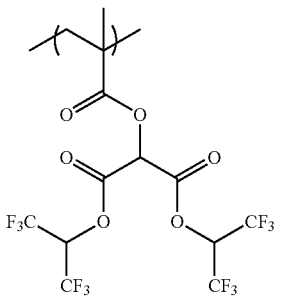
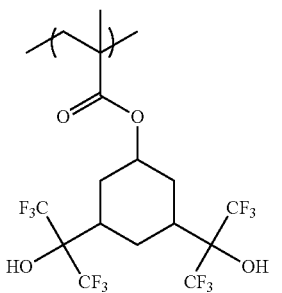
(B-39)
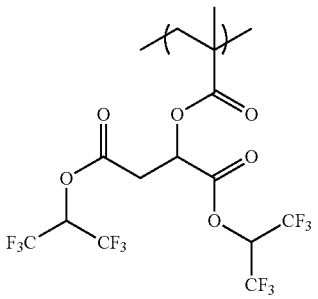
(B-40)
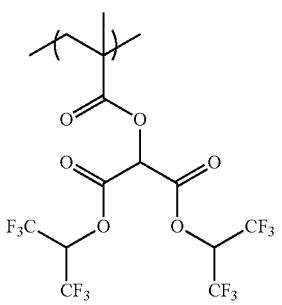
(B-41)
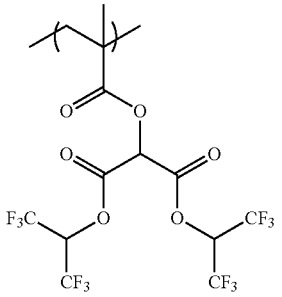

-continued
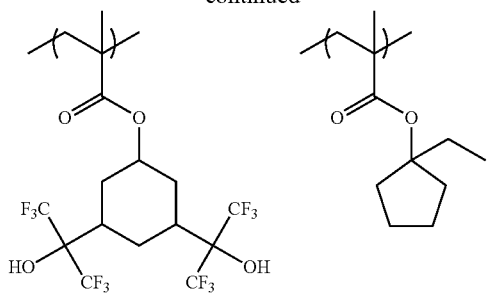
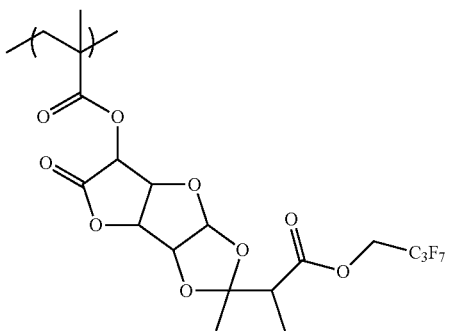
(B-44)
(B-42)
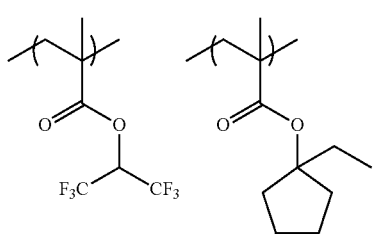
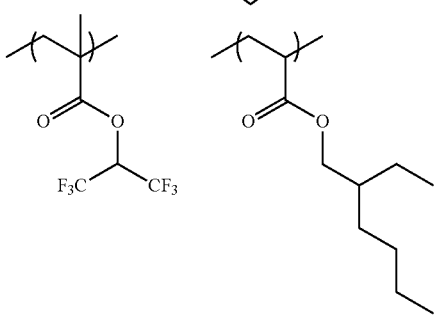
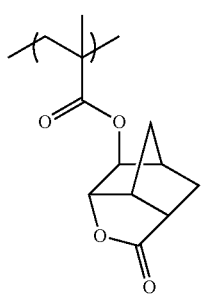
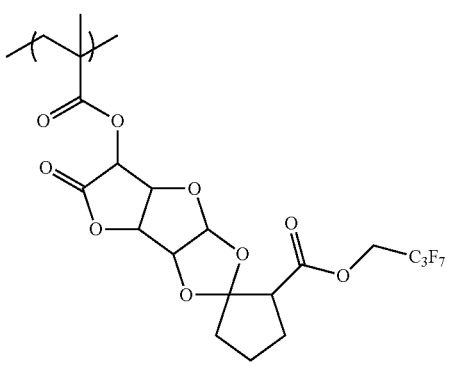
(B-45)
[Chem. 88]
(B-43)
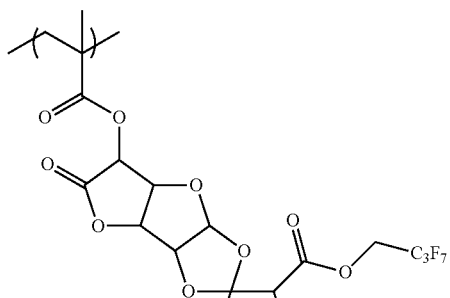
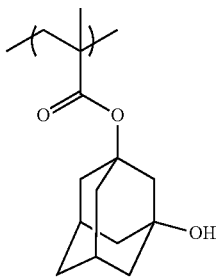
(B-46)
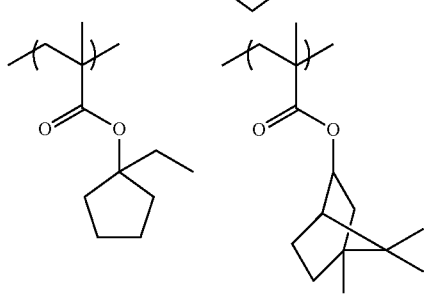
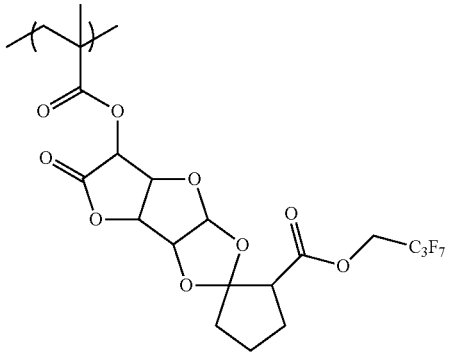

(B-47)
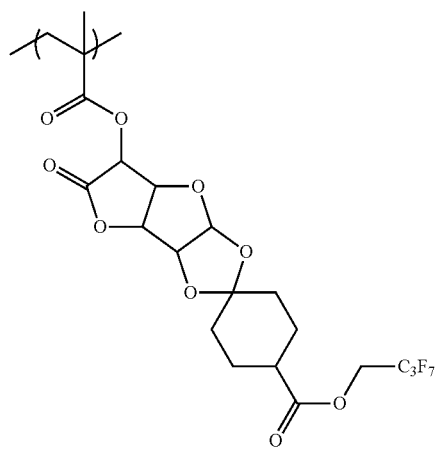
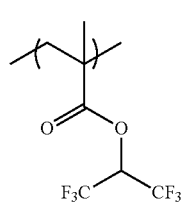
(B-48)
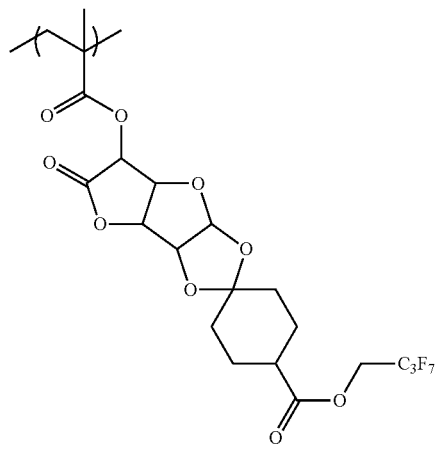
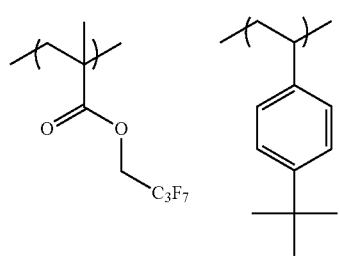
(B-49)
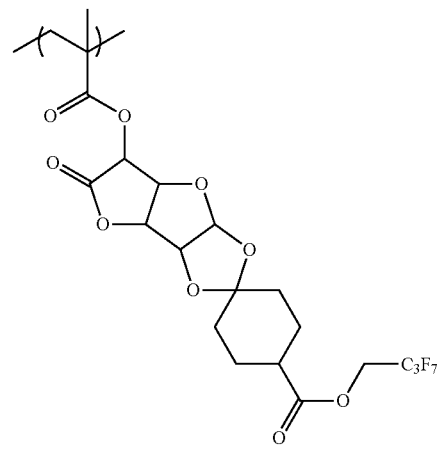
(B-50)
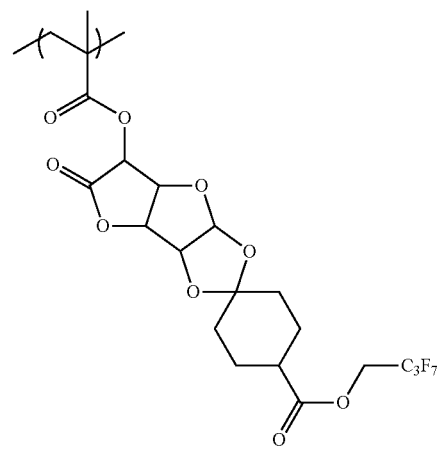
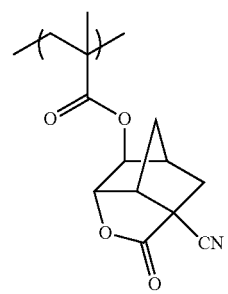
(B-51)
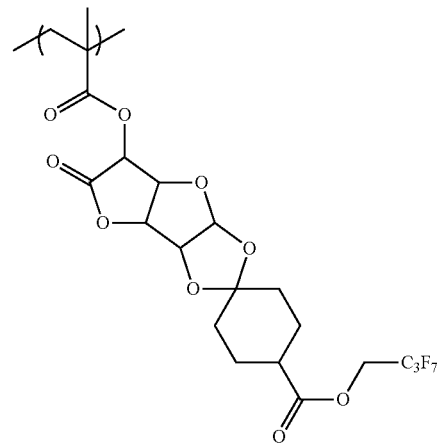

-continued
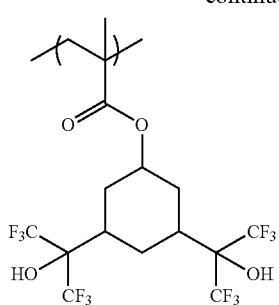
(B-52)
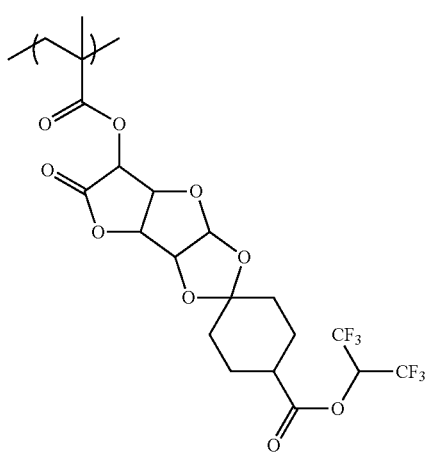
(B-53)
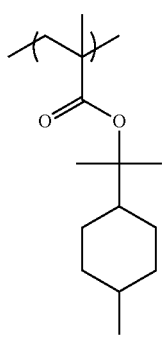
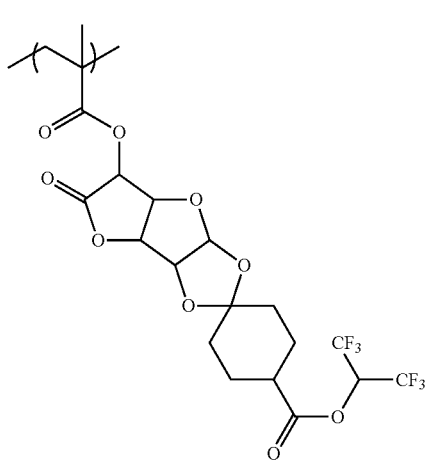
-continued
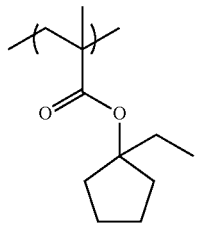
(B-54)
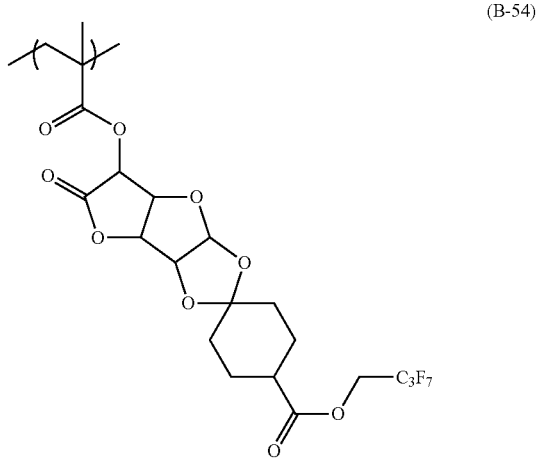
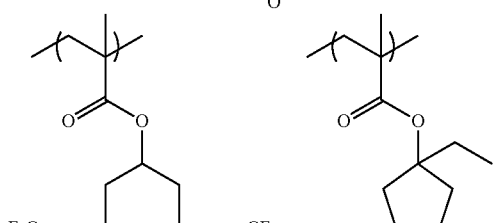
(B-55)
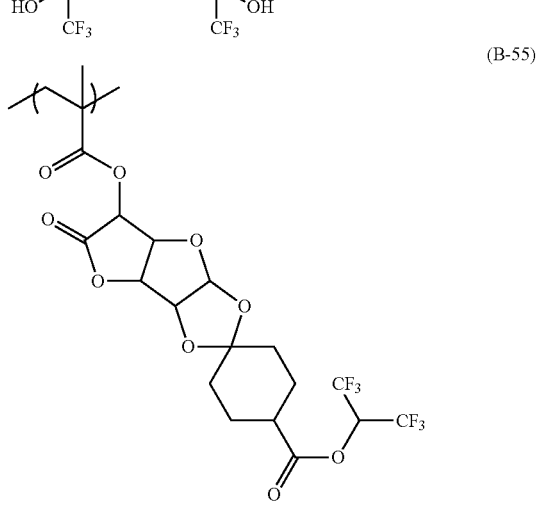
TABLE 1
| Polymer | Compositional ratio (mol %) | Mw | Mw/Mn |
|---|---|---|---|
| B-1 | 50/50 | 6000 | 1.5 |
| B-2 | 30/70 | 6500 | 1.4 |
| B-3 | 45/55 | 8000 | 1.4 |
| B-4 | 100 | 15000 | 1.7 |
| B-5 | 60/40 | 6000 | 1.4 |
| B-6 | 40/60 | 8000 | 1.4 |

TABLE 1-continued

| Polymer | Compositional ratio (mol %) | Mw | Mw/Mn |
|---|---|---|---|
| B-7 | 30/40/30 | 8000 | 1.4 |
| B-8 | 60/40 | 8000 | 1.3 |
| B-9 | 50/50 | 6000 | 1.4 |
| B-10 | 40/40/20 | 7000 | 1.4 |
| B-11 | 40/30/30 | 9000 | 1.6 |
| B-12 | 30/30/40 | 6000 | 1.4 |
| B-13 | 60/40 | 9500 | 1.4 |
| B-14 | 60/40 | 8000 | 1.4 |
| B-15 | 35/35/30 | 7000 | 1.4 |
| B-16 | 50/40/5/5 | 6800 | 1.3 |
| B-17 | 20/30/50 | 8000 | 1.4 |
| B-18 | 25/25/50 | 6000 | 1.4 |
| B-19 | 100 | 9500 | 1.5 |
| B-20 | 100 | 7000 | 1.5 |
| B-21 | 50/50 | 6000 | 1.6 |
| B-22 | 40/60 | 9600 | 1.3 |
| B-23 | 100 | 20000 | 1.7 |
| B-24 | 100 | 25000 | 1.4 |
| B-25 | 100 | 15000 | 1.7 |
| B-26 | 100 | 12000 | 1.8 |
| B-27 | 100 | 18000 | 1.3 |
| B-28 | 70/30 | 15000 | 2.0 |
| B-29 | 80/15/5 | 18000 | 1.8 |
| B-30 | 60/40 | 25000 | 1.8 |
| B-31 | 90/10 | 19000 | 1.6 |
| B-32 | 60/40 | 20000 | 1.8 |
| B-33 | 50/30/20 | 11000 | 1.6 |
| B-34 | 60/40 | 12000 | 1.8 |
| B-35 | 60/40 | 15000 | 1.6 |
| B-36 | 100 | 22000 | 1.8 |
| B-37 | 20/80 | 35000 | 1.6 |
| B-38 | 30/70 | 12000 | 1.7 |
| B-39 | 30/70 | 9000 | 1.5 |
| B-40 | 100 | 9000 | 1.5 |
| B-41 | 40/15/45 | 12000 | 1.9 |
| B-42 | 30/30/40 | 13000 | 2.0 |
| B-43 | 40/40/20 | 23000 | 2.1 |
| B-44 | 65/30/5 | 25000 | 1.6 |
| B-45 | 100 | 15000 | 1.7 |
| B-46 | 20/80 | 9000 | 1.7 |
| B-47 | 70/30 | 18000 | 1.5 |
| B-48 | 60/20/20 | 18000 | 1.8 |
| B-49 | 100 | 12000 | 1.4 |
| B-50 | 60/40 | 20000 | 1.6 |
| B-51 | 70/30 | 33000 | 2.0 |
| B-52 | 60/40 | 19000 | 1.8 |
| B-53 | 50/50 | 15000 | 1.5 |
| B-54 | 40/20/40 | 35000 | 1.9 |
| B-55 | 100 | 16000 | 1.4 |

Since the hydrophobic resin containing at least either a fluorine atom or a silicon atom is included in the actinic-ray-sensitive or radiation-sensitive resin composition of the present invention, the hydrophobic resin is unevenly distributed at a surface layer of the film formed from the actinic-ray-sensitive or radiation-sensitive resin composition and when the liquid immersion medium is water, the receding contact angle of the film surface with water after baking and before exposure can be increased, thereby enhancing the followability of the liquid for liquid immersion.

The receding contact angle of the coating film including the actinic-ray-sensitive or radiation-sensitive resin composition of the present invention that has been baked but is not yet exposed, as measured at the exposure temperature, generally room temperature of 23±3° C. and a humidity of 45±5%, is preferably in the range of 60° to 90°, more preferably 65° or more, still more preferably 70° or more and most preferably 75° or more.

The hydrophobic resin is, as described above, unevenly distributed at the interface but unlike a surfactant, need not necessarily have a hydrophilic group in the molecule and may not contribute to uniform mixing of polar/nonpolar substances.

In the liquid immersion exposure step, the liquid for liquid immersion needs to move on a wafer following the movement of an exposure head that is scanning the wafer at a high speed and forming an exposure pattern. Therefore, the contact angle of the liquid for liquid immersion with the resist film in a dynamic state is important, and the resist is required to have a performance of allowing liquid droplets to follow the high-speed scanning of an exposure head without leaving any liquid droplet.

As the hydrophobic resin is hydrophobic, the problems of development residue (scum) and BLOB defect after alkali development are likely to become serious. However, improvement of performance in terms of the development residue (scum) and BLOB defect can be attained due to an increase in alkali dissolution rate by containing three or more polymer chains combined together through at least one branch point, as compared with linear chain resins.

When the hydrophobic resin contains a fluorine atom, the content of the fluorine atoms is preferably from 5 to 80 mass %, and more preferably from 10 to 80 mass %, based on the molecular weight of the hydrophobic resin. The proportion of the repeating units containing a fluorine atom is preferably from 10 to 100 mol %, and more preferably 30 to 100 mol %, based on all repeating units in the hydrophobic resin.

When the hydrophobic resin contains a silicon atom, the content of the silicon atoms is preferably from 2 to 50 mass %, and more preferably from 2 to 30 mass %, based on the molecular weight of the hydrophobic resin. The proportion of the repeating units containing a silicon atom is preferably from 10 to 90 mol %, and more preferably 20 to 80 mol %, based on all the repeating units of the hydrophobic resin.

The weight average molecular weight of the hydrophobic resin is preferably in the range of 1,000 to 100,000, more preferably 2,000 to 50,000 and still more preferably 3,000 to 35,000. Here, the weight average molecular weight of the resin indicates a molecular weight in terms of polystyrene as measured by GPC (carrier: tetrahydrofuran (THF)).

The content of the hydrophobic resin in the actinic-ray-sensitive or radiation-sensitive resin composition may be adjusted prior to use so that the receding contact angle of the film formed of the actinic-ray-sensitive or radiation-sensitive resin composition falls within the above-specified range. The content of the hydrophobic resin is preferably in the range of 0.01 to 20 mass %, more preferably 0.1 to 15 mass %, still more preferably 0.1 to 10 mass % and most preferably 0.2 to 8 mass %, based on the total solid content of the actinic-ray-sensitive or radiation-sensitive resin composition.

The hydrophobic resins may be used alone or in combination of two or more thereof.

[5] Basic Compound

The actinic-ray-sensitive or radiation-sensitive composition of the present invention preferably contains a basic compound.

The basic compound is preferably a nitrogen-containing organic basic compound.

The compounds that can be used are not particularly limited, but for example, the compounds classified into the following categories (1) to (4) are preferably used.

(1) Compound Represented by Following General Formula (BS-1)

[Chem. 89]

(BS-1)

In the general formula (BS-1),

R's each independently represent any one of a hydrogen atom, an (linear or branched) alkyl group, a (monocyclic or polycyclic) cycloalkyl group, an aryl group, and an aralkyl group, provided that all the three R's are not hydrogen atoms at the same time.

The number of carbon atoms of the alkyl group as R is not particularly limited, but, it is generally 1 to 20, and preferably 1 to 12.

The number of carbon atoms of the cycloalkyl group as R is not particularly limited, but it is generally 3 to 20, and preferably 5 to 15.

The number of carbon atoms of the aryl group as R is not particularly limited, but it is generally 6 to 20, and preferably 6 to 10. In particular, examples of the aryl group include a phenyl group and a naphthyl group.

The number of carbon atoms of the aralkyl group as R is not particularly limited, but it is generally 7 to 20, and preferably 7 to 11. In particular, examples of the aralkyl group include a benzyl group.

In the alkyl group, the cycloalkyl group, the aryl group, and the aralkyl group as by R, a hydrogen atom may be substituted with a substituent. Examples of the substituent include an alkyl group, a cycloalkyl group, an aryl group, an aralkyl group, a hydroxyl group, a carboxyl group, an alkoxy group, an aryloxy group, an alkylcarbonyloxy group, and an alkyloxycarbonyl group.

In the compounds represented by the general formula (BS-1), it is preferable that only one R of the three R's be a hydrogen atom or that all the R's of the three R's not be hydrogen atoms.

Specific examples of the compounds of the general formula (BS-1) include tri-n-butylamine, tri-n-pentylamine, tri-n-octylamine, tri-n-decylamine, triisodecylamine, dicyclohexylmethyl amine, tetradecylamine, pentadecylamine, hexadecyl amine, octadecylamine, dodecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl) aniline, and N-phenyldiethanolamine.

Furthermore, in the general formula (BS-1), the compound in which at least one of the R's is an alkyl group substituted with a hydroxyl group can be mentioned as a preferable embodiment of the compounds. Specific examples of the compound include triethanolamine and N,N-dihydroxyethylaniline.

Furthermore, with respect to the alkyl group as R, an oxygen atom may be present in the alkyl chain so as to form an oxyalkylene chain. The oxyalkylene chain is preferably —CH$_2$CH$_2$O—. Specific examples thereof include tris(methoxyethoxyethyl)amine, compounds exemplified in column 3 line 60 et seq. of U.S. Pat. No. 6,040,112A, and the like.

(2) Compound Having Nitrogen-Containing Heterocyclic Structure

The heterocyclic structure may not have aromaticity. Further, it may have a plurality of nitrogen atoms, and also may have a heteroatom other than nitrogen. Examples thereof include compounds having an imidazole structure (2-phenylbenzoimidazole, 2,4,5-triphenylimidazole, and the like), compounds having a piperidine structure (N-hydroxyethylpiperidine, bis(1,2,2,6,6-pentamethyl-4-piperidyl)sebacate, and the like), compounds having a pyridine structure (4-dimethylaminopyridine and the like), and compounds having an antipyrine structure (antipyrine, hydroxyantipyrine, and the like).

In addition, compounds with two or more ring structures can be appropriately used. Specific examples thereof include 1,5-diazabicyclo[4.3.0]non-5-ene and 1,8-diazabicyclo [5.4.0]-undec-7-ene.

(3) Amine Compound Containing Phenoxy Group

The amine compounds containing a phenoxy group are those having a phenoxy group at the end of the alkyl group of each of the amine compounds opposite to the nitrogen atom. The phenoxy group may have a substituent, such as an alkyl group, an alkoxy group, a halogen atom, a cyano group, a nitro group, a carboxyl group, a carboxylic ester group, a sulfonic ester group, an aryl group, an aralkyl group, an acyloxy group, and an aryloxy group.

Compounds having at least one oxyalkylene chain between the phenoxy group and the nitrogen atom are more preferred. The number of oxyalkylene chains in each molecule is preferably in the range of 3 to 9, and more preferably 4 to 6. Among the oxyalkylene chains, —CH$_2$CH$_2$O— is preferred.

Specific examples thereof include 2-[2-{2-(2,2-dimethoxy-phenoxyethoxy)ethyl}-bis-(2-methoxyethyl)]-amine, compounds (C1-1) to (C3-3) exemplified in the paragraph [0066] of US2007/0224539A1, and the like.

(4) Ammonium Salt

Ammonium salts can also be appropriately used. Hydroxides and carboxylates are preferred. Specific preferable examples thereof include tetraalkylammonium hydroxides, a typical example of which is tetrabutylammonium hydroxide.

Examples of other compounds that can be used in the composition of the present invention include compounds synthesized in Examples of JP2002-363146A compounds described in the paragraph [0108] of JP2007-298569A, and the like.

These basic compounds are used singly or in combination of two or more kinds thereof.

The content of the basic compound to be used is usually from 0.001 to 10 mass %, and preferably from 0.01 to 5 mass %, based on the solids of the composition.

The molar ratio of the acid generator to the basic compound is preferably from 2.5 to 300. That is, the molar ratio of 2.5 or more is preferred from the viewpoint of sensitivity and resolution, and 300 or less is preferred from the viewpoint of inhibition of the reduction of resolution by the thickening of the pattern in aging after exposure until heat treatment. The molar ratio is more preferably 5.0 to 200, and still more preferably 7.0 to 150.

[6] Low-Molecular-Weight Compound Containing Nitrogen Atom and Containing Group that Leaves by Action of Acid The composition of the present invention can include a low-molecular-weight compound containing a nitrogen atom and a group that leaves by the action of an acid (which is also referred to as a "low-molecular-weight compound (D)" or a "compound (D)").

The group that leaves by the action of an acid is not particularly limited, but an acetal group, a carbonate group, a carbamate group, a tertiary ester group, a tertiary hydroxyl group, and a hemiaminal ether group are preferred, and a carbamate group and a hemiaminal ether group are particularly preferred.

The molecular weight of the low-molecular-weight compound (F) containing a group that leaves by the action of an acid is preferably 100 to 1000, more preferably 100 to 700, and particularly preferably 100 to 500.

As the compound (D), an amine derivative containing group that leaves by the action of an acid on a nitrogen atom is preferred.

The compound (D) may contain a carbamate group having a protecting group on a nitrogen atom. The protecting group constituting the carbamate group can be represented by the following general formula (d-1).

[Chem. 90]

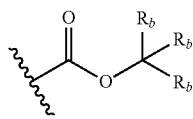

(d-1)

In the general formula (d-1),

Rb's each independently represent a hydrogen atom, an alkyl group, a cycloalkyl group, an aryl group, an aralkyl group, or an alkoxyalkyl group. Rb's may be bonded to each other to form a ring.

The alkyl group, the cycloalkyl group, the aryl group, or the aralkyl group represented by Rb may be substituted with a functional group such as a hydroxyl group, a cyano group, an amino group, a pyrrolidino group, a piperidino group, a morpholino group, and an oxo group, an alkoxy group, or a halogen atom. This case comes under the alkoxyalkyl group represented by Rb.

Examples of the alkyl group, the cycloalkyl group, the aryl group, or the aralkyl group of Rb above (the alkyl group, the cycloalkyl group, the aryl group, and the aralkyl group may be substituted with the above-described functional group, an alkoxy group, or a halogen atom) include:

- a group derived from a linear or branched alkane such as methane, ethane, propane, butane, pentane, hexane, heptane, octane, nonane, decane, undecane, and dodecane, or a group where the group derived from an alkane is substituted with one or more kinds of or one or more groups of cycloalkyl groups such as a cyclobutyl group, a cyclopentyl group, and a cyclohexyl group;
- a group derived from a cycloalkane such as cyclobutane, cyclopentane, cyclohexane, cycloheptane, cyclooctane, norbornane, adamantane, and noradamantane, or a group where the group derived from a cycloalkane is substituted with one or more kinds of or one or more groups of linear or branched alkyl group such as a methyl group, an ethyl group, an n-propyl group, an i-propyl group, an n-butyl group, a 2-methylpropyl group, a 1-methylpropyl group, and a t-butyl group;
- a group derived from an aromatic compound such as benzene, naphthalene, and anthracene, or a group where the group derived from an aromatic compound is substituted with one or more kinds of or one or more groups of linear or branched alkyl group such as a methyl group, an ethyl group, an n-propyl group, an i-propyl group, an n-butyl group, a 2-methylpropyl group, a 1-methylpropyl group, and a t-butyl group;
- a group derived from a heterocyclic compound such as pyrrolidine, piperidine, morpholine, tetrahydrofuran, tetrahydropyran, indole, indoline, quinoline, perhydroquinoline, indazole, and benzimidazole, or a group where the group derived from a heterocyclic compound is substituted with one or more kinds of or one or more groups of linear or branched alkyl groups or aromatic compound-derived groups;
- a group where the group derived from a linear or branched alkane or the group derived from a cycloalkane is substituted with one or more kinds of or one or more groups of aromatic compound-derived group such as a phenyl group, a naphthyl group, and an anthracenyl group; and
- a group where the substituent above is substituted with a functional group such as a hydroxyl group, a cyano group, an amino group, a pyrrolidino group, a piperidino group, a morpholino group, and an oxo group.

Rb is preferably a linear or branched alkyl group, a cycloalkyl group, or an aryl group, and more preferably a linear or branched alkyl group or a cycloalkyl group.

Examples of the ring formed by the mutual bonding of two Rb's include an alicyclic hydrocarbon group, an aromatic hydrocarbon group, a heterocyclic hydrocarbon group, and derivatives thereof.

Specific structures of the group represented by the general formula (d-1) will be shown below.

[Chem. 91]

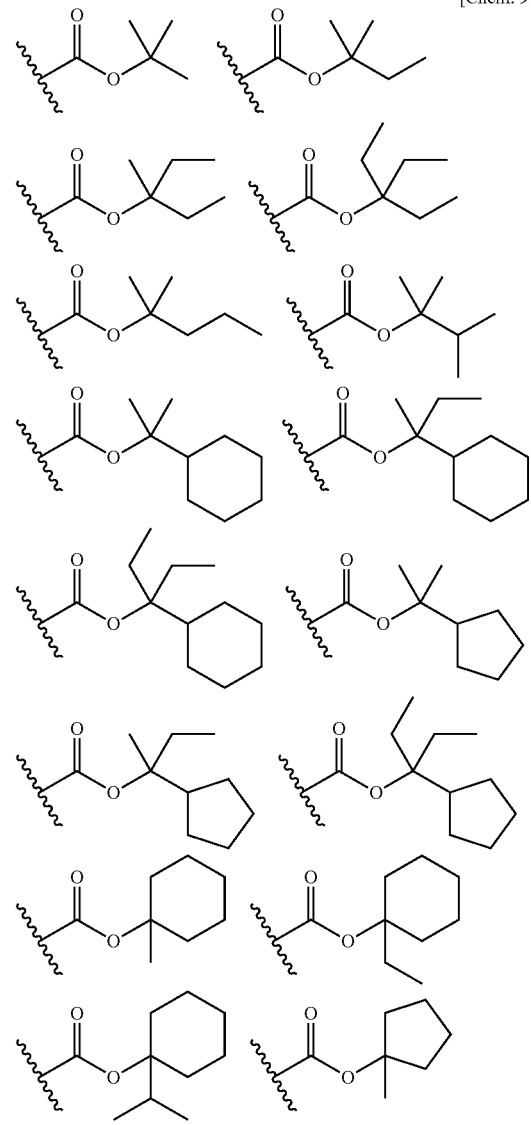

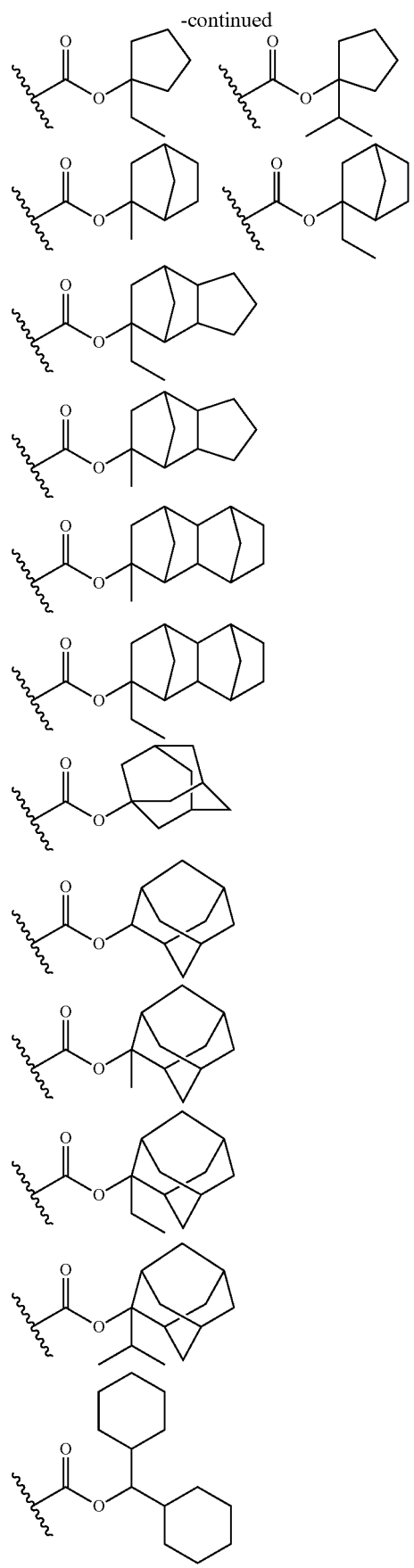
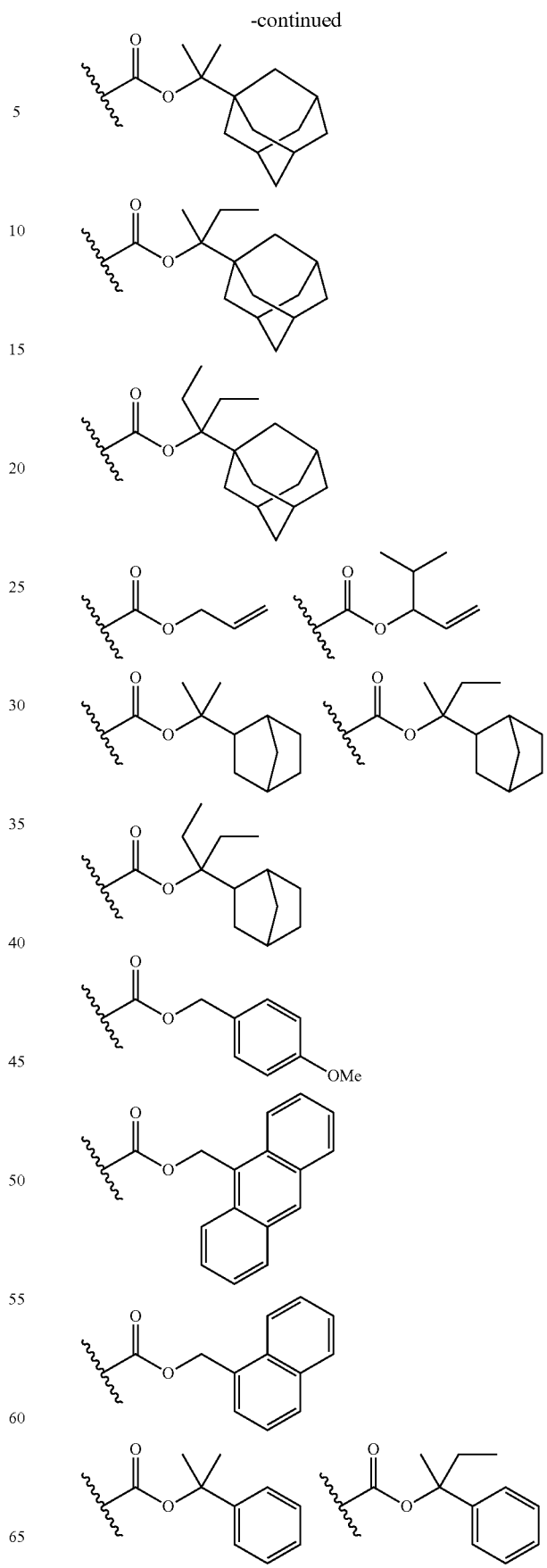

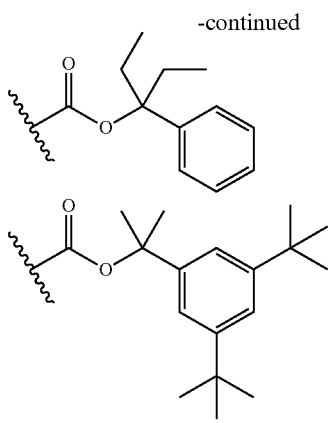

The compound (D) can be formed by any combination of the basic compound and a structure represented by the general formula (d-1).

The compound (D) is particularly preferably one having a structure represented by the following general formula (A).

Further, the compound (D) may correspond to the basic compound as long as it is a low-molecular-weight compound containing group that leaves by the action of an acid.

[Chem. 92]

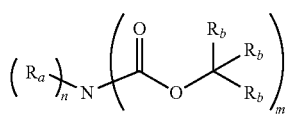

(A)

In the general formula (A), Ra represents a hydrogen atom, an alkyl group, a cycloalkyl group, an aryl group, or an aralkyl group. Further, with n=2, two Ra's may be the same as or different from each other, or the two Ra's may be bonded to each other to form a divalent heterocyclic hydrocarbon group (preferably having 20 or less carbon atoms) or a derivative thereof.

Rb has the same meaning as Rb in the general formula (d-1), and preferable examples thereof are also the same. However, in —C(Rb)(Rb)(Rb), when one or more Rb's are hydrogen atoms, at least one of the remaining Rb's is a cyclopropyl group, a 1-alkoxyalkyl group, or an aryl group.

n represents an integer of 0 to 2 and m represents an integer of 1 to 3, with n+m=3.

In the general formula (A), the alkyl group, the cycloalkyl group, the aryl group, or the aralkyl group represented by Ra may be the same substituent as one which substitutes the alkyl group, the cycloalkyl group, the aryl group, or the aralkyl group represented by Rb.

Specific examples of the alkyl group, the cycloalkyl group, the aryl group, or the aralkyl group of Ra (the alkyl group, the cycloalkyl group, the aryl group, or the aralkyl group may be substituted with the above-described group) include the same as the groups described with respect to Rb.

Furthermore, examples of the divalent heterocyclic hydrocarbon group (preferably having 1 to 20 carbon atoms) formed by the mutual bonding of Ra's or a derivative thereof include a group derived from a heterocyclic compound, such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline, and 1,5,9-triazacyclododecane; and a group as obtained by substituting the above heterocyclic-compound-derived group with at least one or at least one type of linear or branched-alkane-derived group, a cycloalkane-derived group, aromatic-compound-derived group, heterocyclic-compound-derived group or functional group, such as a hydroxyl group, a cyano group, an amino group, a pyrrolidino group, a piperidino group, a morpholino group, and an oxo group.

Specific particularly preferred examples of the compound (D) in the present invention will be shown below, but the present invention is not limited thereto.

[Chem. 93]

(D-1)

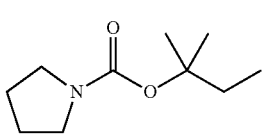

(D-2)

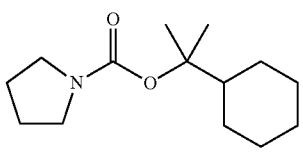

(D-3)

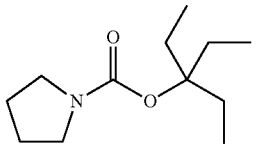

(D-4)

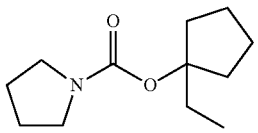

(D-5)

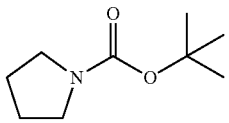

(D-6)

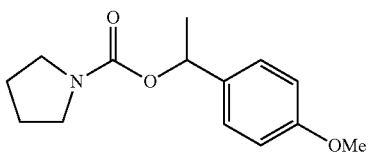

(D-7)

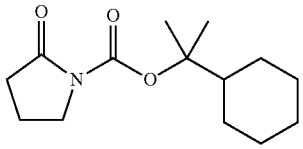

-continued
(D-8)
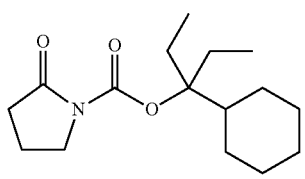
(D-9)
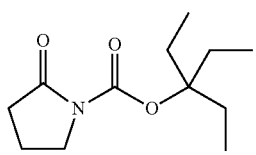
(D-10)
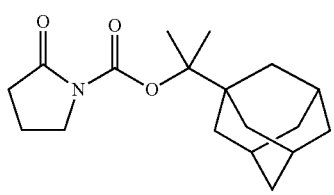
(D-11)
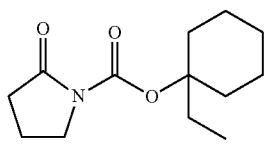
(D-12)
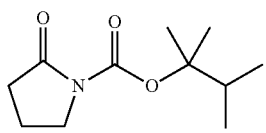
(D-13)
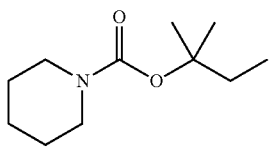
(D-14)
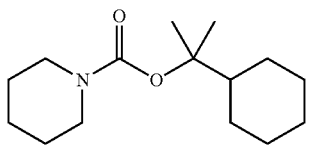
(D-15)
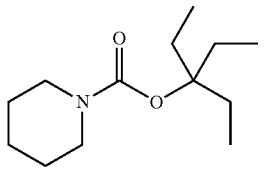
(D-16)
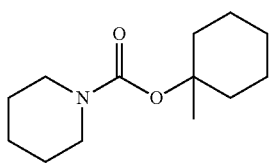
-continued
(D-17)
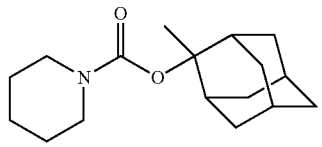
(D-18)
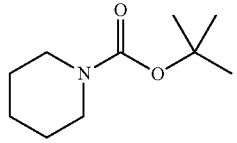
(D-19)
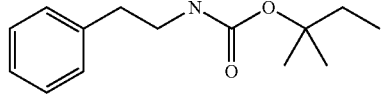
(D-20)
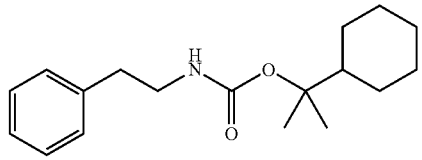
(D-21)
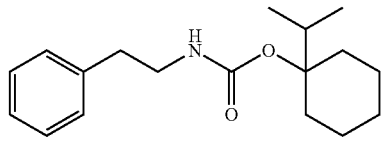
(D-22)
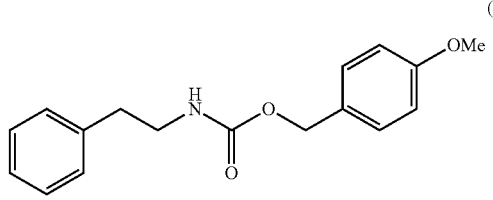
(D-23)
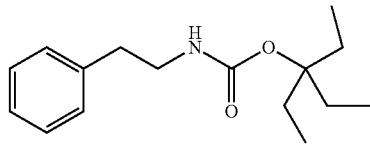
(D-24)
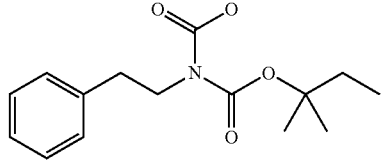

-continued
(D-25)
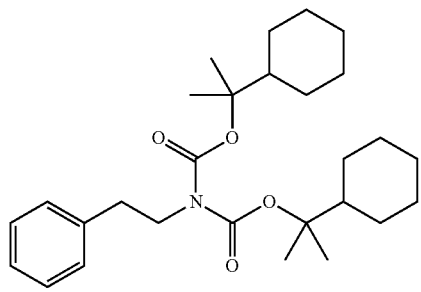
(D-26)
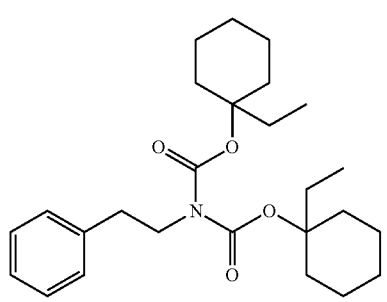
(D-27)
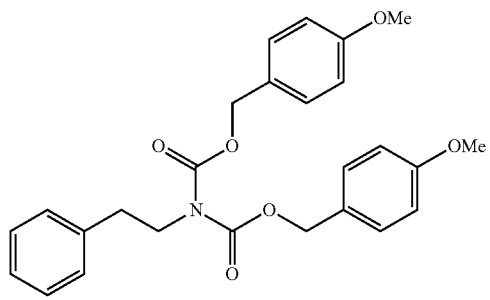
(D-28)
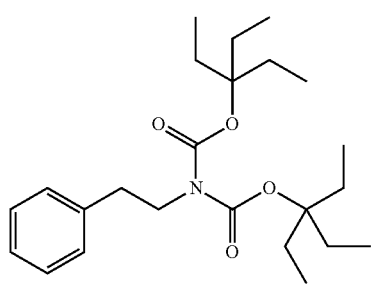
(D-29)
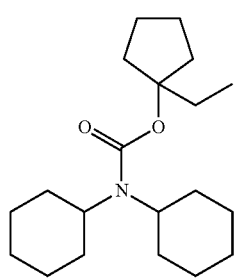
-continued
(D-30)
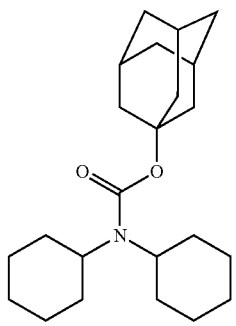
(D-31)
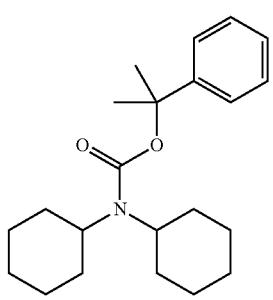
(D-32)
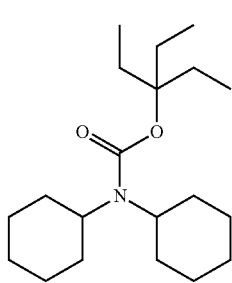
(D-33)
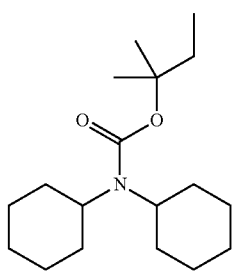
(D-34)
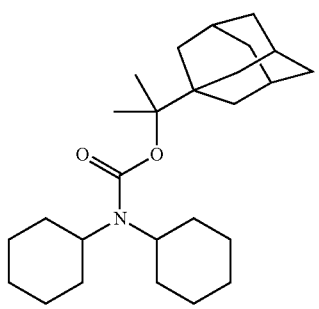

(D-35) 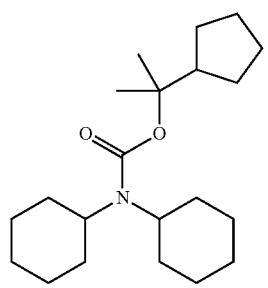
(D-36) 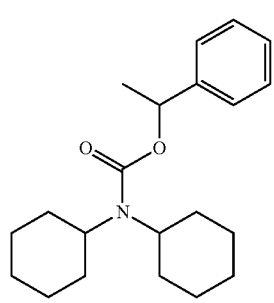
(D-37) 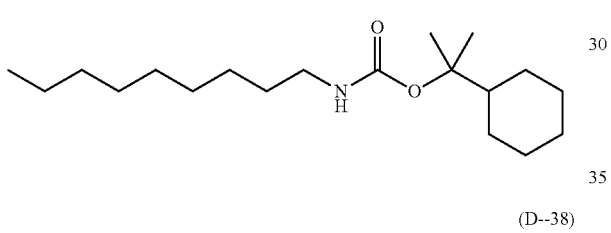
(D-38) 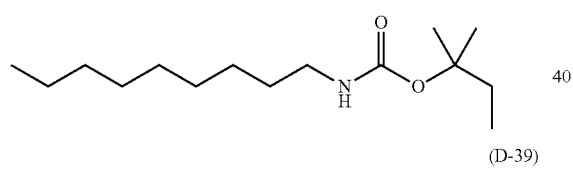
(D-39) 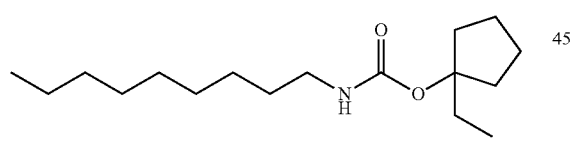
(D-40) 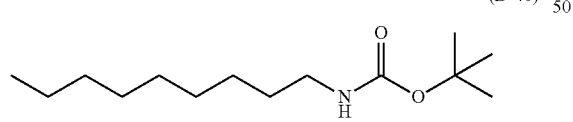
(D-41) 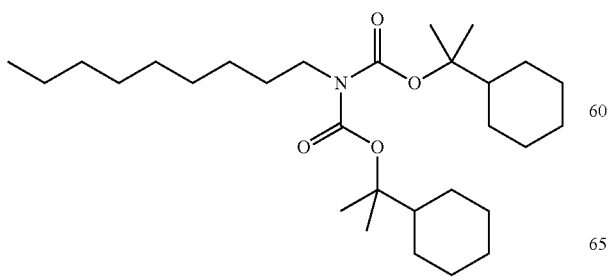
(D-42) 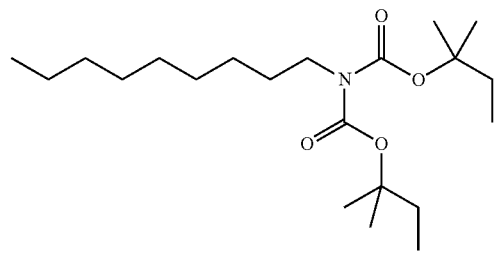
(D-43) 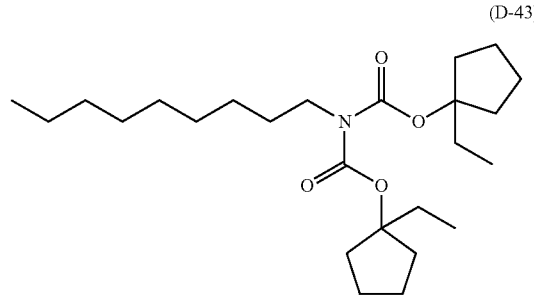
(D-44) 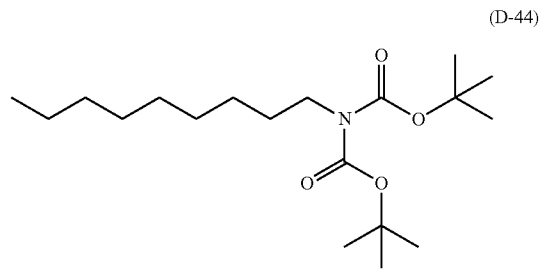
(D-45) 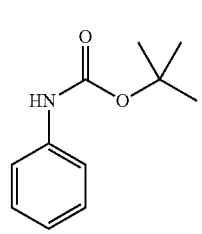
(D-46) 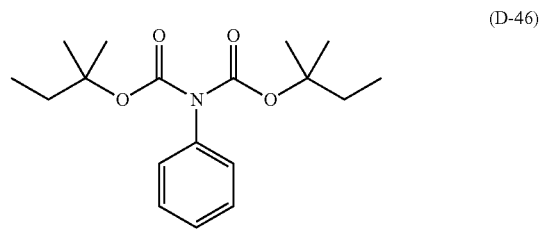
(D-47) 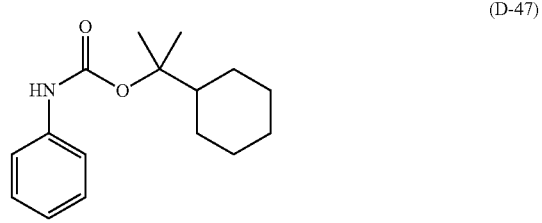

-continued

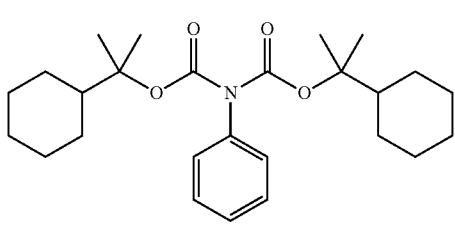
(D-48)

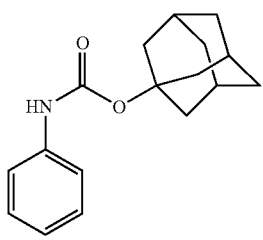
(D-49)

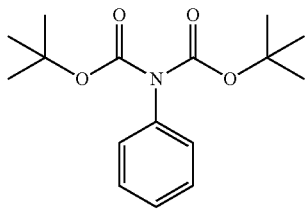
(D-50)

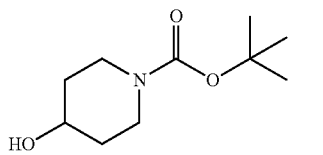
(D-51)

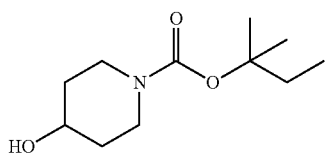
(D-52)

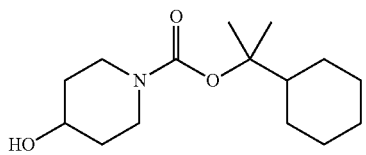
(D-53)

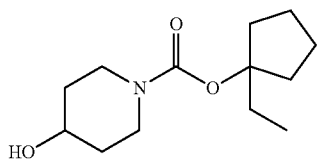
(D-54)

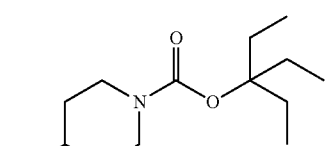
(D-55)

The compound represented by the general formula (A) can be synthesized according to JP2007-298569A, JP2009-199021A, or the like.

In the present invention, the low-molecular-weight compound (D) containing a nitrogen atom and containing a group that leaves by the action of an acid may be used singly or used after mixing two or more kinds thereof.

The composition of the present invention may not include the low-molecular-weight compound (D) containing a nitrogen atom and containing a group that leaves by the action of an acid, but if included, the content of the compound (D) is usually from 0.001 to 20 mass %, preferably from 0.001 to 10 mass %, and more preferably from 0.01 to 5 mass %, based on the total solid content of the composition combined with the basic compound.

With respect to the ratio of the acid generator to the compound (D) used in the composition, preferably, the acid generator/[compound (D)+the basic compound] (molar ratio) =2.5 to 300. The reason for this is that the molar ratio is preferred to be 2.5 or higher from the viewpoint of sensitivity and resolving power. The molar ratio is preferred to be 300 or less from the viewpoint of the inhibition of any resolving power deterioration due to thickening of resist pattern over time from exposure to heating treatment. The acid generator/[compound (D)+the basic compound] (molar ratio) is more preferably 5.0 to 200, and still more preferably 7.0 to 150.

[7] Basic Compound or Ammonium Salt Compound (E) which Decreases Basicity by Irradiation with Actinic Rays or Radiations The actinic-ray-sensitive or radiation-sensitive resin composition in the present invention preferably contains a basic compound or an ammonium salt compound which decreases basicity by irradiation with actinic rays or radiations (which is also referred to as a "compound (E)").

The compound (E) is preferably a compound (E-1) having a basic functional group or an ammonium group, and a group which produces an acidic functional group by irradiation with actinic rays or radiations. That is, the compound (E) is preferably a basic compound having a basic functional group and a group which produces an acidic functional group by irradiation with actinic rays or radiations, or an ammonium slat compound having an ammonium group and a group which produces an acidic functional group by irradiation with actinic rays or radiations.

Examples of the compound (E) or (E-1), which decomposes and is generated by irradiation with actinic rays or radiations, and thus decreases basicity include a compound represented by the following general formula (PA-I), (PA-II), or (PA-III), and from the viewpoint of attaining excellent effects to a high degree in all of LWR, uniformity in local pattern dimension, and DOF (Depth of Focus), the compound represented by the general formula (PA-II) or (PA-III) is particularly preferred.

First, the compound represented by the general formula (PA-I) will be described.

$$Q\text{-}A_1\text{-}(X)_n\text{-}B\text{-}R \quad (PA\text{-}I)$$

In the general formula (PA-I), $A_1$ represents a single bond or a divalent linking group, Q represents —$SO_3H$ or —$CO_2H$, and corresponds to an acidic functional group which is generated by irradiation with actinic rays or radiations, X represents —$SO_2$— or —CO—, n represents 0 or 1, B represents a single bond, an oxygen atom, or —N(Rx)—, Rx represents a hydrogen atom or a monovalent organic group, and R represents a monovalent organic group containing a basic functional group or a monovalent organic group containing an ammonium group.

Next, the compound represented by the general formula (PA-II) will be described.

$$\text{—NH—}X_2\text{-}Q_2 \quad (PA\text{-}II)$$

In the general formula (PA-II),

Q₁ and Q₂ each independently represent a monovalent organic group, provided that any one of Q₁ and Q₂ contains a basic functional group, and Q₁ and Q₂ may be bonded to each other to form a ring and the ring formed may contain a basic functional group, and X₁ and X₂ each independently represent —CO— or —SO₂—.

Further, —NH— corresponds to an acidic functional group which is generated by irradiation with actinic rays or radiations.

Next, the compound represented by the general formula (PA-III) will be described.

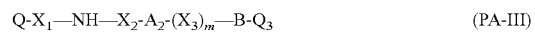

Q-X₁—NH—X₂-A₂-(X₃)ₘ—B-Q₃        (PA-III)

In the general formula (PA-III),

Q₁ and Q₃ each independently represent a monovalent organic group, provided that any one of Q₁ and Q₃ contains a basic functional group, and Q₁ and Q₃ may be bonded to each other to form a ring and the ring formed may contain a basic functional group, X₁, X₂, and X₃ each independently represent —CO— or —SO₂—, A₂ represents a divalent linking group, B represents a single bond, an oxygen atom, or —N(Qx)-, Qx represents a hydrogen atom or a monovalent organic group, when B is —N(Qx)-, Q₃ and Qx may be bonded to each other to form a ring, and m represents 0 or 1.

Further, —NH— corresponds to an acidic functional group which is generated by irradiation with actinic rays or radiations.

Specific examples of the compound (E) which generates the compound represented by the general formula (PA-I) by irradiation with actinic rays or radiations will be shown below, but the present invention is not limited thereto.

[Chem. 95]

(PA-1)

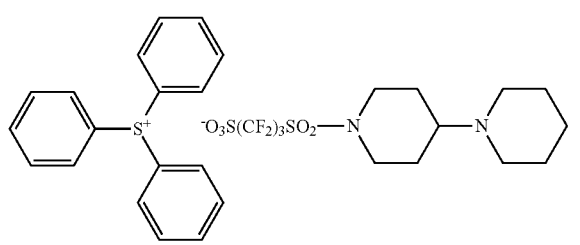

(PA-2)

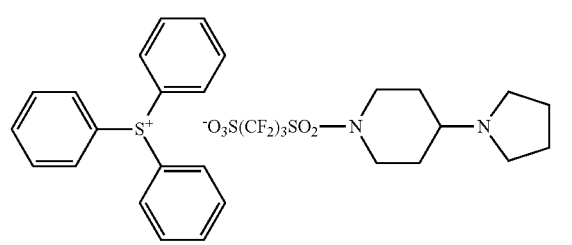

(PA-3)

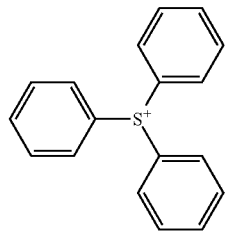

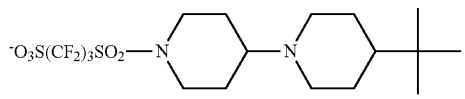

(PA-4)

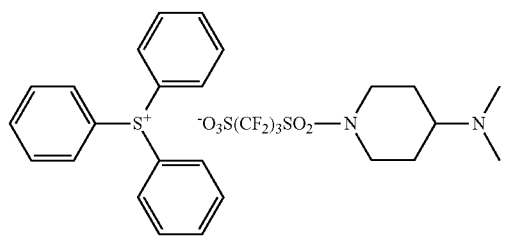

(PA-5)

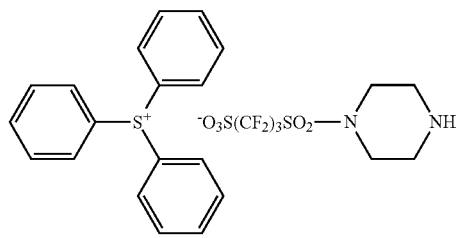

(PA-6)

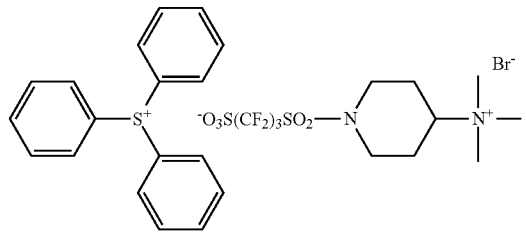

(PA-7)

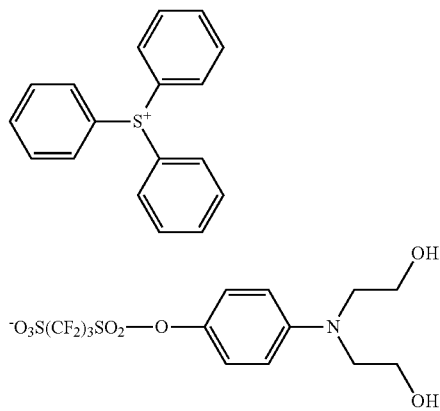

(PA-8)
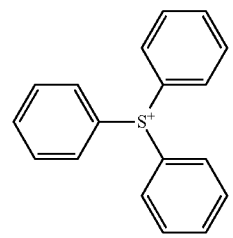
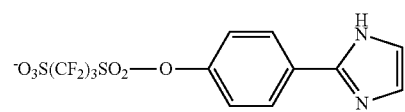
(PA-9)
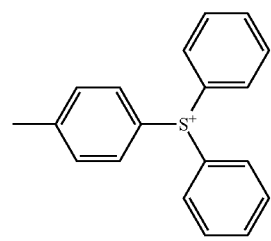
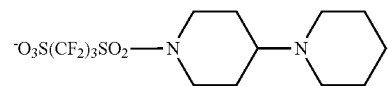
(PA-10)
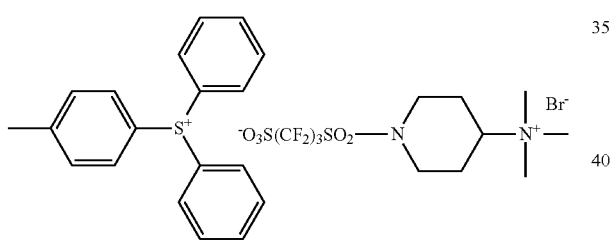
(PA-11)
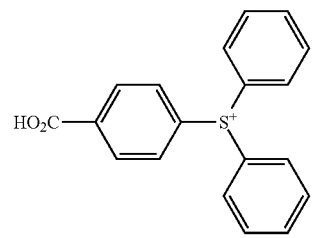
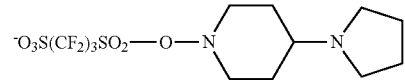
(PA-12)
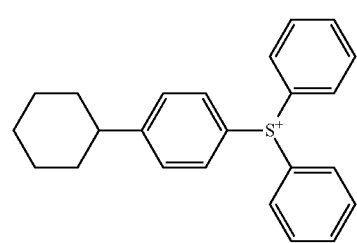
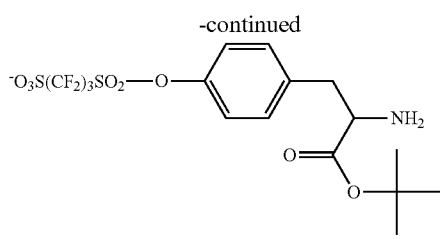
(PA-13)
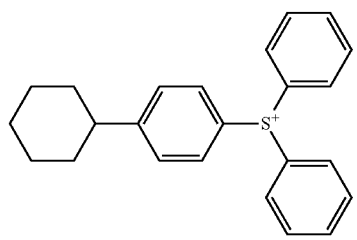
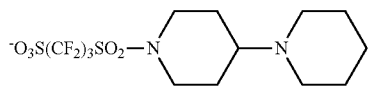
(PA-14)
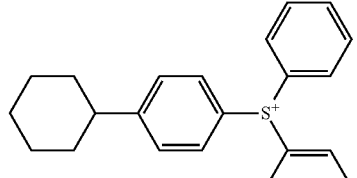
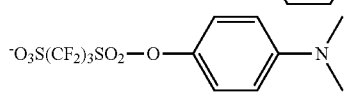
(PA-15)
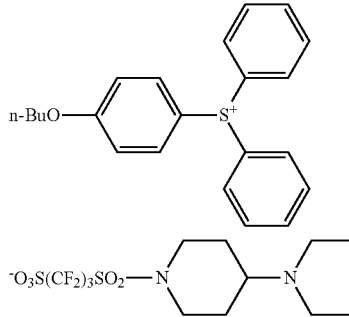
(PA-16)
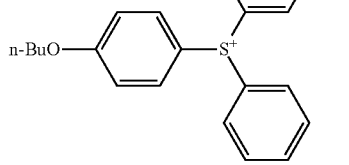
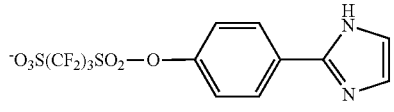

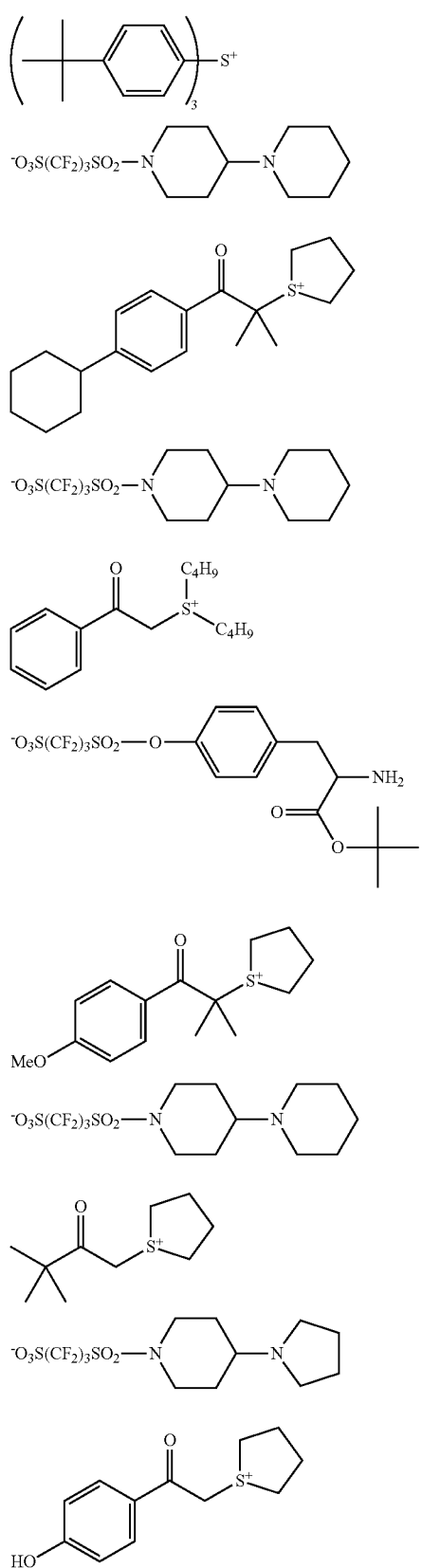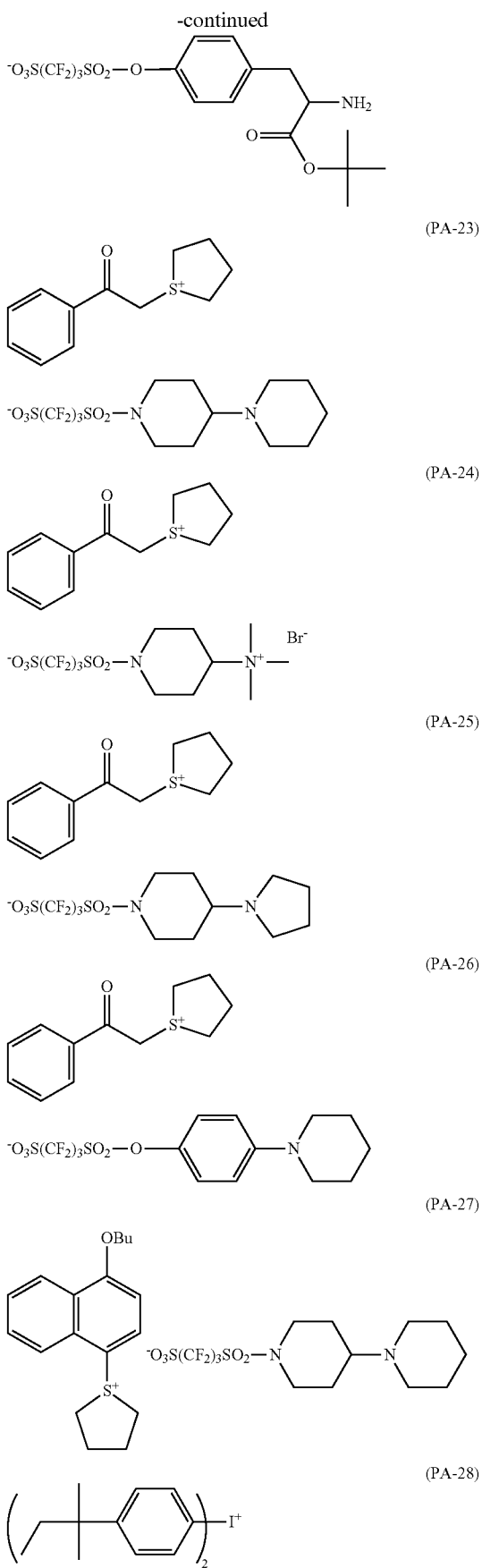

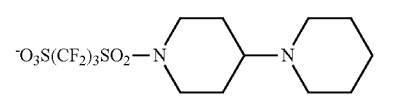
(PA-29)
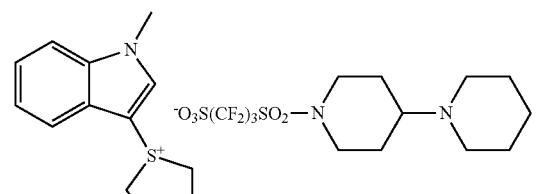
(PA-30)
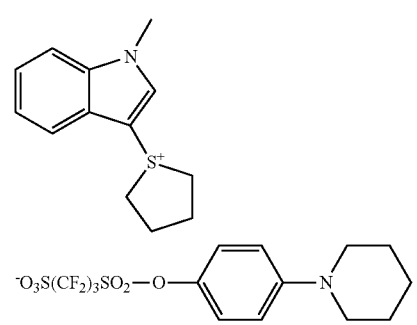
(PA-31)
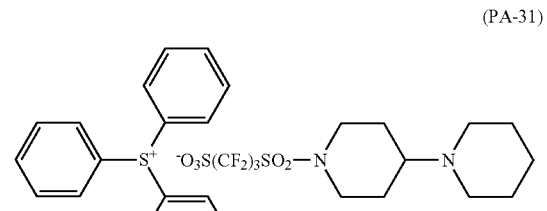
(PA-32)
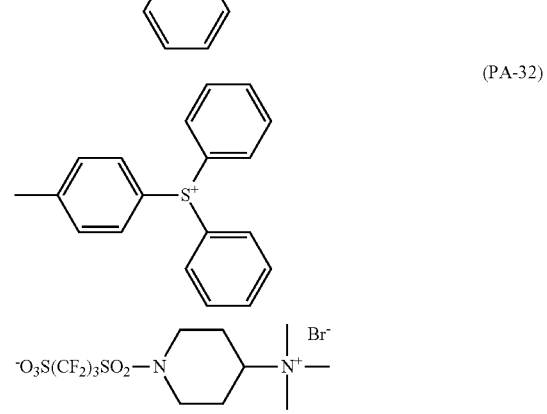
[Chem. 97]
(PA-33)
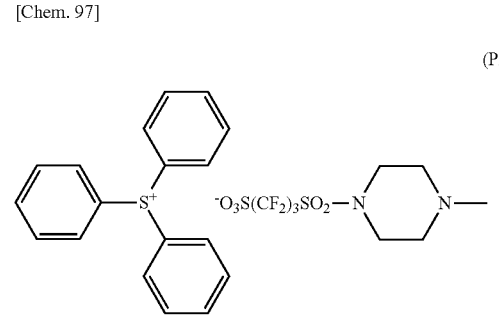
(PA-34)
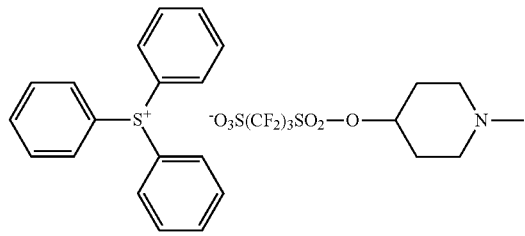
(PA-35)
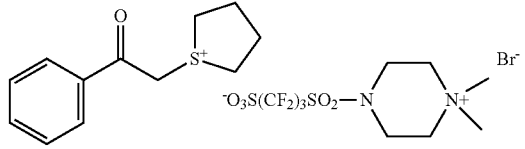
(PA-36)
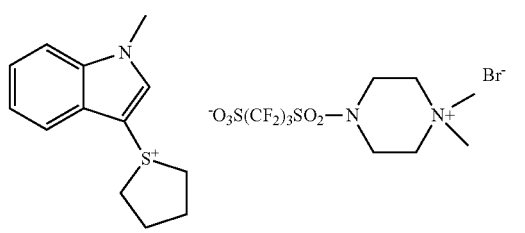
(PA-37)
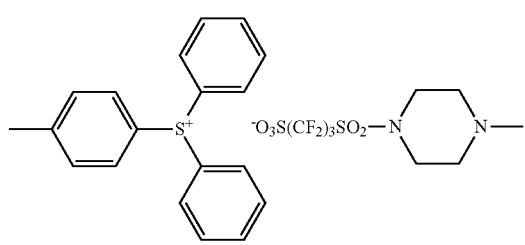
(PA-38)
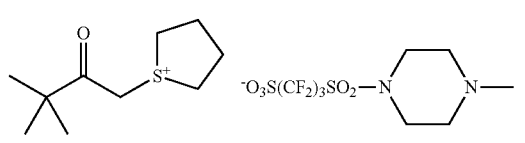
(PA-39)
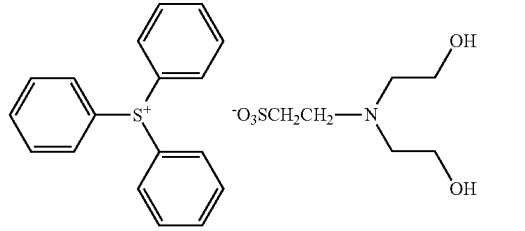
(PA-40)
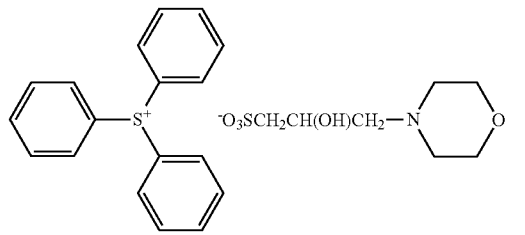

(PA-41)
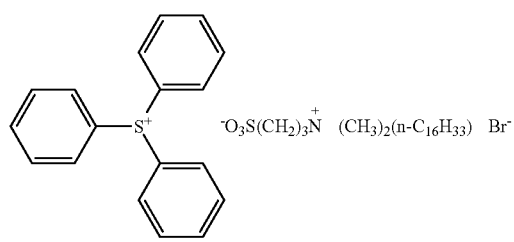
(PA-42)
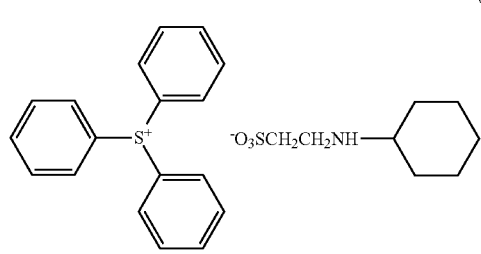
(PA-43)
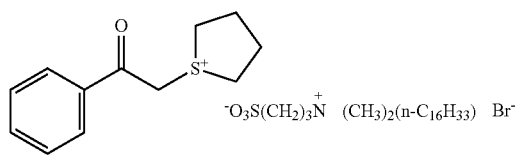
(PA-44)
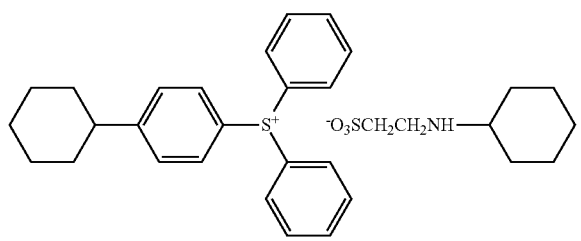
(PA-45)
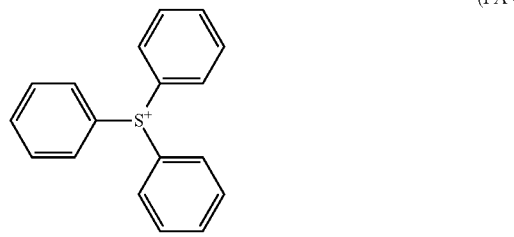
(PA-46)
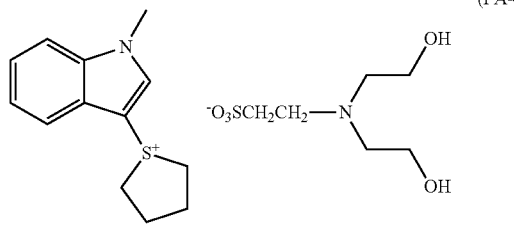
(PA-47)
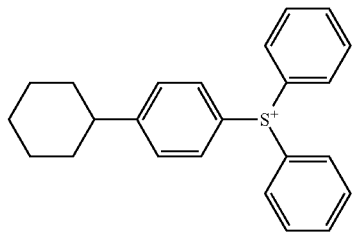
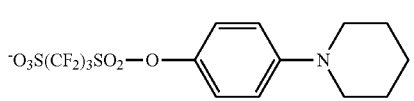
(PA-48)
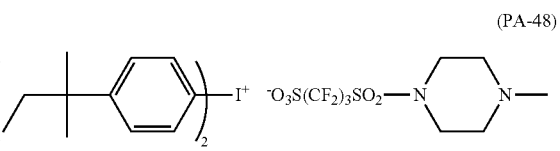
[Chem. 98]
(PA-49)
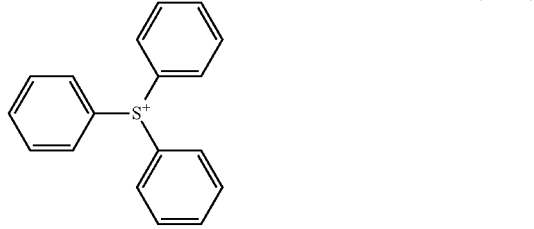
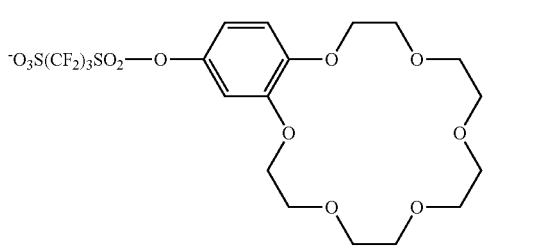
(PA-50)
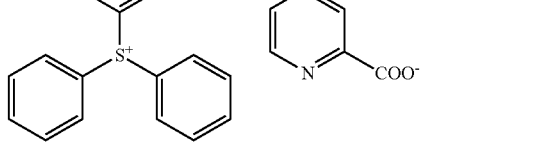
(PA-51)
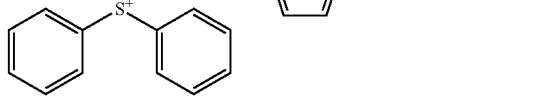

(PA-52)
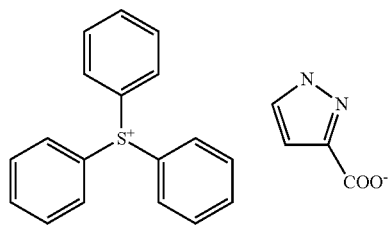

(PA-53)
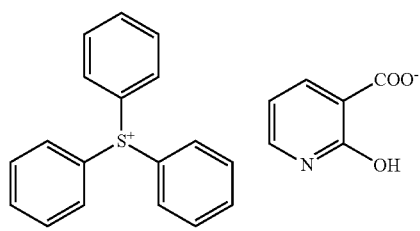

(PA-54)
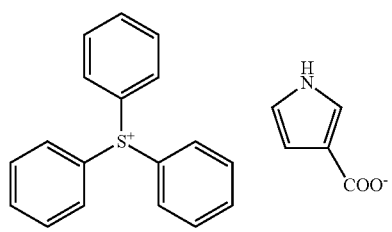

(PA-55)
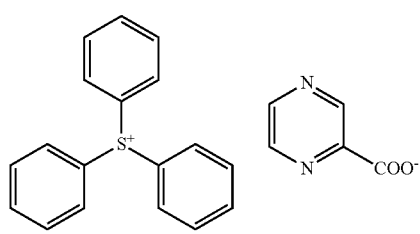

(PA-56)
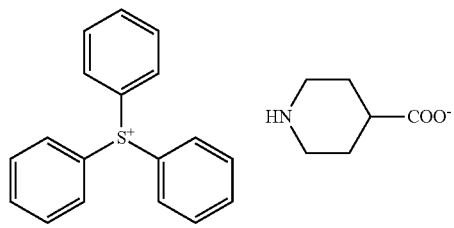

(PA-57)
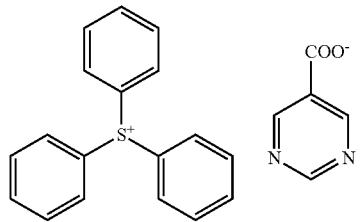

(PA-58)
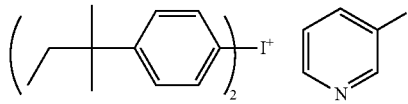

(PA-59)
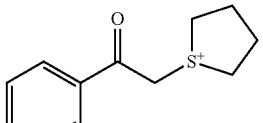

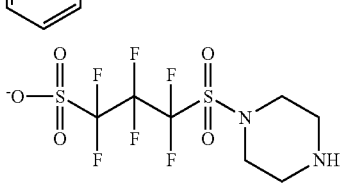

(PA-60)
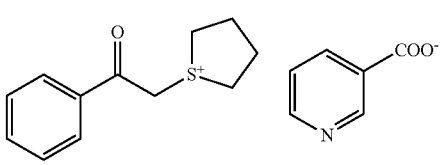

These compounds can be easily synthesized from the compound represented by the general formula (PA-I), or a lithium, sodium, or potassium salt, and a hydroxide, a bromide, a chloride, or the like of iodonium or sulfonium, and the like through the salt exchange method described in JP1999-501909A (JP-H11-501909) or JP2003-246786A. Alternatively, the compounds can be synthesized according to the synthesis method described in JP-1995-333851A (JP-H07-333851A).

Specific examples of the compound (E) which generate the compound represented by the general formula (PA-II) or (PA-III) by irradiation with actinic rays or radiations will be shown below, but the present invention is not limited thereto.

[Chem. 99]

(PA-61)
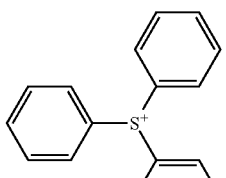

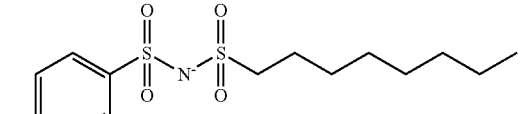

(PA-62)
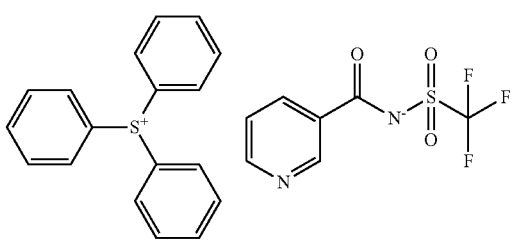

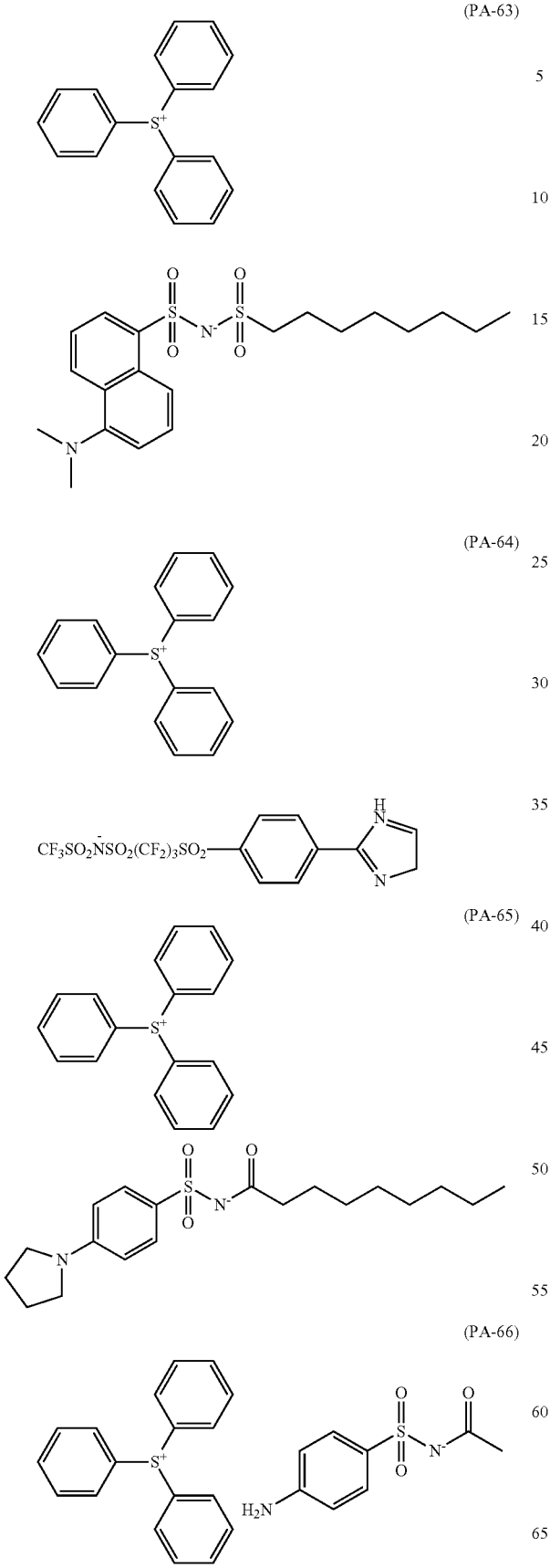
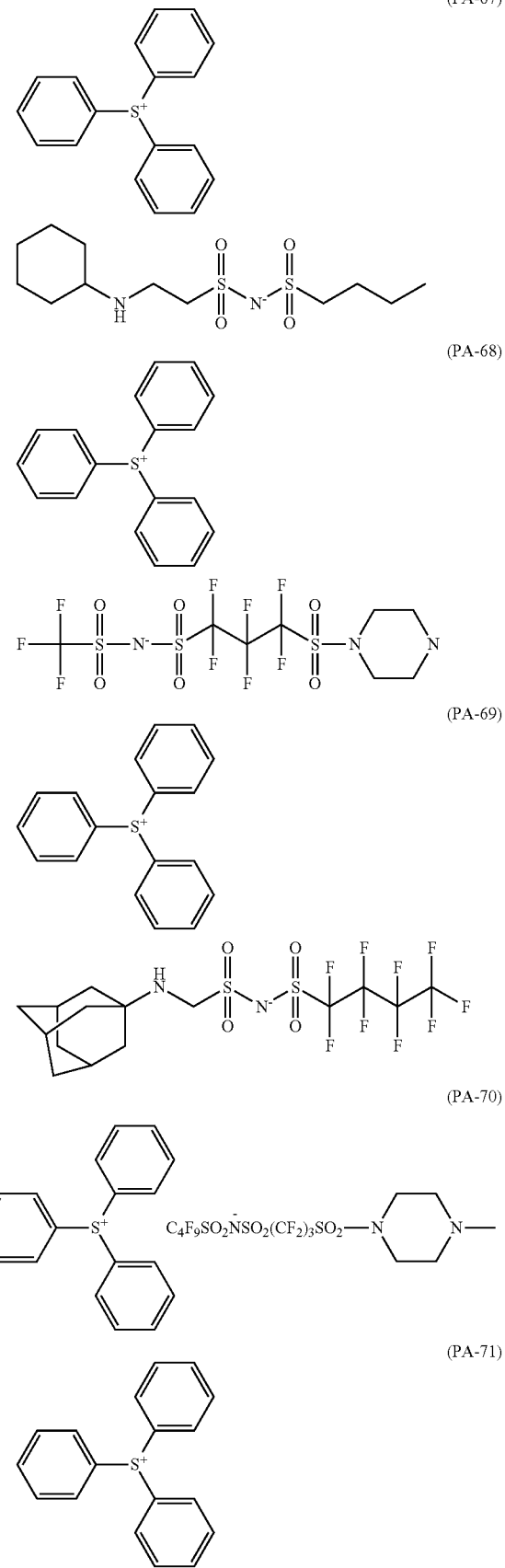

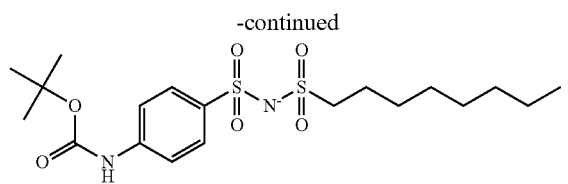
(PA-72)
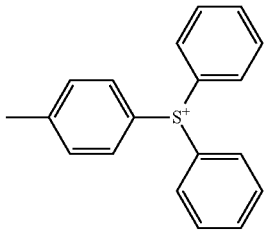
(PA-76)
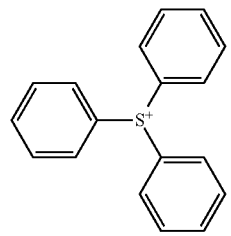
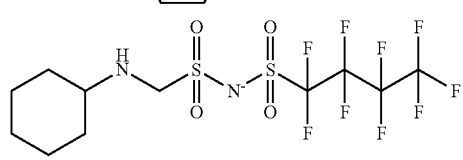
(PA-73)
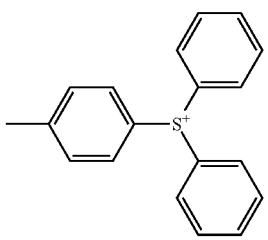
[Chem. 100]
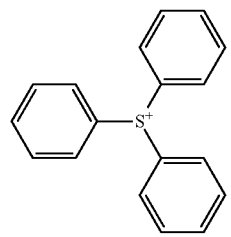
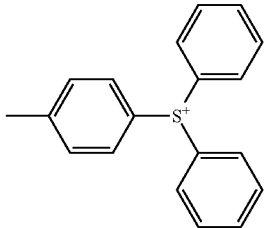
(PA-77)
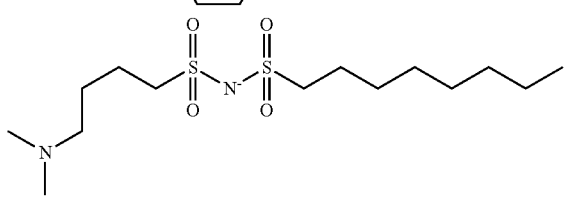
(PA-74)
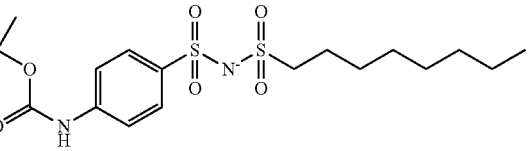
(PA-78)
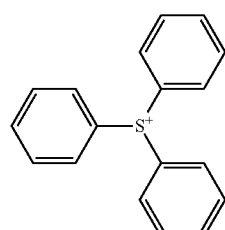
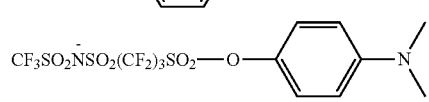
(PA-75)
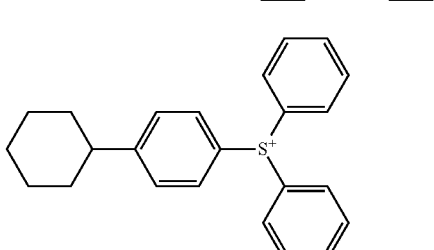
(PA-79)
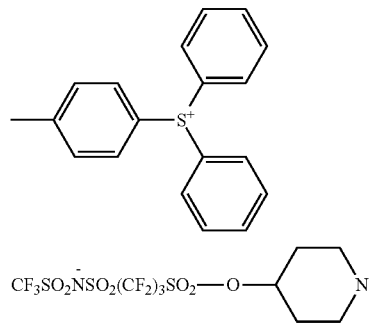
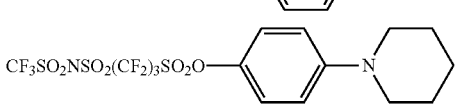

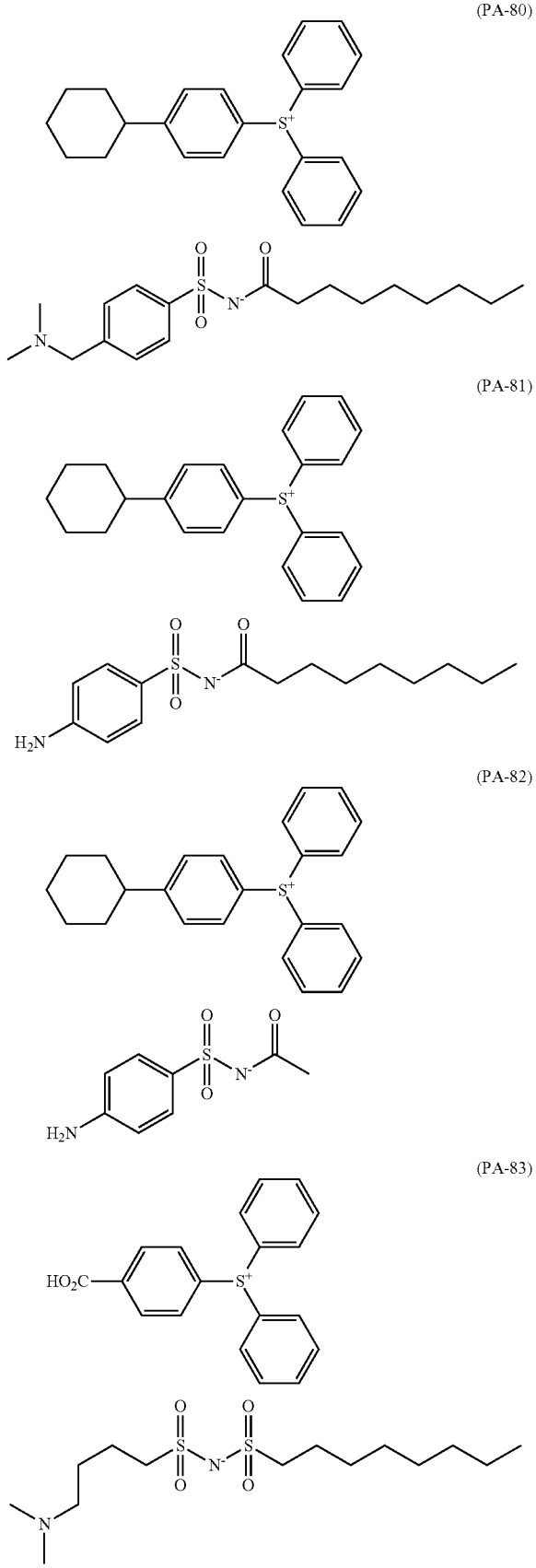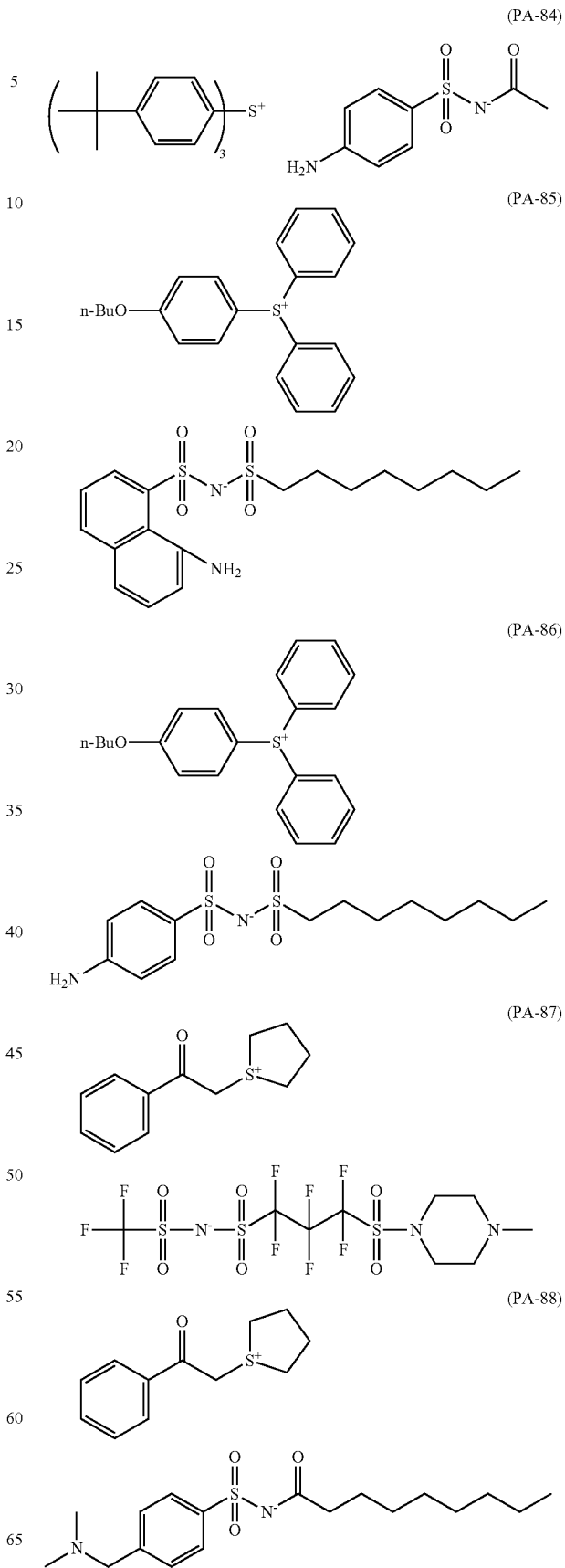

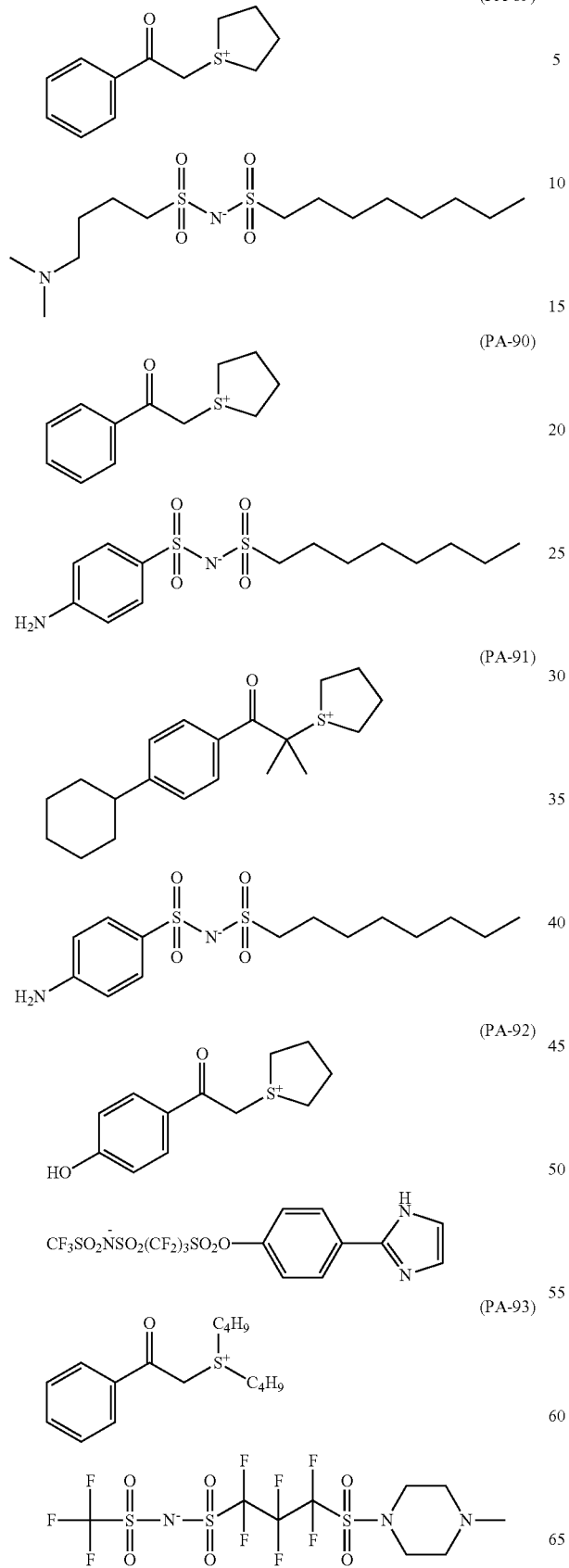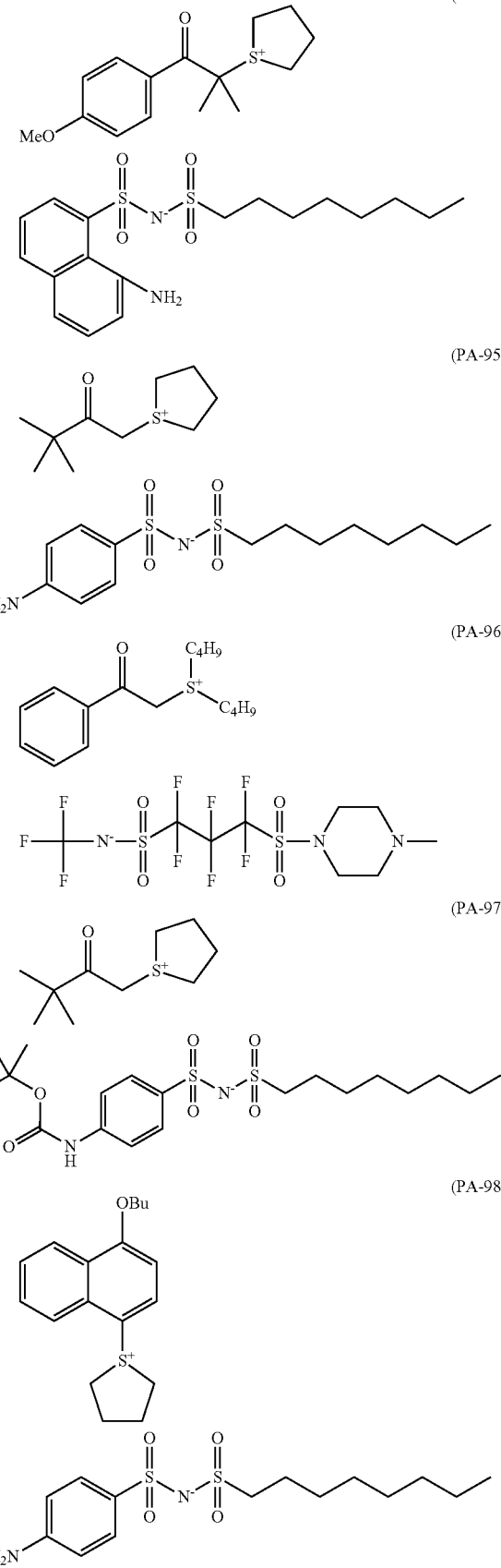

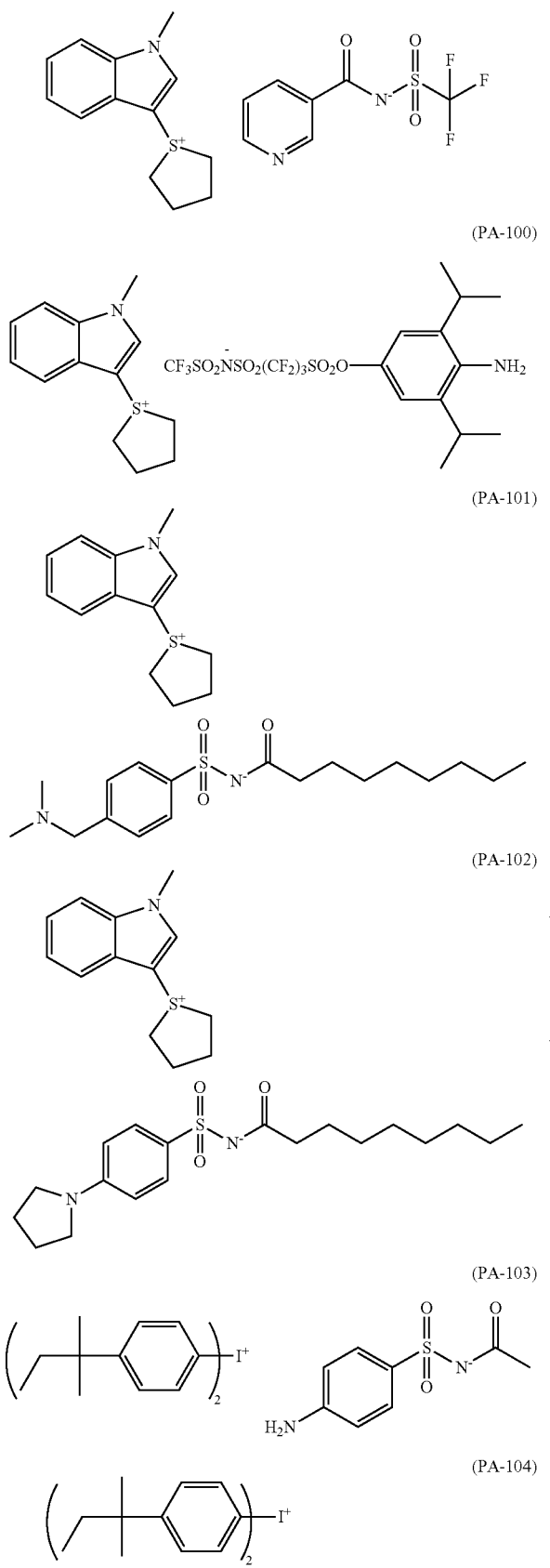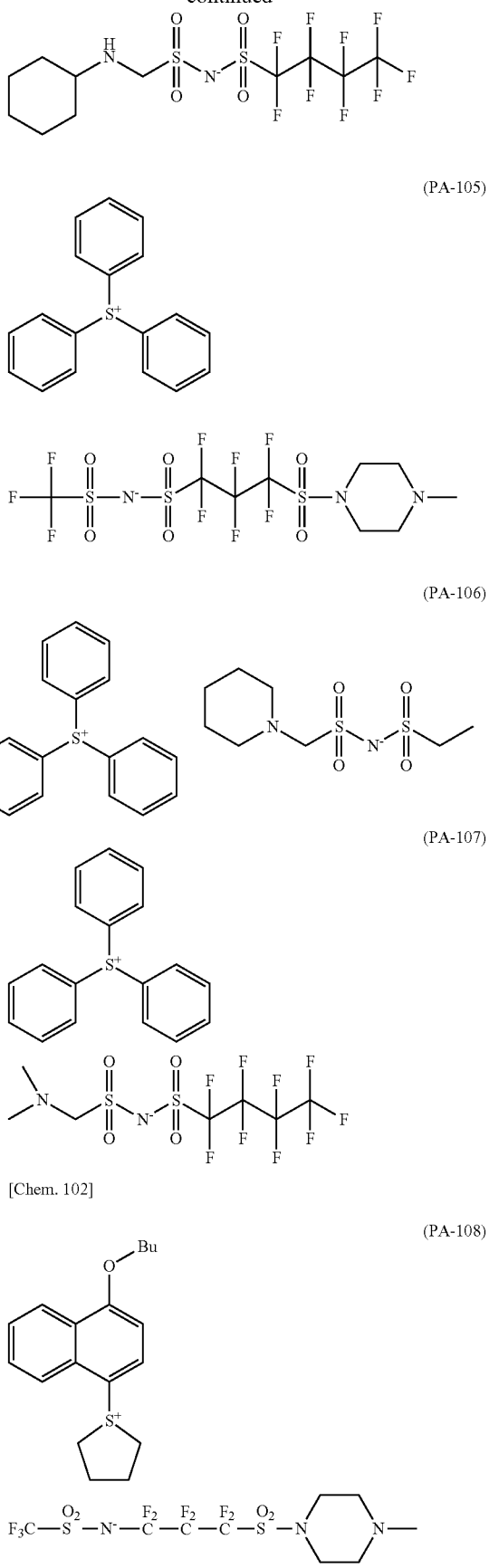

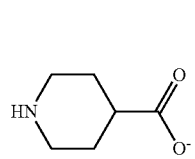
(PA-109)
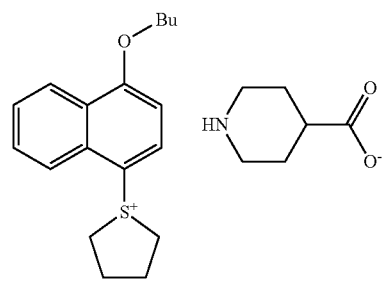
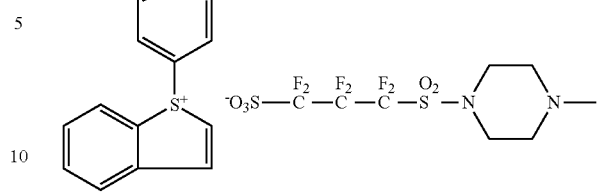
(PA-114)
(PA-115)
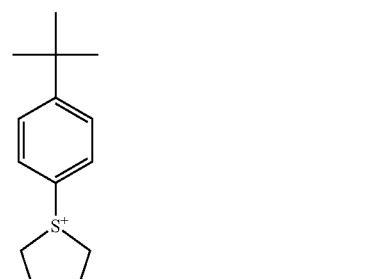
(PA-110)
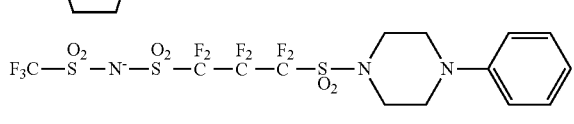
(PA-116)
(PA-111)
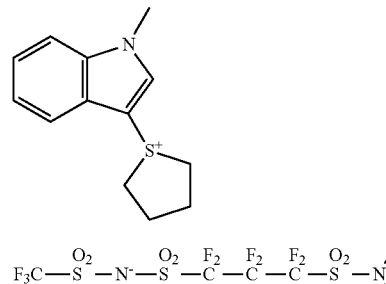
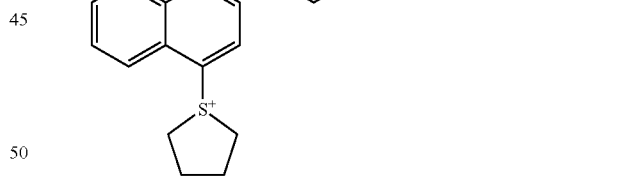
(PA-117)
(PA-112)
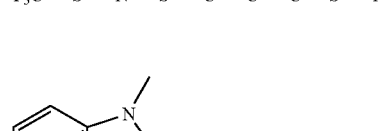
(PA-118)
(PA-113)
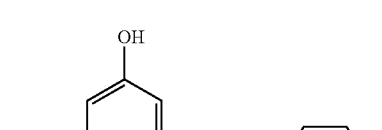
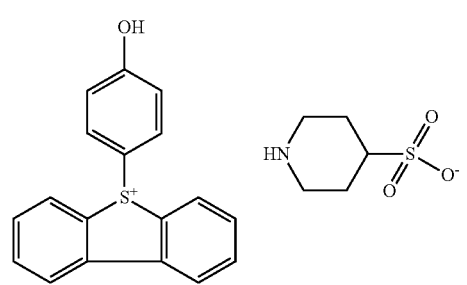
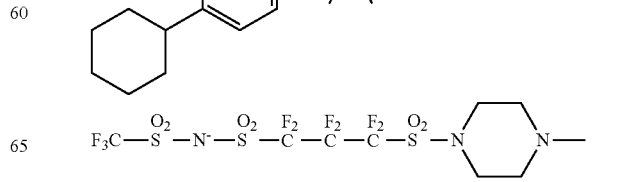
(PA-119)

(PA-120)
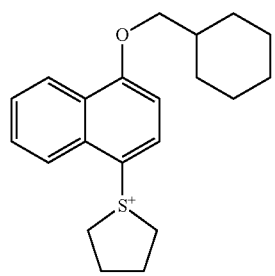
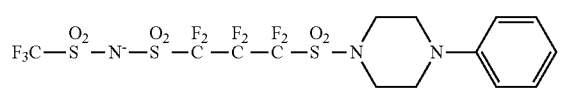
(PA-121)
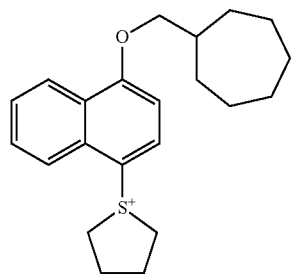
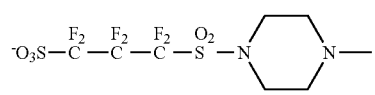
(PA-122)
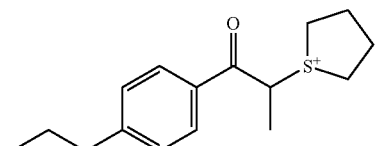
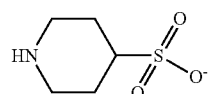
[Chem. 103]
(PA-123)
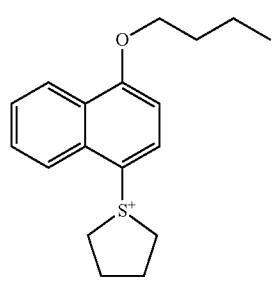
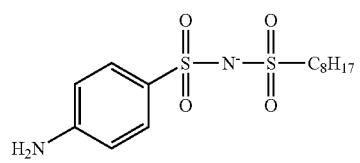
(PA-124)
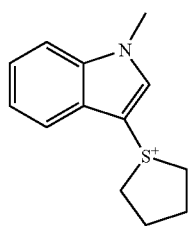
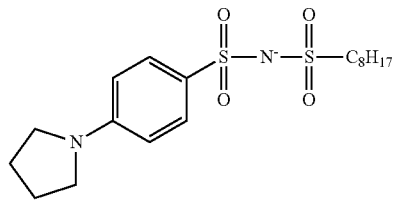
(PA-125)
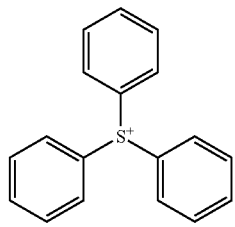
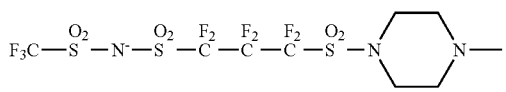
[Chem. 104]
(PA-126)
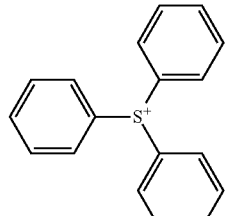
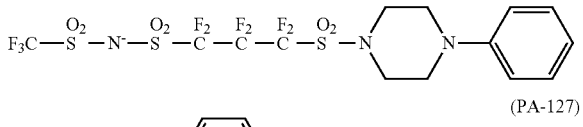
(PA-127)
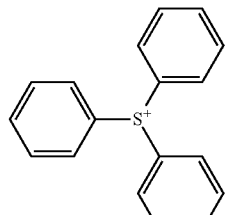
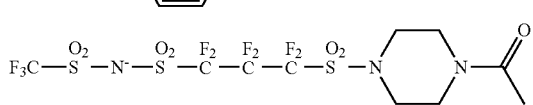

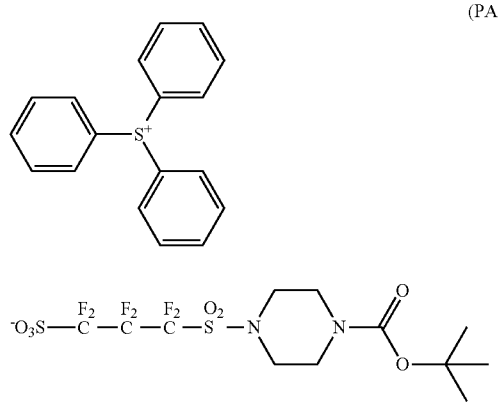
(PA-128)
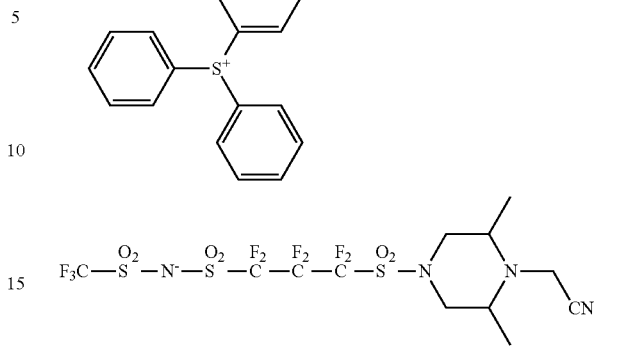
(PA-132)
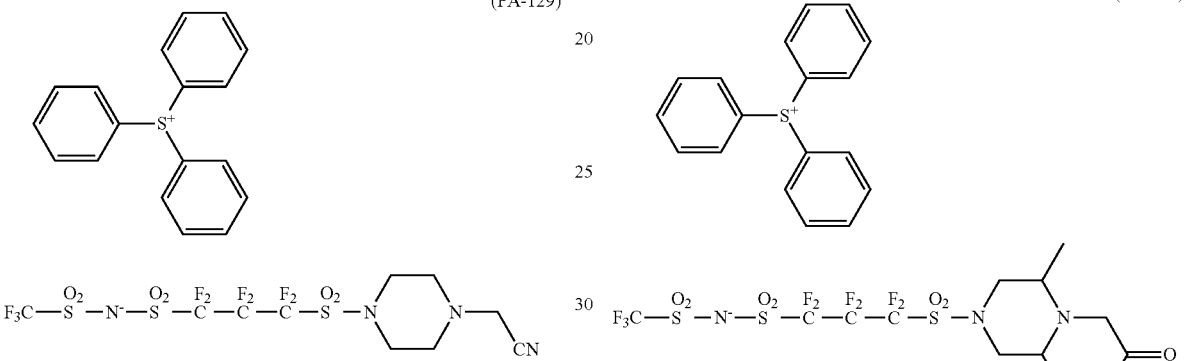
(PA-129) (PA-130) (PA-131) (PA-133) (PA-134) (PA-135)
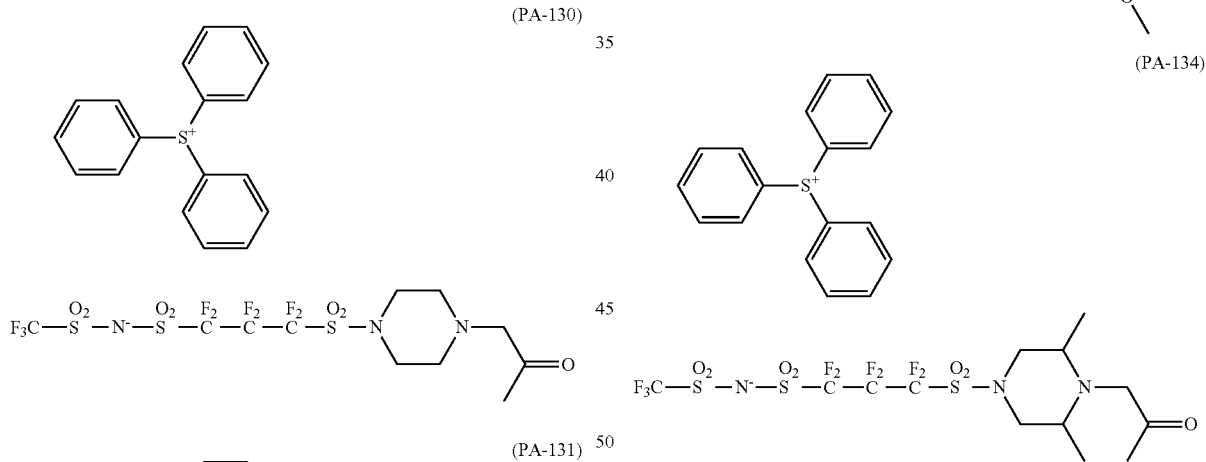
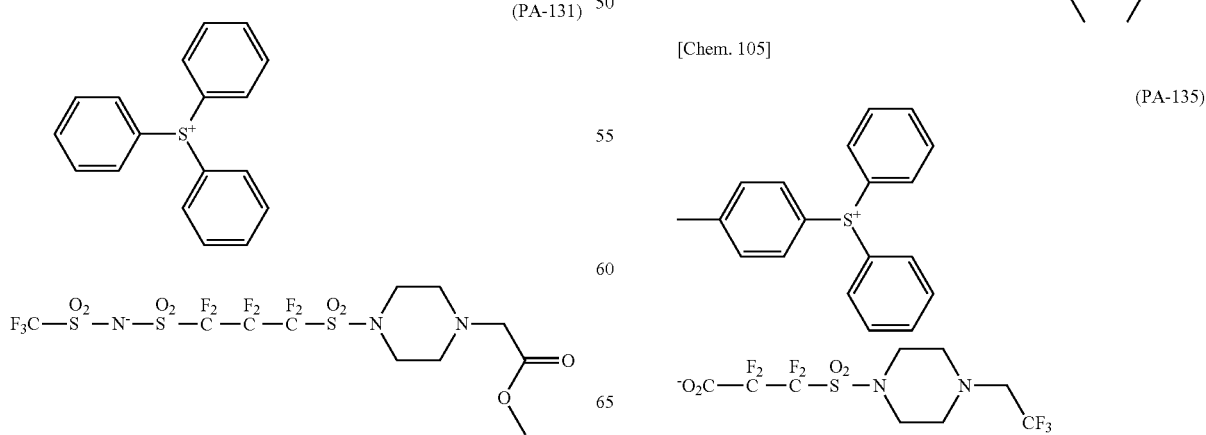
[Chem. 105]

(PA-136)
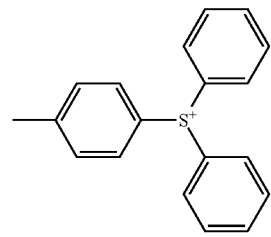
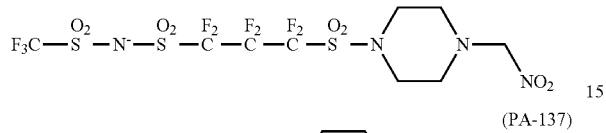
(PA-137)
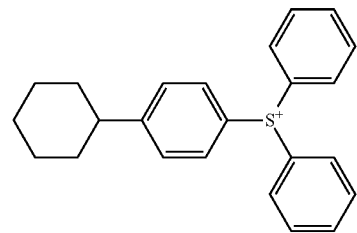
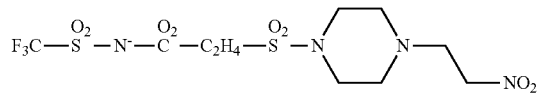
(PA-138)
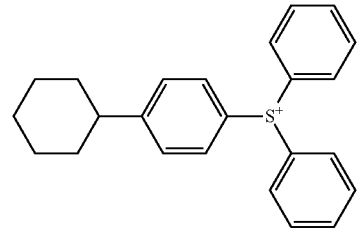
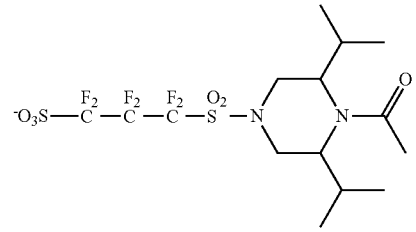
(PA-139)
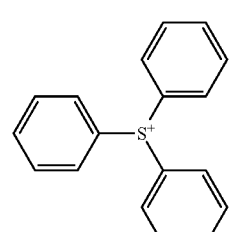
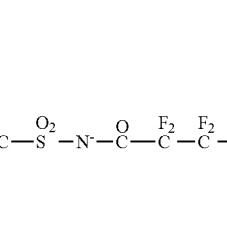
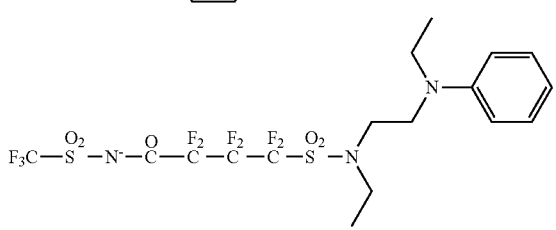
(PA-140)
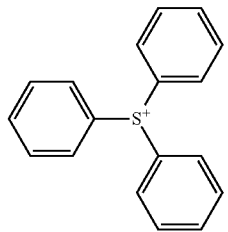
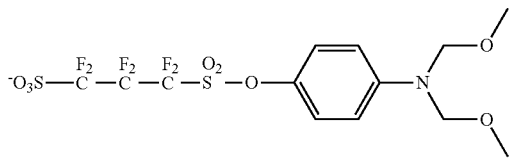
(PA-141)
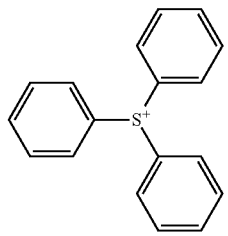
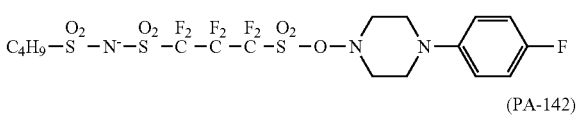
(PA-142)
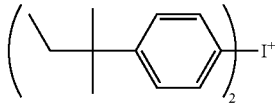
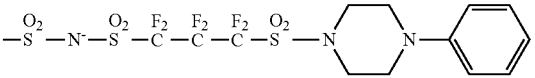
(PA-143)
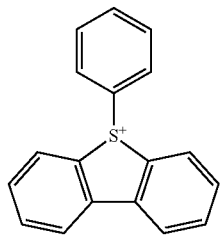
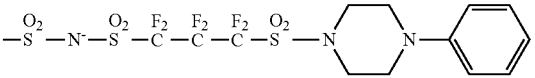
(PA-144)
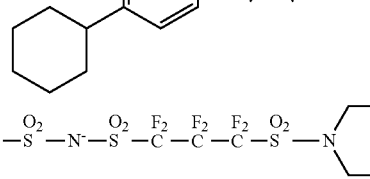
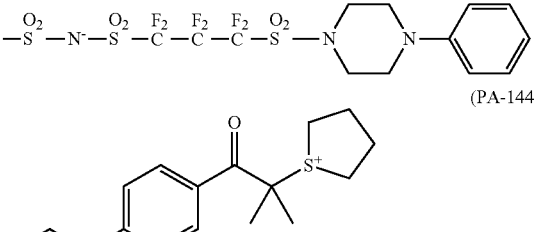

(PA-145)

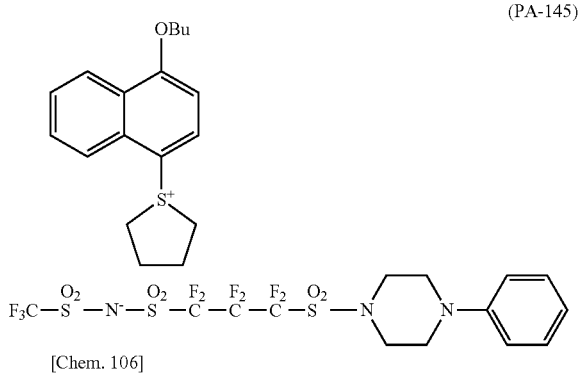

[Chem. 106]

(PA-146)

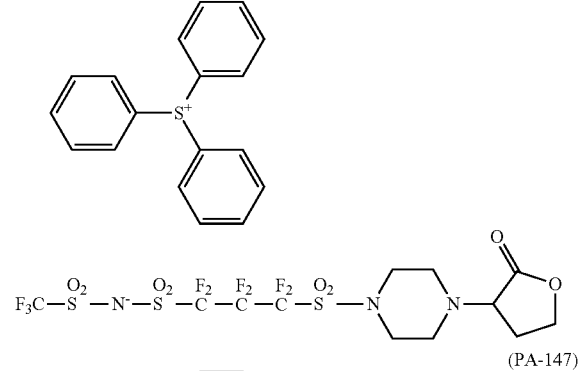

(PA-147)

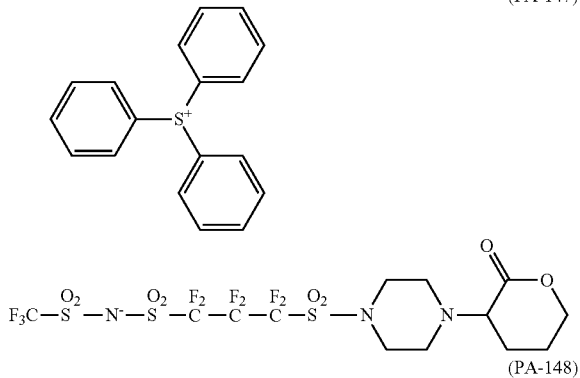

(PA-148)

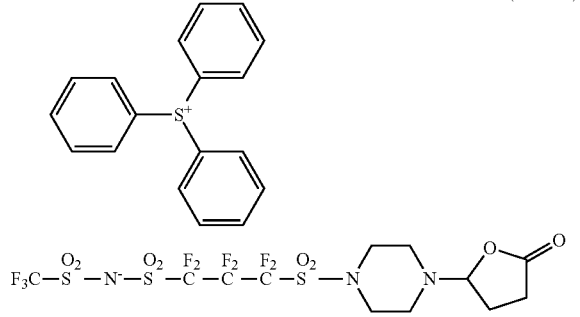

These compounds can be easily synthesized using a general sulfonic esterification reaction or a sulfonamide forming reaction. For example, the compounds can be obtained by a method in which a bissulfonyl halide compound is reacted in such a manner that one of the sulfonyl halide moieties is selectively reacted with an amine, an alcohol, or the like including a partial structure represented by the general formula (PA-II) or (PA-III) to form a sulfonamide bond or a sulfonic ester bond, and thereafter the other sulfonyl halide moiety is hydrolyzed, or by a method in which a cyclic sulfonic anhydride is subjected to ring cleavage with an amine or alcohol including a partial structure represented by the general formula (PA-II). The amine or alcohol including a partial structure represented by the general formula (PA-II) or (PA-III) can be synthesized by reacting an amine or alcohol with an anhydride such as $(R'O_2C)_2O$ and $(R'SO_2)_2O$, or an acid chloride compound such as $R'O_2CCl$ and $R'SO_2Cl$ (wherein R' represents a methyl group, an n-octyl group, a trifluoromethyl group, or the like) under basic conditions.

Synthesis of the compound (E) can be particularly based on Synthesis Examples of JP2006-330098A and JP2011-100105A, or the like.

The molecular weight of the compound (E) is preferably from 500 to 1000.

The actinic-ray-sensitive or radiation-sensitive resin composition in the present invention may not contain a compound (E), but the content of the compound (E) is preferably from 0.1 to 20 mass %, and more preferably from 0.1 to 10 mass %, based on the solid content of the actinic-ray-sensitive or radiation-sensitive resin composition.

[8] Surfactant

The composition of the present invention preferably further contains a surfactant. When the composition contains a surfactant, the surfactant is preferably a fluorinated and/or siliconized surfactant.

Examples of such a surfactant include Megafac F176 and Megafac R08 both manufactured by Dainippon Ink & Chemicals, Inc., PF656 and PF6320 both manufactured by OMNOVA Solutions, Inc., Troysol S-366 manufactured by Troy Chemical Co., Ltd., Fluorad FC430 manufactured by Sumitomo 3M Ltd., and polysiloxane polymer KP-341 manufactured by Shin-Etsu Chemical Co., Ltd.

Furthermore, surfactants other than these fluorinated and/or siliconized surfactants may also be used. Specific examples thereof include polyoxyethylene alkyl ethers and polyoxyethylene alkyl aryl ethers.

Moreover, known surfactants can be appropriately used. Examples of the useful surfactants include those described in [0273] et seq in the specification of US2008/0248425A1.

These surfactants may be used alone or in combination of two or more thereof.

The actinic-ray-sensitive or radiation-sensitive resin composition of the present invention may or may not contain a surfactant, but in the case of a surfactant being contained, the content thereof is preferably from 0 to 2 mass %, more preferably from 0.0001 to 2 mass %, and still more preferably from 0.0005 to 1 mass %, based on the total solid content of the actinic-ray-sensitive or radiation-sensitive resin composition (total amount excluding a solvent).

On the other hand, it is also preferable that the surfactant be not added or be added in an amount of 10 ppm or less. In this case, the hydrophobic resin is more unevenly distributed at the surface, so that the resist film surface can be made more hydrophobic. As a result, the followability of water upon liquid immersion exposure can be enhanced.

[9] Solvent

The solvent that can be used at the time of preparing the composition is not particularly limited as long as it can dissolve the components of the composition. Examples of the solvent include an alkylene glycol monoalkyl ether carboxylate (propylene glycol monomethyl ether acetate or the like), an alkylene glycol monoalkyl ether (propylene glycol monomethyl ether or the like), an alkyl lactate ester (ethyl lactate, methyl lactate, or the like), a cyclic lactone (γ-butyrolactone or the like, preferably having 4 to 10 carbon atoms), a chain or cyclic ketone (2-heptanone, cyclohexanone, or the like, preferably having 4 to 10 carbon atoms), an alkylene carbonate (ethylene carbonate, propylene carbonate, or the like), an alkyl carboxylate (preferably an alkyl acetate such as butyl acetate), and an alkyl alkoxyacetate (ethyl ethoxypropionate or the like). Examples of other useful solvents include those described in Section [0244] et seq. of US 2008/0248425 A1.

Among the above solvents, an alkylene glycol monoalkyl ether carboxylate, and an alkylene glycol monoalkyl ether are preferred.

These solvents may be used singly or in combination of two or more kinds thereof. When two or more kinds of the solvents are mixed together, it is preferable to mix a hydroxylated solvent with a non-hydroxylated solvent. The mass ratio of the hydroxylated solvent to the non-hydroxylated solvent is from 1/99 to 99/1, preferably from 10/90 to 90/10, and more preferably from 20/80 to 60/40.

The hydroxylated solvent is preferably an alkylene glycol monoalkyl ether. The non-hydroxylated solvent is preferably an alkylene glycol monoalkyl ether carboxylate.

[10] Other Components

The composition of the present invention may appropriately contain, in addition to the above components, an onium salt of carboxylic acid, a dissolution inhibiting compound having a molecular weight of 3000 or less described in, for example, Proceedings of SPIE, 2724, 355 (1996), an acid amplifier, a dye, a plasticizer, a photosensitizer, a light absorber, or the like.

[Pattern Forming Method]

The pattern forming method of the present invention includes steps of exposing and developing the resist film.

The resist film is formed from the above-described actinic-ray-sensitive or radiation-sensitive resin composition of the present invention, and more specifically, it is preferably formed on a substrate. The pattern forming method of the present invention can be carried out by a generally known method, including forming a film from the resist composition on a substrate, exposing the film, and developing the film.

The actinic-ray-sensitive or radiation-sensitive resin composition of the present invention is preferably used in a film thickness of 30 to 250 nm, and more preferably from 30 to 200 nm, from the viewpoint of enhancing the resolving power. Such a film thickness can be obtained by setting the solid concentration in the actinic-ray-sensitive or radiation-sensitive resin composition to an appropriate range, thereby imparting an appropriate viscosity and enhancing the coatability and the film-forming property.

The total solid concentration in the actinic-ray-sensitive or radiation-sensitive resin composition is generally from 1 to 10 mass %, preferably from 1 to 8.0 mass %, and more preferably from 1.0 to 6.0 mass %.

The actinic-ray-sensitive or radiation-sensitive resin composition of the present invention is used by dissolving the components above in a predetermined solvent, filtering the solution, and coating it on a predetermined support as follows. The filter used for filtration is preferably a polytetrafluoroethylene, polyethylene, or nylon filter having a pore size of 0.1 µm or less, more preferably 0.05 µM or less, and still more preferably 0.03 µm or less. Further, two or more kinds of the filters can be connected serially or in parallel, and then used. Further, the composition may be filtered two or more times. Further, before and after the filtration with a filter, the composition may be subjected to a deaeration treatment, or the like.

The composition of the present invention can be applied onto a substrate, such as one for use in the production of integrated circuit elements (for example, silicon/silicon dioxide coating), by appropriate application means such as a spinner, and dried to obtain a photosensitive resist film.

This resist film is irradiated with actinic rays or radiations through a predetermined mask, preferably baked (heated), developed, and rinsed, whereby a favorable pattern may be obtained. Further, for the irradiation of an electron beam, lithography through no mask (direct lithography) is generally carried out.

After preparing the film and before the exposure step, a prebake process (PB; Prebake) is also preferably included.

In addition, after the exposure step and before the development step, a heating step after exposure (PEB; Post Exposure Bake) is also preferably included.

As for the heating temperature, heating of any of PB and PEB is preferably at a temperature of 70 to 140° C., and more preferably at a temperature of 80 to 135° C.

The heating time is preferably 30 to 300 seconds, more preferably 30 to 180 seconds, and still more preferably 30 to 90 seconds.

Heating may be carried out by a unit included in an exposure/development apparatus, and may also be carried out using a hot plate or the like.

By the baking, the reaction of the exposed portion is accelerated and the sensitivity or pattern profile is improved.

The actinic rays or the radiations are not particularly limited, but examples thereof include a KrF excimer laser (248 nm), an ArF excimer laser (193 nm), an EUV radiation (13 nm), and an electron beam, with an ArF excimer laser, EUV radiation, and an electron beam being preferred.

In the development step, an alkaline developer used is usually a quaternary ammonium salt, a typical example of which is tetramethylammonium hydroxide (TMAH), but other than this compound, an aqueous alkali solution of an inorganic alkali, a primary to tertiary amine, an alcohol amine, a cyclic amine or the like may also be used.

Furthermore, the alkaline developer may be used after adding thereto alcohols and a surfactant each in an appropriate amount.

The alkali concentration of the alkaline developer is usually from 0.1 to 20 mass %.

The pH of the alkaline developer is usually from 10.0 to 15.0.

As the rinsing solution, pure water is preferred, and an appropriate amount of a surfactant may be added to the pure water before use.

Moreover, prior to the formation of a photosensitive resist film, an antireflection film may also be coated in advance on the substrate.

As the antireflection film, not only an inorganic film of titanium, titanium oxide, titanium nitride, chromium oxide, carbon, amorphous silicon, and the like but also an organic film composed of a light absorber and a polymer substance may be used. Further, as the organic antireflection film, commercially available organic antireflection films, such as the DUV30 Series and DUV40 Series both manufactured by Brewer Science Inc., and AR-2, AR-3, and AR-5 all manufactured by Shipley Co., L. L. C. can also be used.

For the resist film formed using the actinic-ray-sensitive or radiation-sensitive resin composition of the present invention, the exposure may also be carried out by filling a liquid (liquid immersion medium) having a refractive index higher than that of air between the film and the lens during the irradiation with actinic rays or radiations (liquid immersion exposure). By this exposure, the resolution may be enhanced.

As the liquid immersion medium, any liquid having a refractive index higher than that of air may be used, but pure water is preferably used.

The liquid for liquid immersion used in the liquid immersion exposure will be described below.

The liquid for liquid immersion preferably consists of a liquid being transparent in exposure wavelength whose temperature coefficient of refractive index is as low as possible so as to ensure minimization of any distortion of optical image projected on the resist film. Especially in the use of an ArF excimer laser (wavelength: 193 nm) as an exposure light source, however, it is more preferable to use water from the viewpoints of easiness of availability and easiness of handling in addition to the foregoing viewpoints.

Furthermore, a medium having a refractive index of 1.5 or more may also be used from the viewpoint that the refractive index can be further enhanced. This medium may be either an aqueous solution or an organic solvent.

In the case of using water as a liquid for liquid immersion, a slight proportion of an additive (liquid) that does not dissolve the resist film on a wafer and would have negligible influence on an optical coat for an under surface of lens element may be added in order to not only decrease the surface tension of water but also increase a surface activating power. The additive is preferably an aliphatic alcohol with a refractive index approximately equal to that of water, and specific examples thereof include methyl alcohol, ethyl alcohol, and isopropyl alcohol. The addition of an alcohol with a refractive index approximately equal to that of water is advantageous in that even when the alcohol component is evaporated from water, thereby causing a change in the concentration, the change of refractive index of the liquid as a whole can be minimized. On the other hand, when a substance being opaque in light at 193 nm or an impurity whose refractive index is greatly different from that of water is mixed therein, the mixing would invite a distortion of optical image projected on the resist film. Accordingly, distilled water is preferred as the water used. Furthermore, pure water that has been filtered through an ion exchange filter or the like may be used.

For the water, the electrical resistance is preferably 18.3 MΩcm or more and the TOC (total organic matter concentration) is preferably 20 ppb or less. Also, the water is preferably subjected to a deaeration treatment.

Furthermore, by increasing the refractive index of the liquid for liquid immersion, it is possible to enhance a lithography performance. From such viewpoints, an additive capable of increasing a refractive index may be added to the water, or heavy water ($D_2O$) may be used in place of the water.

In the case of the exposure of the film including the composition of the present invention via the liquid immersion medium, a hydrophobic resin (HR) may be further added, if necessary, as described above.

In order that the film may not come into direct contact with the liquid for liquid immersion, a layer which is sparingly soluble in the liquid for liquid immersion (hereinafter referred to as a "top coat") may be provided between the film according to the composition of the present invention and the liquid for liquid immersion. Examples of the function necessary as a top coat include coating aptitude for the upper layer portion of a resist, transparence against a radioactive ray, especially a radioactive ray at 193 nm, and sparing solubility in the liquid for liquid immersion. It is preferable that the top coat does not mix with the resist and is able to be uniformly coated on the upper layer of the resist.

With respect to the top coat, from the viewpoint of transparency against light at 193 nm, a polymer not being rich in the aromatic components is preferred. Specific examples thereof include hydrocarbon polymers, acrylic ester polymers, polymethacrylic acids, polyacrylic acids, polyvinyl ethers, silicon-containing polymers, and fluorine-containing polymers. The hydrophobic resin (HR) is also suitable as a top coat. From the viewpoint that when an impurity elutes from the top coat into the liquid for liquid immersion, it stains an optical lens, it is preferable that the amount of residual monomer components of the polymer included in the top coat be small.

In stripping the top coat, the developer may be used, or a stripper may be separately used. As the stripper, a solvent having low penetration into the film is preferable. In view of the matter that the stripping step can be carried out simultaneously with the developing treatment step of the film, it is preferable that stripping can be achieved by the alkaline developer. From the viewpoint that stripping is achieved by the alkaline developer, it is preferable that the top coat be acidic. However, from the viewpoint of non-intermixing properties with the film, the top coat may also be neutral or alkaline.

A small difference in the refractive indice between the top coat and the liquid for liquid immersion brings about improvement of the resolving power. In an ArF excimer laser (wavelength: 193 nm), when water is used as the liquid for liquid immersion, the top coat for ArF liquid immersion exposure preferably has a refractive index close to that of the liquid for liquid immersion. From the viewpoint of approximation of the refractive index to that of the liquid for liquid immersion, it is preferable for the top coat to contain a fluorine atom. From the viewpoint of transparency and refractive index, a thin film is preferred.

It is preferable that the top coat do not mix with the film and do not mix with the liquid for liquid immersion. Further, from this viewpoint, in the case where the liquid for liquid immersion is water, it is preferable that a solvent of the top coat be a medium which is sparingly soluble in the solvent used in the composition of the present invention and insoluble in water. In addition, when the liquid for liquid immersion is an organic solvent, the top coat may be soluble in water or may be insoluble in water.

In addition, the present invention relates to a method for preparing an electronic device, including the pattern forming method of the present invention as described above, and an electronic device prepared by the preparation method.

The electronic device of the present invention is preferably mounted on an electric/electronic device (domestic appliances, OA•media-related devices, optical devices, and communication devices, or the like).

EXAMPLES

The present invention will be explained below in more detail with reference to Examples, but the contents of the present invention are not limited thereto.

(Acid-Decomposable Resin)

The resins (P-1) to (P-15) and (PA-1) to (PA-4) including the following repeating units were synthesized by the following manner.

[Chem. 107]
(P-1)
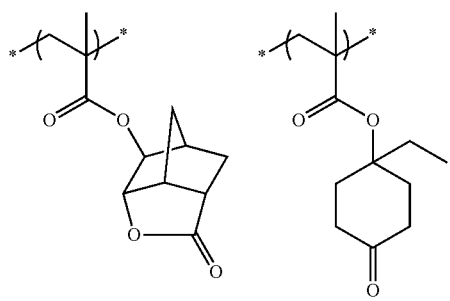
(P-2)
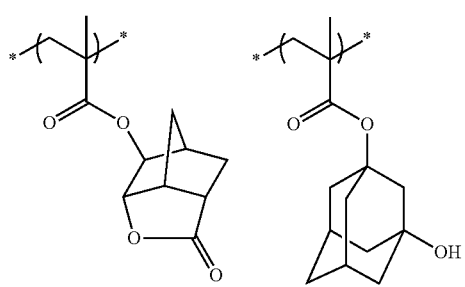
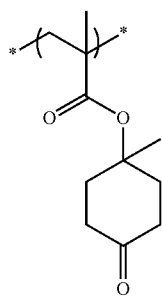
[Chem. 108]
(P-3)
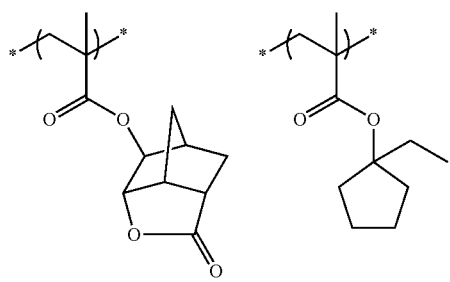
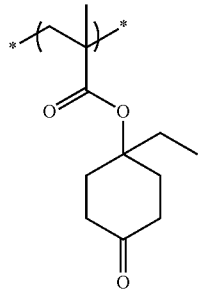
(P-4)
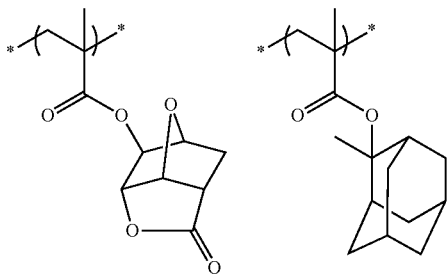
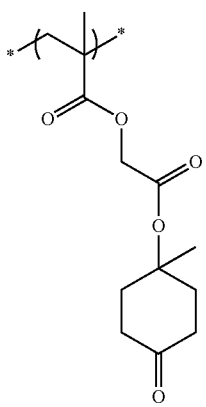
(P-5)
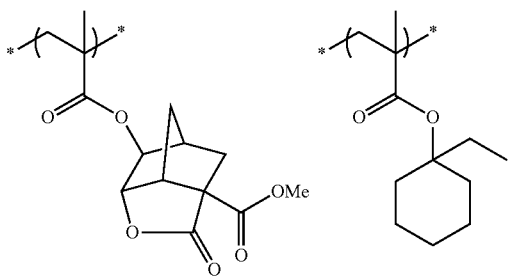
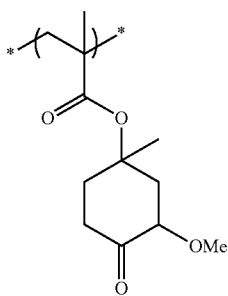
(P-6)
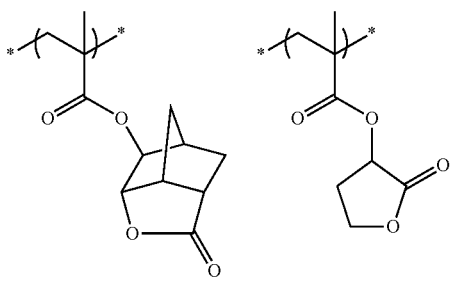

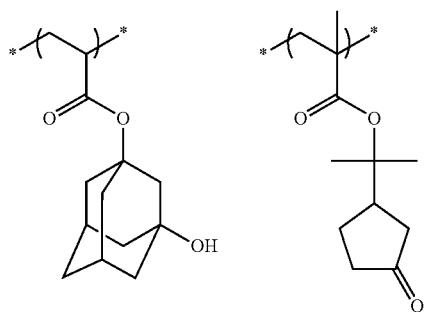
(P-7)
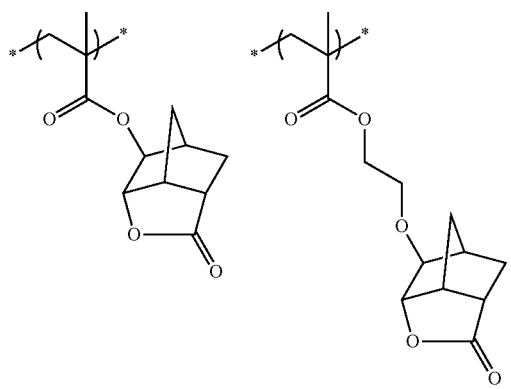
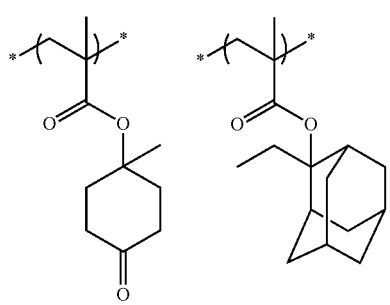
(P-8)
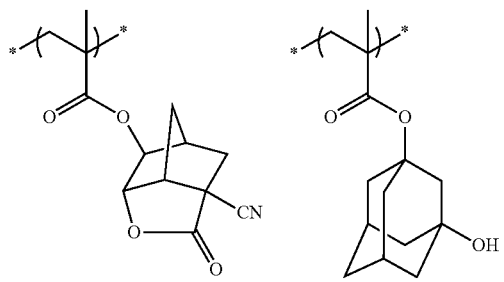
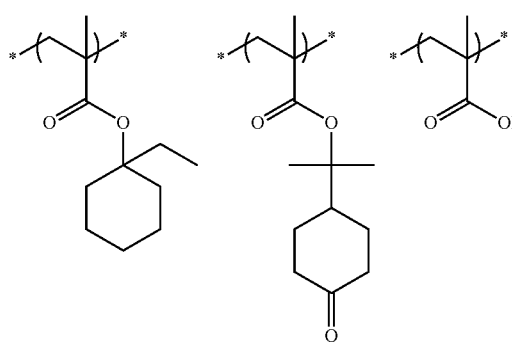
(P-9)
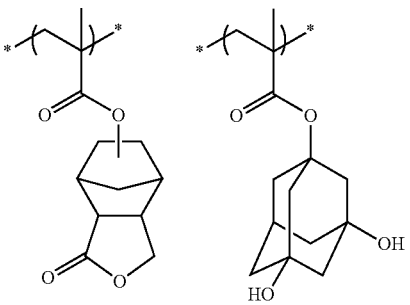
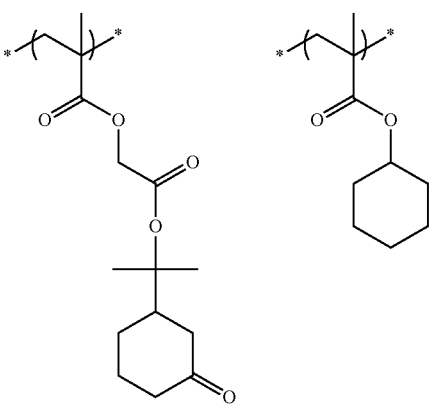
[Chem. 109]
(P-10)
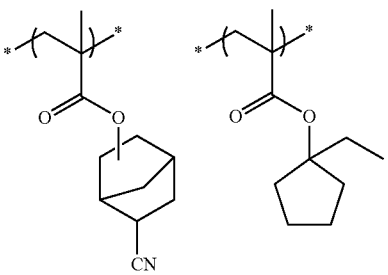

(P-11)
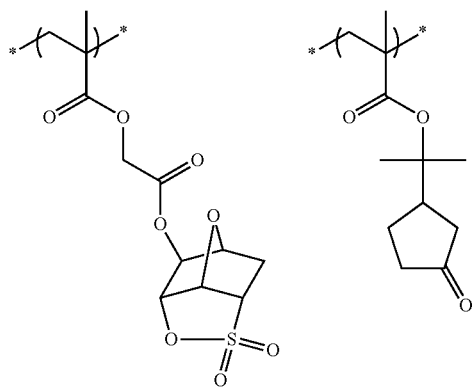
(P-12)
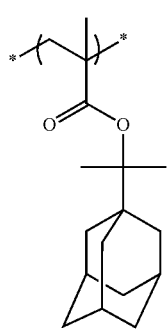
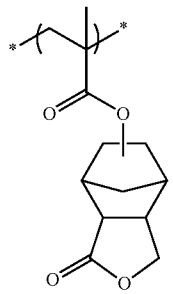
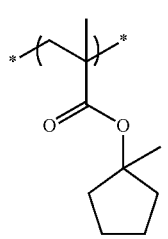
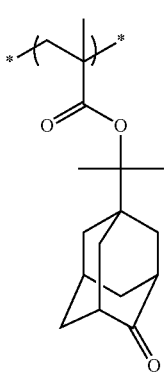
(P-13)
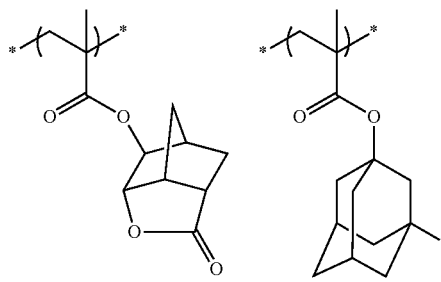
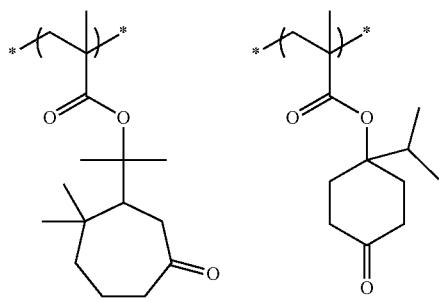
(P-14)
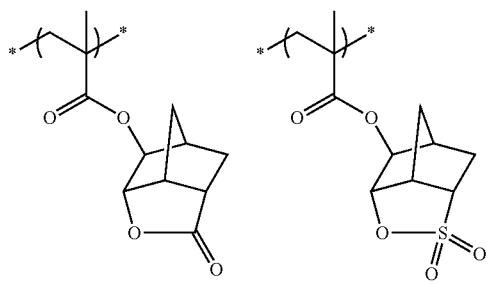
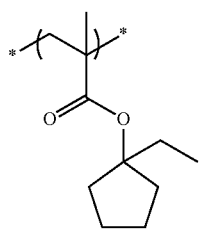
(P-15)
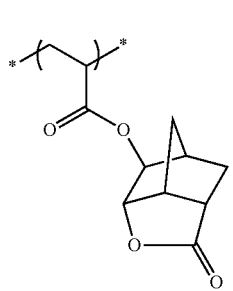

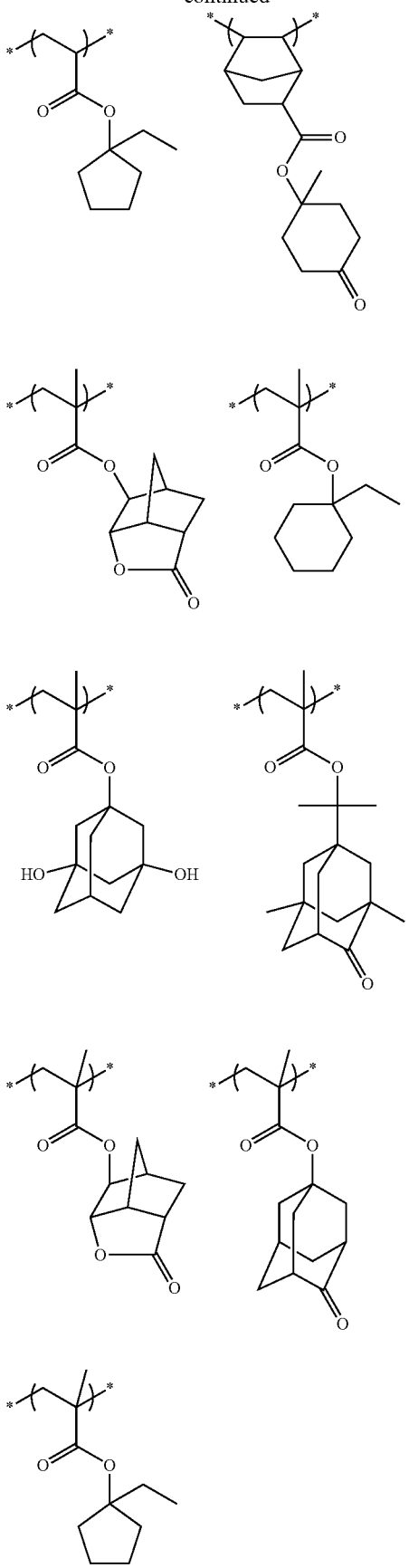

(PA-1)

(PA-2)

(PA-3)

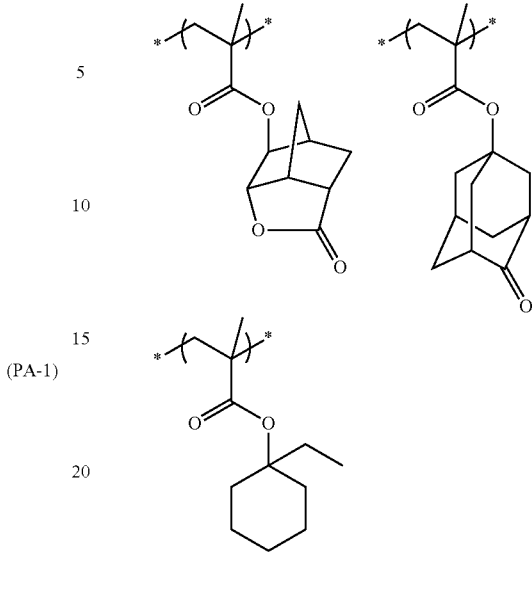

(PA-4)

The weight average molecular weight Mw, the dispersity Mw/Mn, and the compositional ratio of the respective repeating units (molar ratio; corresponding to the sequence from the left side) in the resins (P-1) to (P-15) and (PA-1) to (PA-4) are summarized in Table 2 below.

TABLE 2

| Resin | Compositional ratio (molar ratio) | | | | | Mw | Mw/Mn |
|---|---|---|---|---|---|---|---|
| P-1 | 50 | 50 | | | | 6300 | 1.64 |
| P-2 | 45 | 15 | 40 | | | 8200 | 1.76 |
| P-3 | 50 | 40 | 10 | | | 7800 | 1.58 |
| P-4 | 40 | 20 | 40 | | | 8900 | 1.75 |
| P-5 | 30 | 50 | 20 | | | 11000 | 1.73 |
| P-6 | 40 | 15 | 15 | 30 | | 5800 | 1.52 |
| P-7 | 20 | 20 | 40 | 20 | | 7900 | 1.56 |
| P-8 | 45 | 10 | 30 | 10 | 5 | 12100 | 1.81 |
| P-9 | 40 | 10 | 40 | 10 | | 4200 | 1.48 |
| P-10 | 40 | 40 | 20 | | | 7200 | 1.59 |
| P-11 | 35 | 50 | 15 | | | 15200 | 1.76 |
| P-12 | 40 | 10 | 40 | 10 | | 7500 | 1.52 |
| P-13 | 40 | 10 | 20 | 30 | | 8600 | 1.56 |
| P-14 | 30 | 30 | 30 | 10 | | 7100 | 1.55 |
| P-15 | 40 | 10 | 30 | 20 | | 6600 | 1.62 |
| PA-1 | 50 | 50 | | | | 6800 | 1.69 |
| PA-2 | 50 | 50 | | | | 12300 | 1.78 |
| PA-3 | 30 | 20 | 50 | | | 8200 | 1.72 |
| PA-4 | 50 | 20 | 30 | | | 7800 | 1.65 |

[Synthesis Example of Acid-Decomposable Resin (Resin (A))]

Under a nitrogen air flow, 24.0 g of cyclohexanone was put into a three-neck flask, and heated at 85° C., thereby obtaining a Solvent 1. Next, the monomer-1 (20.5 g) and monomer-2 (19.4 g) as described below were dissolved in cyclohexanone (96.0 g) to prepare a monomer solution. Further, 6.5 mol % of a polymerization initiator, V-601 (manufactured by Wako Pure Chemical Industries, Ltd.) based on the total amount of the monomers was added to the monomer solution and dissolved therein. The prepared solution was added dropwise to the Solvent 1 over 6 hours. After completion of dropwise addition, the solution was further subjected to a reaction at 85° C. for 2 hours. The reaction liquid was left to be cooled and then added dropwise to a mixed solvent of 979 g of heptane/420 g of ethyl acetate. The precipitate thus formed was collected by filtration and dried to obtain 32 g of a resin (P-1). The weight average molecular weight and the dispersity (Mw/Mn) of the obtained resin (P-1) were 6300 and 1.64, respectively, and the compositional ratio measured by $^{13}$C-NMR was 50/50.

[Chem. 111]

monomer-1

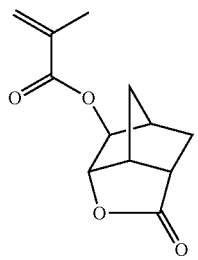

monomer-2

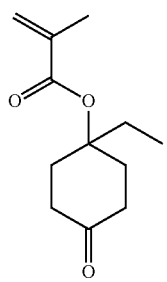

In a similar manner to the resin (P-1), the resins (P-2) to (P-15) and (PA-1) to (PA-4) were synthesized. The weight average molecular weight, the dispersity (Mw/Mn), and the compositional ratio of each of these resins are the same as described in the Table above.

Synthesis Example of Monomer-2

[Chem. 112]

monomer-2

Under a nitrogen air flow, 300 ml (1 mol/L THF (tetrahydrofuran) solution, 0.3 mol) of ethyl magnesium bromide was put into a three-neck flask, and cooled with water. A solution formed by dissolving 23.5 g of 1,4-cyclohexanedione monoethylene ketal in 120 ml of THF was added dropwise thereto such that the reaction temperature reached 20° C. to 30° C. After dropwise addition, the solution was stirred at 25° C. for 2 hours. After completion of the reaction, distilled water, a saturated aqueous ammonium chloride solution, and ethyl acetate were added thereto to carry out purification by liquid separation. Thereafter, the organic phase was washed with an aqueous sodium hydrogen carbonate solution and distilled water, and then the solvent was evaporated under reduced pressure to obtain 11.5 g of an oily compound.

The obtained oily compound was put into a three-neck flask and 80 ml of THF was added thereto under a nitrogen air flow. Then, the solution was cooled to −50° C., and 30.5 ml (2.64 mol/L) of n-butyllithium was added thereto. Thereafter, the solution was warmed to 0° C. and stirred for 1 hour, and then 7.8 ml of methacrylic acid chloride was added thereto. After stirring at 25° C. for 3 hours, distilled water and ethyl acetate were added thereto to carry out a liquid separation operation. The organic phase was washed with an aqueous sodium hydrogen carbonate solution and distilled water, and then the solvent was evaporated under reduced pressure to obtain 18.0 g of an oily compound.

The obtained oily compound was dissolved in 150 ml of THF, 80 ml of 1 N hydrochloric acid was added thereto, and the solution was stirred at 60° C. for 3 hours. After leaving to be cooled, ethyl acetate was added thereto to carry out a liquid separation operation. The organic phase was washed with an aqueous sodium hydrogen carbonate solution, then 20 mg of 4-hydroxy-TEMPO (2,2,6,6-tetramethylpiperidin-1-oxyl), and the solvent was evaporated under reduced pressure. Thereafter, distillation under reduced pressure was carried out to obtain 6 g of a monomer-2.

$^1$H-NMR (400 MHZ in $(CD_3)_2CO$): δ (ppm)=0.92 (t, 3H), 1.79 (dt, 2H), 1.98 (t, 3H), 2.04 (q, 2H), 2.22-2.4 (br, 2H), 2.45 (dt, 2H), 2.62-2.8 (br, 2H), 5.59 (d, 1H), 6.10 (d, 1H)

(Acid Generator)

As an acid generator, one appropriately selected from the acid generators z1 to z110 mentioned above was used.

(Basic Compounds)
DIA: 2,6-Diisopropylaniline
TMEA: Tris(methoxyethoxyethyl)amine
PEA: N-Phenyl diethanol amine
TOA: Trioctylamine
PBI: 2-Phenylbenzoimidazole
DHA: N,N-Dihexylaniline (Surfactants)
W-1: Megafac F176 (manufactured by DIC Corporation; fluorine-based)
W-2: Megafac R08 (manufactured by DIC Corporation; fluorine- and silicone-based)
W-3: Troysol S-366 (manufactured by Troy Chemical Co., Ltd.; fluorine-based)
W-4: PF656 (manufactured by OMNOVA; fluorine-based)
W-5: PF6320 (manufactured by OMNOVA; fluorine-based)

(Solvents)
S1-1: Propylene glycol monomethyl ether acetate (PG-MEA; 1-methoxy-2-acetoxypropane)
S1-2: Cyclohexanone
S2-1: Propylene glycol monomethyl ether (PGME; 1-methoxy-2-propanol)
S2-2: Propylene carbonate
S2-3: γ-Butyrolactone

[Conditions for Exposure: ArF Liquid Immersion Exposure]

[Preparation of Actinic-Ray-Sensitive or Radiation-Sensitive Resin Composition]

The components shown in Table 3 below were dissolved in a solvent to prepare solutions each having a solid concentration of 4 mass %, and the solutions were filtered through a polyethylene filter having a pore size of 0.1 μm to prepare an actinic-ray-sensitive or radiation-sensitive resin composition (positive type photosensitive resin composition). The prepared positive type photosensitive resin composition was evaluated by the following method, and the results are shown in Table 3.

[Image Performance Test]

ARC29SR for forming an organic antireflection film (manufactured by Nissan Chemical Industries, Ltd.) was coated on a silicon wafer (12-inch pore diameter), and baked at 205° C. for 60 seconds to form an antireflection film having a film thickness of 98 nm. The positive type photosensitive resin composition prepared above was coated thereon and baked at 120° C. for 60 seconds to form a photosensitive film (resist film) having a film thickness of 100 nm. The obtained wafer was subjected to exposure through a 6% halftone mask with a line width of 75 nm and a pattern of line:space=1:1, using an ArF excimer laser liquid immersion scanner (manufactured by ASML, XT1700i, NA1.20, C-Quad, outer sigma 0.981, inner sigma 0.895, XY deflection). Ultrapure water was used as a liquid for liquid immersion. Thereafter, the resist film was heated at 120° C. for 60 seconds, then developed with an aqueous tetramethylammonium hydroxide solution (2.38 mass %) for 30 seconds, rinsed with pure water, and then spin-dried to obtain a resist pattern.

<Line Edge Roughness (LER)>

For the measurement of the line edge roughness (nm), the line and space 1/1 pattern was observed using a length-measurement dimension scanning electron microscope (SEM), and in a 5-μm region along the longitudinal direction of the line pattern, the distances of actual edges from a reference line on which edges were to be present were measured on 50 points by means of a length-measurement dimension SEM (S-8840 manufactured by Hitachi, Ltd.), the standard deviation of measurements was determined, and $3\sigma$ was computed therefrom. A smaller value thereof indicates more favorable performance.

<Pattern Collapse>

The pattern collapse was defined using a resolved line width (nm) without pattern collapse when taking an exposure amount reproducing a line and space (1:1) mask pattern with a line width of 75 nm as an optimal exposure amount, and increasing the exposure amount from the optimal exposure amount, thus reducing the line width of a line pattern thus formed. A smaller value thereof indicates better resolution without finer pattern collapse being exhibited, and non-easiness of pattern collapse.

TABLE 3

| Example | Resin (A) (2 g) | Hydrophobic resin (HR) (mg) | Acid generator (mg) | Basic compound (mg) | Surfactant (mg) | Organic solvent (mass ratio) | LER (nm) | Pattern collapse (nm) |
|---|---|---|---|---|---|---|---|---|
| Example 1 | P-1 | B-2 (40) | z71 (600) | TMEA (10) | W-4 (2) | S1-1/S2-1 (8/2) | 5.1 | 50 |
| Example 2 | P-2 | B-3 (40) | z45 (500) | DIA (6) | W-1 (3) | S1-1/S2-1 (6/4) | 5.3 | 52 |
| Example 3 | P-3 | B-14 (70) | z39 (800) | TOA (6) | W-4 (2) | S1-1/S1-2 (9/1) | 4.9 | 49 |
| Example 4 | P-4 | B-21 (80) | z71 (500) | DIA (10) | — | S1-1/S2-3 (9/1) | 5.0 | 45 |
| Example 5 | P-5 | B-32 (60) | z45 (700) | PEA (5) | W-2 (2) | S1-1/S2-2 (9/1) | 5.2 | 51 |
| Example 6 | P-6 | B-39 (40) | z81 (500) | DHA (14) | W-4 (2) | S1-2/S2-1 (6/4) | 5.3 | 54 |
| Example 7 | P-7 | B-42 (50) | z29/z39 (400/200) | PBI (8) | W-5 (1.5) | S1-1 | 5.1 | 44 |
| Example 8 | P-8 | B-50 (80) | z71 (600) | DIA (7) | W-1/W-3 (1/1) | S1-2/S2-3 (9/1) | 4.8 | 52 |
| Example 9 | P-9 | B-55 (30) | z45 (600) | TMEA (12) | W-3 (2) | S1-1/S2-1 (8/2) | 5.0 | 54 |
| Example 10 | P-10 | B-2 (75) | z71 (600) | DIA (12) | W-1 (2) | S1-1/S2-1 (7/3) | 5.6 | 57 |
| Example 11 | P-11 | B-3 (55) | z29 (500) | TOA/PEA (5/5) | W-2 (3) | S1-1/S2-1 (8/2) | 5.1 | 48 |
| Example 12 | P-12 | B-14 (12) | z39 (800) | DIA (8) | W-4 (2) | S1-1/S1-2 (8/2) | 5.4 | 45 |
| Example 13 | P-13 | B-21 (35) | z71 (500) | TOA (10) | W-5 (2) | S1-1/S2-1 (6/4) | 5.1 | 51 |
| Example 14 | P-14 | B-32 (40) | z45 (700) | DIA (8) | W-3 (2) | S1-1 | 5.2 | 52 |
| Example 15 | P-15 | B-39 (40) | z81 (500) | PEA (8) | W-1 (2) | S1-1/S1-2 (9/1) | 5.0 | 54 |
| Example 16 | P-1/P-11 (1 g/1 g) | B-21 (30) | z45 (600) | DHA (10) | W-2 (3) | S1-1/S2-1 (8/2) | 5.2 | 50 |
| Example 17 | P-1/PA-1 (1 g/1 g) | B-32 (50) | z71 (600) | PBI (11) | W-4 (2) | S1-1 | 5.8 | 59 |
| Example 18 | P-1 | B-1/B-3 (40/5) | z45 (600) | DIA (5) | W-5 (2) | S1-1/S2-1 (8/2) | 5.1 | 52 |
| Comparative Example 1 | PA-1 | B-2 (40) | z45 (600) | TMEA (8) | W-4 (2) | S1-1 | 7.2 | 70 |
| Comparative Example 2 | PA-2 | B-3 (40) | z45 (600) | TMEA (8) | W-1 (2) | S1-1/S2-1 (8/2) | 7.0 | 67 |
| Comparative Example 3 | PA-3 | B-2 (40) | z45 (600) | TMEA (8) | W-3 (2) | S1-1 | 7.5 | 73 |
| Comparative Example 4 | PA-4 | B-3 (40) | z45 (600) | TMEA (8) | W-5 (2) | S1-1/S2-1 (8/2) | 7.3 | 65 |

As clearly seen from the results in the Table above, in Comparative Example 1, in which repeating units having a lactone structure are included but any of the structures of the general formulae (I-1) to (I-3) are not included; in Comparative Example 2, in which repeating units having a structure represented by any one of the general formulae (I-1) to (I-3) are included but any of a lactone structure, a sultone structure, and a cyano group are not included; and Comparative Examples 3 and 4, in which repeating units having a lactone structure are included and the structure is similar to that of the general formula (I-2), but does not exhibit acid decomposability, it was found that LER was high, and the resolved line width without pattern collapse was large.

On the other hand, in Examples 1 to 18, in which the resin (A) has the repeating units having a structure represented by any one of the general formulae (I-1) to (I-3), and the repeating units having at least any one of a lactone structure, a sultone structure, and a cyano group, it was found that LER was low, and the resolved line width without pattern collapse was small.

This application claims priority under 35 U.S.C. §119 of Japanese Patent application JP 2011-146859, filed on Jun. 30, 2011, the entire contents of which are hereby incorporated by reference.

What is claimed is:

1. An actinic-ray-sensitive or radiation-sensitive resin composition comprising:
   (A) a resin having
      at least a repeating unit having a structure represented by any one of the following general formulae (I-1) to (I-3), and
      at least a repeating unit having a group containing a lactone structure, a sultone structure, or a cyano group; and
   (B) a compound that generates an acid by irradiation with actinic rays or radiation:

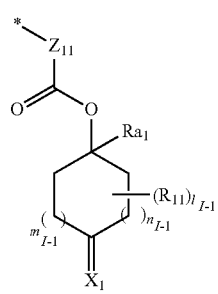

(I-1)

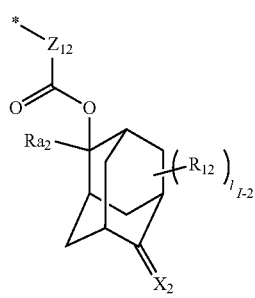

(I-2)

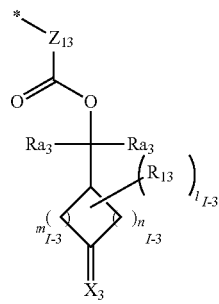

(I-3)

wherein in the general formulae above, $R_{11}$, $R_{12}$, and $R_{13}$ each independently represents a monovalent organic group, when a plurality of $R_{11}$'s, $R_{12}$'s, or $R_{13}$'s are each present, the plurality of $R_{11}$'s, $R_{12}$'s, or $R_{13}$'s may be the same as or different from each other and may be linked to each other to form a ring, $Ra_1$, $Ra_2$, and $Ra_3$ each independently represents an alkyl group or a cycloalkyl group, $X_1$, $X_2$, and $X_3$ each independently represents an oxygen atom or a sulfur atom, $Z_{11}$, $Z_{12}$, and $Z_{13}$ each independently represent a single bond or a divalent linking group, \* represents a moiety linked to a resin, $l_{I\text{-}1}$ represents an integer number of 0 to 12, $l_{I\text{-}2}$ represents an integer number of 0 to 10, and $l_{I\text{-}3}$ represents an integer number of 0 to 12, $m_{I\text{-}1}$ represents an integer number of 1 to 3 and $n_{I\text{-}1}$ represents an integer number of 1 to 3, provided that $m_{I\text{-}1}+n_{I\text{-}1}$ is equal to 2 to 4, and $m_{I\text{-}3}$ represents an integer number of 1 to 5 and $n_{I\text{-}3}$ represents an integer number of 1 to 5, provided that $m_{I\text{-}3}+n_{I\text{-}3}$ is equal to 3 to 6.

2. The actinic-ray-sensitive or radiation-sensitive resin composition according to claim 1, wherein the repeating unit having a group containing at least one selected from the group consisting of a lactone structure, a sultone structure, or a cyano group is represented by any one of the following general formulae (II-1) to (II-4):

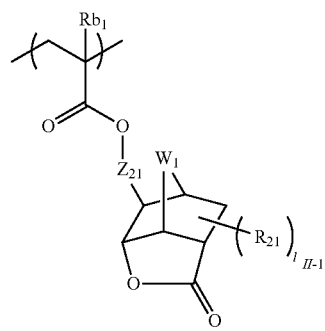

(II-1)

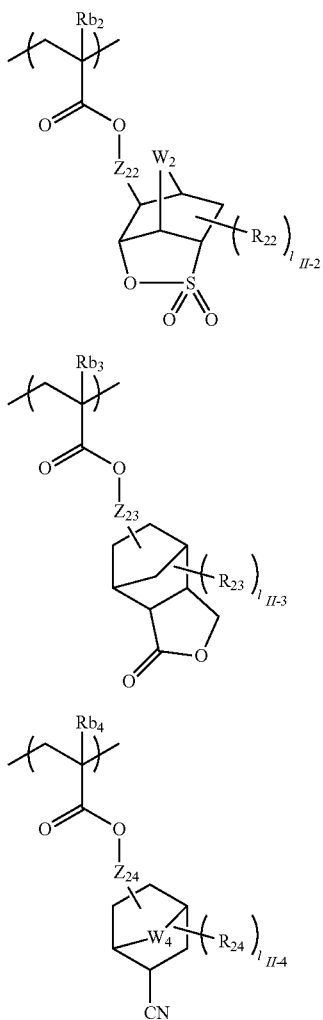

wherein in the general formulae above, $R_{21}$, $R_{22}$, $R_{23}$, and $R_{24}$ each independently represents a monovalent organic group, $Rb_1$, $Rb_2$, $Rb_3$, and $Rb_4$ each independently represents a hydrogen atom or an alkyl group, $W_1$, $W_2$, and $W_4$ each independently represents an alkylene group or an oxygen atom, $Z_{21}$, $Z_{22}$, $Z_{23}$, and $Z_{24}$ each independently represent a single bond or a divalent linking group, $l_{II-1}$ represents an integer number of 0 to 8, $l_{II-2}$ represents an integer number of 0 to 8, $l_{II-3}$ represents an integer number of 0 to 9, and $l_{II-4}$ represents an integer number of 0 to 6.

3. The actinic-ray-sensitive or radiation-sensitive resin composition according to claim 1, wherein the repeating unit having a structure represented by any one of the general formulae (I-1) to (I-3) is a (meth)acrylate-based repeating unit.

4. The actinic-ray-sensitive or radiation-sensitive resin composition according to claim 1, wherein the resin (A) contains at least a repeating unit having a structure represented by the general formula (I-1).

5. The actinic-ray-sensitive or radiation-sensitive resin composition according to claim 1, wherein the resin (A) further contains a group that decomposes by the action of an acid to generate an alkali-soluble group, in addition to a structure represented by any one of the general formulae (I-1) to (I-3).

6. The actinic-ray-sensitive or radiation-sensitive resin composition according to claim 1, further comprising a hydrophobic resin (HR).

7. The actinic-ray-sensitive or radiation-sensitive resin composition according to claim 6, wherein the hydrophobic resin (HR) is a hydrophobic resin having at least any one of a fluorine atom and a silicon atom.

8. The actinic-ray-sensitive or radiation-sensitive resin composition according to claim 1, which comprises an acid-decomposable resin, in addition to the resin (A).

9. The actinic-ray-sensitive or radiation-sensitive resin composition according to claim 1, which comprises two or more kinds of the compound (B).

10. The actinic-ray-sensitive or radiation-sensitive resin composition according to claim 6, which contains the hydrophobic resin (HR) in a proportion of 0.1 to 10 mass % based on the solids content of the composition.

11. The actinic-ray-sensitive or radiation-sensitive resin composition according to claim 1, further comprising a low-molecular-weight compound (D) having a nitrogen atom and a group that leaves by the action of an acid.

12. The actinic-ray-sensitive or radiation-sensitive resin composition according to claim 1, further comprising a basic compound that lowers basicity by irradiation with actinic rays or radiation or an ammonium salt compound.

13. The actinic-ray-sensitive or radiation-sensitive resin composition according to claim 6, wherein the hydrophobic resin (HR) contains a repeating unit having an alkali-soluble group (x).

14. The actinic-ray-sensitive or radiation-sensitive resin composition according to claim 6, wherein the hydrophobic resin (HR) contains a repeating unit having a group that decomposes by the action of an alkali developer to increase the solubility in the alkali developer (y).

15. The actinic-ray-sensitive or radiation-sensitive resin composition according to claim 6, wherein the hydrophobic resin (HR) contains a repeating unit having a group that decomposes by the action of an acid to increase the solubility in an alkali developer (z).

16. A resist film formed using the actinic-ray-sensitive or radiation-sensitive resin composition according to claim 1.

17. A pattern forming method comprising:
a step of exposing the resist film according to claim 16; and
a step of developing the exposed resist film.

18. The pattern forming method according to claim 17, wherein the exposure is a liquid immersion exposure.

19. A method for preparing an electronic device, comprising the pattern forming method according to claim 17.

20. An electronic device prepared by the method for preparing an electronic device according to claim 19.

* * * * *